(12) United States Patent
Iwai et al.

(10) Patent No.: US 7,943,861 B2
(45) Date of Patent: May 17, 2011

(54) PRINTED WIRING BOARD AND METHOD FOR MANUFACTURING PRINTED WIRING BOARD

(75) Inventors: Tsutomu Iwai, Ogaki (JP); Yoshihiro Kodera, Ogaki (JP); Shinya Maeda, Ogaki (JP); Hiroyuki Watanabe, Ogaki (JP); Kazunari Suzuki, Ogaki (JP); Kiyotaka Tsukada, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 11/576,987

(22) PCT Filed: Mar. 15, 2005

(86) PCT No.: PCT/JP2005/004558
§ 371 (c)(1),
(2), (4) Date: Nov. 12, 2007

(87) PCT Pub. No.: WO2006/040847
PCT Pub. Date: Apr. 20, 2006

(65) Prior Publication Data
US 2008/0264681 A1     Oct. 30, 2008

(30) Foreign Application Priority Data

| Oct. 14, 2004 | (JP) | 2004-300696 |
| Oct. 14, 2004 | (JP) | 2004-300697 |
| Dec. 24, 2004 | (JP) | 2004-373471 |
| Dec. 24, 2004 | (JP) | 2004-373472 |

(51) Int. Cl.
*H05K 1/11* (2006.01)

(52) U.S. Cl. ............. 174/262; 174/261; 361/808
(58) Field of Classification Search ............. 174/255, 174/256, 260, 262, 267, 261; 361/808; 438/612–614; 257/690, 700, 737, 780
See application file for complete search history.

(56) References Cited

U.S. PATENT DOCUMENTS

| 6,518,508 B2 * | 2/2003 | Park et al. .................... 174/255 |
| 6,548,898 B2 * | 4/2003 | Matsuki et al. ............... 257/746 |
| 2007/0069379 A1 * | 3/2007 | Souma et al. ................. 257/738 |
| 2008/0067682 A1 * | 3/2008 | Ahrens et al. ................. 257/758 |
| 2008/0136019 A1 * | 6/2008 | Johnson et al. ............... 257/737 |

FOREIGN PATENT DOCUMENTS

| JP | 09-260536 | * 10/1997 |
| JP | 10-154876 | * 6/1998 |
| JP | 11-121529 | * 4/1999 |
| JP | 2000-022027 | * 1/2000 |

(Continued)

*Primary Examiner* — Ishwarbhai B Patel
*Assistant Examiner* — Yuriy Semenenko
(74) *Attorney, Agent, or Firm* — Oblon, Spivak, McClelland, Maier & Neustadt, L.L.P.

(57) ABSTRACT

A composite layer composed of an Ni layer 72 and a Pd layer 73 is formed on a solder pad 77U, and a solder 76α on the composite layer is composed of a solder containing no lead. Because a Pd layer (palladium layer) reduces phenomenons such as repellency of the solder, adhesiveness with the solder can be enhanced. Because a Pd layer has a higher degree of rigidity than a gold layer, thermal stress is absorbed into the Pd layer and buffered so as to reduce the degree of transmission of stress to the solder bump, or to the solder layer, by means of thermal stress.

21 Claims, 70 Drawing Sheets

FOREIGN PATENT DOCUMENTS

| | | | |
|---|---|---|---|
| JP | 2000-022318 | | 1/2000 |
| JP | 2002-124533 | * | 4/2002 |
| JP | 2002-203925 | * | 7/2002 |
| JP | 2004-079891 | | 3/2004 |
| JP | 2004-281937 | | 10/2004 |
| JP | 2006-114705 | | 4/2006 |
| JP | 2006-114706 | | 4/2006 |
| TW | 546997 | | 8/2003 |

* cited by examiner

Fig.4
(A)
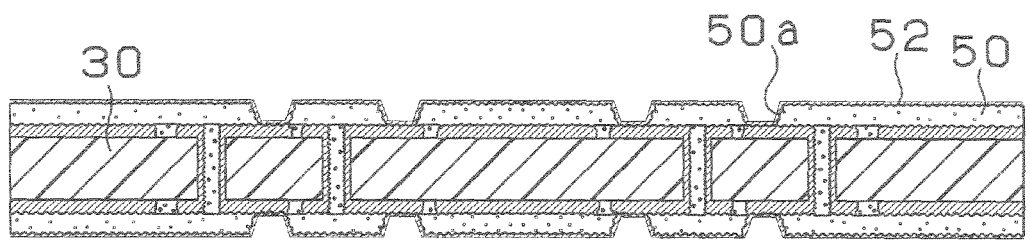
(B)
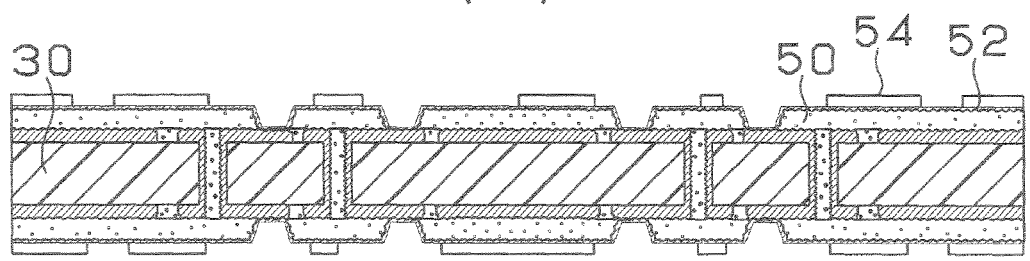
(C)
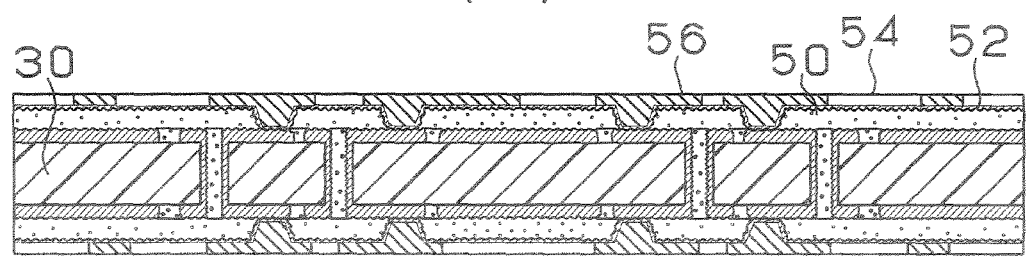
(D)
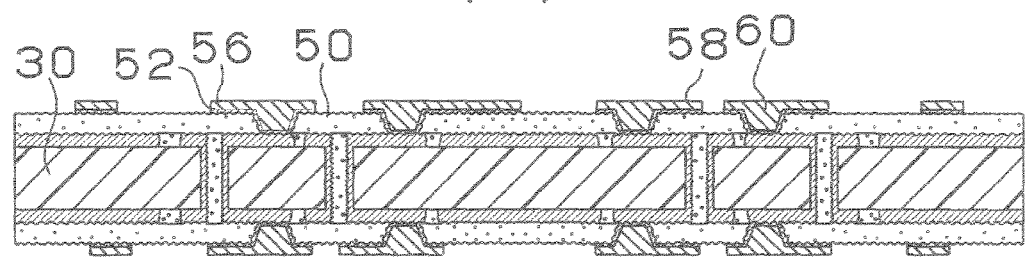

Fig. 5
(A)
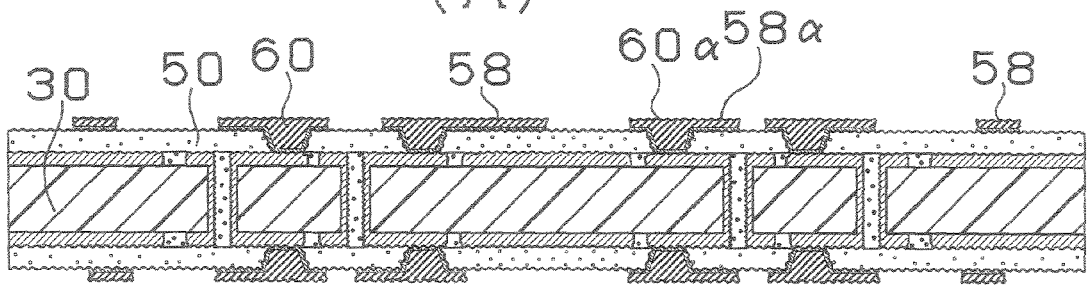
(B)
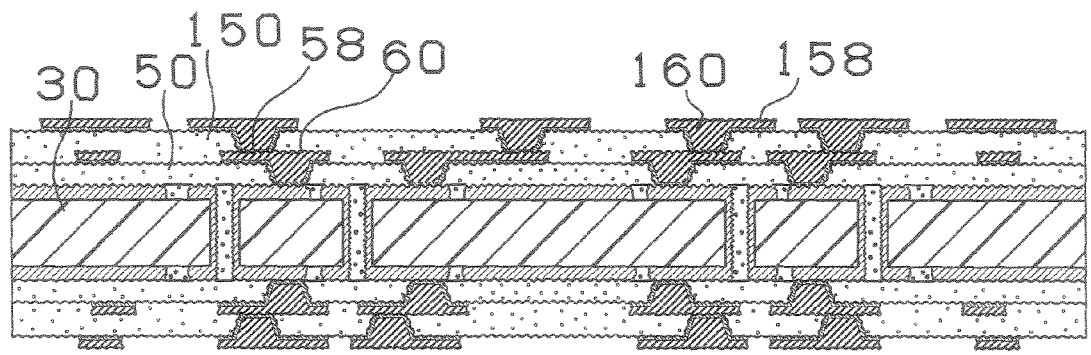
(C)
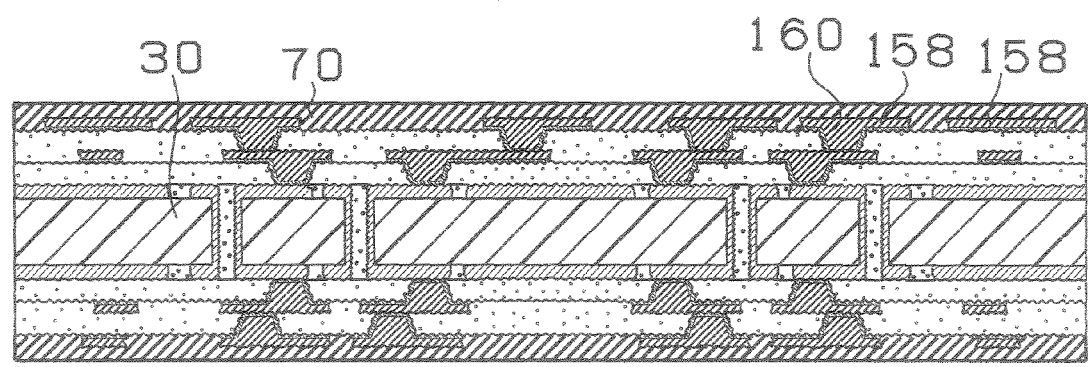

Fig. 6
(A)
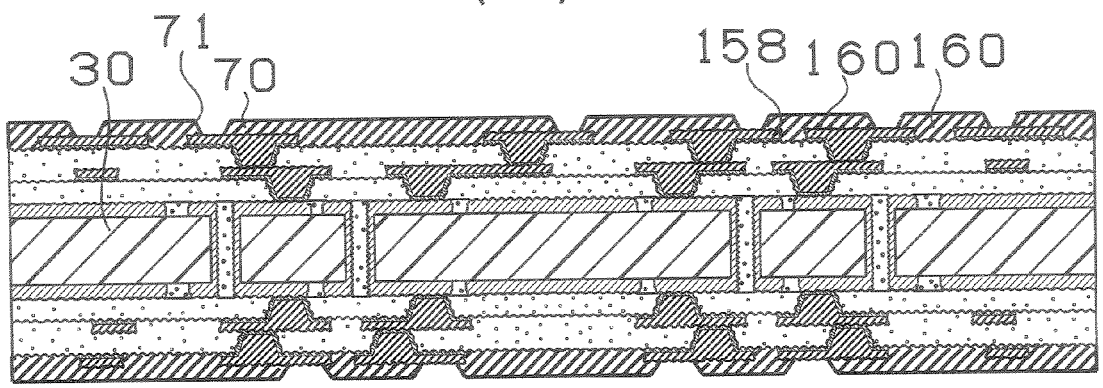
(B)
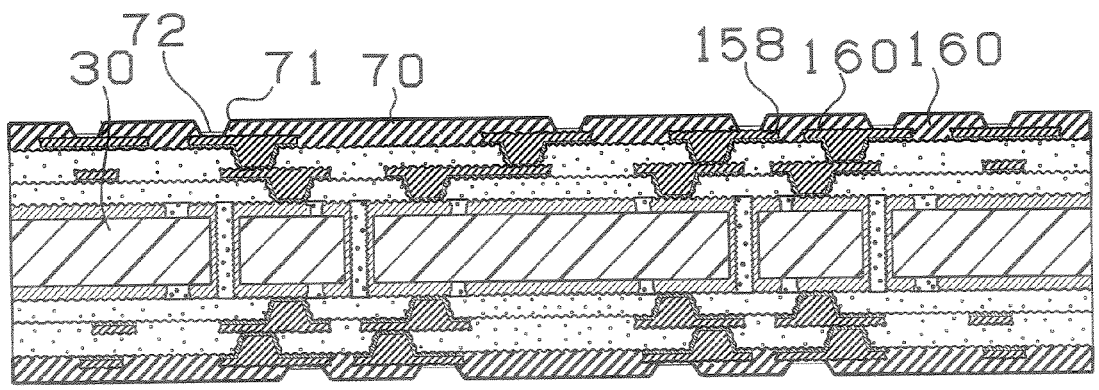

Fig.7
(A)
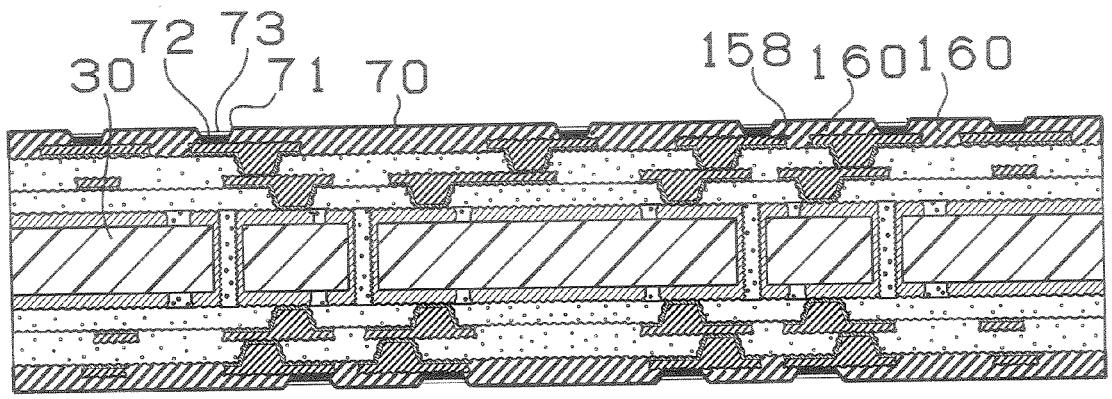
(B)
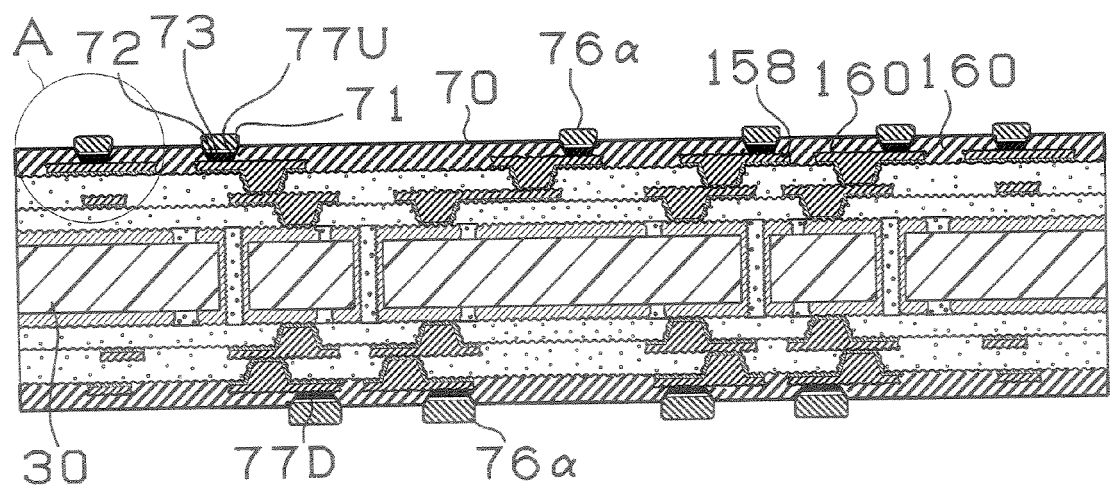

Fig. 8
(A)
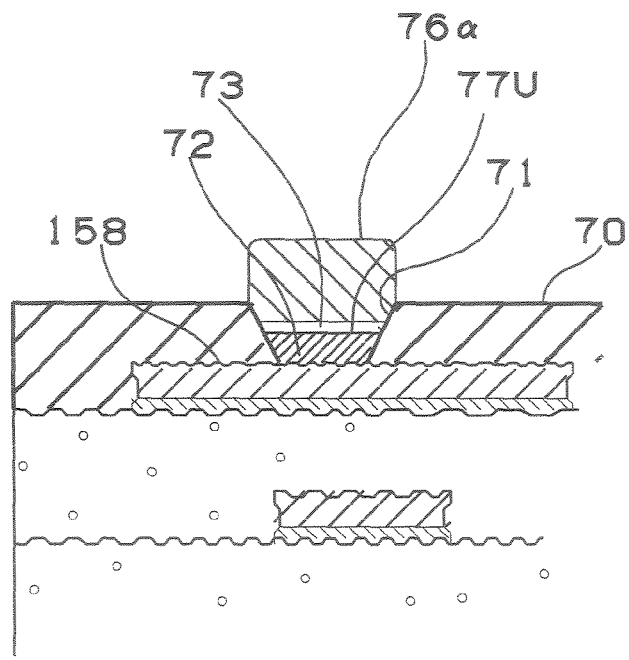
(B)
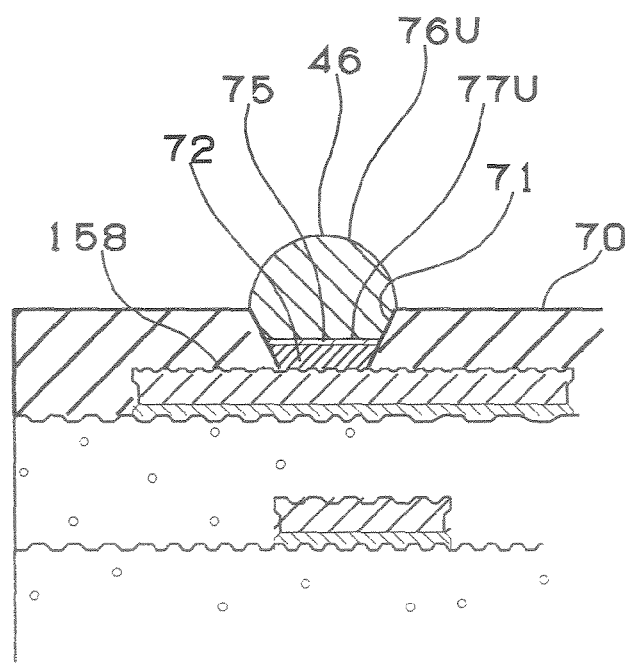

Fig.14
(A)
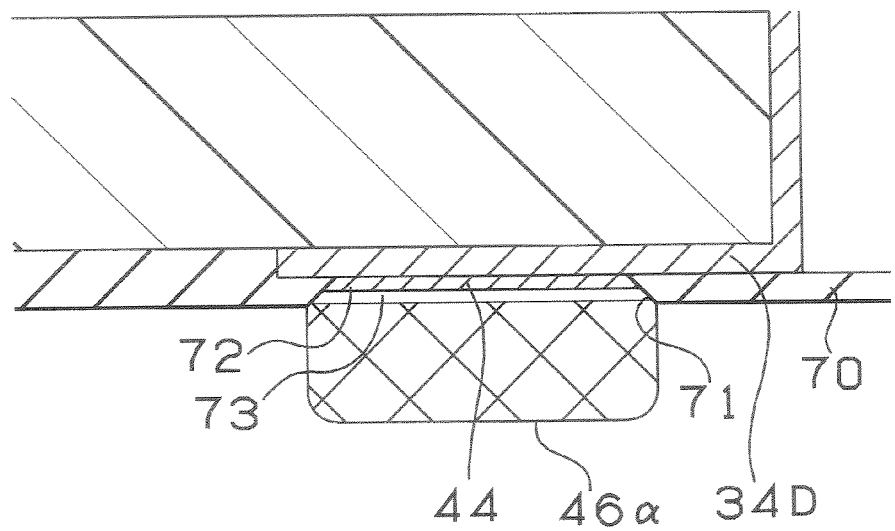
(B)
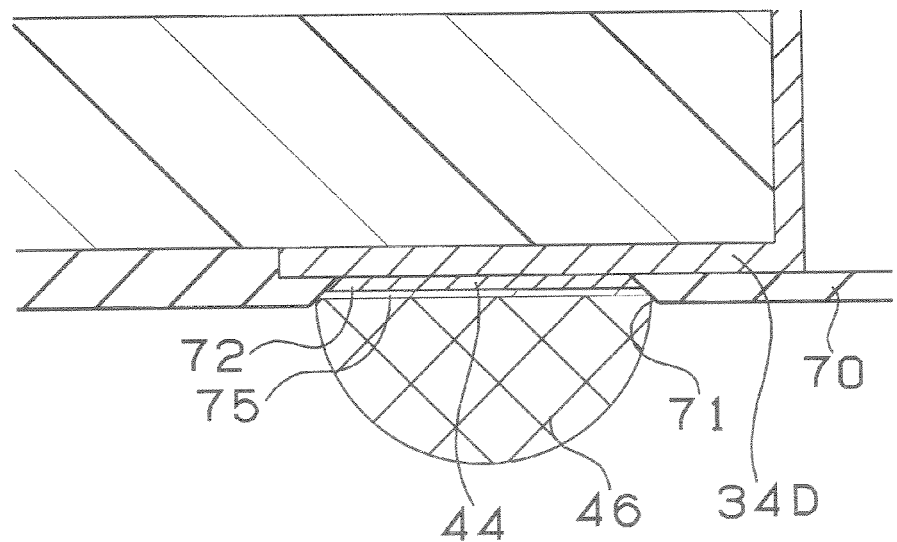

Fig.17
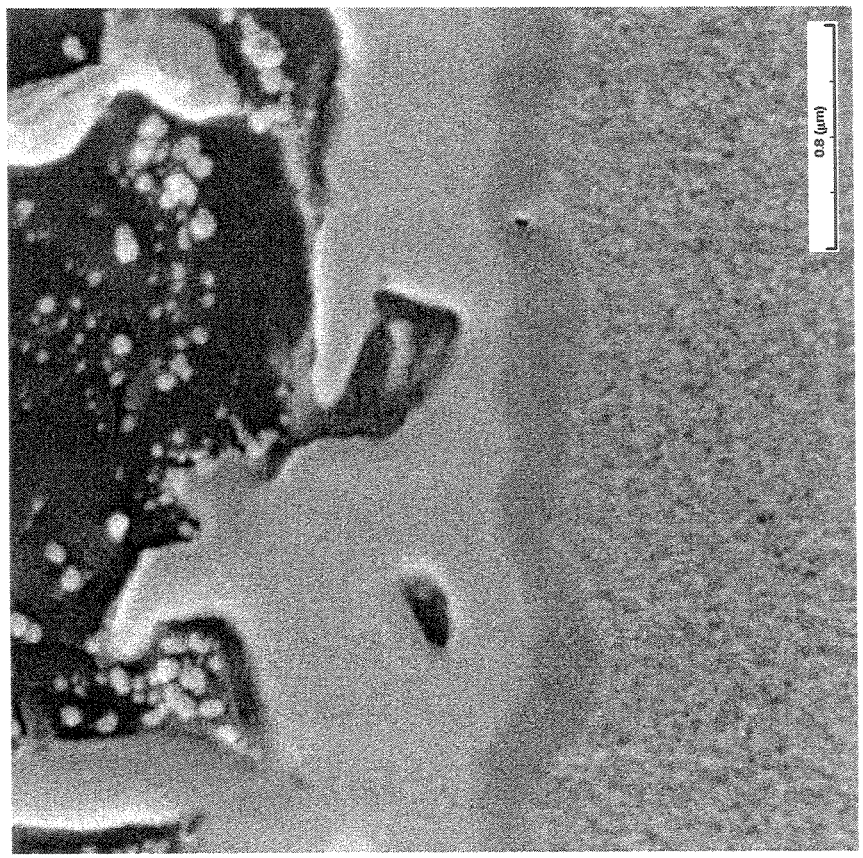
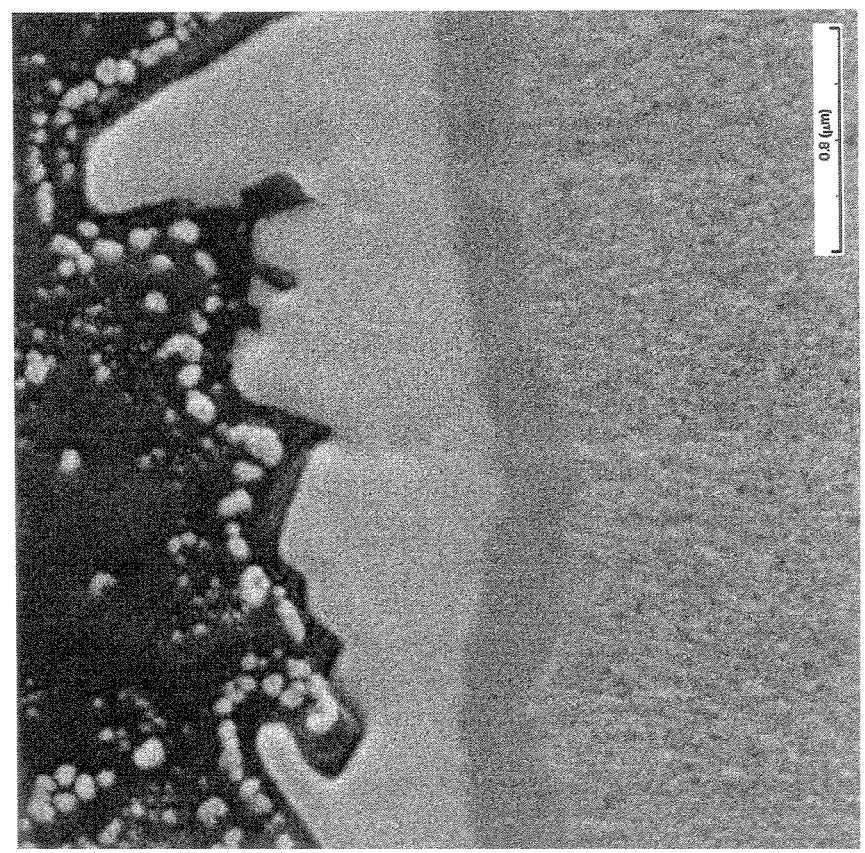

Fig. 22
(A)
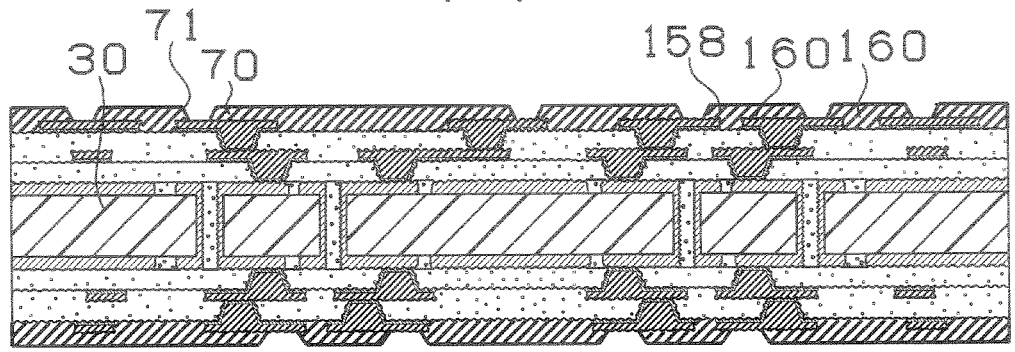
(B)
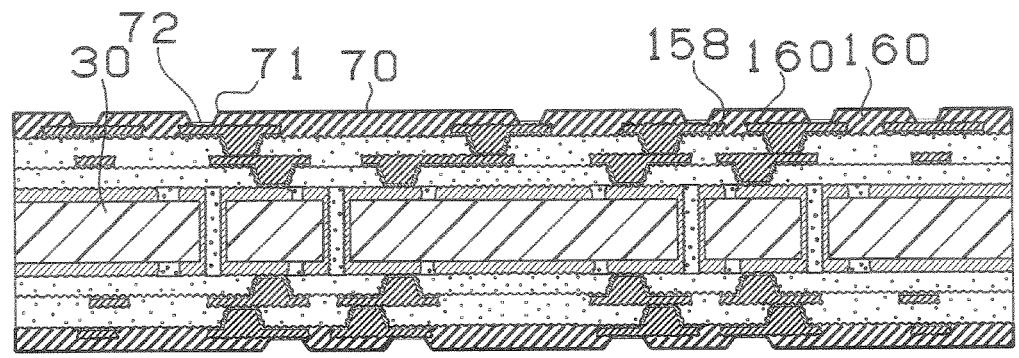
(C)
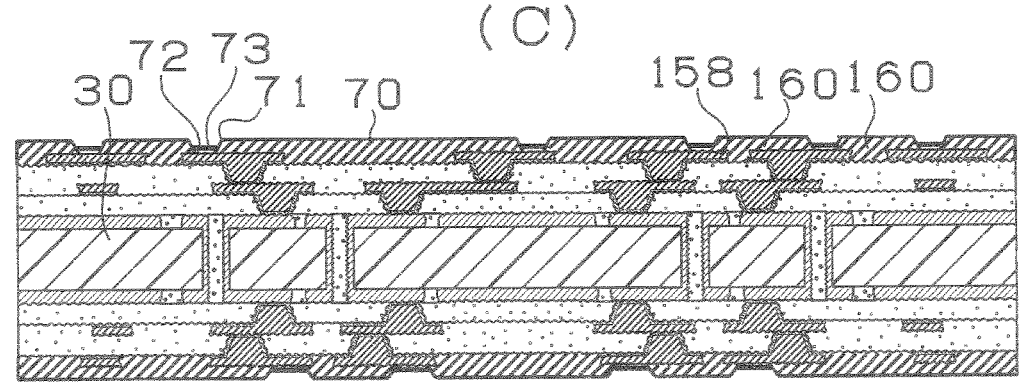

Fig.23
(A)
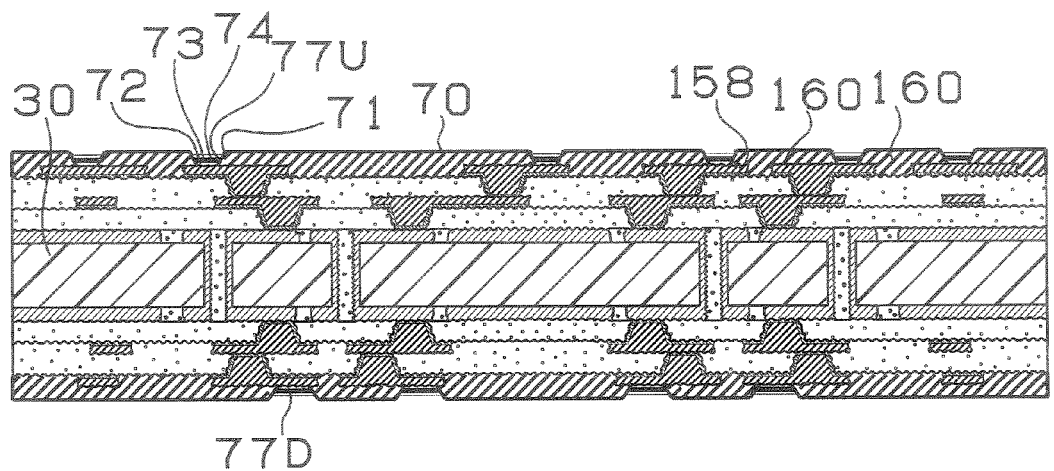
(B)
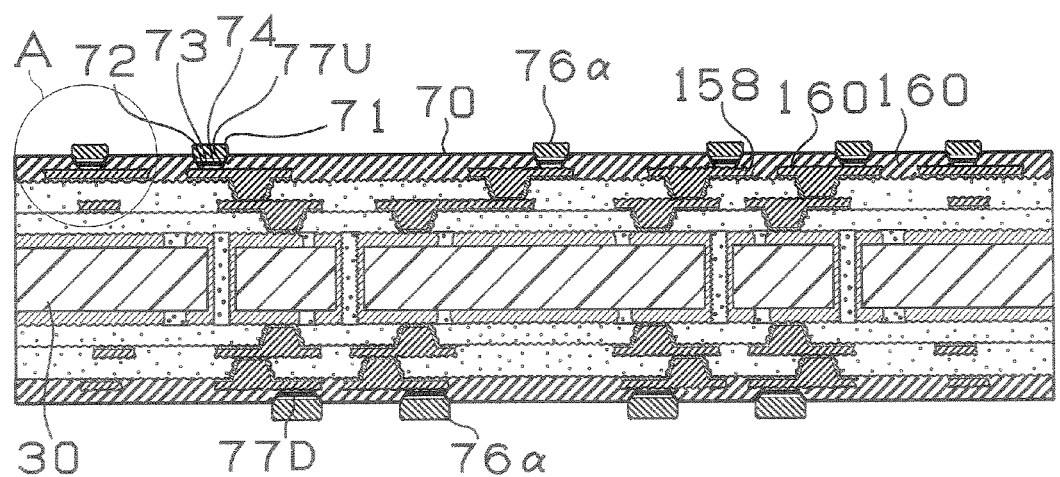

Fig.24
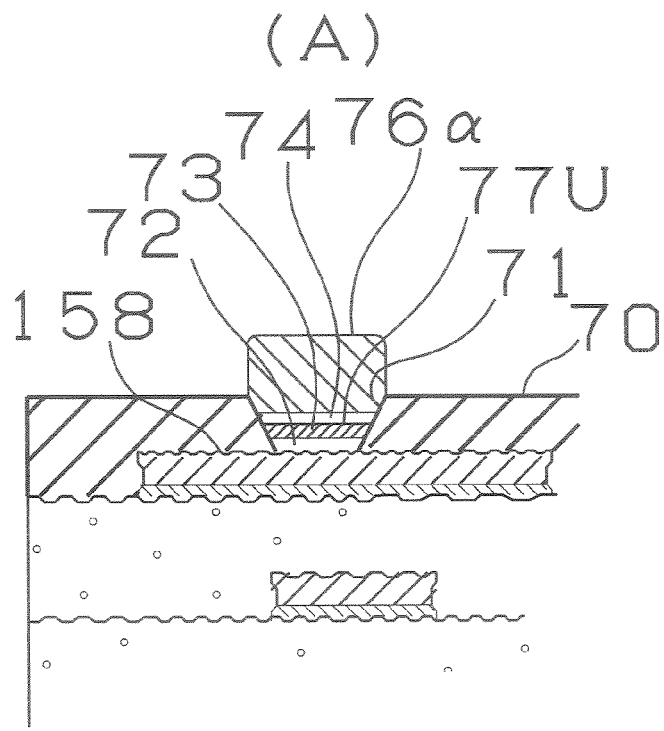
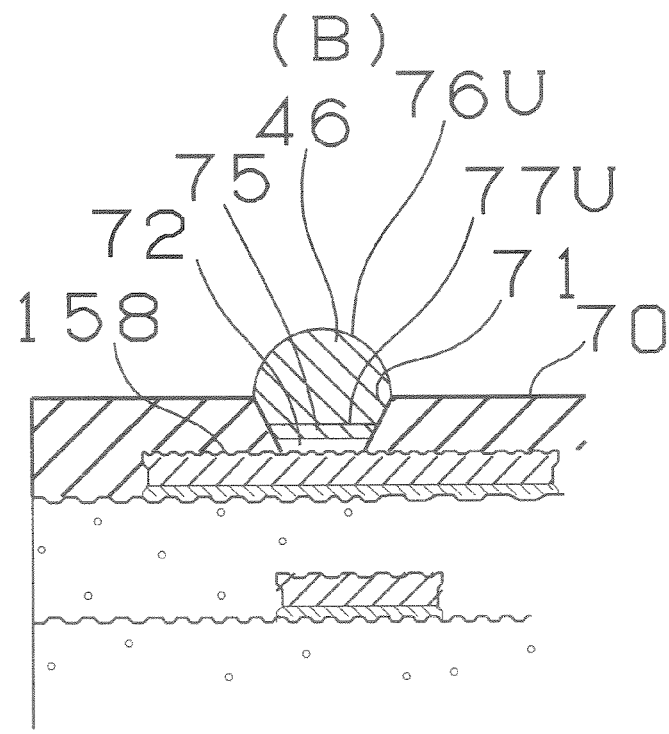

Fig.29
(A)
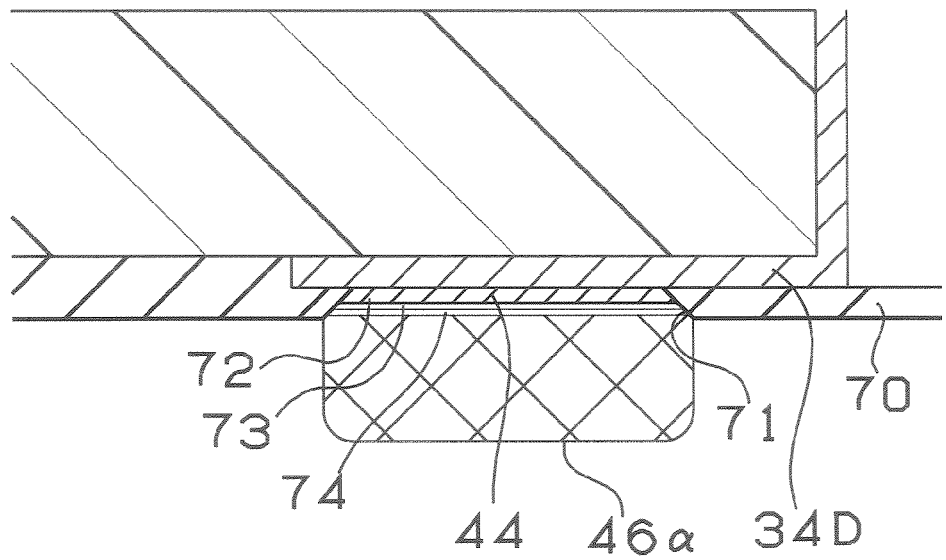
(B)
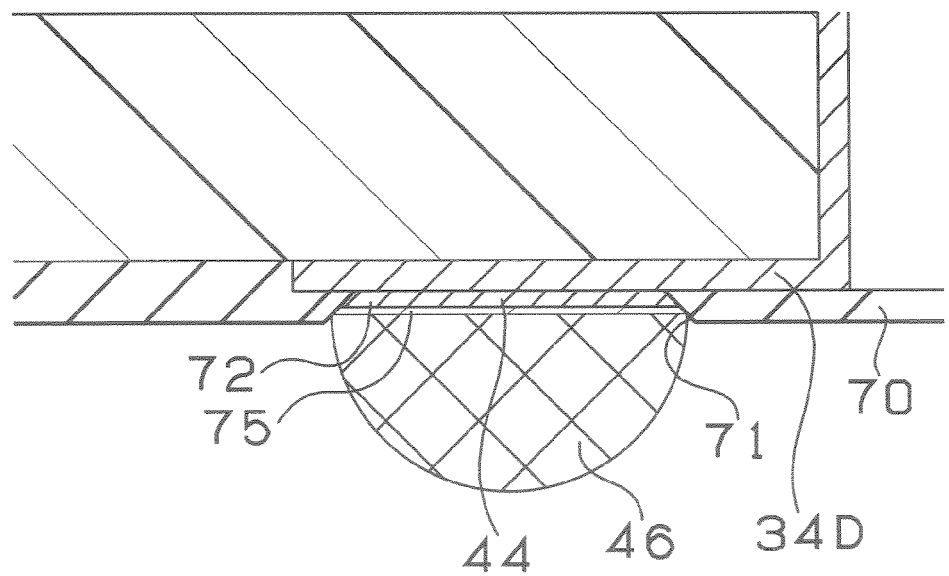

Fig. 31

| Item (Experiment) | Solder Cu/Ag/Sn ratio | Sn/Pb | Ni thickness | quantity of Ni P | thickness of Pd | quantity of Pd P | thickness of Au | quantity of Au P | Su/Cu/Ni ratio | Sn/Cu/Ni thickness | Su/Ni ratio | Sn/Ni thickness |
|---|---|---|---|---|---|---|---|---|---|---|---|---|
| Ex.1-1-1 | 0.5/3.5/95.0 | — | 5 | 1.2 | 0.5 | 5 | — | — | 42/37/21 | 1.5 | — | — |
| Ex.1-1-2 | 0.5/3.5/95.0 | — | 5 | 1.2 | 0.01 | 2 | — | — | 42/37/21 | 1.8 | — | — |
| Ex.1-1-3 | 0.5/3.5/95.0 | — | 5 | 1.2 | 0.01 | 7 | — | — | 42/37/21 | 1.8 | — | — |
| Ex.1-1-4 | 0.5/3.5/95.0 | — | 5 | 1.2 | 1 | 2 | — | — | 42/37/21 | 1.5 | — | — |
| Ex.1-1-5 | 0.5/3.5/95.0 | — | 10 | 0.5 | 1 | 7 | — | — | 42/37/21 | 1.5 | — | — |
| Ex.1-1-6 | 0.5/3.5/95.0 | — | 10 | 0.5 | 0.01 | 7 | — | — | 42/37/21 | 1.7 | — | — |
| Ex.1-1-7 | 0.5/3.5/95.0 | — | 0.05 | 5 | 1 | 7 | — | — | 42/37/21 | 1.7 | — | — |
| Ex.1-1-8 | 0.5/3.5/95.0 | — | 0.05 | 5 | 0.01 | 3 | — | — | 42/37/21 | 1.8 | — | — |
| Ex.1-1-9 | 0.5/3.5/95.0 | — | 0.3 | 0.5 | 0.01 | 2 | — | — | 42/37/21 | 1.7 | — | — |
| Ex.1-1-10 | 0.5/3.5/95.0 | — | 0.3 | 0.5 | 1 | 2 | — | — | 42/37/21 | 1.6 | — | — |
| Ex.1-1-11 | 0.5/3.5/95.0 | — | 0.3 | 0.5 | 0.01 | 7 | — | — | 42/37/21 | 1.7 | — | — |
| Ex.1-1-12 | 0.5/3.5/95.0 | — | 0.3 | 5 | 1 | 7 | — | — | 42/37/21 | 1.6 | — | — |
| Ex.1-1-13 | 0.5/3.5/95.0 | — | 1 | 0.5 | 0.01 | 2 | — | — | 42/37/21 | 1.7 | — | — |
| Ex.1-1-14 | 0.5/3.5/95.0 | — | 1 | 5 | 1 | 7 | — | — | 42/37/21 | 1.7 | — | — |
| Ex.1-1-15 | 0.5/3.5/95.0 | — | 0.3 | 8 | 0.01 | 5 | — | — | 42/37/21 | 1.7 | — | — |
| Ex.1-1-16 | 0.5/3.5/95.0 | — | 0.3 | 8 | 1 | 7 | — | — | 42/37/21 | 1.7 | — | — |
| Ex.1-1-17 | 0.5/3.5/95.0 | — | 0.05 | 10 | 0.01 | 2 | — | — | 42/37/21 | 1.8 | — | — |
| Ex.1-1-18 | 0.5/3.5/95.0 | — | 1 | 10 | 1 | 5 | — | — | 42/37/21 | 1.8 | — | — |
| Ex.1-1-19 | 0.5/3.5/95.0 | — | 0.05 | 15 | 0.01 | 2 | — | — | 42/37/21 | 2.0 | — | — |
| Ex.1-1-20 | 0.5/3.5/95.0 | — | 1 | 15 | 1 | 2 | — | — | 42/37/21 | 1.9 | — | — |
| Ex.1-1-21 | 0.5/3.5/95.0 | — | 8 | 15 | 0.01 | 7 | — | — | 42/37/21 | 2.0 | — | — |
| Ex.1-1-22 | 0.5/3.5/95.0 | — | 10 | 15 | 1 | 7 | — | — | 42/37/21 | 2.1 | — | — |

Fig. 32

| Item (Experiment) | Solder Cu/Ag/Sn ratio | Solder Sn/Pb | Ni thickness | quantity of Ni P | thickness of Pd | quantity of Pd P | thickness of Au | quantity of Au P | Su/Cu/Ni ratio | Sn/Cu/Ni thickness | Su/Ni ratio | Sn/Ni thickness |
|---|---|---|---|---|---|---|---|---|---|---|---|---|
| Ex.1-2-1 | — | 63/37 | 5 | 1.2 | 0.5 | 5 | — | — | — | — | 67/33 | 1.5 |
| Ex.1-2-2 | — | 63/37 | 5 | 1.2 | 0.01 | 2 | — | — | — | — | 67/33 | 1.8 |
| Ex.1-2-3 | — | 63/37 | 5 | 1.2 | 0.01 | 7 | — | — | — | — | 67/33 | 1.8 |
| Ex.1-2-4 | — | 63/37 | 5 | 1.2 | 1 | 2 | — | — | — | — | 67/33 | 1.5 |
| Ex.1-2-5 | — | 63/37 | 10 | 0.5 | 1 | 7 | — | — | — | — | 67/33 | 1.5 |
| Ex.1-2-6 | — | 63/37 | 10 | 5 | 0.01 | 7 | — | — | — | — | 67/33 | 1.7 |
| Ex.1-2-7 | — | 63/37 | 0.05 | 0.5 | 1 | 7 | — | — | — | — | 67/33 | 1.7 |
| Ex.1-2-8 | — | 63/37 | 0.05 | 5 | 0.01 | 3 | — | — | — | — | 67/33 | 1.8 |
| Ex.1-2-9 | — | 63/37 | 0.3 | 0.5 | 0.01 | 2 | — | — | — | — | 67/33 | 1.7 |
| Ex.1-2-10 | — | 63/37 | 0.3 | 0.5 | 1 | 2 | — | — | — | — | 67/33 | 1.6 |
| Ex.1-2-11 | — | 63/37 | 0.3 | 5 | 0.01 | 7 | — | — | — | — | 67/33 | 1.7 |
| Ex.1-2-12 | — | 63/37 | 0.3 | 5 | 1 | 7 | — | — | — | — | 67/33 | 1.6 |
| Ex.1-2-13 | — | 63/37 | 1 | 0.5 | 0.01 | 2 | — | — | — | — | 67/33 | 1.7 |
| Ex.1-2-14 | — | 63/37 | 1 | 5 | 1 | 7 | — | — | — | — | 67/33 | 1.7 |
| Ex.1-2-15 | — | 63/37 | 0.3 | 8 | 0.01 | 5 | — | — | — | — | 67/33 | 1.7 |
| Ex.1-2-16 | — | 63/37 | 0.3 | 8 | 1 | 7 | — | — | — | — | 67/33 | 1.7 |
| Ex.1-2-17 | — | 63/37 | 0.05 | 10 | 0.01 | 2 | — | — | — | — | 67/33 | 1.8 |
| Ex.1-2-18 | — | 63/37 | 1 | 10 | 1 | 5 | — | — | — | — | 67/33 | 1.8 |
| Ex.1-2-19 | — | 63/37 | 0.05 | 15 | 0.01 | 2 | — | — | — | — | 67/33 | 1.9 |
| Ex.1-2-20 | — | 63/37 | 1 | 15 | 1 | 7 | — | — | — | — | 67/33 | 1.8 |
| Ex.1-2-21 | — | 63/37 | 8 | 15 | 0.01 | 7 | — | — | — | — | 67/33 | 2.0 |
| Ex.1-2-22 | — | 63/37 | 10 | 15 | 1 | 7 | — | — | — | — | 67/33 | 2.2 |

Fig. 33

| Item (Experiment) | Solder Cu/Ag/Sn ratio | Sn/Pb | Ni thickness | quantity of Ni P | thickness of Pd | quantity of Pd P | thickness of Au | quantity of Au P | Sn/Cu/Ni ratio | Sn/Cu/Ni thickness | Sn/Ni ratio | Sn/Ni thickness |
|---|---|---|---|---|---|---|---|---|---|---|---|---|
| Ex.1-3-1 | 0.5/3.5/95.0 | -- | 5 | 1.2 | 0.009 | 8 | -- | -- | 42/45/13 | 2.5 | -- | -- |
| Ex.1-3-2 | 0.5/3.5/95.0 | -- | 5 | 1.2 | 0.008 | 7 | -- | -- | 42/45/13 | 2.5 | -- | -- |
| Ex.1-3-3 | 0.5/3.5/95.0 | -- | 5 | 1.2 | 0.009 | 1 | -- | -- | 42/45/13 | 2.5 | -- | -- |
| Ex.1-3-4 | 0.5/3.5/95.0 | -- | 5 | 1.2 | 2 | 2 | -- | -- | 66/29/5 | 1.3 | -- | -- |
| Ex.1-3-5 | 0.5/3.5/95.0 | -- | 10 | 0.5 | 2 | 5 | -- | -- | 66/29/5 | 1.3 | -- | -- |
| Ex.1-3-6 | 0.5/3.5/95.0 | -- | 10 | 5 | 2 | 9 | -- | -- | 66/29/5 | 1.5 | -- | -- |
| Ex.1-3-7 | 0.5/3.5/95.0 | -- | 0.03 | 0.4 | 0.03 | 3 | | | 66/29/5 | 1.1 | | |
| Ex.1-3-8 | 0.5/3.5/95.0 | -- | 0.03 | 0.5 | 0.2 | 7 | | | 66/29/5 | 1.3 | | |
| Ex.1-3-9 | 0.5/3.5/95.0 | -- | 0.03 | 16 | 0.2 | 7 | | | 66/29/5 | 1.3 | | |
| Ex.1-3-10 | 0.5/3.5/95.0 | -- | 10 | 0.4 | 0.2 | 2 | | | 66/29/5 | 1.4 | | |
| Ex.1-3-11 | 0.5/3.5/95.0 | -- | 10 | 16 | 1 | 7 | -- | -- | 66/29/5 | 1.5 | | |
| Ex.1-3-12 | 0.5/3.5/95.0 | -- | 12 | 0.4 | 0.01 | 2 | | | 66/29/5 | 2.4 | | |
| Ex.1-3-13 | 0.5/3.5/95.0 | -- | 12 | 5 | 1 | 2 | | | 66/29/5 | 2.5 | | |
| Ex.1-3-14 | 0.5/3.5/95.0 | -- | 12 | 17 | 1 | 7 | | | 66/29/5 | 2.4 | | |
| Ex.1-4-1 | -- | 63/37 | 5 | 1.2 | 0.009 | 8 | -- | -- | | | 67/33 | 2.5 |
| Ex.1-4-2 | -- | 63/37 | 5 | 1.2 | 0.008 | 7 | -- | -- | | | 67/33 | 2.5 |
| Ex.1-4-3 | -- | 63/37 | 5 | 1.2 | 0.009 | 1 | -- | -- | | | 67/33 | 2.5 |
| Ex.1-4-4 | -- | 63/37 | 5 | 1.2 | 2 | 2 | -- | -- | | | 67/33 | 1.3 |
| Ex.1-4-5 | -- | 63/37 | 10 | 0.5 | 2 | 5 | -- | -- | | | 67/33 | 1.3 |
| Ex.1-4-6 | -- | 63/37 | 10 | 5 | 2 | 9 | | | | | 67/33 | 1.5 |
| Ex.1-4-7 | -- | 63/37 | 0.03 | 0.4 | 0.03 | 3 | | | | | 67/33 | 1.1 |
| Ex.1-4-8 | -- | 63/37 | 0.03 | 0.5 | 0.2 | 7 | | | | | 67/33 | 1.3 |
| Ex.1-4-9 | -- | 63/37 | 0.03 | 16 | 0.2 | 7 | | | | | 67/33 | 1.3 |
| Ex.1-4-10 | -- | 63/37 | 10 | 0.4 | 0.2 | 2 | | | | | 67/33 | 1.4 |
| Ex.1-4-11 | -- | 63/37 | 10 | 16 | 1 | 7 | | | | | 67/33 | 1.5 |
| Ex.1-4-12 | -- | 63/37 | 12 | 0.4 | 0.01 | 2 | | | | | 67/33 | 2.4 |
| Ex.1-4-13 | -- | 63/37 | 12 | 5 | 1 | 2 | | | | | 67/33 | 2.5 |
| Ex.1-4-14 | -- | 63/37 | 12 | 17 | 1 | 7 | | | | | 67/33 | 2.4 |
| Ex.1-5-1 | -- | 63/37 | 5 | 1.2 | 0.03 | 0 | -- | -- | 42/37/21 | 1.5 | -- | -- |
| Ex.1-5-2 | -- | 63/37 | 5 | 1.2 | 0.07 | 5 | | | 42/37/21 | 1.5 | -- | -- |

Fig. 34

| Item (Experiment) | Solder Cu/Ag/Sn ratio | Sn/Pb | Ni thickness | quantity of Ni P | thickness of Pd | quantity of Pd P | thickness of Au | quantity of Au P | Su/Cu/Ni ratio | Sn/Cu/Ni thickness | Su/Ni ratio | Sn/Ni thickness |
|---|---|---|---|---|---|---|---|---|---|---|---|---|
| Ex.2-1-1 | 0.5/3.5/95.0 | — | 5 | 1.2 | 0.5 | 5 | — | — | 42/37/21 | 1.5 | — | — |
| Ex.2-1-2 | 0.5/3.5/95.0 | — | 5 | 1.2 | 0.01 | 2 | — | — | 42/37/21 | 1.8 | — | — |
| Ex.2-1-3 | 0.5/3.5/95.0 | — | 5 | 1.2 | 0.01 | 7 | — | — | 42/37/21 | 1.8 | — | — |
| Ex.2-1-4 | 0.5/3.5/95.0 | — | 5 | 1.2 | 1 | 2 | — | — | 42/37/21 | 1.5 | — | — |
| Ex.2-1-5 | 0.5/3.5/95.0 | — | 10 | 0.5 | 1 | 7 | — | — | 42/37/21 | 1.5 | — | — |
| Ex.2-1-6 | 0.5/3.5/95.0 | — | 10 | 0.5 | 0.01 | 7 | — | — | 42/37/21 | 1.7 | — | — |
| Ex.2-1-7 | 0.5/3.5/95.0 | — | 0.05 | 5 | 1 | 7 | — | — | 42/37/21 | 1.7 | — | — |
| Ex.2-1-8 | 0.5/3.5/95.0 | — | 0.05 | 5 | 0.01 | 3 | — | — | 42/37/21 | 1.8 | — | — |
| Ex.2-1-9 | 0.5/3.5/95.0 | — | 0.3 | 0.5 | 0.01 | 2 | — | — | 42/37/21 | 1.7 | — | — |
| Ex.2-1-10 | 0.5/3.5/95.0 | — | 0.3 | 0.5 | 0.01 | 2 | — | — | 42/37/21 | 1.6 | — | — |
| Ex.2-1-11 | 0.5/3.5/95.0 | — | 0.3 | 0.5 | 1 | 7 | — | — | 42/37/21 | 1.7 | — | — |
| Ex.2-1-12 | 0.5/3.5/95.0 | — | 1 | 0.5 | 0.01 | 2 | — | — | 42/37/21 | 1.6 | — | — |
| Ex.2-1-13 | 0.5/3.5/95.0 | — | 1 | 5 | 1 | 7 | — | — | 42/37/21 | 1.7 | — | — |
| Ex.2-1-14 | 0.5/3.5/95.0 | — | 0.3 | 8 | 0.01 | 2 | — | — | 42/37/21 | 1.7 | — | — |
| Ex.2-1-15 | 0.5/3.5/95.0 | — | 0.3 | 8 | 1 | 5 | — | — | 42/37/21 | 1.7 | — | — |
| Ex.2-1-16 | 0.5/3.5/95.0 | — | 0.05 | 10 | 0.01 | 7 | — | — | 42/37/21 | 1.7 | — | — |
| Ex.2-1-17 | 0.5/3.5/95.0 | — | 0.05 | 10 | 1 | 2 | — | — | 42/37/21 | 1.8 | — | — |
| Ex.2-1-18 | 0.5/3.5/95.0 | — | 1 | 15 | 1 | 5 | — | — | 42/37/21 | 1.8 | — | — |
| Ex.2-1-19 | 0.5/3.5/95.0 | — | 0.05 | 15 | 0.01 | 2 | — | — | 42/37/21 | 2.0 | — | — |
| Ex.2-1-20 | 0.5/3.5/95.0 | — | 1 | 15 | 1 | 2 | — | — | 42/37/21 | 1.9 | — | — |
| Ex.2-1-21 | 0.5/3.5/95.0 | — | 8 | 15 | 0.01 | 7 | — | — | 42/37/21 | 2.0 | — | — |
| Ex.2-1-22 | 0.5/3.5/95.0 | — | 10 | 15 | 1 | 7 | — | — | 42/37/21 | 2.1 | — | — |

Fig. 35

| Item (Experiment) | Solder Cu/Ag/Sn ratio | Sn/Pb | Ni thickness | quantity of Ni P | thickness of Pd | quantity of Pd P | thickness of Au | quantity of Au P | Su/Cu/Ni ratio | Sn/Cu/Ni thickness | Su/Ni ratio | Sn/Ni thickness |
|---|---|---|---|---|---|---|---|---|---|---|---|---|
| Ex.2-2-1 | --- | 63/37 | 5 | 1.2 | 0.5 | 5 | --- | --- | --- | --- | 67/33 | 1.5 |
| Ex.2-2-2 | --- | 63/37 | 5 | 1.2 | 0.01 | 2 | --- | --- | --- | --- | 67/33 | 1.8 |
| Ex.2-2-3 | --- | 63/37 | 5 | 1.2 | 0.01 | 7 | --- | --- | --- | --- | 67/33 | 1.7 |
| Ex.2-2-4 | --- | 63/37 | 5 | 1.2 | 1 | 2 | --- | --- | --- | --- | 67/33 | 1.5 |
| Ex.2-2-5 | --- | 63/37 | 10 | 0.5 | 1 | 7 | --- | --- | --- | --- | 67/33 | 1.5 |
| Ex.2-2-6 | --- | 63/37 | 10 | 5 | 0.01 | 7 | --- | --- | --- | --- | 67/33 | 1.7 |
| Ex.2-2-7 | --- | 63/37 | 0.05 | 0.5 | 1 | 7 | --- | --- | --- | --- | 67/33 | 1.7 |
| Ex.2-2-8 | --- | 63/37 | 0.05 | 5 | 0.01 | 3 | --- | --- | --- | --- | 67/33 | 1.8 |
| Ex.2-2-9 | --- | 63/37 | 0.3 | 0.5 | 0.01 | 2 | --- | --- | --- | --- | 67/33 | 1.7 |
| Ex.2-2-10 | --- | 63/37 | 0.3 | 0.5 | 0.01 | 2 | --- | --- | --- | --- | 67/33 | 1.6 |
| Ex.2-2-11 | --- | 63/37 | 0.3 | 5 | 1 | 2 | --- | --- | --- | --- | 67/33 | 1.7 |
| Ex.2-2-12 | --- | 63/37 | 0.3 | 5 | 0.01 | 7 | --- | --- | --- | --- | 67/33 | 1.6 |
| Ex.2-2-13 | --- | 63/37 | 1 | 0.5 | 1 | 2 | --- | --- | --- | --- | 67/33 | 1.7 |
| Ex.2-2-14 | --- | 63/37 | 1 | 5 | 1 | 7 | --- | --- | --- | --- | 67/33 | 1.7 |
| Ex.2-2-15 | --- | 63/37 | 0.3 | 8 | 0.01 | 5 | --- | --- | --- | --- | 67/33 | 1.7 |
| Ex.2-2-16 | --- | 63/37 | 0.3 | 8 | 1 | 7 | --- | --- | --- | --- | 67/33 | 1.7 |
| Ex.2-2-17 | --- | 63/37 | 0.05 | 10 | 0.01 | 2 | --- | --- | --- | --- | 67/33 | 1.8 |
| Ex.2-2-18 | --- | 63/37 | 1 | 10 | 1 | 5 | --- | --- | --- | --- | 67/33 | 1.7 |
| Ex.2-2-19 | --- | 63/37 | 0.05 | 15 | 0.01 | 2 | --- | --- | --- | --- | 67/33 | 1.9 |
| Ex.2-2-20 | --- | 63/37 | 1 | 15 | 1 | 2 | --- | --- | --- | --- | 67/33 | 1.8 |
| Ex.2-2-21 | --- | 63/37 | 8 | 15 | 0.01 | 7 | --- | --- | --- | --- | 67/33 | 2.1 |
| Ex.2-2-22 | --- | 63/37 | 10 | 15 | 1 | 7 | --- | --- | --- | --- | 67/33 | 2.2 |

Fig. 36

| Item (Experiment) | Solder Cu/Ag/Sn ratio | Sn/Pb | Ni thickness | quantity of Ni P | thickness of Pd | quantity of Pd P | thickness of Au | quantity of Au P | Su/Cu/Ni ratio | Sn/Cu/Ni thickness | Su/Ni ratio | Sn/Ni thickness |
|---|---|---|---|---|---|---|---|---|---|---|---|---|
| Ex.2-3-1 | 0.5/3.5/95.0 | — | 5 | 1.2 | 0.009 | 8 | — | — | 42/45/13 | 2.5 | — | — |
| Ex.2-3-2 | 0.5/3.5/95.0 | — | 5 | 1.2 | 0.008 | 7 | — | — | 42/45/13 | 2.5 | — | — |
| Ex.2-3-3 | 0.5/3.5/95.0 | — | 5 | 1.2 | 0.009 | 1 | — | — | 42/45/13 | 2.5 | — | — |
| Ex.2-3-4 | 0.5/3.5/95.0 | — | 5 | 1.2 | 2 | 2 | — | — | 66/29/5 | 1.3 | — | — |
| Ex.2-3-5 | 0.5/3.5/95.0 | — | 10 | 0.5 | 2 | 5 | — | — | 66/29/5 | 1.3 | — | — |
| Ex.2-3-6 | 0.5/3.5/95.0 | — | 10 | 5 | 2 | 9 | — | — | 66/29/5 | 1.5 | — | — |
| Ex.2-3-7 | 0.5/3.5/95.0 | — | 0.03 | 0.4 | 0.03 | 3 | — | — | 66/29/5 | 1.1 | — | — |
| Ex.2-3-8 | 0.5/3.5/95.0 | — | 0.03 | 0.5 | 0.2 | 7 | — | — | 66/29/5 | 1.3 | — | — |
| Ex.2-3-9 | 0.5/3.5/95.0 | — | 0.03 | 16 | 0.2 | 7 | — | — | 66/29/5 | 1.3 | — | — |
| Ex.2-3-10 | 0.5/3.5/95.0 | — | 10 | 0.4 | 0.2 | 2 | — | — | 66/29/5 | 1.4 | — | — |
| Ex.2-3-11 | 0.5/3.5/95.0 | — | 10 | 16 | 1 | 2 | — | — | 66/29/5 | 1.5 | — | — |
| Ex.2-3-12 | 0.5/3.5/95.0 | — | 12 | 0.4 | 1 | 2 | — | — | 66/29/5 | 2.4 | — | — |
| Ex.2-3-13 | 0.5/3.5/95.0 | — | 12 | 5 | 1 | 2 | — | — | 66/29/5 | 2.5 | — | — |
| Ex.2-3-14 | 0.5/3.5/95.0 | — | 12 | 17 | 1 | 7 | — | — | 66/29/5 | 2.4 | — | — |
| Ex.2-4-1 | — | 63/37 | 5 | 1.2 | 0.009 | 8 | — | — | — | — | 67/33 | 2.5 |
| Ex.2-4-2 | — | 63/37 | 5 | 1.2 | 0.008 | 7 | — | — | — | — | 67/33 | 2.5 |
| Ex.2-4-3 | — | 63/37 | 5 | 1.2 | 0.009 | 1 | — | — | — | — | 67/33 | 2.5 |
| Ex.2-4-4 | — | 63/37 | 5 | 1.2 | 2 | 2 | — | — | — | — | 67/33 | 1.3 |
| Ex.2-4-5 | — | 63/37 | 10 | 0.5 | 2 | 5 | — | — | — | — | 67/33 | 1.3 |
| Ex.2-4-6 | — | 63/37 | 10 | 5 | 2 | 9 | — | — | — | — | 67/33 | 1.5 |
| Ex.2-4-7 | — | 63/37 | 0.03 | 0.4 | 0.03 | 3 | — | — | — | — | 67/33 | 1.1 |
| Ex.2-4-8 | — | 63/37 | 0.03 | 0.5 | 0.2 | 7 | — | — | — | — | 67/33 | 1.3 |
| Ex.2-4-9 | — | 63/37 | 0.03 | 16 | 0.2 | 7 | — | — | — | — | 67/33 | 1.3 |
| Ex.2-4-10 | — | 63/37 | 10 | 0.4 | 0.2 | 2 | — | — | — | — | 67/33 | 1.4 |
| Ex.2-4-11 | — | 63/37 | 10 | 16 | 1 | 2 | — | — | — | — | 67/33 | 1.5 |
| Ex.2-4-12 | — | 63/37 | 12 | 0.4 | 1 | 2 | — | — | — | — | 67/33 | 2.4 |
| Ex.2-4-13 | — | 63/37 | 12 | 5 | 1 | 2 | — | — | — | — | 67/33 | 2.5 |
| Ex.2-4-14 | — | 63/37 | 12 | 17 | 1 | 7 | — | — | — | — | 67/33 | 2.4 |
| Ex.2-5-1 | — | 63/37 | 5 | 1.2 | 0.03 | 0 | — | — | 42/37/21 | 1.5 | — | — |
| Ex.2-5-2 | — | 63/37 | 5 | 1.2 | 0.07 | 5 | — | — | 42/37/21 | 1.5 | — | — |

Fig. 37

| Item (Reference) | Cu/Ag/Sn ratio | Sn/Pb | Solder Ni thickness | quantity of Ni P | thickness of Pd | quantity of Pd P | thickness of Au | quantity of Au P | Su/Cu/Ni ratio | Sn/Cu/Ni thickness | Su/Ni ratio | Sn/Ni thickness |
|---|---|---|---|---|---|---|---|---|---|---|---|---|
| Ref.1-1-1 | 0.2/1/97.0 | — | 5 | 1.2 | 0.5 | — | — | — | 38/20/42 | 0.8 | — | — |
| Ref.1-1-2 | 0.2/1/97.0 | — | 5 | 4 | 1 | 0.8 | — | — | 40/25/35 | 0.9 | — | — |
| Ref.1-1-3 | 0.2/1/97.0 | — | 5 | 4 | 1 | 9 | — | — | 39/26/49 | 2.7 | — | — |
| Ref.1-1-4 | 0.2/1/97.0 | — | 5 | 4 | 1.5 | 9 | — | — | 39/26/49 | 2.9 | — | — |
| Ref.1-1-5 | 0.2/1/97.0 | — | 0.03 | 0.4 | 0.5 | — | — | — | 38/20/42 | 0.8 | — | — |
| Ref.1-1-6 | 0.2/1/97.0 | — | 0.03 | 0.4 | 1 | 2 | — | — | 40/25/35 | 0.9 | — | — |
| Ref.1-1-7 | 0.2/1/97.0 | — | 0.03 | 17 | 1 | 9 | — | — | 40/25/35 | 0.9 | — | — |
| Ref.1-1-8 | 0.2/1/97.0 | — | 0.03 | 17 | 1.5 | 9 | — | — | 40/25/35 | 0.9 | — | — |
| Ref.1-1-9 | 0.2/1/97.0 | — | 12 | 0.4 | 0.5 | — | — | — | 39/26/49 | 2.5 | — | — |
| Ref.1-1-10 | 0.2/1/97.0 | — | 12 | 0.4 | 1 | 2 | — | — | 39/26/49 | 2.6 | — | — |
| Ref.1-1-11 | 0.2/1/97.0 | — | 12 | 16 | 1 | 9 | — | — | 39/26/49 | 2.7 | — | — |
| Ref.1-1-12 | 0.2/1/97.0 | — | 12 | 16 | 1.5 | 9 | — | — | 39/26/49 | 2.9 | — | — |
| Ref.1-2-1 | — | 63/37 | 5 | 1.2 | 0.5 | — | — | — | — | — | 67/33 | 0.9 |
| Ref.1-2-2 | — | 63/37 | 5 | 4 | 1 | 0.8 | — | — | — | — | 67/33 | 0.9 |
| Ref.1-2-3 | — | 63/37 | 5 | 4 | 1 | 9 | — | — | — | — | 67/33 | 2.7 |
| Ref.1-2-4 | — | 63/37 | 5 | 4 | 1.5 | 9 | — | — | — | — | 67/33 | 2.8 |
| Ref.1-2-5 | — | 63/37 | 0.03 | 0.4 | 0.5 | — | — | — | — | — | 67/33 | 0.8 |
| Ref.1-2-6 | — | 63/37 | 0.03 | 0.4 | 1 | 2 | — | — | — | — | 67/33 | 0.9 |
| Ref.1-2-7 | — | 63/37 | 0.03 | 17 | 1 | 9 | — | — | — | — | 67/33 | 0.9 |
| Ref.1-2-8 | — | 63/37 | 0.03 | 17 | 1.5 | 9 | — | — | — | — | 67/33 | 0.9 |
| Ref.1-2-9 | — | 63/37 | 12 | 0.4 | 0.5 | — | — | — | — | — | 67/33 | 2.5 |
| Ref.1-2-10 | — | 63/37 | 12 | 0.4 | 1 | 2 | — | — | — | — | 67/33 | 2.6 |
| Ref.1-2-11 | — | 63/37 | 12 | 16 | 1 | 9 | — | — | — | — | 67/33 | 2.7 |
| Ref.1-2-12 | — | 63/37 | 12 | 16 | 1.5 | 9 | — | — | — | — | 67/33 | 2.9 |

Fig. 38

| Item (Reference) | Solder Cu/Ag/Sn ratio | Solder Sn/Pb | Ni thickness | quantity of Ni P | thickness of Pd | quantity of Pd P | thickness of Au | quantity of Au P | Su/Cu/Ni ratio | Sn/Cu/Ni thickness | Su/Ni ratio | Sn/Ni thickness |
|---|---|---|---|---|---|---|---|---|---|---|---|---|
| Ref.2-1-1 | 0.2/1/97.0 | — | 5 | 1.2 | 0.5 | — | — | — | 38/20/42 | 0.8 | — | — |
| Ref.2-1-2 | 0.2/1/97.0 | — | 5 | 4 | 1 | 0.8 | — | — | 40/25/35 | 0.9 | — | — |
| Ref.2-1-3 | 0.2/1/97.0 | — | 5 | 4 | 1 | 9 | — | — | 39/26/49 | 2.7 | — | — |
| Ref.2-1-4 | 0.2/1/97.0 | — | 5 | 4 | 1.5 | 9 | — | — | 39/26/49 | 2.9 | — | — |
| Ref.2-1-5 | 0.2/1/97.0 | — | 0.03 | 0.4 | 0.5 | — | — | — | 38/20/42 | 0.8 | — | — |
| Ref.2-1-6 | 0.2/1/97.0 | — | 0.03 | 0.4 | 1 | 2 | — | — | 40/25/35 | 0.9 | — | — |
| Ref.2-1-7 | 0.2/1/97.0 | — | 0.03 | 17 | 1 | 9 | — | — | 40/25/35 | 0.9 | — | — |
| Ref.2-1-8 | 0.2/1/97.0 | — | 0.03 | 17 | 1.5 | 9 | — | — | 39/26/49 | 0.9 | — | — |
| Ref.2-1-9 | 0.2/1/97.0 | — | 12 | 0.4 | 0.5 | — | — | — | 39/26/49 | 2.5 | — | — |
| Ref.2-1-10 | 0.2/1/97.0 | — | 12 | 0.4 | 1 | 2 | — | — | 39/26/49 | 2.6 | — | — |
| Ref.2-1-11 | 0.2/1/97.0 | — | 12 | 16 | 1 | 9 | — | — | 39/26/49 | 2.7 | — | — |
| Ref.2-1-12 | 0.2/1/97.0 | — | 12 | 16 | 1.5 | 9 | — | — | 39/26/49 | 2.9 | — | — |
| Ref.2-2-1 | — | 63/37 | 5 | 1.2 | 0.5 | — | — | — | — | — | 67/33 | 0.8 |
| Ref.2-2-2 | — | 63/37 | 5 | 4 | 1 | 0.8 | — | — | — | — | 67/33 | 0.9 |
| Ref.2-2-3 | — | 63/37 | 5 | 4 | 1 | 9 | — | — | — | — | 67/33 | 2.7 |
| Ref.2-2-4 | — | 63/37 | 5 | 4 | 1.5 | 9 | — | — | — | — | 67/33 | 2.9 |
| Ref.2-2-5 | — | 63/37 | 0.03 | 0.4 | 0.5 | — | — | — | — | — | 67/33 | 0.8 |
| Ref.2-2-6 | — | 63/37 | 0.03 | 0.4 | 1 | 2 | — | — | — | — | 67/33 | 1.1 |
| Ref.2-2-7 | — | 63/37 | 0.03 | 7 | 1 | 9 | — | — | — | — | 67/33 | 0.9 |
| Ref.2-2-8 | — | 63/37 | 0.03 | 7 | 1.5 | 9 | — | — | — | — | 67/33 | 0.9 |
| Ref.2-2-9 | — | 63/37 | 12 | 0.4 | 0.5 | — | — | — | — | — | 67/33 | 2.5 |
| Ref.2-2-10 | — | 63/37 | 12 | 0.4 | 1 | 2 | — | — | — | — | 67/33 | 2.6 |
| Ref.2-2-11 | — | 63/37 | 12 | 7 | 1 | 9 | — | — | — | — | 67/33 | 2.7 |
| Ref.2-2-12 | — | 63/37 | 12 | 7 | 1.5 | 9 | — | — | — | — | 67/33 | 2.9 |

Fig. 39

| Item (Experiment) | Solder Cu/Ag/Sn ratio | Sn/Pb | Ni thickness | quantity of Ni P | thickness of Pd | quantity of Pd P | thickness of Au | quantity of Au P | Su/Cu/Ni ratio | Sn/Cu/Ni thickness | Su/Ni ratio | Sn/Ni thickness |
|---|---|---|---|---|---|---|---|---|---|---|---|---|
| Ex.3-1-1 | 0.5/3.5/95.0 | — | 5 | 1.2 | 0.5 | 5 | 0.03 | — | 42/37/21 | 1.5 | — | — |
| Ex.3-1-2 | 0.5/3.5/95.0 | — | 5 | 1.2 | 0.01 | 2 | 0.05 | — | 42/37/21 | 1.8 | — | — |
| Ex.3-1-3 | 0.5/3.5/95.0 | — | 5 | 1.2 | 0.01 | 7 | 1 | — | 42/37/21 | 1.8 | — | — |
| Ex.3-1-4 | 0.5/3.5/95.0 | — | 5 | 1.2 | 1 | 2 | 0.03 | — | 42/37/21 | 1.5 | — | — |
| Ex.3-1-5 | 0.5/3.5/95.0 | — | 10 | 0.5 | 1 | 7 | 0.03 | — | 42/37/21 | 1.5 | — | — |
| Ex.3-1-6 | 0.5/3.5/95.0 | — | 10 | 5 | 0.01 | 7 | 0.01 | — | 42/37/21 | 1.7 | — | — |
| Ex.3-1-7 | 0.5/3.5/95.0 | — | 0.05 | 0.5 | 1 | 7 | 0.02 | — | 42/37/21 | 1.7 | — | — |
| Ex.3-1-8 | 0.5/3.5/95.0 | — | 0.05 | 5 | 0.01 | 3 | 0.01 | — | 42/37/21 | 1.8 | — | — |
| Ex.3-1-9 | 0.5/3.5/95.0 | — | 0.3 | 0.5 | 0.01 | 2 | 0.2 | — | 42/37/21 | 1.7 | — | — |
| Ex.3-1-10 | 0.5/3.5/95.0 | — | 0.3 | 0.5 | 1 | 2 | 0.4 | — | 42/37/21 | 1.6 | — | — |
| Ex.3-1-11 | 0.5/3.5/95.0 | — | 0.3 | 5 | 0.01 | 7 | 0.5 | — | 42/37/21 | 1.7 | — | — |
| Ex.3-1-12 | 0.5/3.5/95.0 | — | 0.3 | 5 | 0.01 | 7 | 0.03 | — | 42/37/21 | 1.6 | — | — |
| Ex.3-1-13 | 0.5/3.5/95.0 | — | 1 | 0.5 | 1 | 2 | 0.5 | — | 42/37/21 | 1.7 | — | — |
| Ex.3-1-14 | 0.5/3.5/95.0 | — | 1 | 5 | 0.01 | 7 | 0.5 | — | 42/37/21 | 1.7 | — | — |
| Ex.3-1-15 | 0.5/3.5/95.0 | — | 0.3 | 8 | 1 | 5 | 0.03 | — | 42/37/21 | 1.7 | — | — |
| Ex.3-1-16 | 0.5/3.5/95.0 | — | 0.3 | 8 | 0.01 | 7 | 0.01 | — | 42/37/21 | 1.7 | — | — |
| Ex.3-1-17 | 0.5/3.5/95.0 | — | 0.05 | 10 | 0.01 | 2 | 0.05 | — | 42/37/21 | 1.8 | — | — |
| Ex.3-1-18 | 0.5/3.5/95.0 | — | 1 | 10 | 1 | 5 | 0.03 | — | 42/37/21 | 1.8 | — | — |
| Ex.3-1-19 | 0.5/3.5/95.0 | — | 0.05 | 15 | 0.01 | 2 | 0.5 | — | 42/37/21 | 2.0 | — | — |
| Ex.3-1-20 | 0.5/3.5/95.0 | — | 1 | 15 | 1 | 2 | 0.5 | — | 42/37/21 | 1.9 | — | — |
| Ex.3-1-21 | 0.5/3.5/95.0 | — | 8 | 15 | 0.01 | 7 | 1 | — | 42/37/21 | 2.0 | — | — |
| Ex.3-1-22 | 0.5/3.5/95.0 | — | 10 | 15 | 1 | 7 | 2 | — | 42/37/21 | 2.1 | — | — |

Fig. 40

| Item (Experiment) | Cu/Ag/Sn ratio | Solder Sn/Pb | Ni thickness | quantity of Ni P | thickness of Pd | quantity of Pd P | thickness of Au | quantity of Au P | Su/Cu/Ni ratio | Sn/Cu/Ni thickness | Su/Ni ratio | Sn/Ni thickness |
|---|---|---|---|---|---|---|---|---|---|---|---|---|
| Ex.3-2-1 | - | 63/37 | 5 | 1.2 | 0.5 | 5 | 0.03 | - | - | - | 67/33 | 1.5 |
| Ex.3-2-2 | - | 63/37 | 5 | 1.2 | 0.01 | 2 | 0.05 | - | - | - | 67/33 | 1.8 |
| Ex.3-2-3 | - | 63/37 | 5 | 1.2 | 0.01 | 7 | 1 | - | - | - | 67/33 | 1.8 |
| Ex.3-2-4 | - | 63/37 | 5 | 1.2 | 1 | 2 | 0.03 | - | - | - | 67/33 | 1.5 |
| Ex.3-2-5 | - | 63/37 | 10 | 0.5 | 1 | 7 | 0.03 | - | - | - | 67/33 | 1.5 |
| Ex.3-2-6 | - | 63/37 | 10 | 5 | 0.01 | 7 | 0.01 | - | - | - | 67/33 | 1.7 |
| Ex.3-2-7 | - | 63/37 | 0.05 | 0.5 | 1 | 7 | 0.02 | - | - | - | 67/33 | 1.7 |
| Ex.3-2-8 | - | 63/37 | 0.05 | 5 | 0.01 | 3 | 0.01 | - | - | - | 67/33 | 1.8 |
| Ex.3-2-9 | - | 63/37 | 0.3 | 5 | 0.01 | 2 | 0.2 | - | - | - | 67/33 | 1.7 |
| Ex.3-2-10 | - | 63/37 | 0.3 | 0.5 | 1 | 2 | 0.4 | - | - | - | 67/33 | 1.6 |
| Ex.3-2-11 | - | 63/37 | 0.3 | 0.5 | 0.01 | 7 | 0.5 | - | - | - | 67/33 | 1.7 |
| Ex.3-2-12 | - | 63/37 | 0.3 | 5 | 0.01 | 7 | 0.03 | - | - | - | 67/33 | 1.6 |
| Ex.3-2-13 | - | 63/37 | 1 | 0.5 | 0.01 | 2 | 0.5 | - | - | - | 67/33 | 1.7 |
| Ex.3-2-14 | - | 63/37 | 1 | 5 | 1 | 7 | 0.5 | - | - | - | 67/33 | 1.7 |
| Ex.3-2-15 | - | 63/37 | 0.3 | 8 | 0.01 | 5 | 0.03 | - | - | - | 67/33 | 1.7 |
| Ex.3-2-16 | - | 63/37 | 0.3 | 8 | 1 | 7 | 0.01 | - | - | - | 67/33 | 1.7 |
| Ex.3-2-17 | - | 63/37 | 0.05 | 10 | 0.01 | 2 | 0.05 | - | - | - | 67/33 | 1.8 |
| Ex.3-2-18 | - | 63/37 | 1 | 10 | 1 | 5 | 0.03 | - | - | - | 67/33 | 1.8 |
| Ex.3-2-19 | - | 63/37 | 0.05 | 15 | 0.01 | 2 | 0.5 | - | - | - | 67/33 | 2.0 |
| Ex.3-2-20 | - | 63/37 | 1 | 15 | 1 | 2 | 0.5 | - | - | - | 67/33 | 1.9 |
| Ex.3-2-21 | - | 63/37 | 8 | 15 | 0.01 | 7 | 1 | - | - | - | 67/33 | 2.0 |
| Ex.3-2-22 | - | 63/37 | 10 | 15 | 1 | 7 | 2 | - | - | - | 67/33 | 2.1 |

Fig. 41

| Item (Experiment) | Solder Cu/Ag/Sn ratio | Sn/Pb | Ni thickness | quantity of Ni P | thickness of Pd | quantity of Pd P | thickness of Au | quantity of Au P | Su/Cu/Ni ratio | Sn/Cu/Ni thickness | Su/Ni ratio | Sn/Ni thickness |
|---|---|---|---|---|---|---|---|---|---|---|---|---|
| Ex.3-3-1 | 0.5/3.5/95.0 | — | 5 | 1.2 | 0.009 | 8 | 0.03 | — | 42/45/13 | 2.5 | — | — |
| Ex.3-3-2 | 0.5/3.5/95.0 | — | 5 | 1.2 | 0.008 | 7 | 0.04 | — | 42/45/13 | 2.5 | — | — |
| Ex.3-3-3 | 0.5/3.5/95.0 | — | 5 | 1.2 | 0.009 | 1 | 0.03 | — | 42/45/13 | 2.5 | — | — |
| Ex.3-3-4 | 0.5/3.5/95.0 | — | 5 | 1.2 | 2 | 2 | 0.05 | — | 66/29/5 | 1.3 | — | — |
| Ex.3-3-5 | 0.5/3.5/95.0 | — | 10 | 0.5 | 2 | 5 | 0.04 | — | 66/29/5 | 1.3 | — | — |
| Ex.3-3-6 | 0.5/3.5/95.0 | — | 10 | 5 | 2 | 9 | 0.06 | — | 66/29/5 | 1.5 | — | — |
| Ex.3-3-7 | 0.5/3.5/95.0 | — | 0.03 | 0.4 | 0.03 | 3 | 0.03 | — | 66/29/5 | 1.1 | — | — |
| Ex.3-3-8 | 0.5/3.5/95.0 | — | 0.03 | 0.5 | 0.2 | 7 | 0.04 | — | 66/29/5 | 1.3 | — | — |
| Ex.3-3-9 | 0.5/3.5/95.0 | — | 0.03 | 16 | 0.2 | 7 | 0.05 | — | 66/29/5 | 1.3 | — | — |
| Ex.3-3-10 | 0.5/3.5/95.0 | — | 10 | 0.4 | 0.2 | 2 | 0.03 | — | 66/29/5 | 1.4 | — | — |
| Ex.3-3-11 | 0.5/3.5/95.0 | — | 10 | 16 | 1 | 7 | 0.01 | — | 66/29/5 | 1.5 | — | — |
| Ex.3-3-12 | 0.5/3.5/95.0 | — | 12 | 0.4 | 0.01 | 2 | 0.04 | — | 66/29/5 | 2.4 | — | — |
| Ex.3-3-13 | 0.5/3.5/95.0 | — | 12 | 5 | 1 | 2 | 0.02 | — | 66/29/5 | 2.5 | — | — |
| Ex.3-3-14 | 0.5/3.5/95.0 | — | 12 | 17 | 1 | 7 | 0.03 | — | 66/29/5 | 2.4 | — | — |
| Ex.3-4-1 | — | 63/37 | 5 | 1.2 | 0.009 | 8 | 0.03 | — | — | — | 67/33 | 2.5 |
| Ex.3-4-2 | — | 63/37 | 5 | 1.2 | 0.008 | 7 | 0.04 | — | — | — | 67/33 | 2.5 |
| Ex.3-4-3 | — | 63/37 | 5 | 1.2 | 0.009 | 1 | 0.03 | — | — | — | 67/33 | 2.5 |
| Ex.3-4-4 | — | 63/37 | 5 | 1.2 | 2 | 2 | 0.05 | — | — | — | 67/33 | 1.3 |
| Ex.3-4-5 | — | 63/37 | 10 | 0.5 | 2 | 5 | 0.04 | — | — | — | 67/33 | 1.3 |
| Ex.3-4-6 | — | 63/37 | 10 | 5 | 2 | 9 | 0.06 | — | — | — | 67/33 | 1.5 |
| Ex.3-4-7 | — | 63/37 | 0.03 | 0.4 | 0.03 | 3 | 0.03 | — | — | — | 67/33 | 1.1 |
| Ex.3-4-8 | — | 63/37 | 0.03 | 0.5 | 0.2 | 7 | 0.04 | — | — | — | 67/33 | 1.3 |
| Ex.3-4-9 | — | 63/37 | 0.03 | 16 | 0.2 | 7 | 0.05 | — | — | — | 67/33 | 1.3 |
| Ex.3-4-10 | — | 63/37 | 10 | 0.4 | 0.2 | 2 | 0.03 | — | — | — | 67/33 | 1.4 |
| Ex.3-4-11 | — | 63/37 | 10 | 16 | 1 | 7 | 0.01 | — | — | — | 67/33 | 1.5 |
| Ex.3-4-12 | — | 63/37 | 12 | 0.4 | 0.01 | 2 | 0.04 | — | — | — | 67/33 | 2.4 |
| Ex.3-4-13 | — | 63/37 | 12 | 5 | 1 | 2 | 0.02 | — | — | — | 67/33 | 2.5 |
| Ex.3-4-14 | — | 63/37 | 12 | 17 | 1 | 7 | 0.03 | — | — | — | 67/33 | 2.4 |
| Ex.3-5-1 | — | 63/37 | 5 | 1.2 | 0.03 | 0 | 0.05 | — | 42/37/21 | 1.5 | — | — |
| Ex.3-5-2 | — | 63/37 | 5 | 1.2 | 0.07 | 5 | 0.07 | — | 42/37/21 | 1.5 | — | — |

Fig. 42

| Item (Experiment) | Solder Cu/Ag/Sn ratio | Sn/Pb | Ni thickness | quantity of Ni P | thickness of Pd | quantity of Pd P | thickness of Au | quantity of Au P | Su/Cu/Ni ratio | Sn/Cu/Ni thickness | Su/Ni ratio | Sn/Ni thickness |
|---|---|---|---|---|---|---|---|---|---|---|---|---|
| Ex.4-1-1 | 0.5/3.5/95.0 | -- | 5 | 1.2 | 0.5 | 5 | 0.03 | -- | 42/37/21 | 1.5 | -- | -- |
| Ex.4-1-2 | 0.5/3.5/95.0 | -- | 5 | 1.2 | 0.01 | 2 | 0.05 | -- | 42/37/21 | 1.8 | -- | -- |
| Ex.4-1-3 | 0.5/3.5/95.0 | -- | 5 | 1.2 | 0.01 | 7 | 1 | -- | 42/37/21 | 1.8 | -- | -- |
| Ex.4-1-4 | 0.5/3.5/95.0 | -- | 5 | 1.2 | 1 | 2 | 0.03 | -- | 42/37/21 | 1.5 | -- | -- |
| Ex.4-1-5 | 0.5/3.5/95.0 | -- | 10 | 0.5 | 1 | 7 | 0.03 | -- | 42/37/21 | 1.5 | -- | -- |
| Ex.4-1-6 | 0.5/3.5/95.0 | -- | 10 | 0.5 | 0.01 | 7 | 0.01 | -- | 42/37/21 | 1.7 | -- | -- |
| Ex.4-1-7 | 0.5/3.5/95.0 | -- | 0.05 | 5 | 1 | 7 | 0.02 | -- | 42/37/21 | 1.8 | -- | -- |
| Ex.4-1-8 | 0.5/3.5/95.0 | -- | 0.05 | 5 | 0.01 | 3 | 0.01 | -- | 42/37/21 | 1.7 | -- | -- |
| Ex.4-1-9 | 0.5/3.5/95.0 | -- | 0.3 | 0.5 | 0.01 | 2 | 0.2 | -- | 42/37/21 | 1.6 | -- | -- |
| Ex.4-1-10 | 0.5/3.5/95.0 | -- | 0.3 | 0.5 | 1 | 2 | 0.4 | -- | 42/37/21 | 1.7 | -- | -- |
| Ex.4-1-11 | 0.5/3.5/95.0 | -- | 0.3 | 5 | 0.01 | 7 | 0.5 | -- | 42/37/21 | 1.6 | -- | -- |
| Ex.4-1-12 | 0.5/3.5/95.0 | -- | 0.3 | 5 | 1 | 2 | 0.03 | -- | 42/37/21 | 1.7 | -- | -- |
| Ex.4-1-13 | 0.5/3.5/95.0 | -- | 1 | 0.5 | 0.01 | 7 | 0.5 | -- | 42/37/21 | 1.7 | -- | -- |
| Ex.4-1-14 | 0.5/3.5/95.0 | -- | 1 | 5 | 1 | 5 | 0.5 | -- | 42/37/21 | 1.7 | -- | -- |
| Ex.4-1-15 | 0.5/3.5/95.0 | -- | 0.3 | 8 | 0.01 | 7 | 0.03 | -- | 42/37/21 | 1.7 | -- | -- |
| Ex.4-1-16 | 0.5/3.5/95.0 | -- | 0.3 | 8 | 1 | 2 | 0.01 | -- | 42/37/21 | 1.7 | -- | -- |
| Ex.4-1-17 | 0.5/3.5/95.0 | -- | 0.05 | 10 | 0.01 | 5 | 0.05 | -- | 42/37/21 | 1.8 | -- | -- |
| Ex.4-1-18 | 0.5/3.5/95.0 | -- | 1 | 10 | 1 | 2 | 0.03 | -- | 42/37/21 | 1.8 | -- | -- |
| Ex.4-1-19 | 0.5/3.5/95.0 | -- | 0.05 | 15 | 0.01 | 2 | 0.5 | -- | 42/37/21 | 2.0 | -- | -- |
| Ex.4-1-20 | 0.5/3.5/95.0 | -- | 1 | 15 | 1 | 7 | 0.5 | -- | 42/37/21 | 1.9 | -- | -- |
| Ex.4-1-21 | 0.5/3.5/95.0 | -- | 8 | 15 | 0.01 | 7 | 1 | -- | 42/37/21 | 2.0 | -- | -- |
| Ex.4-1-22 | 0.5/3.5/95.0 | -- | 10 | 15 | 1 | 7 | 2 | -- | 42/37/21 | 2.1 | -- | -- |

Fig. 43

| Item (Experiment) | Solder Cu/Ag/Sn ratio | Sn/Pb | Ni thickness | quantity of Ni P | thickness of Pd | quantity of Pd P | thickness of Au | quantity of Au P | Su/Cu/Ni ratio | Sn/Cu/Ni thickness | Su/Ni ratio | Sn/Ni thickness |
|---|---|---|---|---|---|---|---|---|---|---|---|---|
| Ex.4-2-1 | — | 63/37 | 5 | 1.2 | 0.5 | 5 | 0.03 | — | — | — | 67/33 | 1.5 |
| Ex.4-2-2 | — | 63/37 | 5 | 1.2 | 0.01 | 2 | 0.05 | — | — | — | 67/33 | 1.8 |
| Ex.4-2-3 | — | 63/37 | 5 | 1.2 | 0.01 | 7 | 1 | — | — | — | 67/33 | 1.8 |
| Ex.4-2-4 | — | 63/37 | 5 | 1.2 | 1 | 2 | 0.03 | — | — | — | 67/33 | 1.5 |
| Ex.4-2-5 | — | 63/37 | 10 | 0.5 | 1 | 7 | 0.03 | — | — | — | 67/33 | 1.5 |
| Ex.4-2-6 | — | 63/37 | 10 | 0.5 | 0.01 | 7 | 0.01 | — | — | — | 67/33 | 1.7 |
| Ex.4-2-7 | — | 63/37 | 0.05 | 5 | 1 | 7 | 0.02 | — | — | — | 67/33 | 1.7 |
| Ex.4-2-8 | — | 63/37 | 0.05 | 5 | 0.01 | 3 | 0.01 | — | — | — | 67/33 | 1.8 |
| Ex.4-2-9 | — | 63/37 | 0.3 | 0.5 | 0.01 | 2 | 0.2 | — | — | — | 67/33 | 1.7 |
| Ex.4-2-10 | — | 63/37 | 0.3 | 0.5 | 1 | 2 | 0.4 | — | — | — | 67/33 | 1.6 |
| Ex.4-2-11 | — | 63/37 | 0.3 | 5 | 0.01 | 7 | 0.5 | — | — | — | 67/33 | 1.7 |
| Ex.4-2-12 | — | 63/37 | 0.3 | 5 | 1 | 2 | 0.03 | — | — | — | 67/33 | 1.6 |
| Ex.4-2-13 | — | 63/37 | 1 | 0.5 | 0.01 | 2 | 0.5 | — | — | — | 67/33 | 1.7 |
| Ex.4-2-14 | — | 63/37 | 1 | 5 | 1 | 7 | 0.5 | — | — | — | 67/33 | 1.7 |
| Ex.4-2-15 | — | 63/37 | 0.3 | 8 | 0.01 | 5 | 0.03 | — | — | — | 67/33 | 1.7 |
| Ex.4-2-16 | — | 63/37 | 0.3 | 8 | 1 | 7 | 0.01 | — | — | — | 67/33 | 1.7 |
| Ex.4-2-17 | — | 63/37 | 0.05 | 10 | 0.01 | 2 | 0.05 | — | — | — | 67/33 | 1.8 |
| Ex.4-2-18 | — | 63/37 | 1 | 10 | 1 | 5 | 0.03 | — | — | — | 67/33 | 1.8 |
| Ex.4-2-19 | — | 63/37 | 0.05 | 15 | 0.01 | 2 | 0.5 | — | — | — | 67/33 | 2.0 |
| Ex.4-2-20 | — | 63/37 | 1 | 15 | 1 | 2 | 0.5 | — | — | — | 67/33 | 1.9 |
| Ex.4-2-21 | — | 63/37 | 8 | 15 | 0.01 | 7 | 1 | — | — | — | 67/33 | 2.0 |
| Ex.4-2-22 | — | 63/37 | 10 | 15 | 1 | 7 | 2 | — | — | — | 67/33 | 2.1 |

Fig. 44

| Item (Experiment) | Solder Cu/Ag/Sn ratio | Sn/Pb | Ni thickness | quantity of Ni P | thickness of Pd | quantity of Pd P | thickness of Au | quantity of Au P | Su/Cu/Ni ratio | Sn/Cu/Ni thickness | Su/Ni ratio | Sn/Ni thickness |
|---|---|---|---|---|---|---|---|---|---|---|---|---|
| Ex.4-3-1 | 0.5/3.5/95.0 | — | 5 | 1.2 | 0.009 | 8 | 0.03 | — | 42/45/13 | 2.5 | — | — |
| Ex.4-3-2 | 0.5/3.5/95.0 | — | 5 | 1.2 | 0.008 | 7 | 0.04 | — | 42/45/13 | 2.5 | — | — |
| Ex.4-3-3 | 0.5/3.5/95.0 | — | 5 | 1.2 | 0.009 | 1 | 0.03 | — | 42/45/13 | 2.5 | — | — |
| Ex.4-3-4 | 0.5/3.5/95.0 | — | 5 | 1.2 | 2 | 2 | 0.05 | — | 66/29/5 | 1.3 | — | — |
| Ex.4-3-5 | 0.5/3.5/95.0 | — | 10 | 0.5 | 2 | 5 | 0.04 | — | 66/29/5 | 1.3 | — | — |
| Ex.4-3-6 | 0.5/3.5/95.0 | — | 10 | 5 | 2 | 9 | 0.06 | — | 66/29/5 | 1.5 | — | — |
| Ex.4-3-7 | 0.5/3.5/95.0 | — | 0.03 | 0.4 | 0.03 | 3 | 0.03 | — | 66/29/5 | 1.1 | — | — |
| Ex.4-3-8 | 0.5/3.5/95.0 | — | 0.03 | 0.5 | 0.2 | 7 | 0.04 | — | 66/29/5 | 1.3 | — | — |
| Ex.4-3-9 | 0.5/3.5/95.0 | — | 0.03 | 16 | 0.2 | 7 | 0.05 | — | 66/29/5 | 1.3 | — | — |
| Ex.4-3-10 | 0.5/3.5/95.0 | — | 10 | 0.4 | 0.2 | 2 | 0.03 | — | 66/29/5 | 1.4 | — | — |
| Ex.4-3-11 | 0.5/3.5/95.0 | — | 10 | 16 | 1 | 7 | 0.01 | — | 66/29/5 | 1.5 | — | — |
| Ex.4-3-12 | 0.5/3.5/95.0 | — | 12 | 0.4 | 1 | 2 | 0.04 | — | 66/29/5 | 2.4 | — | — |
| Ex.4-3-13 | 0.5/3.5/95.0 | — | 12 | 5 | 1 | 2 | 0.02 | — | 66/29/5 | 2.5 | — | — |
| Ex.4-3-14 | 0.5/3.5/95.0 | — | 12 | 17 | 1 | 7 | 0.03 | — | 66/29/5 | 2.4 | — | — |
| Ex.4-4-1 | — | 63/37 | 5 | 1.2 | 0.009 | 8 | 0.03 | — | — | — | 67/33 | 2.5 |
| Ex.4-4-2 | — | 63/37 | 5 | 1.2 | 0.008 | 7 | 0.04 | — | — | — | 67/33 | 2.5 |
| Ex.4-4-3 | — | 63/37 | 5 | 1.2 | 0.009 | 1 | 0.03 | — | — | — | 67/33 | 2.5 |
| Ex.4-4-4 | — | 63/37 | 5 | 1.2 | 2 | 2 | 0.05 | — | — | — | 67/33 | 1.3 |
| Ex.4-4-5 | — | 63/37 | 10 | 0.5 | 2 | 5 | 0.04 | — | — | — | 67/33 | 1.3 |
| Ex.4-4-6 | — | 63/37 | 10 | 5 | 2 | 9 | 0.06 | — | — | — | 67/33 | 1.5 |
| Ex.4-4-7 | — | 63/37 | 0.03 | 0.4 | 0.03 | 3 | 0.03 | — | — | — | 67/33 | 1.1 |
| Ex.4-4-8 | — | 63/37 | 0.03 | 0.5 | 0.2 | 7 | 0.04 | — | — | — | 67/33 | 1.3 |
| Ex.4-4-9 | — | 63/37 | 0.03 | 16 | 0.2 | 7 | 0.05 | — | — | — | 67/33 | 1.3 |
| Ex.4-4-10 | — | 63/37 | 10 | 0.4 | 0.2 | 2 | 0.03 | — | — | — | 67/33 | 1.4 |
| Ex.4-4-11 | — | 63/37 | 10 | 16 | 1 | 7 | 0.01 | — | — | — | 67/33 | 1.5 |
| Ex.4-4-12 | — | 63/37 | 12 | 0.4 | 1 | 2 | 0.04 | — | — | — | 67/33 | 2.4 |
| Ex.4-4-13 | — | 63/37 | 12 | 5 | 1 | 2 | 0.02 | — | — | — | 67/33 | 2.5 |
| Ex.4-4-14 | — | 63/37 | 12 | 17 | 1 | 7 | 0.03 | — | — | — | 67/33 | 2.4 |
| Ex.4-5-1 | — | 63/37 | 5 | 1.2 | 0.03 | 0 | 0.05 | — | 42/37/21 | 1.5 | — | — |
| Ex.4-5-2 | — | 63/37 | 5 | 1.2 | 0.07 | 5 | 0.07 | — | 42/37/21 | 1.5 | — | — |

Fig. 45

| Item (Reference) | Cu/Ag/Sn ratio | Sn/Pb | Solder Ni thickness | quantity of Ni P | thickness of Pd | quantity of Pd P | thickness of Au | quantity of Au P | Su/Cu/Ni ratio | Sn/Cu/Ni thickness | Su/Ni ratio | Sn/Ni thickness |
|---|---|---|---|---|---|---|---|---|---|---|---|---|
| Ref.3-1-1 | 0.2/1/97.0 | — | 5 | 1.2 | 0.5 | — | 0.03 | — | 38/20/42 | 0.8 | — | — |
| Ref.3-1-2 | 0.2/1/97.0 | — | 5 | 4 | 1 | 0.8 | 0.03 | — | 40/25/35 | 0.9 | — | — |
| Ref.3-1-3 | 0.2/1/97.0 | — | 5 | 4 | 1 | 9 | 0.04 | — | 39/26/49 | 2.7 | — | — |
| Ref.3-1-4 | 0.2/1/97.0 | — | 5 | 4 | 1.5 | 9 | 0.02 | — | 39/26/49 | 2.9 | — | — |
| Ref.3-1-5 | 0.2/1/97.0 | — | 0.03 | 0.4 | 0.5 | — | 0.03 | — | 38/20/42 | 0.8 | — | — |
| Ref.3-1-6 | 0.2/1/97.0 | — | 0.03 | 0.4 | 1 | 2 | 0.05 | — | 40/25/35 | 0.9 | — | — |
| Ref.3-1-7 | 0.2/1/97.0 | — | 0.03 | 16 | 1 | 9 | 0.02 | — | 40/25/35 | 0.9 | — | — |
| Ref.3-1-8 | 0.2/1/97.0 | — | 0.03 | 16 | 1.5 | 9 | 0.05 | — | 39/26/49 | 2.5 | — | — |
| Ref.3-1-9 | 0.2/1/97.0 | — | 12 | 0.4 | 0.5 | — | 0.03 | — | 39/26/49 | 2.6 | — | — |
| Ref.3-1-10 | 0.2/1/97.0 | — | 12 | 0.4 | 1 | 2 | 0.02 | — | 39/26/49 | 2.7 | — | — |
| Ref.3-1-11 | 0.2/1/97.0 | — | 12 | 17 | 1 | 9 | 0.03 | — | 39/26/49 | 2.9 | — | — |
| Ref.3-1-12 | 0.2/1/97.0 | — | 12 | 17 | 1.5 | 9 | 0.05 | — | 39/26/49 | 0.9 | — | — |
| Ref.3-1-13 | 0.2/1/97.0 | — | 0.03 | 0.4 | 1 | 2 | 0.008 | — | 39/26/49 | 0.9 | — | — |
| Ref.3-1-14 | 0.2/1/97.0 | — | 0.03 | 16 | 1 | 9 | 0.008 | — | 39/26/49 | 2.6 | — | — |
| Ref.3-1-15 | 0.2/1/97.0 | — | 12 | 0.4 | 1.5 | 2 | 2.1 | — | 39/26/49 | 2.7 | — | — |
| Ref.3-1-16 | 0.2/1/97.0 | — | 12 | 17 | 1.5 | 9 | 2.1 | — | 39/26/49 | — | — | — |
| Ref.3-2-1 | — | 63/37 | 5 | 1.2 | 0.5 | — | 0.03 | — | — | — | 67/33 | 0.8 |
| Ref.3-2-2 | — | 63/37 | 5 | 4 | 1 | 0.8 | 0.03 | — | — | — | 67/33 | 0.9 |
| Ref.3-2-3 | — | 63/37 | 5 | 4 | 1 | 9 | 0.04 | — | — | — | 67/33 | 2.7 |
| Ref.3-2-4 | — | 63/37 | 5 | 4 | 1.5 | 9 | 0.02 | — | — | — | 67/33 | 2.9 |
| Ref.3-2-5 | — | 63/37 | 0.03 | 0.4 | 0.5 | — | 0.03 | — | — | — | 67/33 | 0.8 |
| Ref.3-2-6 | — | 63/37 | 0.03 | 0.4 | 1 | 2 | 0.05 | — | — | — | 67/33 | 0.9 |
| Ref.3-2-7 | — | 63/37 | 0.03 | 16 | 1 | 9 | 0.02 | — | — | — | 67/33 | 0.9 |
| Ref.3-2-8 | — | 63/37 | 0.03 | 16 | 1.5 | 9 | 0.05 | — | — | — | 67/33 | 0.9 |
| Ref.3-2-9 | — | 63/37 | 12 | 0.4 | 0.5 | — | 0.03 | — | — | — | 67/33 | 2.5 |
| Ref.3-2-10 | — | 63/37 | 12 | 0.4 | 1 | 2 | 0.02 | — | — | — | 67/33 | 2.6 |
| Ref.3-2-11 | — | 63/37 | 12 | 17 | 1 | 9 | 0.03 | — | — | — | 67/33 | 2.7 |
| Ref.3-2-12 | — | 63/37 | 12 | 17 | 1.5 | 9 | 0.05 | — | — | — | 67/33 | 2.9 |
| Ref.3-2-13 | — | 63/37 | 0.03 | 0.4 | 1 | 2 | 0.008 | — | — | — | 67/33 | 0.9 |
| Ref.3-2-14 | — | 63/37 | 0.03 | 16 | 1 | 9 | 0.008 | — | — | — | 67/33 | 0.9 |
| Ref.3-2-15 | — | 63/37 | 12 | 0.4 | 1.5 | 2 | 2.1 | — | — | — | 67/33 | 2.6 |
| Ref.3-2-16 | — | 63/37 | 12 | 17 | 1.5 | 9 | 2.1 | — | — | — | 67/33 | 2.7 |

Fig. 46

| Item (Reference) | Solder Cu/Ag/Sn ratio | Sn/Pb | Ni thickness | quantity of Ni P | thickness of Pd | quantity of Pd P | thickness of Au | quantity of Au P | Su/Cu/Ni ratio | Sn/Cu/Ni thickness | Su/Ni ratio | Sn/Ni thickness |
|---|---|---|---|---|---|---|---|---|---|---|---|---|
| Ref.4-1-1 | 0.5/3.5/95.0 | — | 5 | 1.2 | 0.5 | — | 0.03 | — | 42/37/21 | 0.8 | | |
| Ref.4-1-2 | 0.5/3.5/95.0 | — | 5 | 4 | 1 | 0.8 | 0.03 | — | 42/37/21 | 0.9 | | |
| Ref.4-1-3 | 0.5/3.5/95.0 | — | 5 | 4 | 1 | 9 | 0.04 | — | 42/37/21 | 2.7 | | |
| Ref.4-1-4 | 0.5/3.5/95.0 | — | 5 | 4 | 1.5 | 9 | 0.02 | — | 42/37/21 | 2.9 | | |
| Ref.4-1-5 | 0.2/1/97.0 | — | 0.03 | 0.4 | 0.5 | — | 0.03 | — | 38/20/42 | 0.8 | | |
| Ref.4-1-6 | 0.2/1/97.0 | — | 0.03 | 0.4 | 1 | 2 | 0.05 | — | 40/25/35 | 0.9 | | |
| Ref.4-1-7 | 0.2/1/97.0 | — | 0.03 | 16 | 1 | 9 | 0.02 | — | 40/25/35 | 0.9 | | |
| Ref.4-1-8 | 0.2/1/97.0 | — | 0.03 | 16 | 1.5 | 9 | 0.05 | — | 40/25/35 | 0.9 | | |
| Ref.4-1-9 | 0.2/1/97.0 | — | 12 | 0.4 | 0.5 | — | 0.03 | — | 39/26/49 | 2.5 | | |
| Ref.4-1-10 | 0.2/1/97.0 | — | 12 | 0.4 | 1 | 2 | 0.02 | — | 39/26/49 | 2.6 | | |
| Ref.4-1-11 | 0.2/1/97.0 | — | 12 | 17 | 1 | 9 | 0.03 | — | 39/26/49 | 2.7 | | |
| Ref.4-1-12 | 0.2/1/97.0 | — | 12 | 17 | 1.5 | 9 | 0.05 | — | 39/26/49 | 2.9 | | |
| Ref.4-1-13 | 0.2/1/97.0 | — | 0.03 | 0.4 | 1 | 2 | 0.008 | — | 39/26/49 | 0.9 | | |
| Ref.4-1-14 | 0.2/1/97.0 | — | 0.03 | 16 | 1 | 9 | 0.008 | — | 39/26/49 | 0.9 | | |
| Ref.4-1-15 | 0.2/1/97.0 | — | 12 | 0.4 | 1.5 | 2 | 2.1 | — | 39/26/49 | 2.6 | | |
| Ref.4-1-16 | 0.2/1/97.0 | — | 12 | 17 | 1.5 | 9 | 2.1 | — | 39/26/49 | 2.7 | | |
| Ref.4-2-1 | — | 63/37 | 5 | 1.2 | 0.5 | — | 0.03 | — | — | — | 67/33 | 0.8 |
| Ref.4-2-2 | — | 63/37 | 5 | 4 | 1 | 0.8 | 0.03 | — | — | — | 67/33 | 0.9 |
| Ref.4-2-3 | — | 63/37 | 5 | 4 | 1 | 9 | 0.04 | — | — | — | 67/33 | 2.7 |
| Ref.4-2-4 | — | 63/37 | 5 | 4 | 1.5 | 9 | 0.02 | — | — | — | 67/33 | 2.9 |
| Ref.4-2-5 | — | 63/37 | 0.03 | 0.4 | 0.5 | — | 0.03 | — | — | — | 67/33 | 0.8 |
| Ref.4-2-6 | — | 63/37 | 0.03 | 0.4 | 1 | 2 | 0.05 | — | — | — | 67/33 | 0.9 |
| Ref.4-2-7 | — | 63/37 | 0.03 | 16 | 1 | 9 | 0.02 | — | — | — | 67/33 | 0.9 |
| Ref.4-2-8 | — | 63/37 | 0.03 | 16 | 1.5 | 9 | 0.05 | — | — | — | 67/33 | 0.9 |
| Ref.4-2-9 | — | 63/37 | 12 | 0.4 | 0.5 | — | 0.03 | — | — | — | 67/33 | 2.5 |
| Ref.4-2-10 | — | 63/37 | 12 | 0.4 | 1 | 2 | 0.02 | — | — | — | 67/33 | 2.6 |
| Ref.4-2-11 | — | 63/37 | 12 | 17 | 1 | 9 | 0.03 | — | — | — | 67/33 | 2.7 |
| Ref.4-2-12 | — | 63/37 | 12 | 17 | 1.5 | 9 | 0.05 | — | — | — | 67/33 | 2.9 |
| Ref.4-2-13 | — | 63/37 | 0.03 | 0.4 | 1 | 2 | 0.008 | — | — | — | 67/33 | 0.9 |
| Ref.4-2-14 | — | 63/37 | 0.03 | 16 | 1 | 9 | 0.008 | — | — | — | 67/33 | 0.9 |
| Ref.4-2-15 | — | 63/37 | 12 | 0.4 | 1.5 | 2 | 2.1 | — | — | — | 67/33 | 2.6 |
| Ref.4-2-16 | — | 63/37 | 12 | 17 | 1.5 | 9 | 2.1 | — | — | — | 67/33 | 2.7 |

Fig. 47

| Item (Comparative example) | Solder | | Ni thickness | quantity of Ni P | thickness of Pd | quantity of Pd P | thickness of Au | quantity of Au P | Su/Cu/Ni ratio | Sn/Cu/Ni thickness | Su/Ni ratio | Sn/Ni thickness |
|---|---|---|---|---|---|---|---|---|---|---|---|---|
| | Cu/Ag/Sn ratio | Sn/Pb | | | | | | | | | | |
| Comp.1-1-1 | 0.2/1/97.0 | | 5 | 1.2 | | | 0.03 | | | | | none |
| Comp.1-2-1 | | 63/37 | 5 | 1.2 | | | 0.03 | | | | | none |
| Comp.2-1-1 | 0.2/1/97.0 | | 5 | 1.2 | | | 0.03 | | | | | none |
| Comp.2-2-2 | | 63/37 | 5 | 1.2 | | | 0.03 | | | | | none |

Fig.48

| Item (Experiment) | solder peeling test | reliability test | | | | | | peeling test after reliability test |
|---|---|---|---|---|---|---|---|---|
| | | 2500cycle | 3000cycle | 3500cycle | 4000cycle | 4500cycle | 5000cycle | |
| Ex.1-1-1 | ◎ | ◎ | | | | | | ○ |
| Ex.1-1-2 | ◎ | ◎ | ◎ | ◎ | ◎ | ◎ | ◎ | ○ |
| Ex.1-1-3 | ◎ | ◎ | ◎ | ◎ | ◎ | ◎ | ◎ | ○ |
| Ex.1-1-4 | ◎ | ◎ | ◎ | ◎ | ◎ | ◎ | ◎ | ○ |
| Ex.1-1-5 | ◎ | ◎ | ◎ | ◎ | ◎ | ◎ | ◎ | ○ |
| Ex.1-1-6 | ◎ | ◎ | ◎ | ◎ | ◎ | ◎ | ◎ | ○ |
| Ex.1-1-7 | ◎ | ◎ | ◎ | ◎ | ◎ | ◎ | ◎ | ○ |
| Ex.1-1-8 | ◎ | ◎ | ◎ | ◎ | ◎ | ◎ | ◎ | ○ |
| Ex.1-1-9 | ◎ | ◎ | ◎ | ◎ | ◎ | ◎ | ◎ | ○ |
| Ex.1-1-10 | ◎ | ◎ | ◎ | ◎ | ◎ | ◎ | ◎ | ○ |
| Ex.1-1-11 | ◎ | ◎ | ◎ | ◎ | ◎ | ◎ | ◎ | ○ |
| Ex.1-1-12 | ◎ | ◎ | ◎ | ◎ | ◎ | ◎ | ◎ | ○ |
| Ex.1-1-13 | ◎ | ◎ | ◎ | ◎ | ◎ | ◎ | ◎ | ○ |
| Ex.1-1-14 | ◎ | ◎ | ◎ | ◎ | ◎ | ◎ | ◎ | ○ |
| Ex.1-1-15 | ◎ | ◎ | ◎ | ◎ | ◎ | ◎ | ◎ | ○ |
| Ex.1-1-16 | ◎ | ◎ | ◎ | ◎ | ◎ | ◎ | ◎ | ○ |
| Ex.1-1-17 | ◎ | ◎ | ◎ | ◎ | ◎ | ◎ | ◎ | ○ |
| Ex.1-1-18 | ◎ | ◎ | ◎ | ◎ | ◎ | ◎ | ◎ | ○ |
| Ex.1-1-19 | ◎ | ◎ | ◎ | ◎ | ◎ | ◎ | ◎ | ○ |
| Ex.1-1-20 | ◎ | ◎ | ◎ | ◎ | ◎ | ◎ | ◎ | ○ |
| Ex.1-1-21 | ◎ | ◎ | ◎ | ◎ | ◎ | ◎ | ◎ | ○ |
| Ex.1-1-22 | ◎ | ◎ | ◎ | ◎ | ◎ | ◎ | ◎ | ○ |

Fig.49

| Item (Experiment) | solder peeling test | reliability test | | | | | | peeling test after reliability test |
|---|---|---|---|---|---|---|---|---|
| | | 2500cycle | 3000cycle | 3500cycle | 4000cycle | 4500cycle | 5000cycle | |
| Ex.1-2-1 | ◎ | ◎ | ◎ | ◎ | ◎ | ◎ | ◎ | ○ |
| Ex.1-2-2 | ◎ | ◎ | ◎ | ◎ | ◎ | ◎ | ◎ | ○ |
| Ex.1-2-3 | ◎ | ◎ | ◎ | ◎ | ◎ | ◎ | ◎ | ○ |
| Ex.1-2-4 | ○ | ◎ | ◎ | ◎ | ◎ | ◎ | ◎ | ○ |
| Ex.1-2-5 | ○ | ◎ | ◎ | ◎ | ◎ | ◎ | ◎ | ○ |
| Ex.1-2-6 | ○ | ◎ | ◎ | ◎ | ◎ | ◎ | ◎ | ○ |
| Ex.1-2-7 | ◎ | ◎ | ◎ | ◎ | ◎ | ◎ | ◎ | ○ |
| Ex.1-2-8 | ◎ | ◎ | ◎ | ◎ | ◎ | ◎ | ◎ | ○ |
| Ex.1-2-9 | ◎ | ◎ | ◎ | ◎ | ◎ | ◎ | ◎ | ○ |
| Ex.1-2-10 | ◎ | ◎ | ◎ | ◎ | ◎ | ◎ | ◎ | ○ |
| Ex.1-2-11 | ◎ | ◎ | ◎ | ◎ | ◎ | ◎ | ◎ | ○ |
| Ex.1-2-12 | ◎ | ◎ | ◎ | ◎ | ◎ | ◎ | ◎ | ○ |
| Ex.1-2-13 | ◎ | ◎ | ◎ | ◎ | ◎ | ◎ | ◎ | ○ |
| Ex.1-2-14 | ◎ | ◎ | ◎ | ◎ | ◎ | ◎ | ◎ | ○ |
| Ex.1-2-15 | ◎ | ◎ | ◎ | ◎ | ◎ | ◎ | ◎ | ○ |
| Ex.1-2-16 | ◎ | ◎ | ◎ | ◎ | ◎ | ◎ | ◎ | ○ |
| Ex.1-2-17 | ◎ | ◎ | ◎ | ◎ | ◎ | ◎ | ◎ | ○ |
| Ex.1-2-18 | ◎ | ◎ | ◎ | ◎ | ◎ | ◎ | ◎ | ○ |
| Ex.1-2-19 | ◎ | ◎ | ◎ | ◎ | ◎ | ◎ | ◎ | ○ |
| Ex.1-2-20 | ◎ | ◎ | ◎ | ◎ | ◎ | ◎ | ◎ | ○ |
| Ex.1-2-21 | ◎ | ◎ | ◎ | ◎ | ◎ | ◎ | ◎ | ○ |
| Ex.1-2-22 | ◎ | ◎ | ◎ | ◎ | ◎ | ◎ | ◎ | ○ |

Fig.50

| Item (Experiment) | solder peeling test | reliability test | | | | | | peeling test after reliability test |
|---|---|---|---|---|---|---|---|---|
| | | 2500cycle | 3000cycle | 3500cycle | 4000cycle | 4500cycle | 5000cycle | |
| Ex.1-3-1 | ○ | ◎ | ◎ | ◎ | ◎ | ◎ | ○ | ○ |
| Ex.1-3-2 | ○ | ◎ | ◎ | ◎ | ◎ | ◎ | ○ | ○ |
| Ex.1-3-3 | ○ | ◎ | ◎ | ◎ | ◎ | ◎ | ○ | ○ |
| Ex.1-3-4 | ○ | ◎ | ◎ | ◎ | ◎ | ○ | ○ | ○ |
| Ex.1-3-5 | ○ | ◎ | ◎ | ◎ | ◎ | ○ | ○ | ○ |
| Ex.1-3-6 | ○ | ◎ | ◎ | ◎ | ◎ | ○ | ○ | ○ |
| Ex.1-3-7 | ○ | ◎ | ◎ | ◎ | ◎ | ○ | ○ | ○ |
| Ex.1-3-8 | ○ | ◎ | ◎ | ◎ | ◎ | ○ | ○ | ○ |
| Ex.1-3-9 | ○ | ◎ | ◎ | ◎ | ◎ | ○ | ○ | ○ |
| Ex.1-3-10 | ○ | ◎ | ◎ | ◎ | ◎ | ◎ | ○ | ○ |
| Ex.1-3-11 | ○ | ◎ | ◎ | ◎ | ◎ | ◎ | ○ | ○ |
| Ex.1-3-12 | ○ | ◎ | ◎ | ◎ | ◎ | ◎ | ○ | ○ |
| Ex.1-3-13 | ○ | ◎ | ◎ | ◎ | ◎ | ◎ | ○ | ○ |
| Ex.1-3-14 | ○ | ◎ | ◎ | ◎ | ◎ | ◎ | ○ | ○ |
| Ex.1-4-1 | ○ | ◎ | ◎ | ◎ | ◎ | ○ | ○ | ○ |
| Ex.1-4-2 | ○ | ◎ | ◎ | ◎ | ◎ | ○ | ○ | ○ |
| Ex.1-4-3 | ○ | ◎ | ◎ | ◎ | ◎ | ○ | ○ | ○ |
| Ex.1-4-4 | ○ | ◎ | ◎ | ◎ | ◎ | ○ | ○ | ○ |
| Ex.1-4-5 | ○ | ◎ | ◎ | ◎ | ◎ | ○ | ○ | ○ |
| Ex.1-4-6 | ○ | ◎ | ◎ | ◎ | ◎ | ○ | ○ | ○ |
| Ex.1-4-7 | ○ | ◎ | ◎ | ◎ | ◎ | ○ | ○ | ○ |
| Ex.1-4-8 | ○ | ◎ | ◎ | ◎ | ◎ | ○ | ○ | ○ |
| Ex.1-4-9 | ○ | ◎ | ◎ | ◎ | ◎ | ○ | ○ | ○ |
| Ex.1-4-10 | ○ | ◎ | ◎ | ◎ | ◎ | ○ | ○ | ○ |
| Ex.1-4-11 | ○ | ◎ | ◎ | ◎ | ◎ | ○ | ○ | ○ |
| Ex.1-4-12 | ○ | ◎ | ◎ | ◎ | ◎ | ○ | ○ | ○ |
| Ex.1-4-13 | ○ | ◎ | ◎ | ◎ | ○ | ○ | ○ | ○ |
| Ex.1-5-1 | ○ | ◎ | ◎ | ◎ | ◎ | ◎ | ○ | ○ |
| Ex.1-5-2 | ○ | ◎ | ◎ | ◎ | ◎ | ◎ | ◎ | ○ |

Fig.51

| Item (Experiment) | solder peeling test | reliability test ||||||| peeling test after reliability test |
|---|---|---|---|---|---|---|---|---|
| | | 2500cycle | 3000cycle | 3500cycle | 4000cycle | 4500cycle | 5000cycle | |
| Ex.2-1-1 | ◎ | ◎ | ◎ | ◎ | ◎ | ◎ | ◎ | ○ |
| Ex.2-1-2 | ◎ | ◎ | ◎ | ◎ | ◎ | ◎ | ◎ | ○ |
| Ex.2-1-3 | ◎ | ◎ | ◎ | ◎ | ◎ | ◎ | ◎ | ○ |
| Ex.2-1-4 | ◎ | ◎ | ◎ | ◎ | ◎ | ◎ | ◎ | ○ |
| Ex.2-1-5 | ◎ | ◎ | ◎ | ◎ | ◎ | ◎ | ◎ | ○ |
| Ex.2-1-6 | ◎ | ◎ | ◎ | ◎ | ◎ | ◎ | ◎ | ○ |
| Ex.2-1-7 | ◎ | ◎ | ◎ | ◎ | ◎ | ◎ | ◎ | ○ |
| Ex.2-1-8 | ◎ | ◎ | ◎ | ◎ | ◎ | ◎ | ◎ | ○ |
| Ex.2-1-9 | ◎ | ◎ | ◎ | ◎ | ◎ | ◎ | ◎ | ○ |
| Ex.2-1-10 | ◎ | ◎ | ◎ | ◎ | ◎ | ◎ | ◎ | ○ |
| Ex.2-1-11 | ◎ | ◎ | ◎ | ◎ | ◎ | ◎ | ◎ | ○ |
| Ex.2-1-12 | ◎ | ◎ | ◎ | ◎ | ◎ | ◎ | ◎ | ○ |
| Ex.2-1-13 | ◎ | ◎ | ◎ | ◎ | ◎ | ◎ | ◎ | ○ |
| Ex.2-1-14 | ◎ | ◎ | ◎ | ◎ | ◎ | ◎ | ◎ | ○ |
| Ex.2-1-15 | ◎ | ◎ | ◎ | ◎ | ◎ | ◎ | ◎ | ○ |
| Ex.2-1-16 | ◎ | ◎ | ◎ | ◎ | ◎ | ◎ | ◎ | ○ |
| Ex.2-1-17 | ◎ | ◎ | ◎ | ◎ | ◎ | ◎ | ◎ | ○ |
| Ex.2-1-18 | ◎ | ◎ | ◎ | ◎ | ◎ | ◎ | ◎ | ○ |
| Ex.2-1-19 | ◎ | ◎ | ◎ | ◎ | ◎ | ◎ | ◎ | ○ |
| Ex.2-1-20 | ◎ | ◎ | ◎ | ◎ | ◎ | ◎ | ◎ | ○ |
| Ex.2-1-21 | ◎ | ◎ | ◎ | ◎ | ◎ | ◎ | ◎ | ○ |
| Ex.2-1-22 | ◎ | ◎ | ◎ | ◎ | ◎ | ◎ | ◎ | ○ |

Fig.52

| Item (Experiment) | solder peeling test | reliability test | | | | | | peeling test after reliability test |
|---|---|---|---|---|---|---|---|---|
| | | 2500cycle | 3000cycle | 3500cycle | 4000cycle | 4500cycle | 5000cycle | |
| Ex.2-2-1 | ◎ | ◎ | ◎ | ◎ | ◎ | ◎ | ◎ | ○ |
| Ex.2-2-2 | ◎ | ◎ | ◎ | ◎ | ◎ | ◎ | ◎ | ○ |
| Ex.2-2-3 | ◎ | ◎ | ◎ | ◎ | ◎ | ◎ | ◎ | ○ |
| Ex.2-2-4 | ◎ | ◎ | ◎ | ◎ | ◎ | ◎ | ◎ | ○ |
| Ex.2-2-5 | ○ | ◎ | ◎ | ◎ | ◎ | ◎ | ◎ | ○ |
| Ex.2-2-6 | ○ | ◎ | ◎ | ◎ | ◎ | ◎ | ◎ | ○ |
| Ex.2-2-7 | ◎ | ◎ | ◎ | ◎ | ◎ | ◎ | ◎ | ○ |
| Ex.2-2-8 | ◎ | ◎ | ◎ | ◎ | ◎ | ◎ | ◎ | ○ |
| Ex.2-2-9 | ◎ | ◎ | ◎ | ◎ | ◎ | ◎ | ◎ | ○ |
| Ex.2-2-10 | ◎ | ◎ | ◎ | ◎ | ◎ | ◎ | ◎ | ○ |
| Ex.2-2-11 | ◎ | ◎ | ◎ | ◎ | ◎ | ◎ | ◎ | ○ |
| Ex.2-2-12 | ◎ | ◎ | ◎ | ◎ | ◎ | ◎ | ◎ | ○ |
| Ex.2-2-13 | ◎ | ◎ | ◎ | ◎ | ◎ | ◎ | ◎ | ○ |
| Ex.2-2-14 | ◎ | ◎ | ◎ | ◎ | ◎ | ◎ | ◎ | ○ |
| Ex.2-2-15 | ◎ | ◎ | ◎ | ◎ | ◎ | ◎ | ◎ | ○ |
| Ex.2-2-16 | ◎ | ◎ | ◎ | ◎ | ◎ | ◎ | ◎ | ○ |
| Ex.2-2-17 | ◎ | ◎ | ◎ | ◎ | ◎ | ◎ | ◎ | ○ |
| Ex.2-2-18 | ◎ | ◎ | ◎ | ◎ | ◎ | ◎ | ◎ | ○ |
| Ex.2-2-19 | ◎ | ◎ | ◎ | ◎ | ◎ | ◎ | ◎ | ○ |
| Ex.2-2-20 | ◎ | ◎ | ◎ | ◎ | ◎ | ◎ | ◎ | ○ |
| Ex.2-2-21 | ◎ | ◎ | ◎ | ◎ | ◎ | ◎ | ◎ | ○ |
| Ex.2-2-22 | ◎ | ◎ | ◎ | ◎ | ◎ | ◎ | ◎ | ○ |

Fig.53

| Item (Experiment) | solder peeling test | reliability test ||||||| peeling test after reliability test |
|---|---|---|---|---|---|---|---|---|
| | | 2500cycle | 3000cycle | 3500cycle | 4000cycle | 4500cycle | 5000cycle | |
| Ex.2-3-1 | ○ | ◎ | ◎ | ◎ | ◎ | ◎ | ○ | ○ |
| Ex.2-3-2 | ○ | ◎ | ◎ | ◎ | ◎ | ◎ | ○ | ○ |
| Ex.2-3-3 | ○ | ◎ | ◎ | ◎ | ◎ | ◎ | ○ | ○ |
| Ex.2-3-4 | ○ | ◎ | ◎ | ◎ | ◎ | ○ | ○ | ○ |
| Ex.2-3-5 | ○ | ◎ | ◎ | ◎ | ◎ | ○ | ○ | ○ |
| Ex.2-3-6 | ○ | ◎ | ◎ | ◎ | ◎ | ○ | ○ | ○ |
| Ex.2-3-7 | ○ | ◎ | ◎ | ◎ | ◎ | ○ | ○ | ○ |
| Ex.2-3-8 | ○ | ◎ | ◎ | ◎ | ◎ | ○ | ○ | ○ |
| Ex.2-3-9 | ○ | ◎ | ◎ | ◎ | ◎ | ◎ | ○ | ○ |
| Ex.2-3-10 | ○ | ◎ | ◎ | ◎ | ◎ | ◎ | ○ | ○ |
| Ex.2-3-11 | ○ | ◎ | ◎ | ◎ | ◎ | ○ | ○ | ○ |
| Ex.2-3-12 | ○ | ◎ | ◎ | ◎ | ◎ | ◎ | ○ | ○ |
| Ex.2-3-13 | ○ | ◎ | ◎ | ◎ | ◎ | ◎ | ○ | ○ |
| Ex.2-3-14 | ○ | ◎ | ◎ | ◎ | ◎ | ◎ | ○ | ○ |
| Ex.2-4-1 | ○ | ◎ | ◎ | ◎ | ◎ | ○ | ○ | ○ |
| Ex.2-4-2 | ○ | ◎ | ◎ | ◎ | ◎ | ○ | ○ | ○ |
| Ex.2-4-3 | ○ | ◎ | ◎ | ◎ | ◎ | ○ | ○ | ○ |
| Ex.2-4-4 | ○ | ◎ | ◎ | ◎ | ◎ | ◎ | ○ | ○ |
| Ex.2-4-5 | ○ | ◎ | ◎ | ◎ | ◎ | ◎ | ○ | ○ |
| Ex.2-4-6 | ○ | ◎ | ◎ | ◎ | ◎ | ◎ | ○ | ○ |
| Ex.2-4-7 | ○ | ◎ | ◎ | ◎ | ◎ | ○ | ○ | ○ |
| Ex.2-4-8 | ○ | ◎ | ◎ | ◎ | ◎ | ○ | ○ | ○ |
| Ex.2-4-9 | ○ | ◎ | ◎ | ◎ | ◎ | ○ | ○ | ○ |
| Ex.2-4-10 | ○ | ◎ | ◎ | ◎ | ◎ | ○ | ○ | ○ |
| Ex.2-4-11 | ○ | ◎ | ◎ | ◎ | ◎ | ○ | ○ | ○ |
| Ex.2-4-12 | ○ | ◎ | ◎ | ◎ | ◎ | ○ | ○ | ○ |
| Ex.2-4-13 | ○ | ◎ | ◎ | ◎ | ○ | ○ | ○ | ○ |
| Ex.2-4-14 | ○ | ◎ | ◎ | ◎ | ◎ | ○ | ○ | ○ |
| Ex.2-5-1 | ○ | ◎ | ◎ | ◎ | ◎ | ○ | ○ | ○ |
| Ex.2-5-2 | ○ | ◎ | ◎ | ◎ | ◎ | ◎ | ◎ | ○ |

Fig.54

| Item (Reference) | solder peeling test | reliability test 2500cycle | 3000cycle | 3500cycle | 4000cycle | 4500cycle | 5000cycle | peeling test after reliability test |
|---|---|---|---|---|---|---|---|---|
| Ref.1-1-1 | △ | ◎ | ◎ | ◎ | ◎ | ○ | △ | ○ |
| Ref.1-1-2 | △ | ◎ | ◎ | ◎ | ○ | ○ | △ | ○ |
| Ref.1-1-3 | ○ | ◎ | ◎ | ◎ | ○ | △ | △ | ○ |
| Ref.1-1-4 | ○ | ◎ | ◎ | ◎ | ◎ | ○ | △ | ○ |
| Ref.1-1-5 | △ | ◎ | ◎ | ◎ | ◎ | ○ | △ | △ |
| Ref.1-1-6 | △ | ◎ | ◎ | ◎ | ◎ | ○ | △ | ○ |
| Ref.1-1-7 | △ | ◎ | ◎ | ◎ | ◎ | ○ | △ | ○ |
| Ref.1-1-8 | △ | ◎ | ◎ | ◎ | ○ | ○ | △ | △ |
| Ref.1-1-9 | △ | ◎ | ◎ | ◎ | ◎ | ○ | △ | △ |
| Ref.1-1-10 | △ | ◎ | ◎ | ◎ | ○ | ○ | △ | ○ |
| Ref.1-1-11 | △ | ◎ | ◎ | ◎ | ◎ | ○ | △ | ○ |
| Ref.1-1-12 | △ | ◎ | ◎ | ◎ | ◎ | ○ | △ | ○ |
| Ref.1-2-1 | ○ | ◎ | ◎ | ◎ | ◎ | ○ | △ | ○ |
| Ref.1-2-2 | ○ | ◎ | ◎ | ◎ | ◎ | ○ | △ | ○ |
| Ref.1-2-3 | △ | ◎ | ◎ | ◎ | ◎ | ○ | △ | ○ |
| Ref.1-2-4 | △ | ◎ | ◎ | ◎ | ◎ | ○ | △ | △ |
| Ref.1-2-5 | △ | ◎ | ◎ | ◎ | ◎ | ○ | △ | ○ |
| Ref.1-2-6 | △ | ◎ | ◎ | ◎ | ◎ | ○ | △ | ○ |
| Ref.1-2-7 | △ | ◎ | ◎ | ◎ | ◎ | ○ | △ | △ |
| Ref.1-2-8 | △ | ◎ | ◎ | ◎ | ○ | ○ | △ | ○ |
| Ref.1-2-9 | △ | ◎ | ◎ | ◎ | ○ | ○ | △ | △ |
| Ref.1-2-10 | △ | ◎ | ◎ | ◎ | ○ | ○ | △ | ○ |
| Ref.1-2-11 | △ | ◎ | ◎ | ◎ | ○ | ○ | △ | ○ |
| Ref.1-2-12 | △ | ◎ | ◎ | ◎ | ○ | ○ | △ | ○ |

Fig.55

| Item (Reference) | solder peeling test | reliability test ||||||| peeling test after reliability test |
|---|---|---|---|---|---|---|---|---|
| | | 2500cycle | 3000cycle | 3500cycle | 4000cycle | 4500cycle | 5000cycle | |
| Ref.2-1-1 | △ | ◎ | ◎ | ◎ | ◎ | ○ | △ | ○ |
| Ref.2-1-2 | △ | ◎ | ◎ | ◎ | ◎ | ○ | △ | ○ |
| Ref.2-1-3 | ○ | ◎ | ◎ | ◎ | ○ | ○ | △ | ○ |
| Ref.2-1-4 | ○ | ◎ | ◎ | ◎ | ○ | ○ | △ | ○ |
| Ref.2-1-5 | △ | ◎ | ◎ | ◎ | ◎ | ○ | △ | △ |
| Ref.2-1-6 | △ | ◎ | ◎ | ◎ | ◎ | ○ | △ | ○ |
| Ref.2-1-7 | △ | ◎ | ◎ | ◎ | ◎ | ○ | △ | ○ |
| Ref.2-1-8 | △ | ◎ | ◎ | ◎ | ◎ | ○ | △ | △ |
| Ref.2-1-9 | △ | ◎ | ◎ | ◎ | ◎ | ○ | △ | ○ |
| Ref.2-1-10 | △ | ◎ | ◎ | ◎ | ○ | ○ | △ | ○ |
| Ref.2-1-11 | △ | ◎ | ◎ | ◎ | ◎ | ○ | △ | ○ |
| Ref.2-1-12 | △ | ◎ | ◎ | ◎ | ◎ | ○ | △ | ○ |
| Ref.2-2-1 | ○ | ◎ | ◎ | ◎ | ◎ | ○ | △ | ○ |
| Ref.2-2-2 | ○ | ◎ | ◎ | ◎ | ◎ | ○ | △ | ○ |
| Ref.2-2-3 | △ | ◎ | ◎ | ◎ | ○ | ○ | △ | ○ |
| Ref.2-2-4 | △ | ◎ | ◎ | ◎ | ◎ | ○ | △ | △ |
| Ref.2-2-5 | △ | ◎ | ◎ | ◎ | ◎ | ○ | △ | ○ |
| Ref.2-2-6 | △ | ◎ | ◎ | ◎ | ◎ | ○ | △ | ○ |
| Ref.2-2-7 | △ | ◎ | ◎ | ◎ | ◎ | ○ | △ | △ |
| Ref.2-2-8 | △ | ◎ | ◎ | ◎ | ◎ | ○ | △ | △ |
| Ref.2-2-9 | △ | ◎ | ◎ | ◎ | ◎ | ○ | △ | ○ |
| Ref.2-2-10 | △ | ◎ | ◎ | ◎ | ○ | ○ | △ | ○ |
| Ref.2-2-11 | △ | ◎ | ◎ | ◎ | ○ | ○ | △ | ○ |
| Ref.2-2-12 | △ | ◎ | ◎ | ◎ | ○ | ○ | △ | ○ |

Fig.56

| Item (Experiment) | solder peeling test | reliability test ||||||| peeling test after reliability test |
|---|---|---|---|---|---|---|---|---|
| | | 2500cycle | 3000cycle | 3500cycle | 4000cycle | 4500cycle | 5000cycle | |
| Ex.3-1-1 | ◎ | ◎ | ◎ | ◎ | ◎ | ◎ | ◎ | ○ |
| Ex.3-1-2 | ◎ | ◎ | ◎ | ◎ | ◎ | ◎ | ◎ | ○ |
| Ex.3-1-3 | ◎ | ◎ | ◎ | ◎ | ◎ | ◎ | ◎ | ○ |
| Ex.3-1-4 | ◎ | ◎ | ◎ | ◎ | ◎ | ◎ | ◎ | ○ |
| Ex.3-1-5 | ◎ | ◎ | ◎ | ◎ | ◎ | ◎ | ◎ | ○ |
| Ex.3-1-6 | ◎ | ◎ | ◎ | ◎ | ◎ | ◎ | ◎ | ○ |
| Ex.3-1-7 | ◎ | ◎ | ◎ | ◎ | ◎ | ◎ | ◎ | ○ |
| Ex.3-1-8 | ◎ | ◎ | ◎ | ◎ | ◎ | ◎ | ◎ | ○ |
| Ex.3-1-9 | ◎ | ◎ | ◎ | ◎ | ◎ | ◎ | ◎ | ○ |
| Ex.3-1-10 | ◎ | ◎ | ◎ | ◎ | ◎ | ◎ | ◎ | ○ |
| Ex.3-1-11 | ◎ | ◎ | ◎ | ◎ | ◎ | ◎ | ◎ | ○ |
| Ex.3-1-12 | ◎ | ◎ | ◎ | ◎ | ◎ | ◎ | ◎ | ○ |
| Ex.3-1-13 | ◎ | ◎ | ◎ | ◎ | ◎ | ◎ | ◎ | ○ |
| Ex.3-1-14 | ◎ | ◎ | ◎ | ◎ | ◎ | ◎ | ◎ | ○ |
| Ex.3-1-15 | ◎ | ◎ | ◎ | ◎ | ◎ | ◎ | ◎ | ○ |
| Ex.3-1-16 | ◎ | ◎ | ◎ | ◎ | ◎ | ◎ | ◎ | ○ |
| Ex.3-1-17 | ◎ | ◎ | ◎ | ◎ | ◎ | ◎ | ◎ | ○ |
| Ex.3-1-18 | ◎ | ◎ | ◎ | ◎ | ◎ | ◎ | ◎ | ○ |
| Ex.3-1-19 | ◎ | ◎ | ◎ | ◎ | ◎ | ◎ | ◎ | ○ |
| Ex.3-1-20 | ◎ | ◎ | ◎ | ◎ | ◎ | ◎ | ◎ | ○ |
| Ex.3-1-21 | ◎ | ◎ | ◎ | ◎ | ◎ | ◎ | ◎ | ○ |
| Ex.3-1-22 | ◎ | ◎ | ◎ | ◎ | ◎ | ◎ | ◎ | ○ |

Fig.57

| Item (Experiment) | solder peeling test | reliability test | | | | | | | peeling test after reliability test |
|---|---|---|---|---|---|---|---|---|---|
| | | 2500cycle | 3000cycle | 3500cycle | 4000cycle | 4500cycle | 5000cycle | | |
| Ex.3-2-1 | ◎ | ◎ | ◎ | ◎ | ◎ | ◎ | ◎ | | ○ |
| Ex.3-2-2 | ◎ | ◎ | ◎ | ◎ | ◎ | ◎ | ◎ | | ○ |
| Ex.3-2-3 | ◎ | ◎ | ◎ | ◎ | ◎ | ◎ | ◎ | | ○ |
| Ex.3-2-4 | ◎ | ◎ | ◎ | ◎ | ◎ | ◎ | ◎ | | ○ |
| Ex.3-2-5 | ○ | ◎ | ◎ | ◎ | ◎ | ◎ | ◎ | | ○ |
| Ex.3-2-6 | ○ | ◎ | ◎ | ◎ | ◎ | ◎ | ◎ | | ○ |
| Ex.3-2-7 | ◎ | ◎ | ◎ | ◎ | ◎ | ◎ | ◎ | | ○ |
| Ex.3-2-8 | ◎ | ◎ | ◎ | ◎ | ◎ | ◎ | ◎ | | ○ |
| Ex.3-2-9 | ◎ | ◎ | ◎ | ◎ | ◎ | ◎ | ◎ | | ○ |
| Ex.3-2-10 | ◎ | ◎ | ◎ | ◎ | ◎ | ◎ | ◎ | | ○ |
| Ex.3-2-11 | ◎ | ◎ | ◎ | ◎ | ◎ | ◎ | ◎ | | ○ |
| Ex.3-2-12 | ◎ | ◎ | ◎ | ◎ | ◎ | ◎ | ◎ | | ○ |
| Ex.3-2-13 | ◎ | ◎ | ◎ | ◎ | ◎ | ◎ | ◎ | | ○ |
| Ex.3-2-14 | ◎ | ◎ | ◎ | ◎ | ◎ | ◎ | ◎ | | ○ |
| Ex.3-2-15 | ◎ | ◎ | ◎ | ◎ | ◎ | ◎ | ◎ | | ○ |
| Ex.3-2-16 | ◎ | ◎ | ◎ | ◎ | ◎ | ◎ | ◎ | | ○ |
| Ex.3-2-17 | ◎ | ◎ | ◎ | ◎ | ◎ | ◎ | ◎ | | ○ |
| Ex.3-2-18 | ◎ | ◎ | ◎ | ◎ | ◎ | ◎ | ◎ | | ○ |
| Ex.3-2-19 | ◎ | ◎ | ◎ | ◎ | ◎ | ◎ | ◎ | | ○ |
| Ex.3-2-20 | ◎ | ◎ | ◎ | ◎ | ◎ | ◎ | ◎ | | ○ |
| Ex.3-2-21 | ◎ | ◎ | ◎ | ◎ | ◎ | ◎ | ◎ | | ○ |
| Ex.3-2-22 | ◎ | ◎ | ◎ | ◎ | ◎ | ◎ | ◎ | | ○ |

Fig. 58

| item (Experiment) | solder peeling test | reliability test ||||||| peeling test after reliability test |
|---|---|---|---|---|---|---|---|---|
| | | 2500cycle | 3000cycle | 3500cycle | 4000cycle | 4500cycle | 5000cycle | |
| Ex.3-3-1 | ○ | | | | | ◎ | | |
| Ex.3-3-2 | ○ | ◎ | ◎ | ◎ | ◎ | ◎ | ○ | ○ |
| Ex.3-3-3 | ○ | ◎ | ◎ | ◎ | ◎ | ◎ | ○ | ○ |
| Ex.3-3-4 | ○ | ◎ | ◎ | ◎ | ◎ | ○ | ○ | ○ |
| Ex.3-3-5 | ○ | ◎ | ◎ | ◎ | ◎ | ○ | ○ | ○ |
| Ex.3-3-6 | ○ | ◎ | ◎ | ◎ | ◎ | ○ | ○ | ○ |
| Ex.3-3-7 | ○ | ◎ | ◎ | ◎ | ◎ | ◎ | ○ | ○ |
| Ex.3-3-8 | ○ | ◎ | ◎ | ◎ | ◎ | ◎ | ○ | ○ |
| Ex.3-3-9 | ○ | ◎ | ◎ | ◎ | ◎ | ◎ | ○ | ○ |
| Ex.3-3-10 | ○ | ◎ | ◎ | ◎ | ◎ | ◎ | ○ | ○ |
| Ex.3-3-11 | ○ | ◎ | ◎ | ◎ | ◎ | ◎ | ○ | ○ |
| Ex.3-3-12 | ○ | ◎ | ◎ | ◎ | ◎ | ◎ | ○ | ○ |
| Ex.3-3-13 | ○ | ◎ | ◎ | ◎ | ◎ | ◎ | ○ | ○ |
| Ex.3-3-14 | ○ | ◎ | ◎ | ◎ | ◎ | ○ | ○ | ○ |
| Ex.3-4-1 | ○ | ◎ | ◎ | ◎ | ◎ | ◎ | ○ | ○ |
| Ex.3-4-2 | ○ | ◎ | ◎ | ◎ | ◎ | ○ | ○ | ○ |
| Ex.3-4-3 | ○ | ◎ | ◎ | ◎ | ◎ | ○ | ○ | ○ |
| Ex.3-4-4 | ○ | ◎ | ◎ | ◎ | ◎ | ○ | ○ | ○ |
| Ex.3-4-5 | ○ | ◎ | ◎ | ◎ | ◎ | ○ | ○ | ○ |
| Ex.3-4-6 | ○ | ◎ | ◎ | ◎ | ◎ | ○ | ○ | ○ |
| Ex.3-4-7 | ○ | ◎ | ◎ | ◎ | ◎ | ○ | ○ | ○ |
| Ex.3-4-8 | ○ | ◎ | ◎ | ◎ | ◎ | ○ | ○ | ○ |
| Ex.3-4-9 | ○ | ◎ | ◎ | ◎ | ◎ | ○ | ○ | ○ |
| Ex.3-4-10 | ○ | ◎ | ◎ | ◎ | ○ | ○ | ○ | ○ |
| Ex.3-4-11 | ○ | ◎ | ◎ | ◎ | ◎ | ○ | ○ | ○ |
| Ex.3-4-12 | ○ | ◎ | ◎ | ◎ | ◎ | ○ | ○ | ○ |
| Ex.3-4-13 | ○ | ◎ | ◎ | ◎ | ◎ | ○ | ○ | ○ |
| Ex.3-4-14 | ○ | ◎ | ◎ | ◎ | ◎ | ○ | ○ | ○ |
| Ex.3-5-1 | ○ | ◎ | ◎ | ◎ | ◎ | ○ | ○ | ○ |
| Ex.3-5-2 | ○ | ◎ | ◎ | ◎ | ◎ | ◎ | ◎ | ○ |

Fig.59

| Item (Experiment) | solder peeling test | reliability test | | | | | | | peeling test after reliability test |
|---|---|---|---|---|---|---|---|---|---|
| | | 2500cycle | 3000cycle | 3500cycle | 4000cycle | 4500cycle | 5000cycle | | |
| Ex.4-1-1 | ◎ | ◎ | ◎ | ◎ | ◎ | ◎ | ◎ | | ○ |
| Ex.4-1-2 | ◎ | ◎ | ◎ | ◎ | ◎ | ◎ | ◎ | | ○ |
| Ex.4-1-3 | ◎ | ◎ | ◎ | ◎ | ◎ | ◎ | ◎ | | ○ |
| Ex.4-1-4 | ◎ | ◎ | ◎ | ◎ | ◎ | ◎ | ◎ | | ○ |
| Ex.4-1-5 | ◎ | ◎ | ◎ | ◎ | ◎ | ◎ | ◎ | | ○ |
| Ex.4-1-6 | ◎ | ◎ | ◎ | ◎ | ◎ | ◎ | ◎ | | ○ |
| Ex.4-1-7 | ◎ | ◎ | ◎ | ◎ | ◎ | ◎ | ◎ | | ○ |
| Ex.4-1-8 | ◎ | ◎ | ◎ | ◎ | ◎ | ◎ | ◎ | | ○ |
| Ex.4-1-9 | ◎ | ◎ | ◎ | ◎ | ◎ | ◎ | ◎ | | ○ |
| Ex.4-1-10 | ◎ | ◎ | ◎ | ◎ | ◎ | ◎ | ◎ | | ○ |
| Ex.4-1-11 | ◎ | ◎ | ◎ | ◎ | ◎ | ◎ | ◎ | | ○ |
| Ex.4-1-12 | ◎ | ◎ | ◎ | ◎ | ◎ | ◎ | ◎ | | ○ |
| Ex.4-1-13 | ◎ | ◎ | ◎ | ◎ | ◎ | ◎ | ◎ | | ○ |
| Ex.4-1-14 | ◎ | ◎ | ◎ | ◎ | ◎ | ◎ | ◎ | | ○ |
| Ex.4-1-15 | ◎ | ◎ | ◎ | ◎ | ◎ | ◎ | ◎ | | ○ |
| Ex.4-1-16 | ◎ | ◎ | ◎ | ◎ | ◎ | ◎ | ◎ | | ○ |
| Ex.4-1-17 | ◎ | ◎ | ◎ | ◎ | ◎ | ◎ | ◎ | | ○ |
| Ex.4-1-18 | ◎ | ◎ | ◎ | ◎ | ◎ | ◎ | ◎ | | ○ |
| Ex.4-1-19 | ◎ | ◎ | ◎ | ◎ | ◎ | ◎ | ◎ | | ○ |
| Ex.4-1-20 | ○ | ◎ | ◎ | ◎ | ◎ | ◎ | ◎ | | ○ |
| Ex.4-1-21 | ◎ | ◎ | ◎ | ◎ | ◎ | ◎ | ◎ | | ○ |
| Ex.4-1-22 | ◎ | ◎ | ◎ | ◎ | ◎ | ◎ | ◎ | | ○ |

Fig.60

| Item (Experiment) | solder peeling test | reliability test ||||||| peeling test after reliability test |
|---|---|---|---|---|---|---|---|---|
| | | 2500cycle | 3000cycle | 3500cycle | 4000cycle | 4500cycle | 5000cycle | |
| Ex.4-2-1 | ◎ | ◎ | ◎ | ◎ | ◎ | ◎ | ◎ | ○ |
| Ex.4-2-2 | ◎ | ◎ | ◎ | ◎ | ◎ | ◎ | ◎ | ○ |
| Ex.4-2-3 | ◎ | ◎ | ◎ | ◎ | ◎ | ◎ | ◎ | ○ |
| Ex.4-2-4 | ○ | ◎ | ◎ | ◎ | ◎ | ◎ | ◎ | ○ |
| Ex.4-2-5 | ○ | ◎ | ◎ | ◎ | ◎ | ◎ | ◎ | ○ |
| Ex.4-2-6 | ◎ | ◎ | ◎ | ◎ | ◎ | ◎ | ◎ | ○ |
| Ex.4-2-7 | ◎ | ◎ | ◎ | ◎ | ◎ | ◎ | ◎ | ○ |
| Ex.4-2-8 | ◎ | ◎ | ◎ | ◎ | ◎ | ◎ | ◎ | ○ |
| Ex.4-2-9 | ◎ | ◎ | ◎ | ◎ | ◎ | ◎ | ◎ | ○ |
| Ex.4-2-10 | ◎ | ◎ | ◎ | ◎ | ◎ | ◎ | ◎ | ○ |
| Ex.4-2-11 | ◎ | ◎ | ◎ | ◎ | ◎ | ◎ | ◎ | ○ |
| Ex.4-2-12 | ◎ | ◎ | ◎ | ◎ | ◎ | ◎ | ◎ | ○ |
| Ex.4-2-13 | ◎ | ◎ | ◎ | ◎ | ◎ | ◎ | ◎ | ○ |
| Ex.4-2-14 | ◎ | ◎ | ◎ | ◎ | ◎ | ◎ | ◎ | ○ |
| Ex.4-2-15 | ◎ | ◎ | ◎ | ◎ | ◎ | ◎ | ◎ | ○ |
| Ex.4-2-16 | ◎ | ◎ | ◎ | ◎ | ◎ | ◎ | ◎ | ○ |
| Ex.4-2-17 | ◎ | ◎ | ◎ | ◎ | ◎ | ◎ | ◎ | ○ |
| Ex.4-2-18 | ◎ | ◎ | ◎ | ◎ | ◎ | ◎ | ◎ | ○ |
| Ex.4-2-19 | ◎ | ◎ | ◎ | ◎ | ◎ | ◎ | ◎ | ○ |
| Ex.4-2-20 | ◎ | ◎ | ◎ | ◎ | ◎ | ◎ | ◎ | ○ |
| Ex.4-2-21 | ◎ | ◎ | ◎ | ◎ | ◎ | ◎ | ◎ | ○ |
| Ex.4-2-22 | ◎ | ◎ | ◎ | ◎ | ◎ | ◎ | ◎ | ○ |

Fig.61

| Item (Experiment) | solder peeling test | reliability test | | | | | | peeling test after reliability test |
|---|---|---|---|---|---|---|---|---|
| | | 2500cycle | 3000cycle | 3500cycle | 4000cycle | 4500cycle | 5000cycle | |
| Ex.4-3-1 | ○ | ◎ | ◎ | ◎ | ◎ | ◎ | ○ | ○ |
| Ex.4-3-2 | ○ | ◎ | ◎ | ◎ | ◎ | ◎ | ○ | ○ |
| Ex.4-3-3 | ○ | ◎ | ◎ | ◎ | ◎ | ◎ | ○ | ○ |
| Ex.4-3-4 | ○ | ◎ | ◎ | ◎ | ◎ | ○ | ○ | ○ |
| Ex.4-3-5 | ○ | ◎ | ◎ | ◎ | ◎ | ○ | ○ | ○ |
| Ex.4-3-6 | ○ | ◎ | ◎ | ◎ | ◎ | ○ | ○ | ○ |
| Ex.4-3-7 | ○ | ◎ | ◎ | ◎ | ◎ | ○ | ○ | ○ |
| Ex.4-3-8 | ○ | ◎ | ◎ | ◎ | ◎ | ○ | ○ | ○ |
| Ex.4-3-9 | ○ | ◎ | ◎ | ◎ | ◎ | ◎ | ○ | ○ |
| Ex.4-3-10 | ○ | ◎ | ◎ | ◎ | ◎ | ◎ | ○ | ○ |
| Ex.4-3-11 | ○ | ◎ | ◎ | ◎ | ◎ | ○ | ○ | ○ |
| Ex.4-3-12 | ○ | ◎ | ◎ | ◎ | ◎ | ○ | ○ | ○ |
| Ex.4-3-13 | ○ | ◎ | ◎ | ◎ | ◎ | ◎ | ○ | ○ |
| Ex.4-3-14 | ○ | ◎ | ◎ | ◎ | ◎ | ○ | ○ | ○ |
| Ex.4-4-1 | ○ | ◎ | ◎ | ◎ | ◎ | ○ | ○ | ○ |
| Ex.4-4-2 | ○ | ◎ | ◎ | ◎ | ◎ | ○ | ○ | ○ |
| Ex.4-4-3 | ○ | ◎ | ◎ | ◎ | ◎ | ○ | ○ | ○ |
| Ex.4-4-4 | ○ | ◎ | ◎ | ◎ | ◎ | ○ | ○ | ○ |
| Ex.4-4-5 | ○ | ◎ | ◎ | ◎ | ◎ | ○ | ○ | ○ |
| Ex.4-4-6 | ○ | ◎ | ◎ | ◎ | ◎ | ○ | ○ | ○ |
| Ex.4-4-7 | ○ | ◎ | ◎ | ◎ | ◎ | ◎ | ○ | ○ |
| Ex.4-4-8 | ○ | ◎ | ◎ | ◎ | ◎ | ◎ | ○ | ○ |
| Ex.4-4-9 | ○ | ◎ | ◎ | ◎ | ◎ | ◎ | ○ | ○ |
| Ex.4-4-10 | ○ | ◎ | ◎ | ◎ | ◎ | ◎ | ○ | ○ |
| Ex.4-4-11 | ○ | ◎ | ◎ | ◎ | ◎ | ◎ | ○ | ○ |
| Ex.4-4-12 | ○ | ◎ | ◎ | ◎ | ◎ | ◎ | ○ | ○ |
| Ex.4-4-13 | ○ | ◎ | ◎ | ◎ | ◎ | ◎ | ○ | ○ |
| Ex.4-4-14 | ○ | ◎ | ◎ | ◎ | ◎ | ◎ | ○ | ○ |
| Ex.4-5-1 | ○ | ◎ | ◎ | ◎ | ◎ | ◎ | ○ | ○ |
| Ex.4-5-2 | ○ | ◎ | ◎ | ◎ | ◎ | ◎ | ◎ | ○ |

Fig.62

| Item (Reference) | solder peeling test | reliability test 2500cycle | 3000cycle | 3500cycle | 4000cycle | 4500cycle | 5000cycle | peeling test after reliability test |
|---|---|---|---|---|---|---|---|---|
| Ref.3-1-1 | △ | ◎ | ◎ | ◎ | ◎ | ○ | △ | ○ |
| Ref.3-1-2 | △ | ◎ | ◎ | ◎ | ○ | ○ | △ | ○ |
| Ref.3-1-3 | ○ | ◎ | ◎ | ◎ | ○ | < | △ | ○ |
| Ref.3-1-4 | ○ | ◎ | ◎ | ◎ | ◎ | ○ | △ | ○ |
| Ref.3-1-5 | △ | ◎ | ◎ | ◎ | ◎ | ○ | △ | △ |
| Ref.3-1-6 | △ | ◎ | ◎ | ◎ | ◎ | ○ | △ | ○ |
| Ref.3-1-7 | △ | ◎ | ◎ | ◎ | ◎ | ○ | △ | ○ |
| Ref.3-1-8 | △ | ◎ | ◎ | ◎ | ◎ | ○ | △ | △ |
| Ref.3-1-9 | △ | ◎ | ◎ | ◎ | ○ | ○ | △ | △ |
| Ref.3-1-10 | △ | ◎ | ◎ | ◎ | ◎ | ○ | △ | ○ |
| Ref.3-1-11 | △ | ◎ | ◎ | ◎ | ◎ | ○ | △ | ○ |
| Ref.3-1-12 | △ | ◎ | ◎ | ◎ | ◎ | ○ | △ | ○ |
| Ref.3-1-13 | △ | ◎ | ◎ | ◎ | ◎ | ○ | △ | △ |
| Ref.3-1-14 | △ | ◎ | ◎ | ◎ | ◎ | ○ | △ | ○ |
| Ref.3-1-15 | △ | ◎ | ◎ | ◎ | ◎ | ○ | △ | ○ |
| Ref.3-1-16 | △ | ◎ | ◎ | ◎ | ◎ | ○ | △ | ○ |
| Ref.3-2-1 | △ | ◎ | ◎ | ◎ | ◎ | ○ | △ | ○ |
| Ref.3-2-2 | ○ | ◎ | ◎ | ◎ | ◎ | ○ | △ | ○ |
| Ref.3-2-3 | ○ | ◎ | ◎ | ◎ | ◎ | ○ | △ | △ |
| Ref.3-2-4 | △ | ◎ | ◎ | ◎ | ◎ | ○ | △ | ○ |
| Ref.3-2-5 | △ | ◎ | ◎ | ◎ | ◎ | ○ | △ | ○ |
| Ref.3-2-6 | △ | ◎ | ◎ | ◎ | ◎ | ○ | △ | △ |
| Ref.3-2-7 | △ | ◎ | ◎ | ◎ | ◎ | ○ | △ | ○ |
| Ref.3-2-8 | △ | ◎ | ◎ | ◎ | ◎ | ○ | △ | ○ |
| Ref.3-2-9 | △ | ◎ | ◎ | ◎ | ◎ | ○ | △ | △ |
| Ref.3-2-10 | △ | ◎ | ◎ | ◎ | ◎ | ○ | △ | ○ |
| Ref.3-2-11 | △ | ◎ | ◎ | ◎ | ◎ | ○ | △ | ○ |
| Ref.3-2-12 | △ | ◎ | ◎ | ◎ | ◎ | ○ | △ | △ |
| Ref.3-2-13 | △ | ◎ | ◎ | ◎ | ◎ | ○ | △ | ○ |
| Ref.3-2-14 | △ | ◎ | ◎ | ◎ | ◎ | ○ | △ | △ |
| Ref.3-2-15 | △ | ◎ | ◎ | ◎ | ◎ | ○ | △ | ○ |
| Ref.3-2-16 | △ | ◎ | ◎ | ◎ | ○ | ○ | △ | ○ |

Fig.63

| Item (Reference) | solder peeling test | reliability test | | | | | | peeling test after reliability test |
|---|---|---|---|---|---|---|---|---|
| | | 2500cycle | 3000cycle | 3500cycle | 4000cycle | 4500cycle | 5000cycle | |
| Ref.4-1-1 | △ | ◎ | ◎ | ◎ | ◎ | ○ | △ | ○ |
| Ref.4-1-2 | △ | ◎ | ◎ | ◎ | ◎ | ○ | △ | ○ |
| Ref.4-1-3 | ○ | ◎ | ◎ | ◎ | ◎ | ○ | △ | ○ |
| Ref.4-1-4 | ○ | ◎ | ◎ | ◎ | ○ | ○ | △ | ○ |
| Ref.4-1-5 | △ | ◎ | ◎ | ◎ | ◎ | ○ | △ | △ |
| Ref.4-1-6 | △ | ◎ | ◎ | ◎ | ◎ | ○ | △ | ○ |
| Ref.4-1-7 | △ | ◎ | ◎ | ◎ | ○ | ○ | △ | ○ |
| Ref.4-1-8 | △ | ◎ | ◎ | ◎ | ◎ | ○ | △ | △ |
| Ref.4-1-9 | △ | ◎ | ◎ | ◎ | ◎ | ○ | △ | △ |
| Ref.4-1-10 | △ | ◎ | ◎ | ◎ | ○ | ○ | △ | ○ |
| Ref.4-1-11 | △ | ◎ | ◎ | ◎ | ◎ | ○ | △ | ○ |
| Ref.4-1-12 | △ | ◎ | ◎ | ◎ | ◎ | ○ | △ | ○ |
| Ref.4-1-13 | △ | ◎ | ◎ | ◎ | ○ | ○ | △ | △ |
| Ref.4-1-14 | △ | ◎ | ◎ | ◎ | ◎ | ○ | △ | △ |
| Ref.4-1-15 | △ | ◎ | ◎ | ◎ | ◎ | ○ | △ | ○ |
| Ref.4-1-16 | △ | ◎ | ◎ | ◎ | ◎ | ○ | △ | ○ |
| Ref.4-2-1 | △ | ◎ | ◎ | ◎ | ◎ | ○ | △ | ○ |
| Ref.4-2-2 | △ | ◎ | ◎ | ◎ | ◎ | ○ | △ | ○ |
| Ref.4-2-3 | ○ | ◎ | ◎ | ◎ | ◎ | ○ | △ | ○ |
| Ref.4-2-4 | △ | ◎ | ◎ | ◎ | ○ | ○ | △ | △ |
| Ref.4-2-5 | △ | ◎ | ◎ | ◎ | ◎ | ○ | △ | ○ |
| Ref.4-2-6 | △ | ◎ | ◎ | ◎ | ◎ | ○ | △ | △ |
| Ref.4-2-7 | △ | ◎ | ◎ | ◎ | ◎ | ○ | △ | ○ |
| Ref.4-2-8 | △ | ◎ | ◎ | ◎ | ◎ | ○ | △ | ○ |
| Ref.4-2-9 | △ | ◎ | ◎ | ◎ | ◎ | ○ | △ | △ |
| Ref.4-2-10 | △ | ◎ | ◎ | ◎ | ◎ | ○ | △ | ○ |
| Ref.4-2-11 | △ | ◎ | ◎ | ◎ | ◎ | ○ | △ | △ |
| Ref.4-2-12 | △ | ◎ | ◎ | ◎ | ◎ | ○ | △ | ○ |
| Ref.4-2-13 | △ | ◎ | ◎ | ◎ | ◎ | ○ | △ | △ |
| Ref.4-2-14 | △ | ◎ | ◎ | ◎ | ◎ | ○ | △ | △ |
| Ref.4-2-15 | △ | ◎ | ◎ | ◎ | ◎ | ○ | △ | ○ |
| Ref.4-2-16 | △ | ◎ | ◎ | ◎ | ○ | ○ | △ | ○ |

Fig.64

| Item (Comparative example) | solder peeling test | reliability test | | | | | | peeling test after reliability test |
|---|---|---|---|---|---|---|---|---|
| | | 2500cycle | 3000cycle | 3500cycle | 4000cycle | 4500cycle | 5000cycle | |
| Comp.1-1-1 | × | ◎ | ○ | ○ | △ | × | × | × |
| Comp.1-1-2 | × | ◎ | ◎ | ○ | △ | × | × | × |
| Comp.2-1-1 | × | ◎ | ○ | ○ | △ | × | × | × |
| Comp.2-1-2 | × | ◎ | ◎ | ○ | △ | × | × | × |

Fig. 65
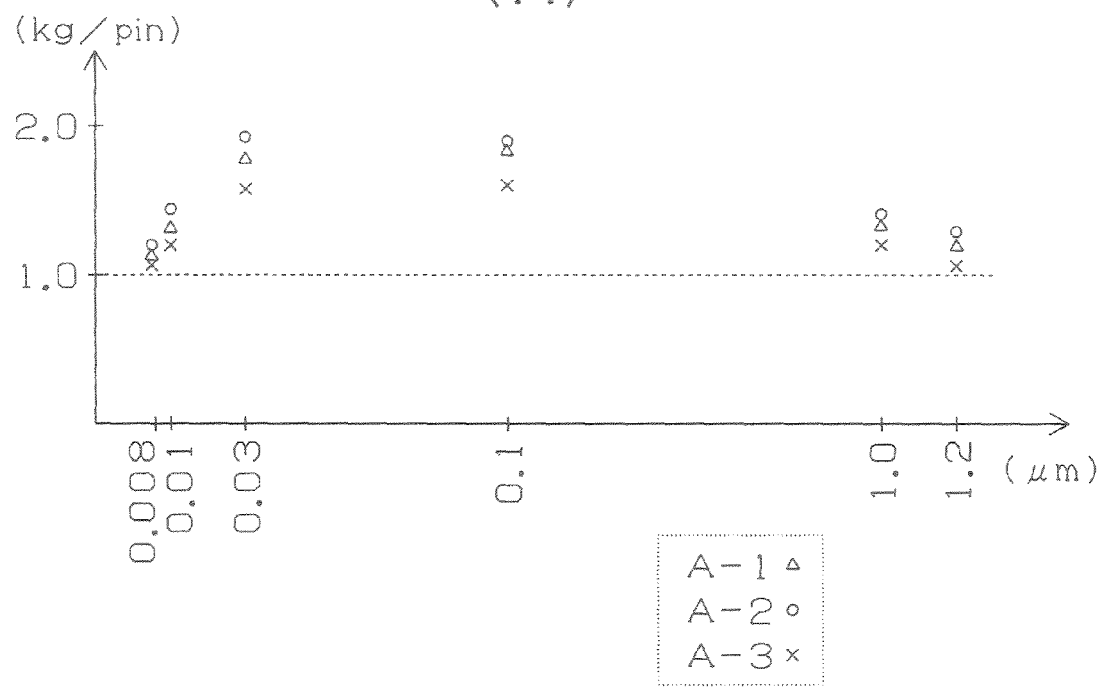
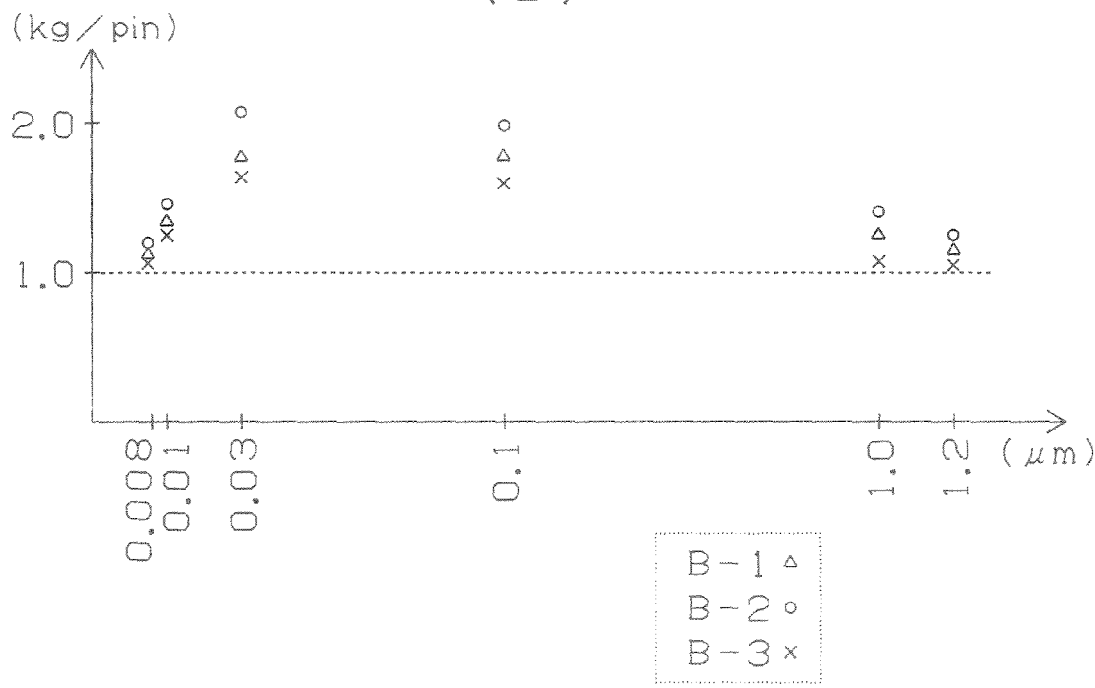

Fig. 66
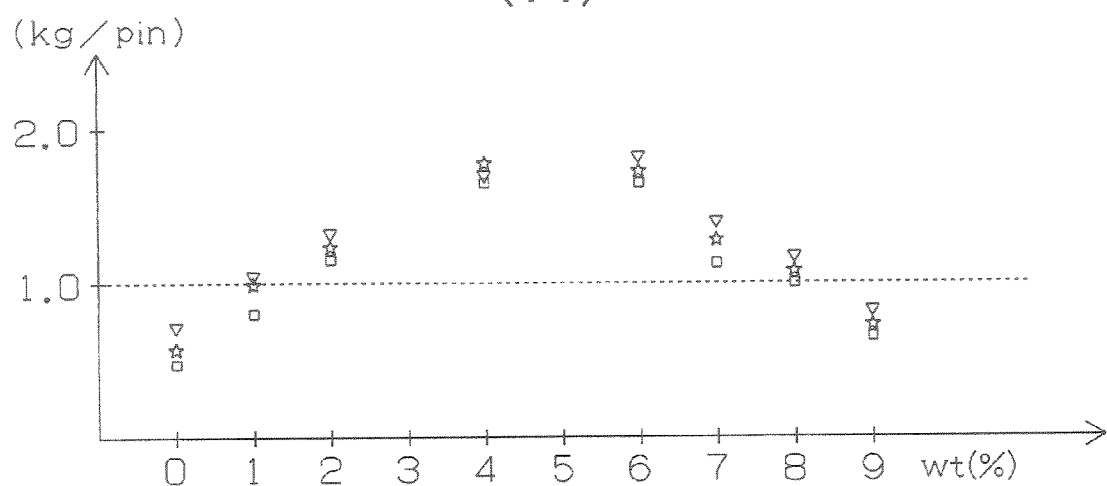
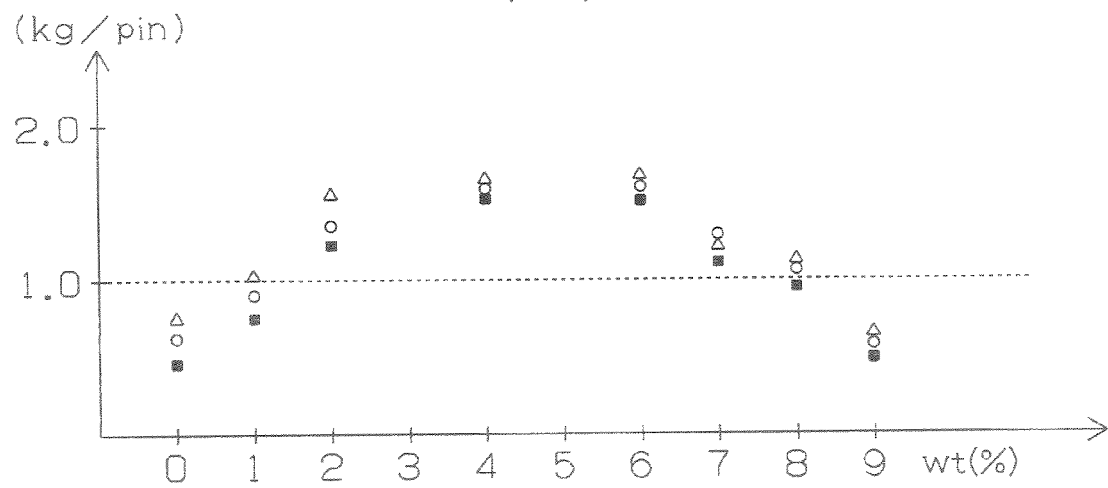

Fig. 67
(A)
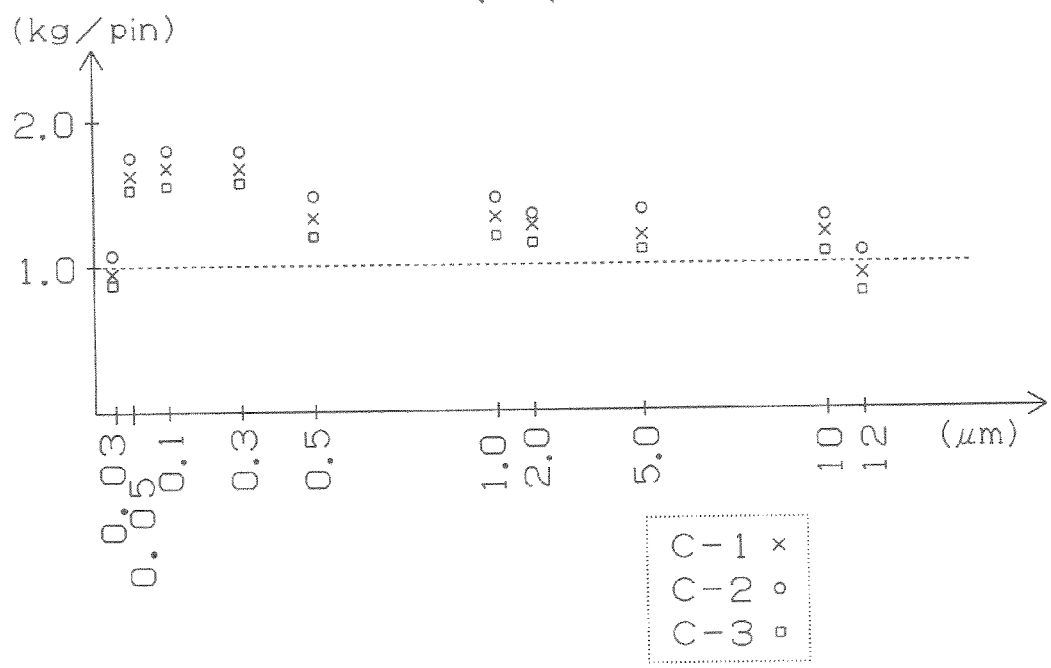
(B)
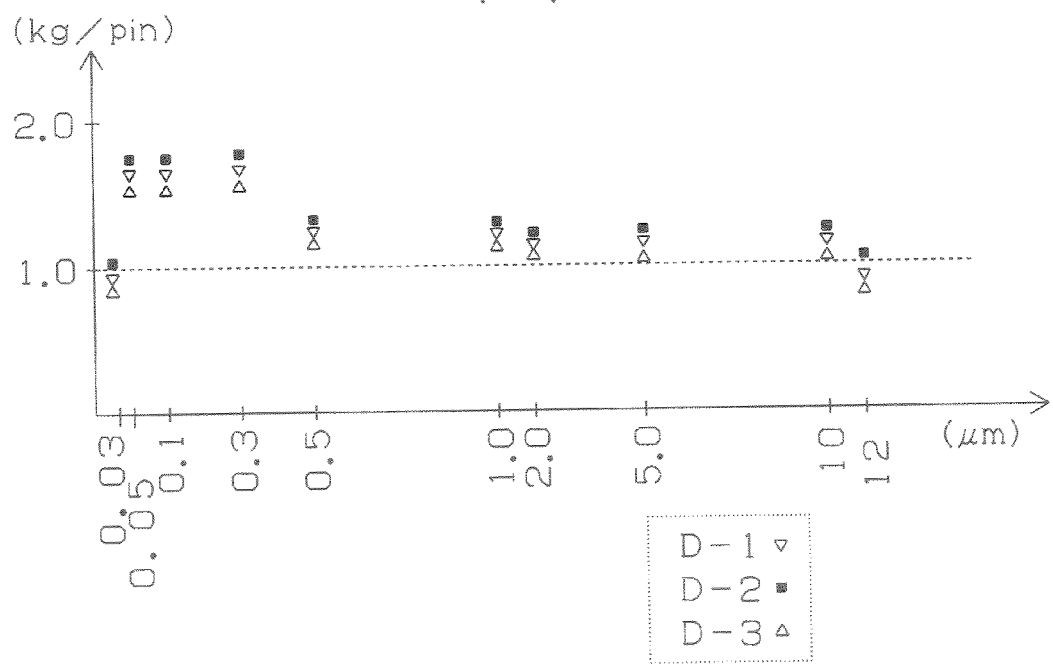

Fig. 68
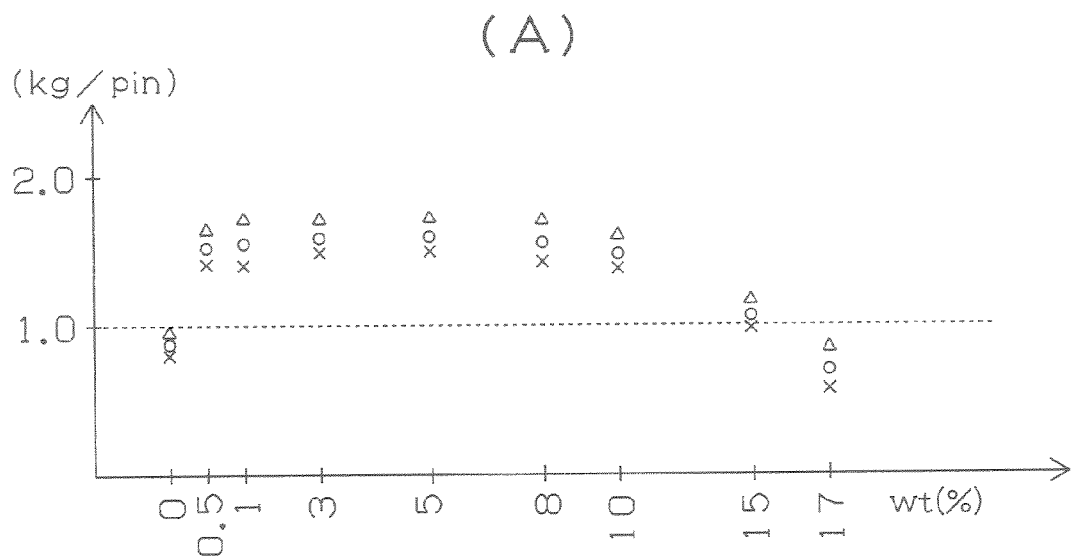
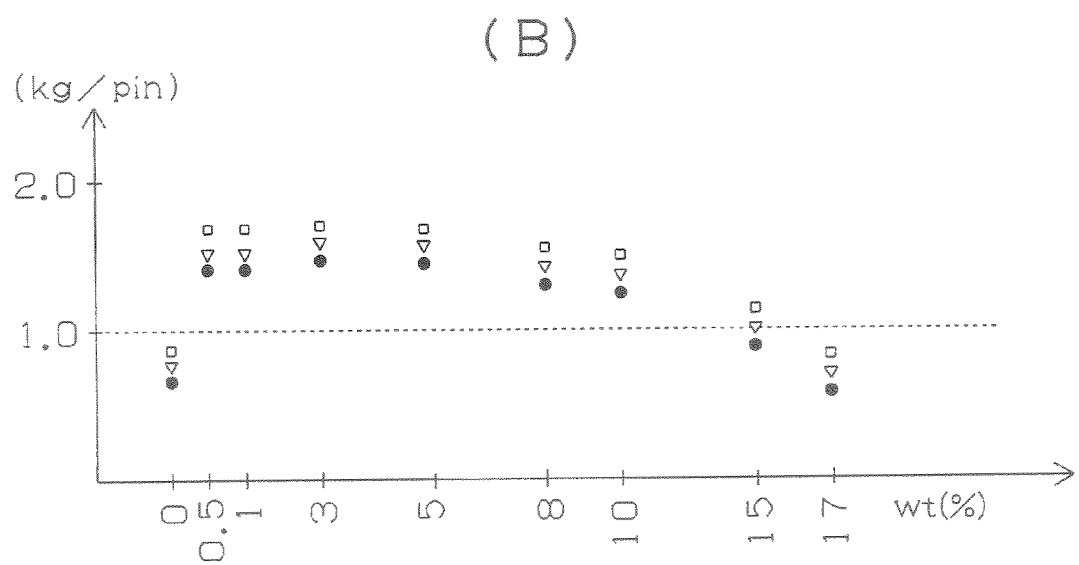

PRINTED WIRING BOARD AND METHOD FOR MANUFACTURING PRINTED WIRING BOARD

TECHNICAL FIELD

The present invention relates to a multilayered printed wiring board for accommodation of a semiconductor, on which a semiconductor device is loaded.

BACKGROUND ART

The outermost layer of a printed wiring board generally has a solder resist layer in order to protect a conductor circuit. When a solder bump is to be formed, a solder pad is formed by opening part of the solder resist such that the interior is exposed in order to connect to the conductor circuit. After a nickel layer and a gold layer have been applied onto a section that is to become a solder pad solder paste is printed thereon and reflow operation is performed so as to form the solder bump. The solder layer is formed at a portion that connects with an external board, and an externally connecting terminal is disposed. As prior art, JP 10-154876 A has been proposed.

PRIOR ART 1

JP 10-154876 A is incorporated herein by reference.

DISCLOSURE OF THE INVENTION

Problem to be Solved by the Invention

However, if the diameter of the solder pad is small (for example, the opening diameter of the solder pad is less than 200 μm), when the solder paste is formed on the solder pad by means of printing, the shape of the solder bump, or of the solder layer that connects with the external terminal sometimes cannot be maintained because of a defect such as insufficient charging, or a lack of charging of the solder on the pad, and on occasions functioning as a solder bump, or as a solder layer, becomes impossible. Consequently, the degree of electric connectivity and reliability may on occasions drop.

Further, as the diameter of the opening of the solder pad decreases, the connecting area between the solder pad and the solder bump may for example, decrease and this may at times result in a deterioration in adhesive property.

Further, bubbles may be formed in the solder paste or in the solder layer, and such bubbles may cause the solder to burst, or bubbles may remain in the solder, and this may on occasions lead to a deterioration in the ability of the solder perform a functions of electric connectivity. This has resulted in a deterioration in the degree of reliability at an early stage.

Further, there is a requirement for thermal, stress to be buffered more than in the case of a conventional solder pad structure (nickel-gold). In the first place, if thermal stress occurs, the thermal stress is applied onto the solder bump or onto the solder layer. Concomitantly with decreases in the opening diameter of the opening of the solder pad, defects such as the destruction or cracking or a solder bump, or of a solder layer are produced. As a result, the degree of electric connectivity and the degree of reliability of the printed wiring board diminish.

For these reasons, the degree of strength and the level of corrosion resistance between the solder pad and the metal in the solder layer, or between one solder bump and another, need to be reinforced.

In particular, in reliability tests such as are performed under heat cycle condition, or in high temperature/and high humidity conditions, it has proved difficult to maintain reliability as a printed wiring board over the duration of a long period.

Further, if a solder containing no lead is used for the solder bump, its degree of toughness is lower than in the case of a solder containing lead and further because stress is not absorbed in the intenor, there has been a tendency for the degree of imperfection to become more pronounced.

The present invention has been achieved to attain the issue described above, and an object of the invention is to provide, by adopting a solder pad structure that excels in terms of strength and adhesion property, a printed wiring board which secures excellent adhesive property, electric connectivity and reliability and a manufacturing method of the same.

Means for Attaining the Issue

First Invention

First Embodiment, Second Embodiment

As a result of assiduous research on the part of the inventor, in the present invention a printed wiring board has been achieved in which solder pads are formed by making an opening in a part of the solder resist layer, a composite layer is provided on the front surface of a conductor circuit that is exposed from the solder pad and a solder bump, or a solder layer, for connection to the exterior, is formed on the composite layer, characterized insofar that the composite layer is composed of an Ni layer (nickel layer) and a Pd layer (palladium layer).

Further, in the present invention a printed wiring board has been achieved in which solder pads are formed by making an opening in a part of the solder resist layer, a composite layer is provided on the front surface of a conductor circuit that is exposed from the solder pad, and a solder bump, or a solder layer, for connection to the extend of, is formed on the composite layer, characterized insofar that the composite layer is composed of an Ni layer and a Pd layer, and that the solder bump, or the solder layer, is composed of a solder containing no lead.

In the composite layer of the present invention, an Ni layer and a Pd layer are overlaid successively from the side at which a conductor circuit is located. In other words, a composite layer composed of an Ni layer and a Pd layer is overlaid on the conductor circuit from the solder pad and then the solder bump, or the solder layer, is formed thereon. The solder bump is intended to be electrically connected with a device such as a semiconductor device, while the solder layer is intended to be electrically connected with an external board through external connecting terminals (BGA, PGA or the like).

A Pd layer (palladium layer) can reduce the chances of a defect occurring such as the eventuality of a repellent solder. Thus, in comparison with a conventional solder pad structure, the degree of adhesiveness with a solder can be further improved.

The reasons are that, in the case of palladium formed by plating, defects such for this as deposition failure are unlikely to occur, and that in comparison with Au layer (gold layer) the case of the palladium layer the ratio of oxide film formed on the front surface is smaller. Thus, even when the solder is mounted, a defect such as a repellent solder occurs less frequently. Further, a solder bump, or a solder layer, of a desired size can be formed within the solder pad. Consequently, because a solder bump or a solder layer adhesion between the solder bump, or the solder layer is formed in a desired size, adhesiveness between the solder bump, or the solder layer, and the conductor circuit tends not to deteriorate. Further, the standard of functioning as a printed wiring board will also tend not to deteriorate.

Furthermore, use of the palladium layer facilitates buffering of thermal stress in consequence, the chances of defects occurring in the solder bump, or in the solder layer, can be reduced, and it thus becomes possible to enhance levels of electric connectivity and reliability.

The reasons for this are that in comparison with gold, a palladium layer has a superior degree of rigidity. Thus, thermal stress can be absorbed within the Pd layer and buffered. Consequently, the frequency of with which stress is transmitted to the solder bump, or to the solder layer, by means of thermal stress can be reduced. In consequence, the solder bump or the solder layer is unlikely to be damaged. Thus, deficiencies in electric connection stemming from the solder bump, or from the solder layer, are much less liable to occur, and reliability can be secured over long periods of time, even than reliability tests are performed.

By adopting a composite layer structure, in comparison with the case of a conventional solder pad structure (nickel-gold layer), degree of electric connectivity and reliability can be enhanced.

Furthermore, the effects of doing so become more pronounced if a solder containing no lead (lead free) is used in the solder bump or in the solder layer, a solder free of lead is inferior to a solder containing lead in terms of the buffering of thermal stress. In the first place, a solder containing lead (for example, Sn/Pd=6:4) buffers stress within the solder the concomitantly with degree of thermal stress induced. The lead contained in the solder absorbs the stress. However, a solder that is free of lead is inferior to a solder containing lead in term of the degree of force in buffering stress. Thus, by providing a solder pad with a composite layer composed of an Ni layer and a Pd layer, stress can be buffered by means of the entire solder pad structure. Consequently, adhesiveness of the solder itself is superior to that in the case of a conventional solder pad structure (Ni layer-Au layer), stress relative to the thermal stress can be buffered more easily and defects such as destruction and cracking in a solder bump, or in a solder layer that is formed can be inhibited. For these reasons according to this invention higher levels of electric connectivity and reliability can be secured than in the case of a type in which a solder free of lead is applied to the conventional solder pad structure.

Further, a composite layer composed of an Ni layer and a Pd layer is provided on a conductor circuit on the solder pad, and a solder bump, or a solder layer, is formed on the composite layer, by means of reflow. At this time, either an Ni layer-NI alloy layer structure, an Ni layer-Sn alloy layer structure, or a solder layer or solder bump structure is formed on the conductor circuit which serves as the solder pad. In this context, an Ni alloy layer or an Ni—Sn alloy layer can enhance adhesiveness on the solder layer. In other words, resistance to pulling can be intensified so that the degree of rigidity of either the Ni alloy layer or the Ni—Sn alloy layer can be reinforced. As a result, the degree of resistance to peeling can be improved.

An Ni alloy layer or an Ni—Sn alloy layer of this type can reinforce the degree of resistance to pulling, irrespective of its size. In other words, an Ni alloy layer or an Ni alloy can inhibit reductions of the level of resistance to peeling.

In this context, the Ni alloy layer or the Ni—Si alloy layer can enhance adhesiveness on the solder layer. In other words, because an Ni alloy layer or an Ni—Sn alloy layer intensifies the degree of rigidity, resistance to pulling can be intensified. In consequence, reductions in the degree of resistance to peeling can be obviated.

An Ni alloy layer or an Ni—Sn alloy layer of this type can intensify resistance to pulling, irrespective of its size. In other words, in this case, an Ni alloy layer or an Ni—Sn alloy layer can inhibit reductions in the degree of the resistance to peeling irrespective of the size of the solder pad. An Ni alloy layer is an alloy layer containing Ni and Sn, and elements such as Cu, Bi and In may also be included. As long as the ratio occupied by Ni is high, a two-component base or a base made up of three or more components is possible.

An Ni—Sn alloy layer is an alloy layer which contains Ni and Sn, and may also contain Cu, Bi or In. As long as the ratio that is principally occupied by Ni and Sn is high the layers may be of a two-component base or a base made up of three or more components. For example, the layer may be an alloy layer containing combinations such as Ni, Sn and Cu or Ni, Sn and Bi.

An Ni alloy or an Ni—Sn alloy layer can inhibit reductions in the degree of rigidity.

By adjusting a thickness of an Ni alloy layer or an Ni—Sn alloy layer, reductions in the degree of bonding strength between a nickel layer and a solder bump can be inhibited and reductions in the degree of resistance to pulling can be inhibited.

An average thickness of an Ni alloy layer or the Ni—Sn alloy layer is preferred to be 1.0-2.5 µm. The reason is that this range decelerates reduction of rigidity of the Ni alloy layer or Ni—Sn alloy layer more so that reduction of the resistance to pulling can be decelerated.

Here, the average thickness is set to less than 1.0 µm. However, if the average thickness exceeds 2.5 µm, the rigidity of the Ni alloy layer, or of the Ni—Sn alloy layer, can still be secured and either of such layers can be used under ordinary conditions. However, the degree of rigidity in such conditions is inferior to a case where thickness of the Ni—Sn alloy layer is within the range mentioned above, and resistance to pulling on occasions may also be inferior.

As a result of experiments, it has been discovered that, the average thickness of an Ni alloy layer, or of an Ni—Sn alloy layer, can be within a range of between 1.0 and 2.5 µm by adjusting the degree of thickness of the Ni layer and the amount of P content therein, or the degree of thickness of the Pd layer and the amount of P content therein. In other words, if when the solder bump is formed, the composite layer is made up of an Ni layer and a Pd layer, or of an Ni layer, a Pd layer and a precious metal layer, the Pd layer, or the Pd layer and the precious metal layer, is diffused and an Ni alloy layer, or an Ni—Sn alloy layer, is formed. At this time, the thickness of the Ni alloy layer, or of the Ni—Sn alloy layer, can be adjusted by means of the thickness of the Ni layer. Combined with the amount of the P content, or by means of the thickness of the Pd layer combined with the amount of the P content. Thus, by adjusting the thickness of the Pd layer, the thickness of the Ni—Sn alloy layer can be modified and consequently, the degree of rigidity of the Ni—Sn alloy layer becomes less likely to decrease, and the resistance to pulling also becomes less likely to diminish.

The Ni alloy layer or the Ni—Sn alloy layer is constituted of particles having any shape selected from among a sheet-like body, a column-like body and a grain-like body. Such a layer may be constituted of a single body selected from among them (for example, lamination in which only sheet-like bodies are piled on top of one another), or it may be of compound structure thereof (for example, lamination in which a sheet-like body and a column-like body are combined). An alloy layer constituted of mainly sheet-like bodies is preferable. In the case of sheet-like bodies, it becomes difficult for gaps to be formed between one sheet-like body and another, and they can be piled up easily. Thus, an alloy layer constituted of mainly sheet-like bodies can secure a degree of rigidity easily. It can also secure easily resistance to pulling relative to the solder. It is particularly preferable that such a layer be an alloy layer constituted of only sheet-like bodies.

Further, an Ni—Sn alloy layer (for example, Ni, Sn and Cu) is preferably an alloy layer constituted of a three-component base. An alloy layer constituted of a three-component base enables components to be mixed evenly and for the configuration of the layer to be uniform. For this reason, it makes separation unlikely within the alloy layer and rigidity can be easily secured. Further, an alloy layer of this kind enables the shapes of its particles to turn easily into sheet-like bodies and also facilitates an increase in the degree of rigidity.

Further, if an alloy layer constituted of a three-component base is in a range of Sn:Cu:Ni=30-90:10-50:1-30, its degree of rigidity tends to diminish easily. In particular, if a solder containing no lead (free of lead) is used for the solder bump, or for the solder layer, it becomes possible for stress caused by thermal stress to be easily buffered. Thus, damage or cracking is unlikely to be induced within a solder free of lead, and degrees of electric connectivity and reliability can be enhanced. In particular, in an Ni—Cu—Sn alloy layer whose Sn is 40-50 wt %, the degree of rigidity can be easily raised.

If the thickness of an Ni layer is 0.05-10.0 µm, the average thickness of an Ni alloy layer, or of an Ni—Sn alloy layer, can be easily changed, to 1.0-2.5 µm.

Thus, if the thickness of an Ni layer is less than 0.05 µm, the thickness of the Ni alloy layer can be easily reduced because Ni diffusion is not achieved to a sufficient degree. As a result, the thickness of an Ni alloy layer can be made less than 1.0 µm, and depending on the circumstances, an Ni alloy layer may be, lost or damaged, and consequently, the degree of rigidity of the solder pad may on occasions diminish.

If, in contrast, the thickness of an Ni layer exceeds 10.0 µm, Ni diffusion is performed sufficiently so that formation of the Ni alloy layer is boosted, the amount of Ni content in the Ni alloy increases (for example, the amount of Ni content in a three-component base alloy of Sn—Ni—Cu increases), and it accordingly becomes easy to increase the thickness of the Ni alloy layer. In such circumstances, the average thickness of an Ni alloy layer, or of an Ni—Sn alloy layer, tends to exceed 2.5 µm, thereby, on occasions, reducing the degree rigidity of the Ni alloy layer or the Ni—Sn alloy layer.

Further, the Ni layer is preferable between 0.05 and 1.0 µm. Within such a range, the thickness of the Ni alloy layer, or of the Ni—Sn alloy layer, never moves outside the of 1.0 to 2.5 µm range, and the Ni alloy layer, or the Ni—Sn alloy layer, maintains continuity and is unlikely to be lost or damaged. In other words, the degree of rigidity of a solder pad becomes unlikely to decrease.

Further, the Ni layer is most preferably between 0.05 and 0.3 µm. Within this range, an Ni alloy layer or an Ni—Sn alloy layer can be formed regardless of which composition is used for the soldering. In other words, because the amount of Ni content in an Ni alloy layer, or in an Ni—Sn alloy layer tends not to increase, an Ni alloy layer or an Ni—Sn alloy layer can be confined to within a desired range, and the degree of rigidity in the solder pad tends to drop.

If the thickness of a Pd layer is set to between 0.01 and 1.0 µm, the average thickness of an Ni—Sn alloy layer can be easily adjusted to 1.0-2.5 µm.

In this context, a Pd layer performs a role of inhibiting Ni diffusion so as to inhibit formation of an Ni alloy layer or an Ni—Sn alloy layer. Thus, if the thickness of a Pd layer is less than 0.01 µm, Ni diffusion cannot be suppressed and consequently, the thickness of the Ni alloy layer, or of the Ni—Sn alloy layer may be easily increased. In these circumstances, the average thickness of an Ni alloy layer tends to exceed 2.5 µm and thus, it becomes difficult to enhance the rigidity of an Ni alloy layer or of an Ni—Sn alloy layer.

In contrast, if the thickness of a Pd layer exceeds 1.0 µm, Ni diffusion is inhibited and the formation of an Ni alloy layer, or of an Ni—Sn alloy layer, can be hampered. Consequently, the thickness of an Ni alloy layer, or an Ni—Sn alloy layer can be reduced easily. In these circumstances, the average thickness of an Ni alloy layer or of an Ni—Sn alloy layer, tends to be less than 0.01 µm, and it becomes difficult to enhance the degree of rigidity of the Ni alloy layer, or of the Ni—Sn alloy layer.

In particular, the thickness of the Pd layer is preferably between 0.03 and 0.2 µm. The reason for this is that within this range, the thickness of a Pd layer enters a range of between 0.01 and 1.0 µm even when thickness has been dispersed locally. Thus, an Ni alloy layer, or an Ni—Sn alloy layer can be easily formed within the desired range and consequently the degree of rigidity of an Ni alloy layer, or of Ni—Sn alloy layer, tends not to decrease.

The thickness of an Ni alloy layer can be controlled, and the degree of rigidity of the Pd layer can be reinforced by the amount of content of phosphor (P) in the Pd layer.

The amount of P content in the Pd layer is preferably 2-7 wt %. Consequently, a Pd layer that is formed is unlikely to be porous, a film thickness is likely to be uniform, and formation of an oxide film on the front layer can be inhibited. Further, it becomes easy to secure the rigidity of the Pd layer formed. Furthermore, because it becomes easy to form an Ni alloy layer, or an Ni—Sn alloy layer, rigidity of the Ni alloy layer, or of the Ni—Sn alloy layer can be easily secured.

In this context, if the amount of content of P in the Pd layer is less than 2%, or if the amount of the content of P in the Pd layer exceeds 7%, the Pd layer cannot be applied to the Ni layer uniformly, and pores remain in the Pd layer. Oxide film can be easily formed on the front surface of the Pd layer, so that even if a solder is formed, the degree of adhesiveness tends to decrease. Further, the degree of rigidity of the Pd layer may sometimes diminish thereby making buffering of thermal stress. Thus, stress may on occasions concentrate on the solder bump, or on the solder layer sometimes lending to defects such as damage or cracking in the solder. Long-term reliability tends to become difficult to secure when reliability tests are performed. In normal conditions, however reliability can still be secured.

An Ni alloy layer, or the Ni—Sn alloy layer, that is formed after the reflowing of solder tends to be formed thick. As a result, the of an Ni alloy layer, or an Ni—Sn alloy layer formed cannot easily be enhanced, even though the layer can perform its function. As an extreme example, the average thickness of an Ni alloy layer, or an Ni—Sn alloy layer, may on occasions exceed 2.5 µm.

Further, the amount of the content of P in the Pd layer is particularly preferably 4-6 wt %. If the amount of the content of P is set within this range, the amount of content of P never fluctuates widely beyond 2-7 wt % even when local deflection occurs. It becomes difficult for oxide film to be formed on the front surface of the Pd layer that is formed and when the solder is formed the drawback of repellency on the part of the solder rarely occurs, and adhesiveness is thereby secured. Further, the rigidity of the Pd layer itself is secured and buffering of stress to thermal stress is facilitated. In consequence, defects such as damage or cracking become unlikely to be induced in a solder formed, on the Pd layer and degree of electric connectivity and reliability are never reduced. Even when a heat reliability test is performed under heat cycle conditions or in conditions at high temperature and high humidity, a deterioration in functioning occurs slowly, and reliability can be easily secured over a long period.

Further, the thickness of the Ni alloy layer, or of the Ni—Sn alloy layer formed by reflowing solder can be contained within a predetermined range. As a result, the degree of rigidity of the Ni alloy layer or of the Ni—Sn alloy layer can be easily enhanced. In other words, the degree of rigidity of such a layer tends not to drop. The thickness of a Pd layer, and the amount of the content of phosphor in the Pd film can be adjusted by adjusting conditions such as those relating to plating time, plating temperature, the composition of the plating solution, and the pH in the plating solution. Although thickness can vary, depending on the size of a bath of the plating solution and the flow of the solution, it is preferable to seek a correlation with the thickness on the basis of initial conditions.

The reason why a Pd film having no pores is formed when an appropriate amount of P is added to the Pd layer will now be described with reference to FIG. 30.

FIG. 30(A) illustrates a case where an appropriate amount of P is contained. In this context, formation of the Pd film is carried out by electroless plating, and for the plating solution, a hypophosphorous acid base chemical liquid is used as its reducing agent. As one example thereof, sodium hypophosphite ($NaH_2PO_2$) can be used. First, hypophosphite ions ($H_2PO_2-$) 63 are attracted onto the nickel layer ((1) in FIG. 30(A)). Next, Ni serves as catalyst to make hypophosphite ions induce dehydrogenolysis ($H_2PO_2-+2H-Pd+2H+$). Hydrogen atoms 65 generated by means of this dehydrogenolysis are attracted onto the Ni surface and activated ((2) in FIG. 30(A)). Pd ions ($Pd^{2+}$) in the plating solution receives electrons from hydrogen on the Ni surface and are reduced ($Pd^{2+}+2H—Pd+2H+$) by Pd metal ((3) in FIG. 30(A)). With deposited Pd metal acting as a catalyst, Pd is deposited on the Ni surface by means of the same mechanism ((4) in FIG. 30(A)). In this context P in the Pd—P is formed by a codeposit of hypophosphorous acid which acts as a reducing agent. Because hypophosphorous acid, plays a role in activating Ni as a catalyst, it can be plated on the Ni, surface without selectivity, or, in other words, form a compact Pd layer. Further, by adjusting degree of concentration of the hypophosphorous acid, the amount of the content of P in a film of the Pd layer can be adjusted.

FIG. 30(B) illustrates a case of pure Pd containing no P. Here, formation of the Pd film is carried out by electroless plating and, as its plating solution, a formic acid (HCOOH) containing no P is used as a reducing agent. First, hydrogen atoms 85 generated during an Ni plating reaction are attracted onto the Ni surface ((1) in FIG. 30(B)). Next, when Pd ions in the plating solution make contact with hydrogen on the Ni surface, the Pd ions are reduced to metal ((2) in FIG. 30(B)). The formic acid is dissolved to $H_2$ and $CO_2$ by the influence of the Pd deposition reaction ((3) in FIG. 30(B)). The Pd ions receive electrons from hydrogen generated by decomposition of the formic acid and are reduced to metal ((4) in FIG. 30(B)). However, because a formic acid cannot act as a reducing agent during an early deposition period, hydrogen on the Ni surface serves as a reducing agent. However, because much hydrogen does not exist on the Ni front surface, a plating film having selectivity can be formed. In other words, a Pd plating layer having a porous configuration can be formed.

A determination of the quantity of each metal mentioned, above is carried out according to an energy dispersion method (EDS). According to this method, on electron beam, which is a source of excitation in a SEM (a scanning electron microscope) or in a TEM (a transmission electron microscope), is irradiated onto the surface of a specimen so as to generate a variety of signals. In the course of this process, a mainly characteristic X ray is detected with a Si (Li) semiconductor detector and electron-positive pairs of holes of a quantity proportional to its energy are produced in the semiconductor so as to generate electric signals. After the electric signals have been amplified and analogously/digitally converted, an X-ray spectrum is obtained by identifying with a multi-channel analyzer, and identification of elements is carried out from its peak energy by a quantitative analysis of that peak value. An energy dispersion type X-ray analyzer (manufactured by JEOL Ltd., JED-2140) was used for the measurement and quantitative analysis. By irradiating directly a metal, layer that has been formed, a quantitative measurement of the metal was executed.

The thickness of the Pd layer is preferably formed within a range of between 0.01 and 1.0 µm. It is particularly preferable to form it within a range of between 0.03 and 0.7 µm. If the thickness of the Pd layer is less than 0.01 µm, the formation of the Ni alloy layer, or of the Ni—Sn alloy layer can not be promoted. Consequently, Ni alloy layer or Ni—Sn alloy layer is not formed locally and as a result, it becomes difficult to enhance the degree of rigidity of the Ni alloy layer, or of the Ni—Sn alloy layer, and it becomes difficult to improve the resistance to peeling of the Ni—Sn alloy layer. If, in contrast, the thickness of the Pd layer exceeds 1 µm, formation of the Ni alloy layer, or of the Ni—Sn alloy layer may sometimes be hindered by that thickness. For this reason, occasions may arise where no Ni alloy layer, or Ni—Sn alloy layer is formed locally, and the degree of rigidity of the Ni alloy layer, or of the Ni—Sn alloy layer, may sometimes deteriorate. As a result, it becomes difficult to improve the resistance to peeling of the Ni alloy layer, or of the Ni—Sn alloy layer (a predetermined degree of resistance to peeling is, however secured).

The Ni layer constituting the composite layer in the present invention is preferably formed with an alloy metal containing elements such as Ni—Cu, Ni—P or Ni—Cu—P.

If an Ni layer is formed by forming film with pure Ni, the plating film may on occasions not be formed in all directions, and in consequence fine pores (defects) may be formed. An alloy metal forms a uniform film because pores (defects) are buried. An Ni layer (intermediate) and a Pd layer, and an Ni layer (intermediate), a Pd layer and a corrosion resistant layer, may be formed by either a physical, method or by a chemical method, or by using a combination of these methods, and they may be formed in a either single layer, or in two or more layers.

In particular, it is preferably formed of an alloy metal of Ni—P, or of Ni—Cu—P. In other words, the Ni layer preferably contains P (phosphor). A further reason for this is that even if unevenness is formed on the surface of the conductor circuit, a film whose front layer is flattened can be formed by killing that unevenness. Further, if the Ni layer is formed by plating, instances of a metal layer not being formed, or errors in formation caused by non-deposition or a cessation of reaction, tend not to occur in the Ni layer formed. Further, formation of a Pd layer that is formed on the Ni layer can be promoted and instances of a layer not being formed, or errors in the formation of the Pd layer tend to occur rarely. For this reason, a Pd layer that is desired can be formed and rigidity as a composite layer can be secured.

The amount of the content of P (phosphor) in the Ni layer is particularly preferably between 0.5 and 15 wt %. If the amount of the content of P is less than 15%, or exceeds 15.0 wt %, formation of the Ni layer can easily be inhibited. Further, the formation of a Pd layer on the Ni layer becomes more difficult to promote, and in consequent, defects such as instances of the non-formation of the Pd layer, and errors in formation may be induced, and rigidity of the Pd layer is sometimes not able to be secured. As a consequence it sometimes becomes difficult to secure electric connectivity or reliability. Although no problem arises in use as a printed wiring board for ordinary purposes, advantages can on occasions be secured in cases of printed wiring boards for which long-term reliability is sought.

The thickness of the nickel film and the amount of the content of phosphor in the nickel film can be adjusted by factors such as adjusting the plating time, the plating temperature, the composition of the plating solution and the PH of the plating solution. Although variations may occur, depending on the size of the bath for the plating solution and the flow of the plating solution, it is preferable to seek a correlation with the thickness on the basis of initial conditions.

P (phosphor) is preferably contained in both the Ni layer and the Pd layer. If phosphor is contained in both, the Ni alloy layer or the Ni—Sn alloy layer, becomes easy to form, and as a consequence, rigidity of the solder bump in the solder pad, or in the alloy layer, formed in the solder layer becomes less liable to deteriorate.

The amount of the content of P (phosphor) in the Ni layer is preferably lower than the amount of the content of P (phosphor) in the Pd layer. In consequence, the Ni layer tends to become covered by the Pd layer and separation becomes unlikely to occur in an interface between the Pd layer and the Ni layer. As a result, reductions in the degrees of electric connectivity or reliability caused by defects in the interface of the solder pad becomes unlikely to occur.

The amount of the content of P (phosphor) in the Ni layer is preferably higher than the amount of the content of P (phosphor) in the Pd layer. Consequently, when an alloy layer is formed by heat treatment of a Pd layer and an Ni layer with a solder, it tends to turn into a sheet-like body and consequently, it becomes easy to secure a desired, or higher degree of rigidity in the solder pad.

As the solder for use in the present invention, it is permissible to use a solder with a two-component base, a solder with a three-component base or a solder with a base of four or more components. As metals contained in these compositions, elements such as Sn, Ag, Cu, Pb, Sb, Bi, Zn, and In may be used.

A two-component base solder may be of combinations such as Sn/Pb, Sn/Sb, Sn/Ag, Sn/Cu and Sn/Zn. A three-component base solder may be of combinations such as Sn/Ag/Cu, Sn/Ag/Sb, Sn/Cu/Pb, Sn/Sb/Cu, Sn/Ag/In, Sn/Sb/In, Sn/Ag/Bi and Sn/Sb/Bi. With regard to such three-component base solders, the three components may occupy more than 10 wt %, or the main two components may account for more than 95 wt % while the remainder may be accounted for by one component (for example, a three-component base solder in which a total of the Sn and At accounts for 97.5 wt % while the remainder is accounted for by Cu).

A solder containing no lead (free of lead) may include combinations such as a Sn/Ag base solder, a Sn/Bi base solder, a Sn/Zn base solder and a Sn/Cu base solder. Such solders are inferior to Sn/Pb in terms of buffering of stress within the solder in relation to thermal stress. Thus, stress is likely to remain in the solder.

Additionally, a multi-component base solder may be used. A multi-component base solder may include combinations such as Sn/Ag/Cu/Sb and Sn/Ag/Cu/Bi. It is permissible to use a solder whose a dose has been adjusted.

It is permissible to use a solder in which the Ni alloy layer, or the Ni—Sn alloy layer, can be formed in an interface between a component of the solder and the Ni layer. The degree of rigidity can be reinforced by this Ni alloy layer, or by an Ni—Sn alloy layer, thereby inhibiting a reduction in the resistance of the solder to peeling.

Among such options it is preferable to use an Ni—Sn alloy layer that is composed of Ni—Sn—Cu. The degree of rigidity can be reinforced by this alloy. Further, such an alloy may contain elements such as Ag, Sb, Bi, and Zn in addition to the three components of Ni, Sn, and Cu. Even if such elements are contained, rigidity of the Ni—Sn—Cu alloy layer never deteriorates. However, if the total amount of such elements exceeds any one of the metals of Sn, Ni, Cu, rigidity may deteriorate.

Further, the melting point of these solders is preferably between 150 and 350° C. Even if the melting point of the solder is less than 150° or even if, in contrast, the melting point of the solder is over 350° C. Formation of the Ni—Sn alloy layer may on occasions be hindered. The reason for this is that even if the temperature is low, the formation of an Ni—Sn alloy is difficult to achieve and if the temperature is high, the Ni is separated and it becomes difficult for the Ni—Sn alloy to be formed. For these reasons, an Ni—Sn alloy can be better formed at a temperature mentioned above.

In the printed wiring board of the present invention, a rough layer may be formed in a conductor circuit on the front surface of the printed wiring board provided with the conductor circuit. The average roughness (Ra) is preferably 0.02-7μ. The rough layer enhances adhesiveness between the conductor circuit and the solder resist layer. In particular, the average roughness of a desired range is 1-5 μm. Within that range, a desired degree of adhesiveness can be obtained, irrespective of factors such as the composition and the thickness of the solder resist layer.

As a method of forming the rough layer, a method of forming an alloy layer of Cu—Ni—P by electroless plating, a method of formation by etching with a cupric complex and an organic acid salt, and a method of formation by oxidation reduction are available. The rough layer may be covered with an element such as Sn or Zn, depending on the circumstances.

The conductor circuit on the outermost layer is covered and protected by the solder resist layer. A variety of resins may be used for the solder resist layer, and, for example, a thermosetting resin, a thermoplastic resin, a light curing resin, a thermoplastic resin partially transformed to (meta) acrylic, or a resin composite containing two or more of such types may be used. The resin used may be a resin such as an epoxy resin, a phenol resin, a polyimide resin, a phenoxy resin or an olefin resin.

Formation of the solder resist layer is achieved by setting a level of the viscosity in advance and by coating with a resultant varnish-like agent. Alternatively, a film-like agent in a semi-hardened condition (B stage) can be affixed, and it is also permissible to use a method of affixing a film after coating. The film may be formed of plural layers, by means of using two or more resins.

Further, the solder resist layer can be provided with a solder pad by opening part of the layers. As a method of opening at this time, a method can be used by placing on the solder resist layers a mask, on which an opening pad has been drawn, and by forming the solder pad by exposure and development (photo resist method), alternatively, a method can be adopted of opening part of the layer with a laser such as a carbon dioxide gas laser, an excimer laser or a YAG laser. Further, it is acceptable to use a method of making an opening for the solder pad according to a direct drawing method.

In the case of a solder resist layer which is formed by exposure and development, a resin may be used that is obtained by means of hardening, for example, by using a bisphenol ft type epoxy resin, a biphenol A type epoxy resin acrylate, a novolac type epoxy resin or a novolac type epoxy resin acrylate with an amine base hardener or an imidazole hardener.

In particular, if the solder bump is formed by providing the solder resist layer with an opening, it is preferable that the solder resist be composed of a "novolac type epoxy resin or a novolac type epoxy resin acrylate" and contain an "imidazole hardener" as its hardener.

Next, the solder resist layer is formed on the conductor circuit. The thickness of the solder resist layer of the present invention should be 5-40μ. If it is too thin, it does not function as a solder dam, and if it is too thick, it is difficult to bore and, moreover it will make contact with the solder body and thereby cause cracking.

A solder resist layer of such a structure has an advantage insofar that there is a low degree of migration of lead (a phenomenon whereby lead ions are diffused in the solder resist layer). Additionally, this solder resist layer is a resin layer that has been obtained by hardening the acrylate of the novolac type epoxy resin with an imidazole hardener, that has a superior degree of heat resistance and alkali resistance, and that never deteriorates at temperatures (around 200° C.) at which a solder melts. Further, the solder resist layer can not be dissolved by a strong basic plating solution such as nickel plating, palladium plating or gold plating.

However, a solder resist layer of this type is likely to separate because it is composed of a resin that has a strict skeleton. A rough layer is effective for purposes of preventing such separation.

As the acrylate of the aforementioned novolac type epoxy resin, it is permissible to use an epoxy resin that has been obtained by reacting glycin ether of phenol novolac or cresol novolac with acrylic acid or methacryl.

The aforementioned imidazole hardener should preferably be in liquid form at 25° C. The reason for this is that, if it is in liquid form, it can be mixed uniformly.

As such a liquid imidazole hardener, 1-benzil-2-methyl imidazole (product name: 1B2MZ), 1-cyano ethyl-2-ethyl-4-methyl imidazole (product name: 2E4MZ-CN), 4-methyl-2-ethyl imidazole (product name: 2E4MZ) may be used.

The amount of imidazole hardener added is preferably 1-10 w % relative to the total solid content of the solder resist compound. The reason for this is that if the amount of hardener added is within this range, it can be mixed uniformly.

As for the compound used before the hardening of the solder resist, it is preferable to use a glycol ether base solvent as its solvent.

A solder resist layer for which such compound is used never generates free oxygen, and never oxidizes the surface of the copper pad. Additionally, harm caused to the human body is minimal.

As such a glycol ether base solvent, at least one selected from diethylene glycol dimethyl ether (DMDG) and triethylene glycol dimethyl ether (DMTG) is preferably used. The reason for this is that by heating at between 30 and 50° C.

these solvents can completely dissolve benzophenone or Michler's ketone which serve as initiating reagent.

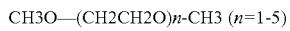

This glycol ether base solvent should be 10-40 wt % relative to the total weight of the solder resist compound.

Furthermore, to the solder resist compounds described above can be added various kinds of antifoam agents and leveling agents, a thermoplastic resin for purposes of enhancing heat resistance and resistance to bases, and for purposes of providing of plasticity, and, for purposes of enhancing resolution, a photosensitive monomer.

For example, as the leveling agent, a leveling agent composed of a polymer of acrylic acid ester is preferably used. As the initiating agent, IRGACURE I907 manufactured by Ciba-Geigy is recommended, and as the photosensitizing agent, DETX-S manufactured by NIPPON KAYAKU CO., LTD.

Further it is permissible to add a pigment or colorant to the solder resist compound. This is because such an addition can hide the wiring pattern. As such a pigment, it is preferable to use a phthalocyanine green.

As the thermosetting resin added, as a component, as mentioned above, a biphenol type epoxy resin may be used. Such bisphenol type epoxy resins include a biphenol type A type epoxy resin and a biphenol F type epoxy resin and if resistance to bases is regarded as important, the former is preferred. If the path of low viscosity is desirable (if a coating property is to be given priority), the latter is preferable.

As the photosensitive monomer added as a component, as mentioned above, use of a multivalent acrylic base monomer can serve to improve resolution. For example, a multivalent acrylic base monomer manufactured by NIPPON KAYAKU CO, LTD., DPE-6A or KYOEISHA CHEMICAL CO., LTD., R-604 is preferable.

Preferably, these solder resist compositions are 0.5-10 Pa·s at 25° C., and more preferably, 1-10 Pa·s, because a degree of viscosity is secured that allows it to be applied easily with a roll coater. After the solder resist has been formed, an opening is formed. That opening is formed by exposure and development processing. It is acceptable to use a commercially marketed solder resist.

After the solder resist layer has been formed, a composite layer made up of the Ni layer and Pd layer is formed in the portion of the solder resist layer surrounding opening.

As an example, a metal layer containing Ni is formed by electroless plating on a conductor circuit exposed from the solder pad. As examples of a composition of plating solution, nickel sulfate 4.5 g/l, sodium hypophosphite 25 g/l, sodium citrate 40 g/l, boracic acid 12 g/l, thiouric acid 0.1 g/l (PH=11) are available. The portion of the solder resist layer surrounding the opening and the surface are washed with a degreasing solution, and a catalyst such as palladium is applied to a conductor portion exposed in the portion surrounding the opening so as to activate it. By means of dipping in the plating solution, a nickel plating layer is then formed.

After the nickel layer has been formed, the Pd layer is formed on the Ni layer.

As and when necessary, a corrosion resistant layer can be formed on the Pd layer of a metal selected from Au, Ag, Pt and Sn. It is particularly preferable for it to be formed of gold. Depending on the circumstances, two layers may be formed by means of displacement plating with the same metal, and by means of electroless plating. The thickness is preferably 0.01-2μ.

After the solder pad has been formed by producing a corrosion resistant layer on the portion surrounding the opening, a solder paste of a solder that is constituted by a two-component base solder, a three-component base solder or a multi-component base solder is applied onto the portion surrounding the opening by means of printing. After that, it is passed through a nitrogen reflow at 250-350° C. and fixed to a solder pad that is located in the portion surrounding the opening as a solder bump and that to be connected, to the semiconductor device. A solder containing no lead (free of lead) may be used.

Further, a solder layer is formed on the solder pad at an external connecting terminal, and the external connecting terminal (BGA, PGA or the like) is mounted on the solder layer. Further, a component such as a capacitor may be loaded onto the solder layer.

Second Embodiment

Third Embodiment, Fourth Embodiment

As a result of researches by the inventor, a solder pad can be formed with a part of the solder resist layer opened and a composite layer provided on the conductor circuit that has been exposed from the solder pad.

One of the layers making up the composite layer of the present invention is an Ni layer or Ni alloy layer (depending on circumstances, the Ni—Sn alloy layer described above), and the other may be an Ni layer, an intermediate layer or a precious metal layer. These composite layers are disposed on the solder pad and the solder bump and the solder layer are provided so as to achieve an electric connection with the external connecting terminal (BGA, PGA or the like) which connects the semiconductor device or an external board.

Example that can be considered for purposes of forming the Ni layer or the Ni alloy layer as the composite layer, are an Ni layer, an alloy layer formed of Ni and another metal, an Ni—Sn alloy layer containing the Ni layer and Ni—Sn, and an alloy layer containing the Ni layer and Cu—Ni—Sn. Additionally, elements such as In, Bi and P may be contained.

Composite layers of this kind are provided on the conductor circuit on the solder pad and a solder bump is formed on the composite layer by heating treatment such as a reflow. In cases of a solder layer, other electronic components, or external connecting terminals, can be disposed. Consequently, a composite layer (an Ni layer and an Ni alloy layer or an Ni—Sn alloy layer), together with a solder layer or a solder bump are formed on the solder pad. In this context, the Ni alloy layer (or the Ni—Sn alloy layer) can enhance the level of adhesiveness with the solder. In other words, because the Ni alloy reinforces the degree of rigidity, the degree of resistance to pulling can be boosted. As a result, in comparison with a conventional solder pad structure, resistance to peeling can be enhanced.

An Ni alloy layer of this kind can boost the degree of resistance to pulling, irrespective of the size of the layer. In such circumstances, in comparison with a conventional solder pad structure an Ni alloy layer can enhance the degree of resistance to peeling irrespective of the size of the solder pad.

When an Ni layer, an intermediate layer or a precious metal layer are formed as a composite layer examples may include, a nickel layer (an Ni layer), a palladium layer (a Pd layer), a gold layer (an Au layer), and a nickel layer (an Ni layer) and a palladium layer (a Pd layer), and a silver layer (an Ag layer).

If any of such composite layers is provided and a solder layer or solder bumps are provided on the composite layer by reflow, the intermediate layer and the precious metal layer are diffused toward the solder. Thus, an Ni alloy layer composed of Ni and a solder composition metal is formed on an interface between the nickel layer and the solder bump (an Ni alloy layer may include a two-component or three-more component alloy layer composed of Ni and other metals, an Ni—Sn alloy layer containing Ni—Sn and an alloy layer containing Cu—Ni—Sn).

In this context, an Ni alloy layer can enhance the degree of adhesiveness with the solder layer or the solder bump. In other words, because the formation of an Ni alloy layer reinforces the level of rigidity as a solder pad, the level of resistance to pulling can be boosted. As a result, in comparison with a conventional solder pad, reductions in the degree of resistance to peeling can be inhibited.

Irrespective of its size, an Ni alloy layer of this kind inhibits reductions in the level of resistance to pulling. In other words, in comparison with the conventional solder pad structure, an Ni alloy layer inhibits reductions in resistance to peeling irrespective of the size of the solder pad, thus contributing to a rise in the level of resistance to peeling.

An Ni alloy layer may, for example, include a two-component or a three or more component alloy Layer composed of Ni and another metal, an alloy layer containing Ni—Sn, an alloy layer containing Cu—Ni—Sn and the like. Ni alloy layers of this kind reinforce the level of rigidity of the solder layer, or of the solder bump, in the solder pad.

By adjusting the degree of thickness of the Ni alloy layer, in comparison with a conventional solder pad structure, the bonding strength of a solder pad portion composed of a nickel layer, an alloy layer fan Ni alloy layer or an Ni—Sn alloy layer) and a solder layer or a solder bump can be intensified, thereby leading to a rise in the level of resistance to pulling.

The average thickness of an Ni alloy layer or an Ni—Sn alloy layer is preferably between 1.0 and 2.5 µm. Within this range, it becomes difficult for the degree of rigidity of the Ni alloy layer or Ni—Sn alloy layer to decrease, and reductions in the resistance to pulling can be inhibited. Further, reductions in the degree of resistance to pulling can be inhibited, irrespective of the combinations of metals, excepting Ni and Sn, which are chosen.

In this context, an average thickness is set to less than 1.0 µm. If the average thickness exceeds 2.5 µm, in comparison with cases where the thickness of the Ni—Sn alloy layer is within the range mentioned above, the degree of rigidity is inferior. Although the rigidity as an Ni alloy layer, or an Ni—Sn alloy layer can still be secured, and the layers can be used in normal circumstances, the level of resistance to pulling may diminish.

As a result of experiments, it has been discovered that by adjusting the thickness of the Ni layer that serves as the composite layer, and the amount of the content of P therein, or the thickness of the Pd layer and the amount of the content of P therein, the average thickness of the Ni alloy layer, or of the Ni—Sn alloy layer, can be adjusted to 1.0-2.5 µm. In other words, if when the solder bump is formed, the composite layer is an Ni layer and Pa layer, or an Ni layer, Pd layer and precious metal layer, the Pd layer, or the Pd layer and precious metal layer, are diffused so as to form an Ni alloy layer or an Ni—Sn alloy layer. At this time, the thickness of the Ni alloy layer, or of the Ni—Sn alloy layer, can be adjusted by means of the thickness, and the amount of the content of P in the Ni layer, or by means of the thickness, and the amount of the content of P in the Pd layer. Thus, adjustment of the thickness of the Pd layer leads to a change in the thickness of the Ni—Sn alloy layer. Consequently, reductions in the degree of the rigidity of the Ni—Sn alloy layer can be inhibited and at the same time, reductions in the resistance to pulling can also be curbed.

An Ni alloy layer or an Ni—Sn alloy layer is constituted of particles having any one of shapes selected from among sheet-like bodies, column-like bodies and grain-like bodies.

Such a layer may be constituted of a single body selected from among them (for example, lamination in which only sheet-like bodies are laid on top of one another) or may also be of a compound structure thereof (for example, lamination in which sheet-like bodies and column-like bodies are combined). An alloy layer constituted of mainly sheet-like bodies is preferable. Sheet-like bodies allow for a gap to be formed between one sheet-like body and another and can be piled on top of one another. Thus, an alloy layer constituted of mainly sheet-like bodies can secure a degree of rigidity easily, and can also easily secure a degree of resistance to pulling relative to the solder. It is particularly preferable for an alloy layer to be constituted of only sheet-like bodies.

The amount of the content of P (phosphor) in the Ni layer is particularly preferably 0.5-15.0 wt %. If the amount of the content of P is less than 0.5 wt %, or if it exceeds 15.0 wt %, formation of the Ni layer can easily be hampered. Further, promotion of the formation of the Pd layer on the Ni layer can be hindered leading to defects such as a failure of the Pd layer to form errors in the formation of the Pb layer, or on occasions an appropriate degree of rigidity on the part of the Pb layer may not be secured. As a result, electric connectivity or reliability may on occasions not be secured. Although no problem occurs when used as a printed wiring board for ordinary purposes, advantages can accrue from the invention in a printed wiring board when long-term reliability is demanded.

The thickness of the nickel film, and the amount of the content; of phosphor in the nickel film can be adjusted by adjusting factors such as the plating time, the plating temperature, the composition of the plating solution and the PB of the plating solution. Although variations can occur, depending on the size of the bath used for the plating solution, and the flow of the plating solution, it is preferable to seek a correlation with the thickness on the basis of the initial conditions.

P (phosphor) is preferably contained in both the Ni layer and the Pd layer. If phosphor is contained in both, an Ni alloy layer, or an Ni—Sn alloy layer, becomes easy to form and in consequence, it becomes more difficult for the degree of rigidity of the solder bump in the solder pad, or in the alloy layer formed in the solder layer, to deteriorate.

The amount of the content of P (phosphor) in the Ni layer is preferably lower than the amount of the content of P (phosphor) in the Pd layer. In consequence, the Ni layer becomes covered with the Pd layer and separation becomes less likely to be induced in an interface between the Pd layer and the Ni layer. As a result, reductions in the degree of electric connectivity and reliability, resulting from defects in the interface of the solder pad, never occur.

The amount of the content of P (phosphor) in the Ni layer is preferably higher than the amount of the content of P (phosphor) in the Pd layer. In consequence, when an alloy layer is formed by heat treatment of the Pd layer and the Ni layer by means of a solder, it is likely to turn into a sheet-like body and consequently, it becomes easier to secure a desired, or greater degree of rigidity in the solder pad.

If, for example, a Pd layer is used, in the intermediate layer, the Pd layer (palladium layer) can inhibit the occurrence of defects such as the phenomenon of a repellent solder. Thus, in comparison with a conventional solder pad structure, adhesiveness with solder can be enhanced.

The reasons for this are that palladium formed, by plating rarely suffers from defects such as deposition failure, and that in terms of the formation of oxide film the ratio of the front surface of the palladium layer is less than in the case of an Au layer (gold layer). Thus, defects such as the repelling of a solder are induced less frequently, even when a solder is mounted. Further, a solder bump, or a solder layer, of a desired size can be formed within the solder pad. Consequently, adhesiveness between the solder bump or the solder layer and the conductor circuit becomes less likely to diminish because a solder bump, or a solder layer, of a desired size can be formed to a desired size.

Use of the palladium layer facilitates buffering of thermal stress and consequently, the frequency of defects in the solder bump, or in the solder layer, can be reduced, thereby reducing the possibility of deteriorations in the degrees of electric connectivity and reliability.

The reason for this is that the palladium layer has a superior degree of rigidity to that of gold. Thus, thermal stress can be absorbed within the Pd layer and buffered. Consequently, frequency of transmission of stress to the solder bump, or to the solder layer, by means of thermal stress, can be reduced. Thus, the solder bump or the solder layer is unlikely to be damaged. Thus, defects in electric connections stemming from the solder bump, or from the solder layer, become less likely to be induced, and even when reliability tests are performed, long-term reliability can be secured.

Effects of this kind become more pronounced if a solder containing no lead (lead free) is used in the solder bump, or in the solder layer. A solder that is free of lead is inferior to a solder containing lead in terms of the buffering of thermal stress. In the first place, a solder containing lead (for example, Sn/Pd=6:4) buffers stress in the solder concomitantly with the thermal stress generated. The reason for this is that the lead contained in the solder absorbs stress. However, a solder that is free of lead is inferior to a solder containing lead in terms of a force for buffering stress. Thus, by providing a solder pad with a composite layer composed of an Ni layer and a Pd layer, stress can be buffered, throughout the entire solder pad structure. Consequently, adhesiveness of the solder itself is superior to that in a conventional solder pad structure (Ni layer-Au layer), and since stress relative to thermal stress can be buffered more easily, defects, such as destruction and cracking in a solder bump or in a solder layer, that is formed, can be curbed. Thus, this invention can secure degrees of electric connectivity and reliability that are higher than in the case of a type in which a solder that is free of lead is applied to a conventional solder pad structure.

The thickness of an alloy layer including an Ni alloy layer can be controlled, by means of the amount of the content of phosphor (P) in the Pd layer. The amount of P content in the Pd layer is preferably 2-7 wt %. Consequently, an intermediate layer that is formed is unlikely to be porous and the thickness of the film is likely to be uniform. Consequently, an alloy layer such as an Ni alloy layer can be formed easily so that a degree of rigidity of the Ni alloy layer is easy to secure.

If a Pd layer is used for an intermediate layer, the amount of the content of P is preferably 2-7 wt %. If the amount of the content of P in the Pd layer is set within this range, the Pd layer formed is unlikely to be porous and the thickness of the film is likely to be uniform. Consequently, an Ni alloy layer becomes easy to form and because the aforementioned range of thickness can be secured, a degree of rigidity of the Ni alloy layer becomes easiest to secure.

If the amount of the content of P in the Pd layer is less than 2% or if the amount of the content of P in the Pd layer exceeds 7%, the Pd layer cannot be applied, to the Ni layer uniformly and pores will remain in the Pd layer. Although a thick Ni alloy layer becomes likely to be formed and in consequence, an Ni alloy layer that is formed can perform its functions, it does become more difficult to enhance further a degree of rigidity. As an extreme example, the average thickness of an Ni alloy layer can sometimes exceed 2.5 μm.

Further, the degree of rigidity of the Pd layer may on occasions deteriorate, thereby inhibiting the buffering of thermal stress. Thus, stress may on occasions be concentrated on the solder bump, or on the solder layer, thus making more likely defects such as damage or cracking in the solder. Further if reliability tests are performed, it can on occasions become difficult to secure reliability over a prolonged period.

It is desirable that a corrosion resistant layer be provided on an intermediate layer of the composite layer. The reason for this is that provision of such a corrosion resistant layer enables an intermediate layer play a role in promoting the formation of an Ni alloy layer on the Ni layer.

If a Pd layer is used, as an intermediate layer of the composite layer, it is desirable to provide a corrosion resistant layer on the Pd layer. The reason for this is that provision of a corrosion, resistant layer enables it to play a role of promoting the formation of an Ni alloy layer on the Ni layer.

In this context, a corrosion resistant layer is preferably formed of at least one of precious metals selected from among precious metals such as Au, Ag, Pt and Sn. The reason for this is that use of these metals promotes the formation of the Ni alloy layer.

The corrosion resistant layer may further be formed in two stages, by displacement plating with the same metal, by electroless plating or by a combination of displacement plating and electroless plating. Consequently, a metal film is formed that is not affected by the Ni layer which serves as a lower layer and corrosion resistance is accordingly improved, adverse effects on the shape and the functioning of the solder bump can in consequence be mitigated.

It has been discovered that if a corrosion resistant layer is formed of Au, the solder pad that is formed can vary, depending on the ratio of Au used and that in consequence the corrosion resistant property, the adhesiveness of the solder pad, and the shape and the functioning of the solder bump can be enhanced.

The thickness of the corrosion resistant is preferably formed within a range of 0.01-2 μm. It is particularly preferable that the thickness be formed within a range of 0.03-1 μm. If the thickness of the corrosion resistant layer is less than 0.01 μm, formation of the alloy layer is not in some cases promoted in local areas even when an Ni alloy layer is formed. Thus, an Ni alloy layer may in some cases not be formed in local areas and in consequence it becomes more difficult to enhance the rigidity of the Ni alloy layer. As a result, improvements in resistance of the Ni alloy layer peeling become less easy to obtain. However, no special problems occurred in the functioning, performance and reliability of a printed wiring board which is used in a normal way. In contrast, if the thickness of the corrosion resistant layer exceeds 2 μm, the promotion of the formation of the Ni alloy layer may on occasions be hindered by that thickness. Thus, areas may occur in which no Ni alloy layer is formed and in which, it thus becomes difficult to enhance the degree of rigidity of the Ni alloy layer. In consequence, it becomes more difficult to raise the level of resistance of the Ni alloy layer to peeling.

In a three-layer structure of an Ni layer, an intermediate layer and a corrosion resistant layer, it has been discovered that the Ni layer and the intermediate layer exercise most influence on the formation of the Ni alloy layer, followed by the corrosion resistant layer. The presence or otherwise of the corrosion resistant layer has had less influence on the formation of the alloy layer.

An Ni layer constituting the composite layer of the present invention is preferably formed of an alloy metal containing elements such as Ni—Cu, Ni—P, and Ni—Cu—P.

If an Ni layer is formed of a pure Ni film, its plating films need not necessarily be overlaid in all directions, and for this reason fine pores (defects) may on occasions occur. The reason for this is that in the case of an alloy metal, a film is formed evenly by filling in pores. An Ni layer (intermediate)-Pd layer, or an Ni layer-Pd layer-corrosion resistant layer may be formed either physically or chemically, or by a combination of the two methods. Further, such layers may be formed as a single layer, or as two or more layers.

It is particularly preferable that an Ni layer be formed of an alloy metal made up of Ni—P, or of Ni—Cu—P. In other words, the Ni layer should preferably contain P (phosphor). A further reason for this is that even if instances of unevenness are formed on the surface of the conductor circuit, a film with a flattened front layer can be formed by killing those instances of unevenness. Further, if the Ni layer is formed by plating, instances of non-formation of the metal layer, or of errors in the formation of the metal layer caused by non-deposition or by halts in reaction are unlikely to occur in the Ni layer formed.

The conductor circuit on the outermost layer is covered and protected by a solder resist layer.

After a solder resist layer has been formed, a composite layer made up of an Ni layer and a Pd layer, or an Ni layer, an intermediate layer and a corrosion resistant layer, is formed in the portion surrounding the opening.

As an example, a metal layer containing Ni can be formed by electroless plating on a conductor circuit exposed from the solder pad. As an example of a composition of a plating solution, nickel sulfate of 4.5 g/l, sodium hypophosphite of 25 g/l, sodium citrate of 40 g/l, boracic acid of 12 g/l, and thiouric acid of 0.1 g/l (PH=11) are available. The position of the solder resist layer surrounding the opening and the surface can be washed with a degreasing solution, and a catalyst such as palladium can be applied to a conductor portion exposed in the portion surrounding the opening so as to activate it and then, by dipping in the plating solution, a nickel plating layer can be formed.

After the nickel layer has been formed, an intermediate layer (for example, a Pd layer) can be formed on the Ni layer. Next, a corrosion resistant layer is formed of a metal selected from among Au, Ag, Pt and Sn. It is particularly preferable that the corrosion resistant layer be formed of gold. Depending on the circumstances, two layers may be formed, by means of displacement plating with the same metal, and by means of electroless plating. The thickness is preferably 0.01-2μ.

After the corrosion resistant layer has been applied in the portion surrounding the opening so as to form the solder pad, solder paste of a two-component base solder, a three-component base solder or a multi-component base solder is applied onto the portion surrounding the opening by means of printing. Thereafter, the board is passed through nitrogen reflow at a temperature of 250-350° C. so as to fix the solder bump to the solder pad in the portion surrounding the opening.

The solder layer is formed on the solder pad on the external connecting terminal side, and the external connecting terminal (BGA, PGA or the like) is loaded onto the solder layer.

Although the present invention is applied to a build-up printed wiring board, and to a subtraction multilayered board, the same effects can be expected when it is applied to various boards such as a single face circuit board, to a double face circuit board, to a flexible board, flexible board in which a reel-to-reel method is used to a ceramic board and to a AlN board.

BRIEF DESCRIPTION OF THE DRAWINGS

FIGS. 4 (A, B, C, D) are diagrams of a manufacturing process of the multilayered printed wiring board according to the first embodiment of the present invention.

FIGS. 5 (A, B, C) are diagrams of a manufacturing process of the multilayered printed wiring board according to the first embodiment of the present invention.

FIGS. 6 (A, B) are diagrams of a manufacturing process of the multilayered printed wiring board according to the first embodiment of the present invention.

FIG. 7 (A, B) are diagrams of a manufacturing process of the multilayered printed wiring board according to the first embodiment of the present invention.

FIG. 8(A) is a schematic diagram illustrating the circular portion A in FIG. 7(B) in an enlarged form, and FIG. 8(B) is a schematic diagram illustrating the circular portion B in FIG. 1 in an enlarged form.

FIG. 14(A) is a schematic diagram illustrating the circular portion A in FIG. 12(B) in an enlarged form and FIG. 14(B) is a schematic diagram illustrating the circular portion B in FIG. 9 in an enlarged form.

FIG. 17 contains electron microscopic pictures of a Cu—Ni—Sn alloy layer.

FIGS. 22 (A, B, C) are diagrams of a manufacturing process of the multilayered printed wiring board according to the third embodiment.

FIGS. 23 (A, B) are diagrams of a manufacturing process of the multilayered printed wiring board according to the third embodiment.

FIG. 24(A) is a schematic diagram illustrating the circular portion A in FIG. 23(B) in an enlarged form and FIG. 24(B) is a schematic diagram illustrating the circular portion A in FIG. 21 in an enlarged form.

FIG. 29(A) is a schematic diagram illustrating the circular portion B in FIG. 29(A) in an enlarged form and FIG. 29(B) is a schematic diagram illustrating the circular portion A in FIG. 27 in an enlarged form.

FIG. 30(A) illustrates a case where P is provided while FIG. 30(B) illustrates a case where no P is provided.

FIG. 31 is a table showing parameters of the first embodiment.

FIG. 32 is a table showing parameters of the first embodiment.

FIG. 33 is a table showing parameters of the first embodiment.

FIG. 34 is a table showing parameters of the second embodiment.

FIG. 35 is a table showing parameters of the second embodiment.

FIG. 36 is a table showing parameters of the second embodiment.

FIG. 37 is a table showing parameters of a first reference example.

FIG. 38 is a table showing parameters of a second reference example.

FIG. 39 is a table showing parameters of the third embodiment.

FIG. 40 is a table showing parameters of the third embodiment.

FIG. 41 is a table showing parameters of the third embodiment.

FIG. 42 is a table showing parameters of the fourth embodiment.

FIG. 43 is a table showing parameters of the fourth embodiment.

FIG. 44 is a table showing parameters of the fourth embodiment.

FIG. 45 is a table showing parameters of a third reference example.

FIG. 46 is a table showing parameters of a fourth reference example.

FIG. 47 is a table showing parameters of a comparative example.

FIG. 48 is a table showing test results of the first embodiment.

FIG. 49 is a table showing test results of the first embodiment.

FIG. 50 is a table showing test results of the first embodiment.

FIG. 51 is a table showing test results of the second embodiment.

FIG. 52 is a table showing test results of the second embodiment.

FIG. 53 is a table showing test results of the second embodiment.

FIG. 54 is a table showing test results of the first reference example.

FIG. 55 is a table showing test results of the second reference example.

FIG. 56 is a table showing test results of the third reference example.

FIG. 57 is a table showing test results of the third reference example.

FIG. 58 is a table showing test results of the third reference example.

FIG. 59 is a table showing test results of the fourth embodiment.

FIG. 60 is a table showing test results of the fourth embodiment.

FIG. 61 is a table showing test results of the fourth embodiment.

FIG. 62 is a table showing test results of the third reference example.

FIG. 63 is a table showing test results of the fourth reference example.

FIG. 64 is a table showing test results of the comparative example.

FIGS. 65 (A, B) are graphs showing a correlation between palladium thickness and strength.

FIGS. 66 (A, B) are graphs showing a correlation between the amount of the content of phosphor in palladium and strength.

FIGS. 67 (A, B) are graphs showing a correlation between nickel thickness and strength.

FIGS. 68 (A, B) are graphs showing a correlation between the amount of the content of phosphor in nickel and strength.

BEST MODES FOR CARRYING OUT THE INVENTION

Embodiment 1

Figure 1:
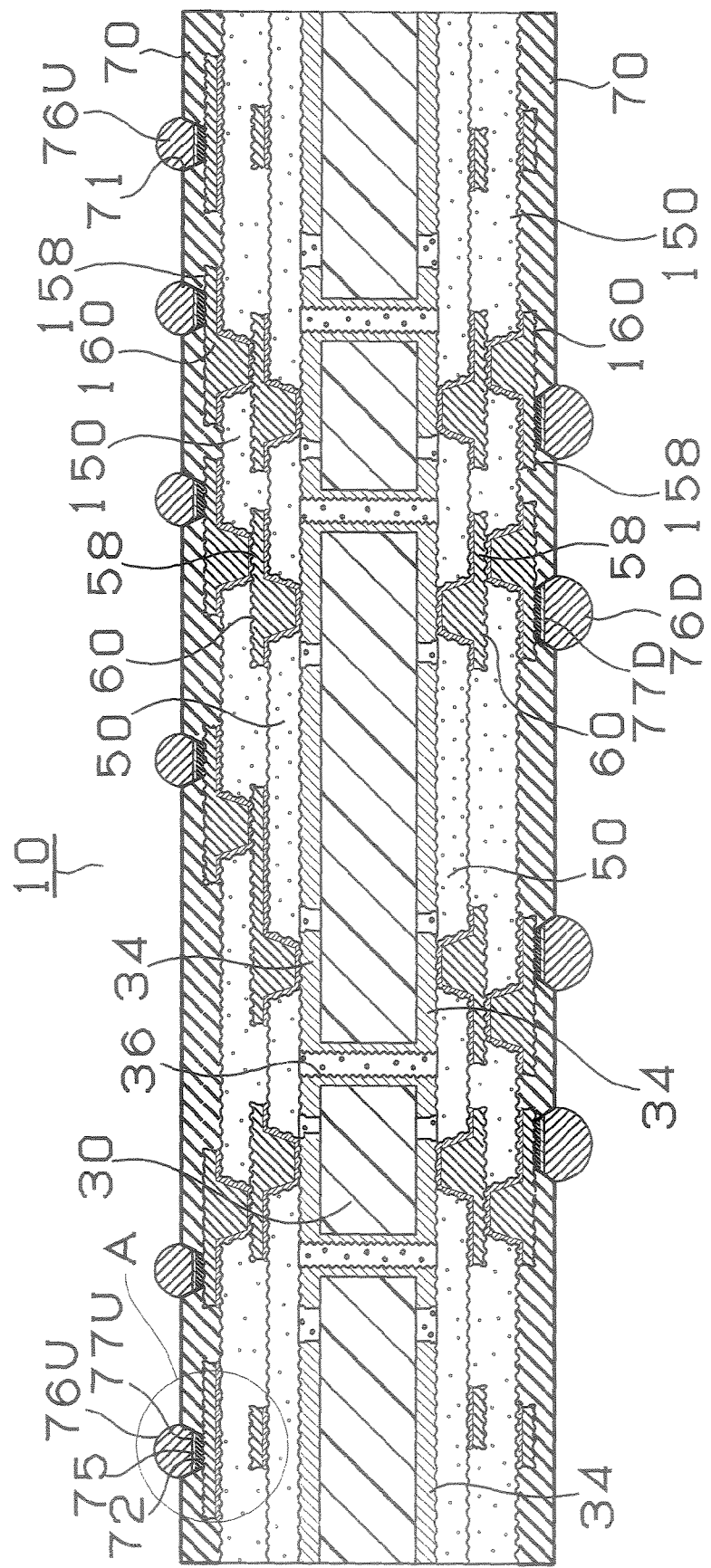
FIG. 1 is a sectional view of a multilayered printed wiring board according to a first embodiment of the present invention.
Figure 2:
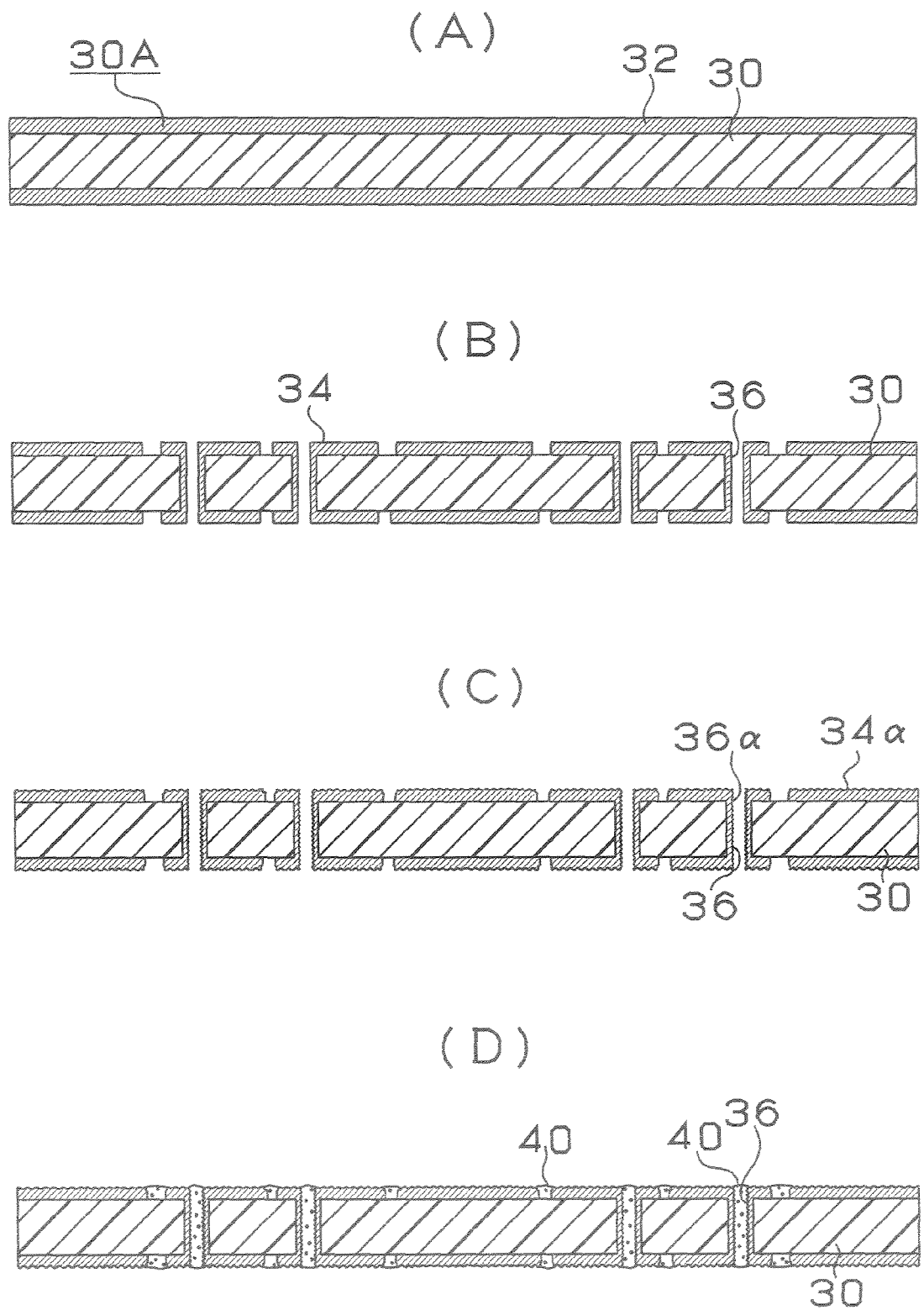
FIGS. 2 (A, B, C, D) are diagrams of a manufacturing process of the multilayered printed wiring board according to the first embodiment of the present invention.
Figure 3:
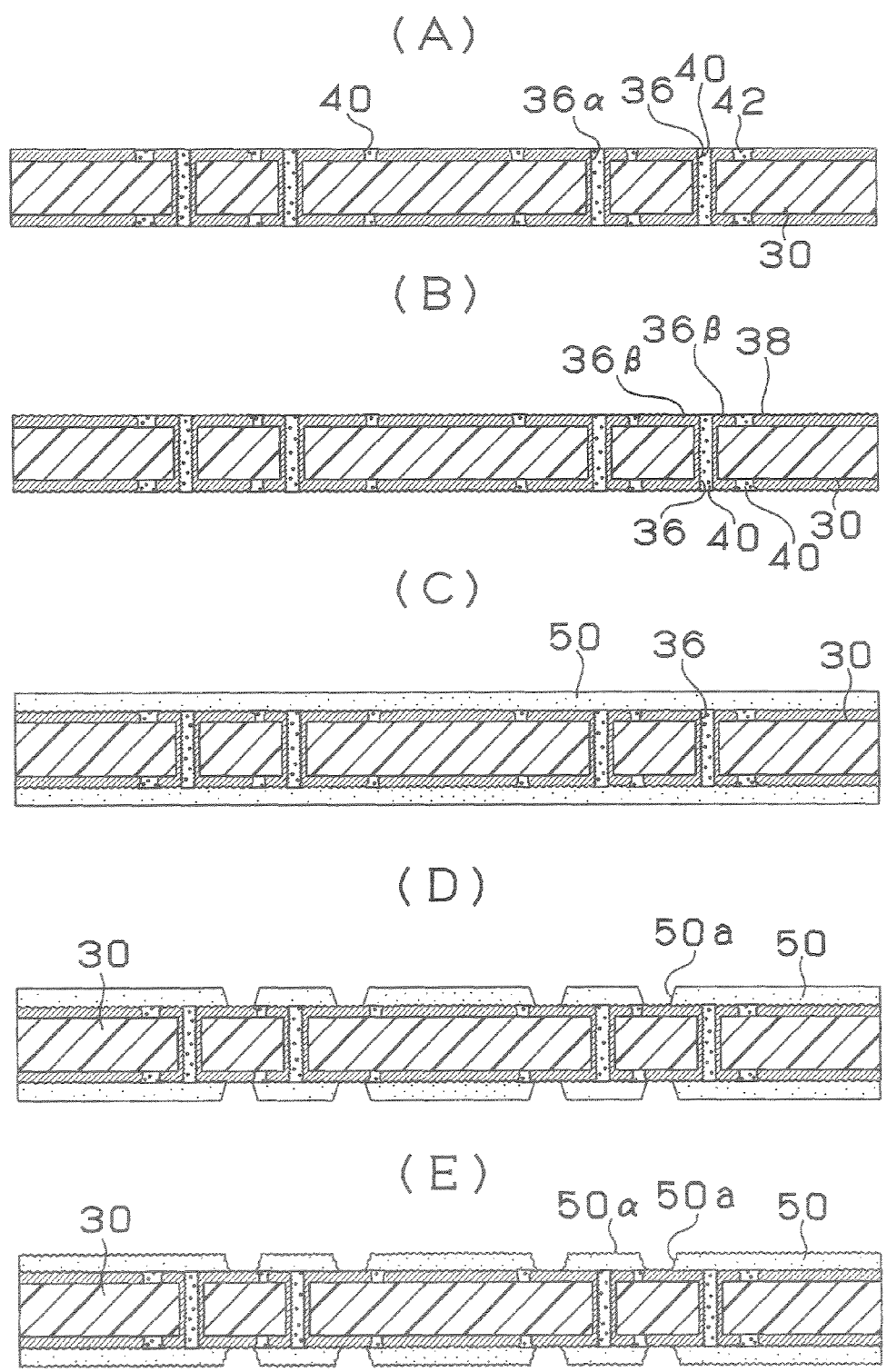
FIGS. 3 (A, B, C, D, E) are diagrams of a manufacturing process of the multilayered printed wiring board according to the first embodiment of the present invention.

The configuration of a multilayer printed wiring board 10 according to Embodiment 1 of the present invention will first be described with reference to FIG. 1 showing the cross section thereof. The multilayer printed wiring board 10 has a conductor circuit 34 formed on the front surface of a core substrate 30. The front and rear surfaces of the core substrate 30 are connected to each other via through holes 36. In addition, an interlayer resin insulating layer 50 on which via holes 60 and conductor circuits 58 are formed and an interlayer resin insulating layer 150 on which via holes 160 and conductor circuits 158 are formed are provided on the both surfaces of the core substrate 30. Solder resist layers 70 are formed on upper layers of the via holes 160 and the conductor circuits 158, and solder pads 77U and 77D are formed on the conductor circuits 158 through the opening portions 71 of the solder resist layers 70, respectively. Bumps 76U and 76D are formed on the solder pads 77U and 77D.

Next, the solder pads 76U will be described with, referring to FIG. 8. FIG. 8(B) enlarged shows circle A part of multilayer printed circuit board 10 in FIG. 1. Nickel plated layer 72 is formed on conductor circuit 158. The conductor circuit 158 is connected to solder layer (bump) 46 via Ni—Sn alloy layer 75 on nickel plated layer 72. In embodiment 1, by controlling the average thickness of Ni—Sn alloy layer 75, the occurrence of the breakage in the interface between the nickel plated layers 72 and the solder layer 46 can be reduced. Thereby, the strength and adhesion of solder layer 46 can be improved.

A method for manufacturing the multilayer printed wiring board 10 described above will next be described with reference to FIGS. 2 to 8.

A. Manufacturing of Resin Film of Interlayer Resin Insulating layer 30 parts by weight of bisphenol A type epoxy resin (epoxy equivalent weight of 469, Epicoat 1001 manufactured by Yuka Shell Epoxy), 40 parts by weight of cresol novolac type epoxy resin (epoxy equivalent weight of 215, EpiclonN-673 manufactured by Dainippon Ink and Chemicals) and 30 parts by weight of phenol novolac resin including a triazine structure (phenol hydroxyl group equivalent weight of 120, PhenoliteKA-7052 manufactured by Dainippon Ink and Chemicals) are heated and molten while being agitated with 20 parts by weight of ethyl diglycol acetate and 20 parts by weight of solvent naphtha, and 15 parts by weight of terminally epoxidized polybutadiene rubber (DenalexR-45EPT manufactured by Nagase Chemicals Ltd.) and 1.5 parts by weight of crushed product of 2-phenyl-4,5-bis(hydroxymethyl) imidazole, 2 parts by weight of pulverized silica and 0.5 parts by weight of silicon-based defoaming agent are added thereto, thereby preparing an epoxy resin composition.

The obtained epoxy resin composition is coated on a PET film having a thickness of 38 µm so as to have a thickness of 50 µm after being dried by a roll coater and dried for 10 minutes at 80 to 120° C., thereby manufacturing a resin film for an interlayer resin insulating layer.

B. Preparation of Resin Filler 100 parts by weight of bisphenol F type epoxy monomer (manufactured by Yuka Shell, molecular weight: 310, YL983U), 170 parts by weight of $SiO_2$ spheroidal particles having a silane coupling agent coated on surfaces thereof, a mean particle size of 1.6 µm, and a largest particle size of not more than 15 µm (manufactured by ADTEC Corporation, CRS 1101-CE) and 1.5 parts by weight of leveling agent (manufactured by Sannopuko KK, PelenolS4) are input in a container and agitated and mixed therein, thereby preparing resin filler having a viscosity of 44 to 49 Pa·s at 23±1° C. As hardening agent, 6.5 parts by weight of imidazole hardening agent (manufactured by Shikoku Chemicals, 2E4MZ-CN) is used. As the resin filler, thermosetting resin such as the other epoxy resin (e.g., bisphenol A type, novolac type or the like), polyimide resin or phenol resin may be used.

C. Manufacturing of Multilayer Printed Wiring Board (1) A copper-clad laminate 30A having 18 µm copper foils 32 laminated on the both surfaces of a 0.8 mm insulative substrate 30 made of glass epoxy resin or BT (Bismaleimide-Triazine) resin, respectively, is used as a starting material (FIG. 2(A)). First, this copper-clad laminate 30A is drilled, subjected to an electroless plating treatment and an electroplating treatment, and etched into a pattern to thereby form lower layer conductor circuits 34 on the both surfaces of the substrate, and through holes 36 (FIG. 2(B)).

(2) After washing and drying the substrate having the through holes and the lower layer conductor circuits formed thereon, an oxidization treatment using an aqueous solution containing NaOH (10 g/l), NaClO2 (40 g/l) and Na3PO4 (6 g/l) as a blackening bath (an oxidation bath) and a reduction treatment using an aqueous solution containing NaOH (10 g/l) and NaBH4 (6 g/l) as a reduction bath are conducted to the substrate 30, thereby respectively forming roughened surfaces 36a, 34α on the entire surfaces of the conductor circuits 34 including through holes 36 (FIG. 2(C)).

(3) After preparing the resin filler described in B above, within 24 hours of preparation, according to the following method, layers of the resin filler 40 are formed in the through holes 36 and on the lower layer conductor circuits unformed portions and outer edges of the one side of substrate.

Namely, a resin filling mask having openings in portions corresponding to the through holes 36 and the lower layer conductor circuit 34 unformed portions is put on the substrate, and the resin filler 40 is filled into the through holes, depressed the lower layer conductor circuits unformed portions and the outer edges of the lower layer conductor circuits with a squeegee and then dried at 100° C. for 20 minutes (FIG. 2(D)).

(4) One of the surfaces of the substrate which has been subjected to the treatment of (3) is polished by belt sander polishing using #600 belt abrasive paper (manufactured by Sankyo Rikagaku Co.) so as not to leave the resin filler 40 on the outer edges of the lower layer conductor layers 34 and those of the lands of the through holes 36, and the entire surfaces of the lower layer conductor layers 34 (including the land surfaces of the through holes) are then buffed to remove scratches caused by the belt sander polishing. A series of these polishing treatments are similarly conducted to the other surface of the substrate. The resin filler 40 is then heated at 100° C. for 1 hour and at 150° C. for 1 hour and hardened (FIG. 3(A)).

As a result, a substrate in which the surface layer portions of the resin fillers 40 formed in the through holes 36 and on the conductor circuit unformed portions and the surfaces of the lower layer conductor layers 34 are flattened, the resin fillers 40 are fixedly attached to the side surfaces of lower layer conductor layers 34 through the roughened surfaces and the inner wall surfaces of the through holes 36 are fixedly attached to the resin fillers through the roughened surfaces, is obtained. That is to say, through the steps, the surfaces of the resin fillers become almost flush with those of the lower layer conductor circuits.

(5) After washing and acid-degreasing the substrate, soft etching is conducted to the substrate and etchant is sprayed onto the both surfaces thereof to etch the surfaces of the lower layer conductor circuits 34, and the land surfaces of the through holes 36, thereby forming roughened surfaces 36β on the entire surfaces of the respective lower layer conductor circuits 34 (see FIG. 3(B)). As the etchant, etchant (manufactured by Mech Corporation, Mech-Etch Bond) comprising 10 parts by weight of an imidazole copper (II) complex, 7 parts by weight of glycolic acid and 5 parts by weight of potassium chloride is used.

(6) Interlayer resin insulating layer resin films slightly larger than the substrate manufactured in A are put on the both surfaces of the substrate, respectively, temporarily press-fitted under conditions of pressure of 0.4 MPa, a temperature of 80° C. and press-fit time of 10 seconds and cut, and then bonded using a vacuum laminator by the following method, thereby forming interlayer resin insulating layers 50 (FIG. 3(C)). Namely, the interlayer resin insulating layer resin films are actually press-fitted onto the substrate under conditions of vacuum of 67 Pa, pressure of 0.4 MPa, a temperature of 80° C. and press-fit time of 60 seconds, and then thermally hardened at 170° C. for 30 minutes.

(7) Next, through a mask having pass-through holes having a thickness of 1.2 mm formed therein, openings 50a for via holes are formed to have a diameter of 80 μm in the interlayer resin insulating layers 50 by a CO2 gas laser at a wavelength of 10.4 μm under conditions of a beam diameter of 4.0 mm, a top hat mode, a pulse width of 8.0 microseconds, the pass-through hole diameter of the mask of 1.0 mm and one shot (FIG. 3(D)).

(8) The substrate having the via hole openings 50a formed therein is immersed in a solution containing 60 g/l of permanganic acid at a temperature of 80° C. for 10 minutes to melt and remove epoxy resin particles existing or the surfaces of the interlayer resin insulating layers 50, thereby forming roughened surfaces on the surfaces of the respective interlayer resin insulating layers 50 including the inner walls of the via hole openings 50a (FIG. 3(E)).

(9) Next, the substrate which has been subjected to the above-stated treatments is immersed in neutralizer (manufactured by Shipley Corporation) and then washed. Further, a palladium catalyst is added to the surfaces of the roughened substrate (a roughening depth of 3 μm), thereby attaching catalyst nuclei to the surfaces of the interlayer resin insulating layers 50 and the inner wall surfaces of the via hole openings 50a (Not shown in Figs.). Namely, the substrate is immersed in a catalytic solution containing palladium chloride (PbCl2) and stannous chloride (SnCl2) and palladium metal is precipitated, thereby attaching the catalyst.

(10) The substrate to which the catalyst is attached is immersed in an electroless copper plating aqueous solution having the following composition and electroless copper plated films having a thickness of 0.6 to 3.0 μm are formed on the entire roughened surfaces, thereby obtaining the substrate having electroless copper plated films 52 formed on the surfaces of the interlayer resin insulating layers 50 including the inner walls of the via hole openings 50a (FIG. 4(A)).

| [Electroless plating aqueous solution] | |
| --- | --- |
| NiSO4 | 0.003 mol/l |
| Tartaric acid | 0.200 mol/l |
| Copper sulfate | 0.030 mol/l |
| HCHO | 0.050 mol/l |
| NaOH | 0.100 mol/l |
| α,α'-bipyridyl | 100 mg/l |
| Polyethylene glycol (PEG) | 0.10 g/l |

Electroless Plating Conditions 40 minutes and a solution temperature of 34° C.

(11) Commercially available sensitive dry films are bonded to the substrate on which the electroless copper plated films 52 are formed, a mask is put on the substrate, the substrate is exposed at 100 mJ/cm² and developed with a 0.8% sodium carbonate aqueous solution, thereby providing plating resists 54 having a thickness of 20 μm (FIG. 4(B)).

(12) Next, the substrate is cleaned and degreased with water at 50° C., washed with water at 25° C., cleaned with sulfuric acid and electroplated under the following conditions.

| [Electroplating solution] | |
| --- | --- |
| Sulfuric acid | 2.24 mol/l |
| Copper sulfate | 0.26 mol/l |
| Additive (Kalapacid GL manufactured by Atotech Japan) | 19.5 ml/l |

| [Electroplating conditions] | |
|---|---|
| Current density | 1 A/dm$^2$ |
| Time | 65 minutes |
| Temperature | 22 ± 2° C. |

Thereby forming electroplated copper films 56 having a thickness of 20 μm on portions on which the plating resists 54 are not formed (FIG. 4(C)).

(13) After peeling off the plating resists 54 with 5% KOH, the electroless plated films 52 under the plating resist 54 are etched, molten and removed with a solution mixture of sulfuric acid and hydrogen peroxide, thus forming independent upper layer conductor circuits 58 and via holes 60 (FIG. 4(D)).

(14) The same treatment as that of (5) is performed to form roughened surfaces 58α and 60α on the surfaces of the conductor circuits 58 and the via holes 60 (FIG. 4(A)).

(15) The steps (6) to (14) stated above are repeated, thereby forming further upper layer interlayer resin insulating layers 150 having conductor circuits 158 and via holes 160, and a multilayer wiring board is obtained (FIG. 5(B)).

(16) Next, 46.67 parts by weight of oligomer (molecular weight: 4000) which is obtained by forming 50% of epoxy groups of 60 parts by weight of ere sol novolac type epoxy resin (manufactured, by Nippon Kayaku Co., Ltd.) dissolved in diethylene glycol, dimethyl ether (DMDG) into an acrylic structure and which imparts photosensitive characteristic, 15.0 parts by weight of 80 wt % of bisphenol A type epoxy resin (manufactured by Yuka Shell, product name: Epicoat 1001) dissolved in methylethyl ketone, 1.6 parts by weight of imidazole hardening agent (manufactured by Shikoku Chemicals, product name: 2E4MZ-CN), 4.5 parts by weight of bifunctional acryl monomer which is photosensitive monomer (manufactured by Kyoei Chemical, product name: R604), 1.5 parts by weight of polyhydric acryl monomer (manufactured by Kyoei Chemical, product name: DPE6A), and 0.71 parts by weight of dispersing defoaming agent (manufactured by Sannopuko KK, product name: S-65) are input in the container, agitated and mixed to prepare a mixture composition. 2.0 parts by weight of benzophenone (manufactured by Kanto Chemical) serving as photoinitiator and 0.2 parts by weight of Michler's ketone (manufactured by Kanto Chemical) serving as photosensitizer are added to the mixture composition, thereby obtaining a solder resist composition adjusted to have a viscosity of 2.0 Pa·s at 25° C.

The viscosity is measured by using the No. 4 rotor of a B-type viscometer (manufactured by Tokyo Keiki, DVL-B type) when the velocity is 60 min-1, and using the No. 3 rotor thereof when the velocity is 6 min-1.

(17) Next, after the above-stated solder resist composition 70 is coated on each surface of the multilayer wiring board by a thickness of 30 μm (FIG. 5(C)), and dried under conditions of 70° C. for 20 minutes and 70° C. for 30 minutes, a photomask on which a pattern of solder resist opening portions are drawn and which has a thickness of 5 mm, is fixedly attached to each solder resist layer 70, exposed with ultraviolet rays of 800 mJ/cm$^2$, and developed with a DMTG solution, thereby forming opening portions 71 having a diameter of 150 μm (FIG. 6(A)).

Further, heat treatments are conducted at 100° C. for 1 hour, and at 150° C. for 3 hours, respectively, to harden the solder resist layers, thus forming solder resist layers 20 each having opening portions and a thickness of 20 μm. As the solder resist composition, a commercially available solder resist composition can be also used.

(18) Next, nickel plated layers are formed on the solder pads of the substrate having the solder resist layers 70.

| [Nickel plating aqueous solution] | |
|---|---|
| nickel chloride | 2.3 × 10$^{-1}$ mol/l |
| sodium hypophosphite | 1.8 to 4.0 × 10$^{-1}$ mol/l |
| sodium citrate | 1.6 × 10$^{-1}$ mol/l |
| pH of 4.5 | |
| temperature of 40 to 60° C. | |

The substrate is immersed in the electroless nickel plating solution for 5 to 40 minutes, thereby forming nickel plated layers 72 in the opening portions 71 (FIG. 6(B)). In the Embodiment 1, nickel plated layers 72 are adjusted so as to have a thickness of 0.03 to 10 μm, to include 0.4 to 17 wt % of P. The thickness and the P content of the nickel plated layers are adjusted in considering the value of a plating tub and plating solution circulation.

(19) Thereafter, palladium layers are formed on the solder pads on which the nickel plated layers have been formed in step (18) of the substrate.

| [Palladium plating aqueous solution] | |
|---|---|
| palladium chloride | 1.0 × 10$^{-2}$ mol/l |
| ethylenediamine | 8.0 × 10$^{-2}$ mol/l |
| sodium hypophosphite | 4.0 to 6.0 × 10$^{-2}$ mol/l |
| thiodiglycolic acid | 30 mg/l |
| pH of 8 | |
| temperature of 50 to 60° C. | |

The substrate is immersed in the electroless palladium plating solution for 3 to 10 minutes, thereby forming palladium plated layers 73 having a thickness of 0.08 μm on the nickel plated layers 72 (FIG. 7(A)). In the Embodiment 1, palladium plated layers 73 are adjusted so as to have a thickness of 0.008 to 2.0 μm, to include 1 to 8 wt % of P. The thickness and the P content of the palladium plated layers are adjusted in considering the value of a plating tub and plating solution circulation.

(20) Solder paste 76α is printed on solder pads 77U, 77D in each opening 71 of the solder resist layer 70 (FIG. 7(B)). The solder pad 77U in the circle A in FIG. 7(B) is enlarged shown in FIG. 8(A). The solder pad 77U consists of the multi-layers, that is, the two layers comprise nickel plated layers 72-palladium plated layers 73 which have been formed in turn on the conductor circuit 158.

(21) Thereafter, solder bumps 76U, 76D are formed by conducting reflow at 250° C. in nitrogenous atmosphere (FIG. 1). The solder pad 77U in the circle B in FIG. 1 is enlarged shown in FIG. 8(B). During the reflow, palladium plated layers 73 almost diffuse into solder bumps 76U, 76D, Cu—Ni—Sn alloy layer 75 or Ni layer alloy layer is formed in the interface between nickel plated layers 72 and solder bumps 76U, 76D as shown in FIG. 1 and FIG. 8(B).

Here, the nickel plated layers 72 is adjusted so as to have the thickness of 0.05 to 7 μm and the P content is adjusted to 0.4 to 17 wt % which is lower or higher than thereof the palladium layers. And the palladium plated layers 73 is adjusted so as to have thickness of 0.01 to 1.0 μm and the P content is adjusted to 2 to 7 wt %. Thereby, the average thickness of Cu—Ni—Sn alloy layer 75 is controlled between 1.0 and 2.5 μm.

Embodiment 1-1-1

Figure 15:
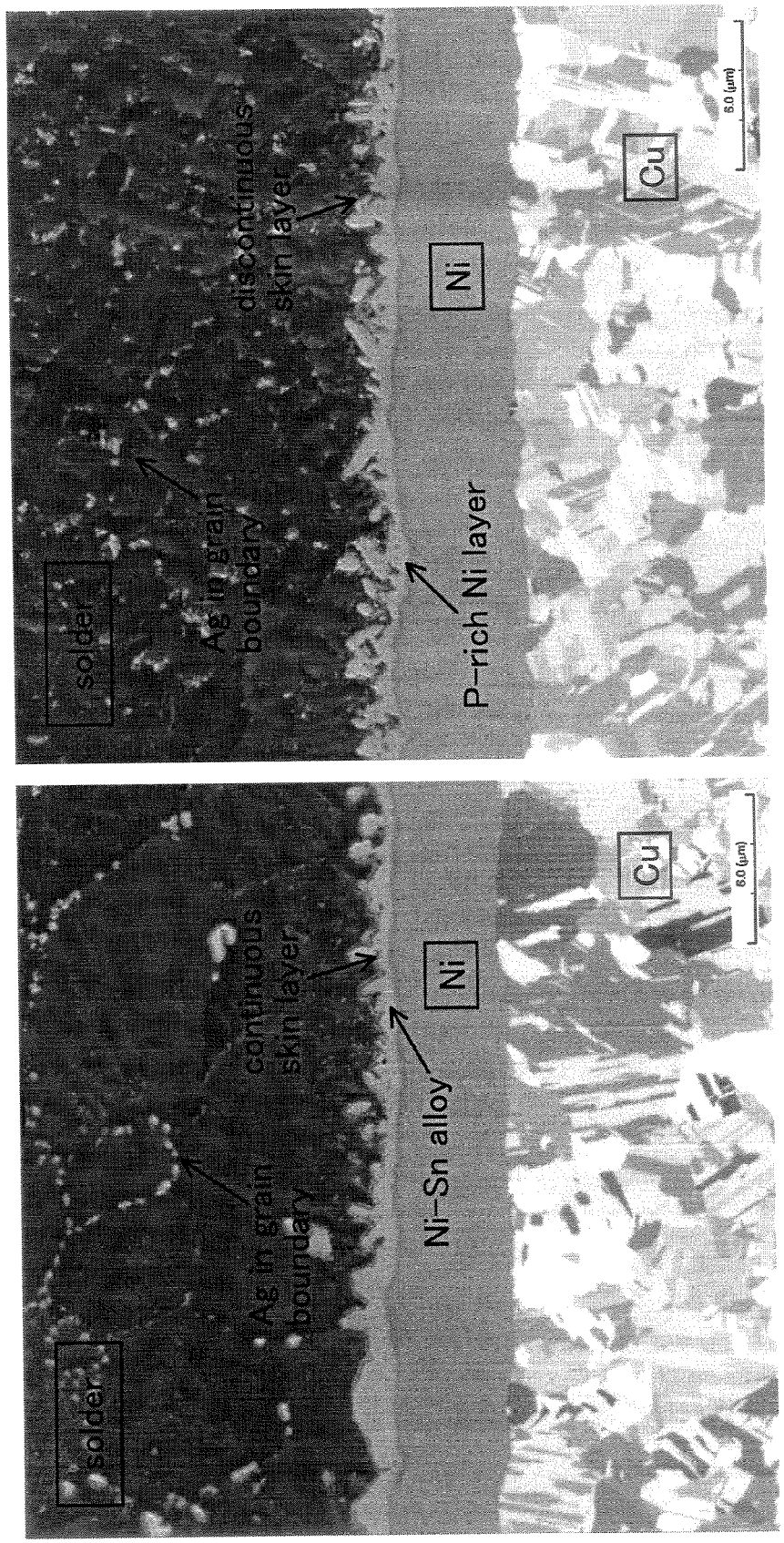
FIG. 15 contains electron microscopic pictures of a nickel layer, a Cu—Ni—Sn alloy layer and a solder.
Figure 16:
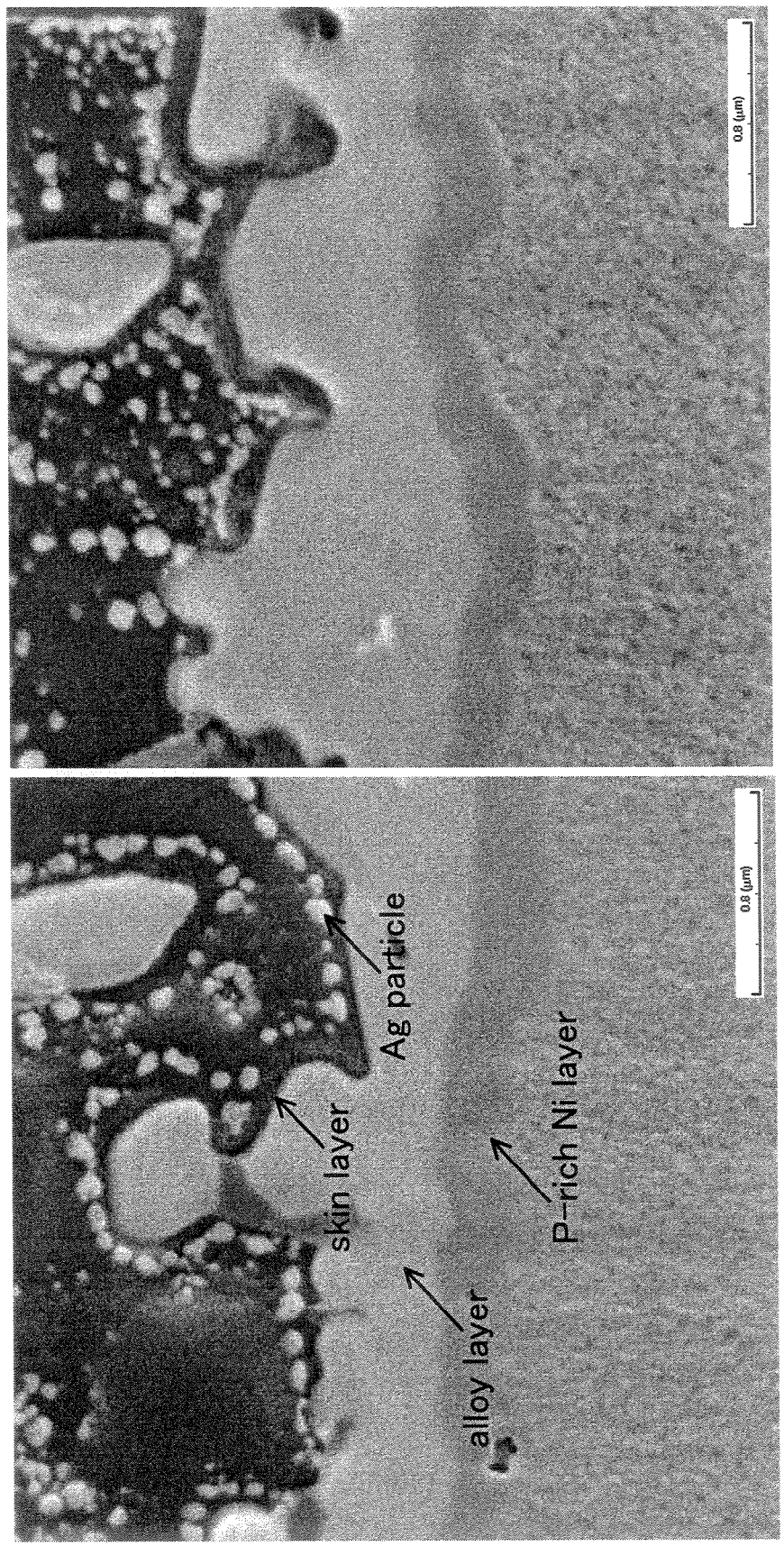
FIG. 16 contains electron microscopic pictures of a Cu—Ni—Sn alloy layer.
Figure 18:
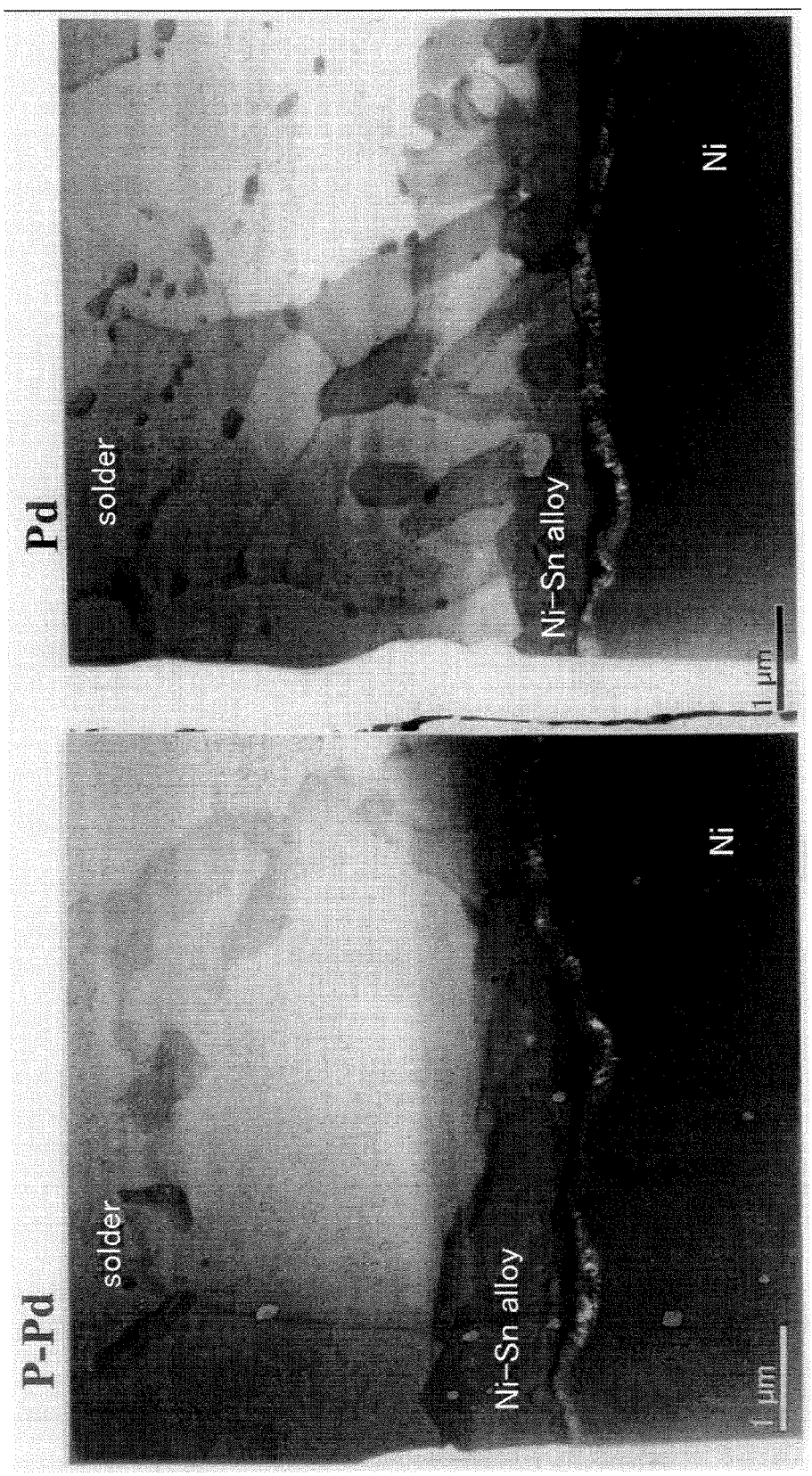
FIG. 18 contains transmission type electron microscopic pictures of a Cu—Ni—Sn alloy layer.

In embodiment 1-1-1, an alloy of Cu: 0.5 wt %, Ag: 3.5 wt %, Sn: 95 wt % is used as a solder consisting of the solder bump. Ni layer is formed as thickness 5 μm, P content 1.2 wt %. On the other hand, Pd layer is formed as thickness 0.5 μm, P content 5 wt %. Therefore, the composition of the Ni—Sn alloy layer becomes Sn:Cu:Ni=42:37:21, the thickness becomes 1.5 μm. Electron microscope pictures of Ni layer, Cu—Ni—Sn alloy and solder in embodiment 1-1-1 are shown in FIGS. 15-18. The electron microscope picture (×20 k) in the left side of FIG. 15 shows embodiment 1-1-1. The electron microscope pictures (×100 k) in the left sides of FIG. 16, 17 are a more enlarged, scale. The right sides of electron microscope pictures in FIGS. 15, 16, 17 show Pd layers which do not contain P in reference example 1-1-1. The lower side is the Ni layer and the upper side is the solder and the interface between the Ni layer and the solder is the Cu—Ni—Sn alloy. As shown in the electron microscope picture in the left side of FIG. 15, in embodiment 1-1-1, the Cu—Ni—Sn alloy is consecutively formed on the surface of Ni layer, that is, is slightly Ups and downs. As shown in the electron microscope pictures in the left sides of FIG. 16, 17 using enlarged scale, Ag particles uniformly exist on the surface of the Cu—Ni—Sn alloy through skin layer of Sn. In embodiment 1-1-1, as shown in the permeation type electron microscope picture in the right side of FIG. 18, the Ni—Cu—Sn alloy layer is typically a board-shaped form, that is, formed in parallel with the Ni layer.

Embodiment 1-1-2

In embodiment 1-1-2, an alloy of Cu: 0.5 wt %, Ag: 3.5 wt %, Sn: 95 wt % is used as a solder consisting of the solder bump. Ni layer is formed as thickness 5 μm, P content 1.2 wt %. On the other hand, Pd layer is formed as thickness 0.01 μm, P content 2 wt %. Therefore, the composition of the Ni—Sn alloy layer becomes Sn:Cu:Ni=42:37:21, the thickness becomes 1.8 μm. The Ni—Sn alloy layer is typically a board-shaped form.

Embodiment 1-1-3

In embodiment 1-1-3, an alloy of Cu: 0.5 wt %, Ag: 3.5 wt %, Sn: 95 wt % is used as a solder consisting of the solder bump. Ni layer is formed as thickness 5 μm, P content 1.2 wt %. On the other hand, Pd layer is formed as thickness 0.01 μM, P content 7 wt %. Therefore, the composition of the Ni—Sn alloy layer becomes Sn:Cu:Ni=42:37:21, the thickness becomes 1.8 μm. The Ni—Sn alloy layer is typically a board-shaped form.

Embodiment 1-1-4

In embodiment 1-1-4, an alloy of Cu: 0.5 wt %, Ag: 3.5 wt %, Sn: 95 wt % is used as a solder consisting of the solder bump. Ni layer is formed as thickness 5 μm, P content 1.2 wt %. On the other hand, Pd layer is formed as thickness 1.0 μm, P content 2 wt %. Therefore, the composition of the Ni—Sn alloy layer becomes Sn:Cu:Ni=42:37:21, the thickness becomes 1.5 μm. The Ni—Sn alloy layer is typically a board-shaped form.

Embodiment 1-1-5

In embodiment 1-1-5, an alloy of Cu: 0.5 wt %, Ag: 3.5 wt %, Sn: 95 wt % is used as a solder consisting of the solder bump. Ni layer is formed as thickness 10 μm, P content 0.5 wt %. On the other hand, Pd layer is formed as thickness 1.0 μm, P content 7 wt %. Therefore, the composition of the Ni—Sn alloy layer becomes Sn:Cu:Ni=42:37:21, the thickness becomes 1.5 μm. The Ni—Sn alloy layer is typically a board-shaped form.

Embodiment 1-1-6

In embodiment 1-1-6, an alloy of Cu: 0.5 wt %, Ag: 3.5 wt %, Sn: 95 wt % is used as a solder consisting of the solder bump. Ni layer is formed as thickness 10 μm, P content 5 wt %. On the other hand, Pd layer is formed as thickness 0.01 μm, P content 7 wt %. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 1-1-7

In embodiment 1-1-7, an alloy of Cu: 0.5 wt %, Ag: 3.5 wt %, Sn: 95 wt % is used as a solder consisting of the solder bump. Ni layer is formed as thickness 0.05 μm, P content 0.5 wt %. On the other hand, Pd layer is formed as thickness 1 μm, P content 7 wt %. Therefore, the composition of the Ni—Sn alloy layer becomes Sn:Cu:Ni=42:37:21, the thickness becomes 1.7 μm, The Ni—Sn alloy layer is typically a board-shaped form.

Embodiment 1-1-8

In embodiment 1-1-8, an alloy of Cu: 0.5 wt %, Ag: 3.5 wt %, Sn: 95 wt % is used as a solder consisting of the solder bump. Ni layer is formed as thickness 0.05 μm, P content 5 wt %. On the other hand, Pd layer is formed as thickness 0.01 μm, P content 3 wt %. Therefore, the composition of the Ni—Sn alloy layer becomes Sn:Cu:Ni=42:37:21, the thickness becomes 1.8 μm. The Ni—Sn alloy layer is typically a board-shaped form.

Embodiment 1-1-9

In embodiment 1-1-9, an alloy of Cu: 0.5 wt %, Ag: 3.5 wt %, Sn: 95 wt % is used as a solder consisting of the solder bump. Ni layer is formed as thickness 0.3 μm, P content 0.5 wt %. On the other hand, Pd layer is formed as thickness 0.01 μm, P content 2 wt %. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 1-1-10

In embodiment 1-1-10, an alloy of Cu: 0.5 wt %, Ag: 3.5 wt %, Sn: 95 wt % is used as a solder consisting of the solder bump. Ni layer is formed as thickness 0.3 μm, P content 0.5 wt %. On the other hand, Pd layer is formed as thickness 1 μm, P content 2 wt %. Therefore, the composition of the Ni—Sn alloy layer becomes Sn:Cu:Ni=42:37:21, the thickness becomes 1.6 μm. The Ni—Sn alloy layer is typically a board-shaped form.

Embodiment 1-1-11

In embodiment 1-1-11, an alloy of Cu: 0.5 wt %, Ag: 3.5 wt %, Sn: 95 wt % is used as a solder consisting of the solder bump. Ni layer is formed as thickness 0.3 μm, P content 5 wt %. On the other hand, Pd layer is formed as thickness 0.01 μm, P content 7 wt %. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 1-1-12

In embodiment 1-1-12, an alloy of Cu: 0.5 wt %, Ag: 3.5 wt %, Sn: 95 wt % is used as a solder consisting of the solder bump. Ni layer is formed as thickness 0.3 μm, P content 5 wt %. On the other hand, Pd layer is formed as thickness 1 μm, P content 7 wt %. Therefore, the composition of the Ni—Sn alloy layer becomes Sn:Cu:Ni=42:37:21, the thickness becomes 1.6 μm. The Ni—Sn alloy layer is typically a board-shaped form.

Embodiment 1-1-13

In embodiment 1-1-13, an alloy of Cu: 0.5 wt %, Ag: 3.5 wt %, Sn: 95 wt % is used, as a solder consisting of the solder bump. Ni layer is formed as thickness 1 μm, P content 0.5 wt %. On the other hand, Pd layer is formed as thickness 0.01 μm, P content 2 wt %. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 1-1-14

In embodiment 1-1-14, an alloy of Cu: 0.5 wt %, Ag: 3.5 wt %, Sn: 95 wt % is used as a solder consisting of the solder bump. Ni layer is formed as thickness 1 μm, P content 5 wt %. On the other hand, Pd layer is formed as thickness 1 μm, P content 7 wt %. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 1-1-15

In embodiment 1-1-15, an alloy of Cu: 0.5 wt %, Ag: 3.5 wt %, Sn: 95 wt % is used as a solder consisting of the solder bump. Ni layer is formed as thickness 0.3 μm, P content 8 wt %. On the other hand, Pd layer is formed as thickness 0.01 μm, P content 5 wt %. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 1-1-16

In embodiment 1-1-16, an alloy of Cu: 0.5 wt %, Ag: 3.5 wt %, Sn: 95 wt % is used as a solder consisting of the solder bump. Ni layer is formed as thickness 0.3 μm, P content 8 wt %. On the other hand, Pd layer is formed as thickness 1 μm, P content 7 wt %. Therefore, the composition of the Ni—Sn alloy layer becomes Sn:Cu:Ni=42:37:21, the thickness becomes 1.7 μm, The Ni—Sn alloy layer is typically a board-shaped form.

Embodiment 1-1-17

In embodiment 1-1-17, an alloy of Cu: 0.5 wt %, Ag: 3.5 wt %, Sn: 95 wt % is used as a solder consisting of the solder bump. Ni layer is formed as thickness 0.05 μm, P content 10 wt %. On the other hand, Pd layer is formed as thickness 0.01 μm, P content 2 wt %. Therefore, the composition of the Ni—Sn alloy layer becomes Sn:Cu:Ni=42:37:21, the thickness becomes 1.8 μm. The Ni—Sn alloy layer is typically a board-shaped form.

Embodiment 1-1-18

In embodiment 1-1-18, an alloy of Cu: 0.5 wt %, Ag: 3.5 wt %, Sn: 95 wt % is used as a solder consisting of the solder bump. Ni layer is formed, as thickness 1 μm, P content 10 wt %. On the other hand, Pd layer is formed as thickness 1 μm, P content 5 wt %. Therefore, the composition of the Ni—Sn alloy layer becomes Sn:Cu:Ni=42:37:21, the thickness becomes 1.8 μm. The Ni—Sn alloy layer is typically a board-shaped form.

Embodiment 1-1-19

In embodiment 1-1-19, an alloy of Cu: 0.5 wt %, Ag: 3.5 wt %, Sn: 95 wt % is used as a solder consisting of the solder bump. Ni layer is formed as thickness 0.05 μm, P content 15 wt %. On the other hand, Pd layer is formed as thickness 0.01 μm, P content 2 wt %. Therefore, the composition of the Ni—Sn alloy layer becomes Sn:Cu:Ni=42:37:21, the thickness becomes 2.0 μm. The Ni—Sn alloy layer is typically a board-shaped form.

Embodiment 1-1-20

In embodiment 1-1-20, an alloy of Cu: 0.5 wt %, Ag: 3.5 wt %, Sn: 95 wt % is used as a solder consisting of the solder bump. Ni layer is formed as thickness 1 μm, P content 15 wt %. On the other hand, Pd layer is formed, as thickness 1 μm, P content 2 wt %. Therefore, the composition of the Ni—Sn alloy layer becomes Sn:Cu:Ni=42:37:21, the thickness becomes 1.9 μm. The Ni—Sn alloy layer is typically a board-shaped form.

Embodiment 1-1-21

In embodiment 1-1-21, an alloy of Cu: 0.5 wt %, Ag: 3.5 wt %, Sn: 95 wt % is used as a solder consisting of the solder bump. Ni layer is formed as thickness 8 μm, P content 15 wt %. On the other hand, Pd layer is formed as thickness 0.01 μm, P content 7 wt %. Therefore, the composition of the Ni—Sn alloy layer becomes Sn:Cu:Ni=42:37:21, the thickness becomes 2.0 μm. The Ni—Sn alloy layer is typically a board-shaped form.

Embodiment 1-1-22

In embodiment 1-1-22, an alloy of Cu: 0.5 wt %, Ag: 3.5 wt %, Sn: 95 wt % is used as a solder consisting of the solder bump. Ni layer is formed as thickness 10 μm, P content 15 wt %. On the other hand, Pd layer is formed as thickness 1 μm, P content 7 wt %. Therefore, the composition of the Ni—Sn alloy layer becomes Sn:Cu:Ni=42:37:21, the thickness becomes 2.1 μm. The Ni—Sn alloy layer is typically a board-shaped form.

Embodiment 1-2-1

In embodiments 1-1-1 to 1-1-20, the Cu/Ag/Sn solder which does not include lead is used as the solder consisting of the solder bump. Whereas, in embodiment 1-2-1, an alloy of Sn:Pb=63:37 (wt %) is used as a solder consisting of the solder bump. Ni layer is formed as thickness 5 μm, P content 1.2 wt %. On the other hand, Pd layer is formed as thickness 0.5 μm, P content 5 wt %. Therefore, the composition of the Ni—Sn alloy layer becomes Sn:Ni=67:33, the thickness becomes 1.5 μm. The Ni—Sn alloy layer is typically a board-shaped form.

Embodiment 1-2-2

In embodiment 1-2-2, an alloy of Sn:Pb=63:37 (wt %) is used as a solder consisting of the solder bump. Ni layer is formed as thickness 5 μm, P content 1.2 wt %. On the other hand, Pd layer is formed as thickness 0.01 μm, P content 2 wt %. Therefore, the composition of the Ni—Sn alloy layer becomes Sn:Ni=67:33, the thickness becomes 1.8 μm. The Ni—Sn alloy layer is typically a board-shaped form.

Embodiment 1-2-3

In embodiment 1-2-3, an alloy of Sn:Pb=63:37 (wt %) is used as a solder consisting of the solder bump. Ni layer is formed as thickness 5 μm, P content 1.2 wt %. On the other hand, Pd layer is formed as thickness 0.01 μm, P content 7 wt %. Therefore, the composition of the Ni—Sn alloy layer becomes Sn:Ni=67:33, the thickness becomes 1.8 μm. The Ni—Sn alloy layer is typically a board-shaped form.

Embodiment 1-2-4

In embodiment 1-2-4, an alloy of Sn:Pb=63:37 (wt %) is used as a solder consisting of the solder bump. Ni layer is formed as thickness 5 μm, P content 1.2 wt %. On the other hand, Pd layer is formed as thickness 1.0 μm, P content 2 wt %. Therefore, the composition of the Ni—Sn alloy layer becomes Sn:Ni=67:33, the thickness becomes 1.5 μm. The Ni—Sn alloy layer is typically a board-shaped form.

Embodiment 1-2-5

In embodiment 1-2-5, an alloy of Sn:Pb=63:37 (wt %) is used as a solder consisting of the solder bump. Ni layer is formed as thickness 10 μm, P content 0.5 wt %. On the other hand, Pd layer is formed as thickness 1.0 μm, P content 7 wt %. Therefore, the composition of the Ni—Sn alloy layer becomes Sn:Ni=67:33, the thickness becomes 1.5 μm. The Ni—Sn alloy layer is typically a board-shaped form.

Embodiment 1-2-6

In embodiment 1-2-6, an alloy of Sn:Pb=63:37 (wt %) is used as a solder consisting of the solder bump. Ni layer is formed as thickness 10 μm, P content 5 wt %. On the other hand, Pd layer is formed as thickness 0.01 μm, P content 7 wt %. Therefore, the composition of the Ni—Sn alloy layer becomes Sn:Ni=67:33, the thickness becomes 1.7 μm. The Ni—Sn alloy layer is typically a board-shaped form.

Embodiment 1-2-7

In embodiment 1-2-7, an alloy of Sn:Pb=63:37 (wt %) is used as a solder consisting of the solder bump. Ni layer is formed as thickness 0.05 μm, P content 0.5 wt %. On the other hand, Pd layer is formed as thickness 1 μm, P content 7 wt %. Therefore, the composition of the Ni—Sn alloy layer becomes Sn:Ni=67:33, the thickness becomes 1.7 μm. The Ni—Sn alloy layer is typically a board-shaped form.

Embodiment 1-2-8

In embodiment 1-2-8, an alloy of Sn:Pb=63:37 (wt %) is used as a solder consisting of the solder bump. Ni layer is formed as thickness 0.05 μm, P content 5 wt %. On the other hand, Pd layer is formed as thickness 0.01 μm, P content 3 wt %. Therefore, the composition of the Ni—Sn alloy layer becomes Sn:Ni=67:33, the thickness becomes 1.8 μm. The Ni—Sn alloy layer is typically a board-shaped form.

Embodiment 1-2-9

In embodiment 1-2-9, an alloy of Sn:Pb=63:37 (wt %) is used as a solder consisting of the solder bump. Ni layer is formed as thickness 0.3 μm, P content 0.5 wt %. On the other hand, Pd layer is formed as thickness 0.01 μm, P content 2 wt %. Therefore, the composition of the Ni—Sn alloy layer becomes Sn:Ni=67:33, the thickness becomes 1.7 μm. The Ni—Sn alloy layer is typically a board-shaped form.

Embodiment 1-2-10

In embodiment 1-2-10, an alloy of Sn:Pb=63:37 (wt %) is used as a solder consisting of the solder bump. Ni layer is formed as thickness 0.3 μm, P content 0.5 wt %. On the other hand, Pd layer is formed as thickness 1 μm, P content 2 wt %. Therefore, the composition of the Ni—Sn alloy layer becomes Sn:Ni=67:33, the thickness becomes 1.6 μm. The Ni—Sn alloy layer is typically a board-shaped form.

Embodiment 1-2-11

In embodiment 1-2-11, an alloy of Sn:Pb=63:37 (wt %) is used as a solder consisting of the solder bump. Ni layer is formed as thickness 0.3 μm, P content 5 wt %. On the other hand, Pd layer is formed as thickness 0.01 μm, P content 7 wt %. Therefore, the composition of the Ni—Sn alloy layer becomes Sn:Ni=67:33, the thickness becomes 1.7 μm. The Ni—Sn alloy layer is typically a board-shaped form.

Embodiment 1-2-12

In embodiment 1-2-12, an alloy of Sn:Pb=63:37 (wt %) is used as a solder consisting of the solder bump. Ni layer is formed as thickness 0.3 μm, P content 5 wt %. On the other hand, Pd layer is formed as thickness 1 μm, P content 7 wt %. Therefore, the composition of the Ni—Sn alloy layer becomes Sn:Ni=67:33, the thickness becomes 1.6 μm. The Ni—Sn alloy layer is typically a board-shaped form.

Embodiment 1-2-13

In embodiment 1-2-13, an alloy of Sn:Pb=63:37 (wt %) is used as a solder consisting of the solder bump. Ni layer is formed as thickness 1 μm, P content 0.5 wt %. On the other hand, Pd layer is formed as thickness 0.01 μm, P content 2 wt %. Therefore, the composition of the Ni—Sn alloy layer becomes Sn:Ni=67:33, the thickness becomes 1.7 μm. The Ni—Sn alloy layer is typically a board-shaped form.

Embodiment 1-2-14

In embodiment 1-2-14, an alloy of Sn:Pb=63:37 (wt %) is used as a solder consisting of the solder bump. Ni layer is formed as thickness 1 μm, P content 5 wt %. On the other hand, Pd layer is formed as thickness 1 μm, P content 7 wt %. Therefore, the composition of the Ni—Sn alloy layer becomes Sn:Ni=67:33, the thickness becomes 1.7 μm. The Ni—Sn alloy layer is typically a board-shaped form.

Embodiment 1-2-15

In embodiment 1-2-15, an alloy of Sn:Pb=63:37 (wt %) is used as a solder consisting of the solder bump. Ni layer is formed as thickness 0.3 μm, P content 8 wt %. On the other hand, Pd layer is formed as thickness 0.01 μm, P content 5 wt %. Therefore, the composition of the Ni—Sn alloy layer becomes Sn:Ni=67:33, the thickness becomes 1.7 μm. The Ni—Sn alloy layer is typically a board-shaped form.

Embodiment 1-2-16

In embodiment 1-2-16, an alloy of Sn:Pb=63:37 (wt %) is used as a solder consisting of the solder bump. Ni layer is formed as thickness 0.3 μm, P content 8 wt %. On the other hand, Pd layer is formed as thickness 1 μm, P content 7 wt %. Therefore, the composition of the Ni—Sn alloy layer becomes Sn:Ni=67:33, the thickness becomes 1.7 μm. The Ni—Sn alloy layer is typically a board-shaped form.

Embodiment 1-2-17

In embodiment 1-2-17, an alloy of Sn:Pb=63:37 (wt %) is used as a solder consisting of the solder bump. Ni layer is formed as thickness 0.05 μm, P content 10 wt %. On the other hand, Pd layer is formed as thickness 0.01 μm, P content 2 wt %. Therefore, the composition of the Ni—Sn alloy layer becomes Sn:Ni=67:33, the thickness becomes 1.8 μm. The Ni—Sn alloy layer is typically a board-shaped form.

Embodiment 1-2-18

In embodiment 1-2-18, an alloy of Sn:Pb=63:37 (wt %) is used as a solder consisting of the solder bump. Ni layer is formed as thickness 1 μm, P content 10 wt %. On the other hand, Pd layer is formed as thickness 1 μm, P content 5 wt %. Therefore, the composition of the Ni—Sn alloy layer becomes Sn:Ni=67:33, the thickness becomes 1.8 μm. The Ni—Sn alloy layer is typically a board-shaped form.

Embodiment 1-2-19

In embodiment 1-2-19, an alloy of Sn:Pb=63:37 (wt %) is used as a solder consisting of the solder bump. Ni layer is formed as thickness 0.05 μm, P content 15 wt %. On the other hand, Pd layer is formed as thickness 0.01 μm, P content 2 wt %. Therefore, the composition of the Ni—Sn alloy layer becomes Sn:Ni=67:33, the thickness becomes 1.9 μm. The Ni—Sn alloy layer is typically a board-shaped form.

Embodiment 1-2-20

In embodiment 1-2-20, an alloy of Sn:Pb=63:37 (wt %) is used as a solder consisting of the solder bump. Ni layer is formed as thickness 1 μm, P content 15 wt %. On the other hand, Pd layer is formed as thickness 1 μm, P content 2 wt %. Therefore, the composition of the Ni—Sn alloy layer becomes Sn:Ni=67:33, the thickness becomes 1.8 μm. The Ni—Sn alloy layer is typically a board-shaped form.

Embodiment 1-2-21

In embodiment 1-2-21, an alloy of Sn:Pb=63:37 (wt %) is used as a solder consisting of the solder bump. Ni layer is formed as thickness 8 μm, P content 15 wt %. On the other hand, Pd layer is formed as thickness 0.01 μm, P content 7 wt %. Therefore, the composition of the Ni—Sn alloy layer becomes Sn:Ni=67:33, the thickness becomes 2.0 μm. The Ni—Sn alloy layer is typically a board-shaped form.

Embodiment 1-2-22

In embodiment 1-2-22, an alloy of Sn:Pb=63:37 (wt %) is used as a solder consisting of the solder bump. Ni layer is formed as thickness 10 μm, P content 15 wt %. On the other hand, Pd layer is formed as thickness 1 μm, P content 7 wt %. Therefore, the composition of the Ni—Sn alloy layer becomes Sn:Ni=67:33, the thickness becomes 2.2 μm. The Ni—Sn alloy layer is typically a board-shaped form.

Embodiment 1-3-1

In embodiment 1-3-1, the alloy of Cu: 0.5 wt %, Ag: 3.5 wt %, Sn: 95 wt % is used as a solder consisting of the solder bump same as embodiment 1-1-1. Ni layer is formed as thickness 5 μm, P content 1.2 wt % as same as embodiment 1-1-1. On the other hand, Pd layer is formed as thickness 0.009 μm, P content 8 wt %. Therefore, the composition of the Ni—Sn alloy layer becomes Sn:Cu:Ni=42:45:13, the thickness becomes 2.5 μm. In embodiment 1-3-1, as shown an electron microscope picture in the right side of FIG. 18, the Ni—Cu—Sn alloy layer is typically a pillar-shaped form, that is, pillar-shaped alloy crystal vertically formed along with the Ni layer as same as reference example 1-1-1 which will be explained later.

Embodiment 1-3-2

In embodiment 1-3-2, an alloy of Cu: 0.5 wt %, Ag: 3.5 wt %, Sn: 95 wt % is used as a solder consisting of the solder bump. Ni layer is formed as thickness 5 μm, P content 1.2 wt %. On the other hand, Pd layer is formed as thickness 0.008 μm, P content 7 wt %. Therefore, the composition of the Ni—Sn alloy layer becomes Sn:Cu:Ni=42:45:13, the thickness becomes 2.5 μm. The Ni—Sn alloy layer is typically a pillar-shaped form.

Embodiment 1-3-3

In embodiment 1-3-3, an alloy of Cu: 0.5 wt %, Ag: 3.5 wt %, Sn: 95 wt % is used as a solder consisting of the solder bump. Ni layer is formed as thickness 5 μm, P content 1.2 wt %. On the other hand, Pd layer is formed as thickness 0.009 μm, P content 1 wt %. Therefore, the composition of the Ni—Sn alloy layer becomes Sn:Cu:Ni=42:45:13, the thickness becomes 2.5 μm. The Ni—Sn alloy layer is typically a pillar-shaped form.

Embodiment 1-3-4

In embodiment 1-3-4, an alloy of Cu: 0.5 wt %, Ag: 3.5 wt %, Sn: 95 wt % is used as a solder consisting of the solder bump. Ni layer is formed as thickness 5 μm, P content 1.2 wt %. On the other hand, Pd layer is formed as thickness 2.0 μm, P content 2 wt %. Therefore, the composition of the Ni—Sn alloy layer becomes Sn:Cu:Ni=66:29:5, the thickness becomes 1.3 μm. The Ni—Sn alloy layer is typically a grain-shaped and formed at an interface of the Ni layer.

Embodiment 1-3-5

In embodiment 1-3-5, an alloy of Cu: 0.5 wt %, Ag: 3.5 wt %, Sn: 95 wt % is used as a solder consisting of the solder bump. Ni layer is formed as thickness 10 µm, P content 0.5 wt %. On the other hand, Pd layer is formed as thickness 2.0 µm, P content 5 wt %. Therefore, the composition of the Ni—Sn alloy layer becomes Sn:Cu:Ni=66:29:5, the thickness becomes 1.3 µm. The Ni—Sn alloy layer is typically a grain-shaped (grainy crystal) and formed, at an interface of the Ni layer.

Embodiment 1-3-6

In embodiment 1-3-6, an alloy of Cu: 0.5 wt %, Ag: 3.5 wt %, Sn: 95 wt % is used as a solder consisting of the solder bump. Ni layer is formed as thickness 10 µm, P content 5 wt %. On the other hand, Pd layer is formed as thickness 2.0 µm, P content 9 wt %. Therefore, the composition of the Ni—Sn alloy layer becomes Sn:Cu:Ni=66:29:5, the thickness becomes 1.5 µm. The Ni—Sn alloy layer is typically a grain-shaped and formed at an interface of the Ni layer.

Embodiment 1-3-7

In embodiment 1-3-7, an alloy of Cu: 0.5 wt %, Ag: 3.5 wt %, Sn: 95 wt % is used as a solder consisting of the solder bump. Ni layer is formed as thickness 0.03 µm, P content 0.4 wt %. On the other hand, Pd layer is formed as thickness 0.03 µm, P content 3 wt %. Therefore, the composition of the Ni—Sn alloy layer becomes Sn:Cu:Ni=66:29:5, the thickness becomes 1.1 µm. The Ni—Sn alloy layer is typically a grain-shaped and formed, at an interface of the Ni layer.

Embodiment 1-3-8

In embodiment 1-3-8, an alloy of Cu: 0.5 wt %, Ag: 3.5 wt %, Sn: 95 wt % is used as a solder consisting of the solder bump. Ni layer is formed as thickness 0.03 µm, P content 0.5 wt %. On the other hand, Pd layer is formed as thickness 0.2 µm, P content 7 wt %. Therefore, the composition of the Ni—Sn alloy layer becomes Sn:Cu:Ni=66:29:5, the thickness becomes 1.3 µm. The Ni—Sn alloy layer is typically a grain-shaped and formed at an interface of the Ni layer.

Embodiment 1-3-9

In embodiment 1-3-9, an alloy of Cu: 0.5 wt %, Ag: 3.5 wt %, Sn: 95 wt % is used as a solder consisting of the solder bump. Ni layer is formed as thickness 0.03 µm, P content 16 wt %. On the other hand, Pd layer is formed as thickness 0.2 µm, P content 7 wt %. Therefore, the composition of the Ni—Sn alloy layer becomes Sn:Cu:Ni=66:29:5, the thickness becomes 1.3 µm. The Ni—Sn alloy layer is typically a grain-shaped and formed at an interface of the Ni layer.

Embodiment 1-3-10

In embodiment 1-3-10, an alloy of Cu: 0.5 wt %, Ag: 3.5 wt %, Sn: 95 wt % is used as a solder consisting of the solder bump. Ni layer is formed as thickness 10 µm, P content 0.4 wt %. On the other hand, Pd layer is formed as thickness 0.2 µm, P content 2 wt %. Therefore, the composition of the Ni—Sn alloy layer becomes Sn:Cu:Ni=66:29:5, the thickness becomes 1.4 µm. The Ni—Sn alloy layer is typically a grain-shaped and formed at an interface of the Ni layer.

Embodiment 1-3-11

In embodiment 1-3-11, an alloy of Cu: 0.5 wt %, Ag: 3.5 wt %, Sn: 95 wt % is used as a solder consisting of the solder bump. Ni layer is formed as thickness 10 µm, P content 16 wt %. On the other hand, Pd layer is formed as thickness 1 µm, P content 7 wt %. Therefore, the composition of the Ni—Sn alloy layer becomes Sn:Cu:Ni=66:29:5, the thickness becomes 1.5 µm. The Ni—Sn alloy layer is typically a grain-shaped and formed at an interface of the Ni layer.

Embodiment 1-3-12

In embodiment 1-3-12, an alloy of Co: 0.5 wt %, Ag: 3.5 wt %, Sn: 95 wt % is used as a solder consisting of the solder bump. Ni layer is formed as thickness 12 µm, P content 0.4 wt %. On the other hand, Pd layer is formed as thickness 0.01 µm, P content 2 wt %. Therefore, the composition of the Ni—Sn alloy layer becomes Sn:Cu:Ni=66:29:5, the thickness becomes 2.4 µm. The Ni—Sn alloy layer is typically a grain-shaped and formed at an interface of the Ni layer.

Embodiment 1-3-13

In embodiment 1-3-13, an alloy of Cu: 0.5 wt %, Ag: 3.5 wt %, Sn: 95 wt % is used as a solder consisting of the solder bump. Ni layer is formed as thickness 12 µm, P content 5 wt %. On the other hand, Pd layer is formed as thickness 1 µm, P content 2 wt %. Therefore, the composition of the Ni—Sn alloy layer becomes Sn:Cu:Ni=66:29:5, the thickness becomes 2.5 µm. The Ni—Sn alloy layer is typically a grain-shaped and formed at an interface of the Ni layer.

Embodiment 1-3-14

In embodiment 1-3-14, an alloy of Cu: 0.5 wt %, Ag: 3.5 wt %, Sn: 95 wt % is used as a solder consisting of the solder bump. Ni layer is formed as thickness 12 µm, P content 17 wt %. On the other hand, Pd layer is formed as thickness 1 µm, P content 7 wt %. Therefore, the composition of the Ni—Sn alloy layer becomes Sn:Cu:Ni=66:29:5, the thickness becomes 2.4 µm. The Ni—Sn alloy layer is typically a grain-shaped and formed at an interface of the Ni layer.

Embodiment 1-4-1

In embodiment 1-4-1, an alloy of Sn:Pb=63:37 (wt %) is used as a solder consisting of the solder bump, as same as embodiment 1-2-1. Ni layer is formed as thickness 5 µm, P content 1.2 wt %. On the other hand, Pd layer is formed as thickness 0.009 µm, P content 8 wt %. Therefore, the composition of the Ni—Sn alloy layer becomes Sn:Ni=67:33, the thickness becomes 2.3 µm. The Ni—Sn alloy layer is typically a pillar-shaped form.

Embodiment 1-4-2

In embodiment 1-4-2, an alloy of Sn:Pb=63:37 (wt %) is used as a solder consisting of the solder bump. Ni layer is formed as thickness 5 µm, P content 1.2 wt %. On the other hand, Pd layer is formed as thickness 0.008 µm, P content 7 wt %. Therefore, the composition of the Ni—Sn alloy layer becomes Sn:Ni=67:33, the thickness becomes 2.5 µm. The Ni—Sn alloy layer is typically a pillar-shaped form.

Embodiment 1-4-3

In embodiment 1-4-3, an alloy of Sn:Pb=63:37 (wt %) is used as a solder consisting of the solder bump. Ni layer is formed as thickness 5 µm, P content 1.2 wt %. On the other hand, Pd layer is formed as thickness 0.009 µm, P content 1 wt %. Therefore, the composition of the Ni—Sn alloy layer becomes Sn:Ni=67:33, the thickness becomes 2.5 µm. The Ni—Sn alloy layer is typically a pillar-shaped form.

Embodiment 1-4-4

In embodiment 1-4-4, an alloy of Sn:Pb=63:37 (wt %) is used as a solder consisting of the solder bump. Ni layer is formed as thickness 5 µm, P content 1.2 wt %. On the other hand, Pd layer is formed as thickness 2.0 µm, P content 2 wt %. Therefore, the composition of the Ni—Sn alloy layer becomes Sn:Ni=67:33, the thickness becomes 1.3 µm. The Ni—Sn alloy layer is typically a grain-shaped and formed at an interface of the Ni layer.

Embodiment 1-4-5

In embodiment 1-4-5, an alloy of Sn:Pb=63:37 (wt %) is used as a solder consisting of the solder bump. Ni layer is formed as thickness 10 µm, P content 0.5 wt %. On the other hand, Pd layer is formed as thickness 2.0 µm, P content 5 wt %. Therefore, the composition of the Ni—Sn alloy layer becomes Sn:Ni=67:33, the thickness becomes 1.3 µm. The Ni—Sn alloy layer is typically a grain-shaped and formed at an interface of the Ni layer.

Embodiment 1-4-6

In embodiment 1-4-6, an alloy of Sn:Pb=63:37 (wt %) is used as a solder consisting of the solder bump. Ni layer is formed as thickness 10 µm, P content 5 wt %. On the other hand, Pd layer is formed as thickness 2.0 µm, P content 9 wt %. Therefore, the composition of the Ni—Sn alloy layer becomes Sn:Ni=67:33, the thickness becomes 1.5 µm. The Ni—Sn alloy layer is typically a grain-shaped and formed at an interface of the Ni layer.

Embodiment 1-4-7

In embodiment 1-4-7, an alloy of Sn:Pb=63:37 (wt %) is used as a solder consisting of the solder bump. Ni layer is formed as thickness 0.03 µm, P content 0.4 wt %. On the other hand, Pd layer is formed as thickness 0.03 µm, P content 3 wt %. Therefore, the composition of the Ni—Sn alloy layer becomes Sn:Ni=67:33, the thickness becomes 1.1 µm. The Ni—Sn alloy layer is typically a grain-shaped and formed at an interface of the Ni layer.

Embodiment 1-4-8

In embodiment 1-4-8, an alloy of Sn:Pb=63:37 (wt %) is used as a solder consisting of the solder bump. Ni layer is formed as thickness 0.03 µm, P content 0.5 wt %. On the other hand, Pd layer is formed as thickness 0.2 µm, P content 7 wt %. Therefore, the composition of the Ni—Sn alloy layer becomes Sn:Ni=67:33, the thickness becomes 1.3 µm. The Ni—Sn alloy layer is typically a grain-shaped and formed at an interface of the Ni layer.

Embodiment 1-4-9

In embodiment 1-4-9, an alloy of Sn:Pb=63:37 (wt %) is used as a solder consisting of the solder bump. Ni layer is formed as thickness 0.03 µm, P content 16 wt %. On the other hand, Pd layer is formed as thickness 0.2 µm, P content 7 wt %. Therefore, the composition of the Ni—Sn alloy layer becomes Sn:Ni=67:33, the thickness becomes 1.3 µm. The Ni—Sn alloy layer is typically a grain-shaped and formed at an interface of the Ni layer.

Embodiment 1-4-10

In embodiment 1-4-10, an alloy of Sn:Pb=63:37 (wt %) is used as a solder consisting of the solder bump. Ni layer is formed as thickness 10 µm, P content 0.4 wt %. On the other hand, Pd layer is formed as thickness 0.2 µm, P content 2 wt %. Therefore, the composition of the Ni—Sn alloy layer becomes Sn:Ni=67:33, the thickness becomes 1.4 µm. The Ni—Sn alloy layer is typically a grain-shaped and formed at an interface of the Ni layer.

Embodiment 1-4-11

In embodiment 1-4-11, an alloy of Sn:Pb=63:37 (wt %) is used as a solder consisting of the solder bump. Ni layer is formed as thickness 10 µm, P content 16 wt %. On the other hand, Pd layer is formed as thickness 1 µm, P content 7 wt %. Therefore, the composition of the Ni—Sn alloy layer becomes Sn:Ni=67:33, the thickness becomes 1.5 µm. The Ni—Sn alloy layer is typically a grain-shaped and formed at an interface of the Ni layer.

Embodiment 1-4-12

In embodiment 1-4-12, an alloy of Sn:Pb=63:37 (wt %) is used as a solder consisting of the solder bump. Ni layer is formed as thickness 12 µm, P content 0.4 wt %. On the other hand, Pd layer is formed as thickness 0.01 µm, P content 2 wt %. Therefore, the composition of the Ni—Sn alloy layer becomes Sn:Ni=67:33, the thickness becomes 2.4 µm. The Ni—Sn alloy layer is typically a grain-shaped and formed at an interface of the Ni layer.

Embodiment 1-4-13

In embodiment 1-4-13, an alloy of Sn:Pb=63:37 (wt %) is used as a solder consisting of the solder bump. Ni layer is formed as thickness 12 µm, P content 5 wt %. On the other hand, Pd layer is formed as thickness 1 µm, P content 2 wt %. Therefore, the composition of the Ni—Sn alloy layer becomes Sn:Ni=67:33, the thickness becomes 2.5 µm. The Ni—Sn alloy layer is typically a grain-shaped and formed at an interface of the Ni layer.

Embodiment 1-4-14

In embodiment 1-4-14, an alloy of Sn:Pb=63:37 (wt %) is used as a solder consisting of the solder bump. Ni layer is formed as thickness 12 µm, P content 17 wt %. On the other hand, Pd layer is formed as thickness 1 µm, P content 7 wt %. Therefore, the composition of the Ni—Sn alloy layer becomes Sn:Ni=67:33, the thickness becomes 2.4 µm. The Ni—Sn alloy layer is typically a grain-shaped and formed at an interface of the Ni layer.

Embodiment 1-5-1

Figure 19:
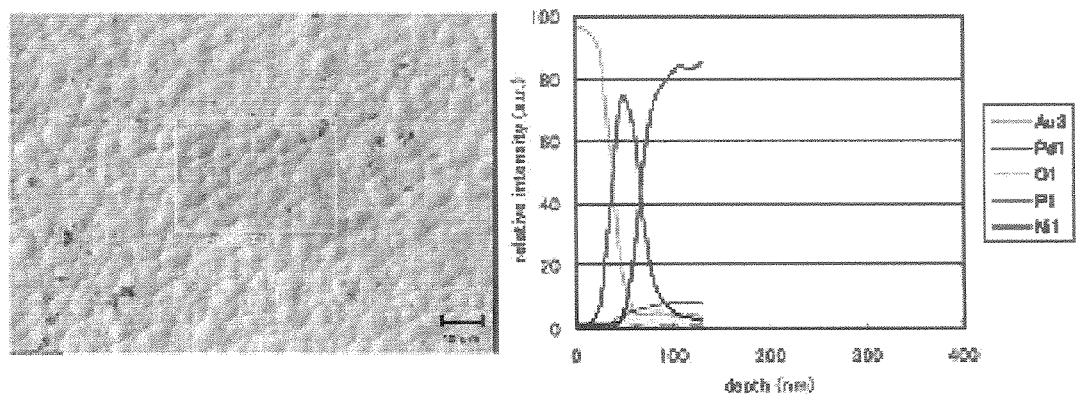
FIG. 19 is an electron microscopic picture of a Pd layer of 0.7 μm in thickness.

In embodiment 1-5-1, an alloy of Sn:Pb=63:37 (wt %) is used as a solder consisting of the solder bump. Ni layer is formed as thickness 5 µm, P content 1.2 wt %. On the other hand, Pd layer is formed as thickness 0.03 µm, P content 0 wt %, (An electron microscope picture of the Pd layer is shown in FIG. 19. As shown in the figure, Pd layer partly separates out, and under Ni layer can be seen via porous of the Pd layer.) When the solder is conducted reflow, flux containing copper is used. Therefore, the composition of the Ni—Sn alloy layer becomes Sn:Cu:Ni=42:37:21, the thickness becomes 1.5 μm. The Ni—Sn alloy layer is typically a grain-shaped form.

Embodiment 1-5-2

Figure 20:
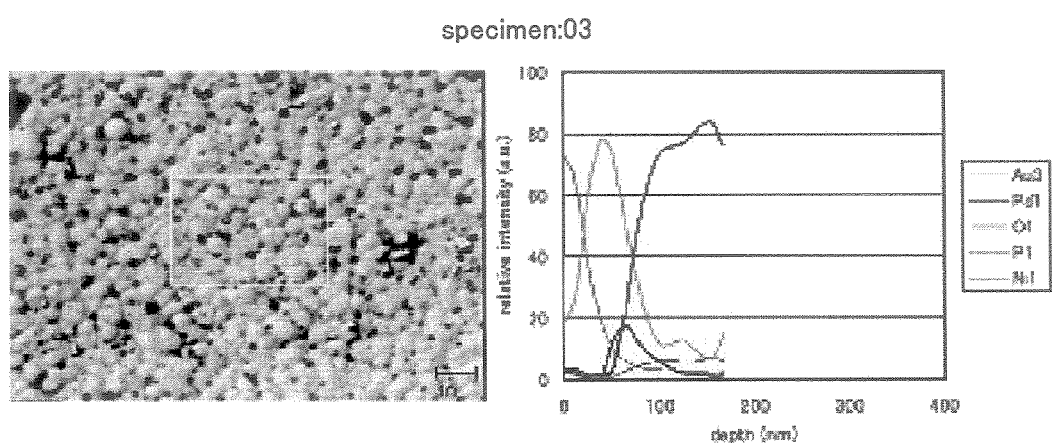
FIG. 20 is an electron microscopic picture of a Pd layer of 0.3 μm in thickness.

In embodiment 1-5-2, an alloy of Sn:Pb=63:37 (wt %) is used as a solder consisting of the solder bump. Ni layer is formed as thickness 5 μm, P content 1.2 wt %. On the other hand, Pd layer is formed as thickness 0.07 μm, P content 5 wt %. (An electron microscope picture of the Pd layer is shown in FIG. 20. As shown in the figure, Pd layer is uniformly formed.) When the solder is conducted reflow, flux containing copper is used. Therefore, the composition of the Ni—Sn alloy layer becomes Sn:Cu:Ni=42:37:21, the thickness becomes 1.5 μm. The Ni—Sn alloy layer is typically a board-shaped form, as same as embodiment 1-1-1 which has been referred with the electron microscope picture of the left side of FIG. 18.

Reference Example 1-1-1

In reference examples 1-1-1 to 1-1-12 and reference examples 1-2-1 to 1-2-12, a buildup-multi-layer-circuit-board is formed and a solder bump is formed, as same as the above embodiment 1 which has been explained with referring to FIGS. 1-8.

In reference example 1-1-1, an alloy of Cu: 0.2 wt %, Ag: 1 wt %, Sn: 97 wt % is used as a solder consisting of the solder bump. Ni layer is formed as thickness 5 μm, P content 1.2 wt %. On the other hand, Pd layer is formed as thickness 0.5 μm, P content 0 wt %. Therefore, the composition of the Ni—Sn alloy layer becomes Sn:Cu:Ni=38:20:42, the thickness becomes 0.8 μm. Electron microscope pictures of Ni layer, Cu—Ni—Sn alloy and solder in reference example 1-1-1 are shown in FIGS. 15-18. The electron microscope picture (×20 k) in the right side of FIG. 15 shows reference example 1-1-1. The electron microscope pictures (×100 k) in the right sides of FIG. 16, 17 are a more enlarged scale. The lower side is the Ni layer and the upper side is the solder and the interface between the Ni layer and the solder is the Cu—Ni—Sn alloy. As shown in the electron microscope picture in the right side of FIG. 15, in reference example 1-1-1, the Cu—Ni—Sn alloy is un-consecutively formed on the surface of Ni layer, that is, is Ups and downs. As shown in the electron microscope pictures in the right sides of FIG. 16, 17 using enlarged scale, Ag particles un-uniformly dotted exist on the surface of the Cu—Ni—Sn alloy through skin layer of Sn. In reference example 1-1-1, as shown in the electron microscope picture in the right side of FIG. 18, the Ni—Cu—Sn alloy layer is typically a pillar-shaped form, that is, pillar-shaped alloy crystal vertically formed along with the Ni layer.

Reference Example 1-1-2

In reference example 1-1-2, an alloy of Cu: 0.2 wt %, Ag: 1 wt %, Sn: 97 wt % is used as a solder consisting of the solder bump. Ni layer is formed as thickness 5 μm, P content 4 wt %. On the other hand, Pd layer is formed as thickness 1.0 μm, P content 0.8 wt %. Therefore, the composition of the Ni—Sn alloy layer becomes Sn:Cu:Ni=40:25:35, the thickness becomes 0.9 μm.

Reference Example 1-1-3

In reference example 1-1-3, an alloy of Cu: 0.2 wt %, Ag: 1 wt %, Sn: 97 wt % is used as a solder consisting of the solder bump. Ni layer is formed as thickness 5 μm, P content 4 wt %. On the other hand, Pd layer is formed as thickness 1.0 μm, P content 9 wt %. Therefore, the composition of the Ni—Sn alloy layer becomes Sn:Cu:Ni=39:26:49, the thickness becomes 2.7 μm.

Reference Example 1-1-4

In reference example 1-1-4, an alloy of Cu: 0.2 wt %, Ag: 1 wt %, Sn: 97 wt % is used as a solder consisting of the solder bump. Ni layer is formed as thickness 5 μm, P content 4 wt %. On the other hand, Pd layer is formed as thickness 1.5 μm, P content 9 wt %. Therefore, the composition of the Ni—Sn alloy layer becomes Sn:Cu:Ni=39:26:49, the thickness becomes 2.9 μm.

Reference Example 1-1-5

In reference example 1-1-5, an alloy of Cu: 0.2 wt %, Ag: 1 wt %, Sn: 97 wt % is used as a solder consisting of the solder bump. Ni layer is formed as thickness 0.03 μm, P content 0.4 wt %. On the other hand, Pd layer is formed as thickness 0.5 μm, P content 0 wt %. Therefore, the composition of the Ni—Sn alloy layer becomes Sn:Cu:Ni=38:20:42, the thickness becomes 0.8 μm.

Reference Example 1-1-6

In reference example 1-1-6, an alloy of Cu: 0.2 wt %, Ag: 1 wt %, Sn: 97 wt % is used as a solder consisting of the solder bump. Ni layer is formed as thickness 0.03 μm, P content 0.4 wt %. On the other hand, Pd layer is formed as thickness 1.0 μm, P content 2 wt %. Therefore, the composition of the Ni—Sn alloy layer becomes Sn:Cu:Ni=40:25:35, the thickness becomes 0.9 μm.

Reference Example 1-1-7

In reference example 1-1-7, an alloy of Cu: 0.2 wt %, Ag: 1 wt %, Sn: 97 wt % is used as a solder consisting of the solder bump. Ni layer is formed as thickness 0.03 μm, P content 17 wt %. On the other hand, Pd layer is formed as thickness 1.0 μm, P content 9 wt %. Therefore, the composition of the Ni—Sn alloy layer becomes Sn:Cu:Ni=40:25:35, the thickness becomes 0.9 μm.

Reference Example 1-1-8

In reference example 1-1-8, an alloy of Cu: 0.2 wt %, Ag: 1 wt %, Sn: 97 wt % is used as a solder consisting of the solder bump. Ni layer is formed as thickness 0.03 μm, P content 17 wt %. On the other hand, Pd layer is formed as thickness 1.5 μm, P content 9 wt %. Therefore, the composition of the Ni—Sn alloy layer becomes Sn:Cu:Ni=40:25:35, the thickness becomes 0.9 μm.

Reference Example 1-1-9

In reference example 1-1-9, an alloy of Cu: 0.2 wt %, Ag: 1 wt %, Sn: 97 wt % is used as a solder consisting of the solder bump. Ni layer is formed as thickness 12 μm, P content 0.4 wt %. On the other hand, Pd layer is formed as thickness 0.5 μm, P content 0 wt %. Therefore, the composition of the Ni—Sn alloy layer becomes Sn:Cu:Ni=39:26:49, the thickness becomes 2.5 μm.

Reference Example 1-1-10

In reference example 1-1-10, an alloy of Cu: 0.2 wt %, Ag: 1 wt %, Sn: 97 wt % is used as a solder consisting of the solder bump. Ni layer is formed as thickness 12 μm, P content 0.4 wt %. On the other hand, Pd layer is formed as thickness 1 μm, P content 2 wt %. Therefore, the composition of the Ni—Sn alloy layer becomes Sn:Cu:Ni=39:26:49, the thickness becomes 2.6 μm.

Reference Example 1-1-11

In reference example 1-1-11, an alloy of Cu: 0.2 wt %, Ag: 1 wt %, Sn: 97 wt % is used as a solder consisting of the solder bump. Ni layer is formed as thickness 12 μm, P content 16 wt %. On the other hand, Pd layer is formed as thickness 1 μm, P content 9 wt %. Therefore, the composition of the Ni—Sn alloy layer becomes Sn:Cu:Ni=39:26:49, the thickness becomes 2.7 μm.

Reference Example 1-1-12

In reference example 1-1-12, an alloy of Cu: 0.2 wt %, Ag: 1 wt %, Sn: 97 wt % is used as a solder consisting of the solder bump. Ni layer is formed as thickness 12 μm, P content 16 wt %. On the other hand, Pd layer is formed as thickness 1.5 μm, P content 9 wt %. Therefore, the composition of the Ni—Sn alloy layer becomes Sn:Cu:Ni=39:26:49, the thickness becomes 2.9 μm.

Reference Example 1-2-1

In reference examples 1-1-1 to 1-1-12, the Cu/Ag/Sn solder which does not include lead is used as the solder consisting of the solder bump. Whereas, in reference examples 1-2-1 to 1-2-12, an alloy of Sn:Pb=63:37 (wt %) is used as a solder consisting of the solder bump. Ni layer is formed as thickness 5 μm, P content 1.2 wt %. On the other hand, Pd layer is formed as thickness 0.5 μm, P content 0 wt %. Therefore, the composition of the Ni—Sn alloy layer becomes Sn:Ni=67:33, the thickness becomes 0.9 μm.

Reference Example 1-2-2

In reference example 1-2-2, an alloy of Sn:Pb=63:37 (wt %) is used as a solder consisting of the solder bump. Ni layer is formed as thickness 5 μm, P content 4 wt %. On the other hand, Pd layer is formed as thickness 1.0 μm, P content 0.8 wt %. Therefore, the composition of the Ni—Sn alloy layer becomes Sn:Ni=67:33, the thickness becomes 0.9 μm.

Reference Example 1-2-3

In reference example 1-2-3, an alloy of Sn:Pb=63:37 (wt %) is used as a solder consisting of the solder bump. Ni layer is formed as thickness 5 μm, P content 4 wt %. On the other hand, Pd layer is formed as thickness 1.0 μm, P content 9 wt %. Therefore, the composition of the Ni—Sn alloy layer becomes Sn:Ni=67:33, the thickness becomes 2.7 μm.

Reference Example 1-2-4

In reference example 1-2-4, an alloy of Sn:Pb=63:37 (wt %) is used as a solder consisting of the solder bump. Ni layer is formed as thickness 5 μm, P content 4 wt %. On the other hand, Pd layer is formed as thickness 1.5 μm, P content 9 wt %. Therefore, the composition of the Ni—Sn alloy layer becomes Sn:Ni=67:33, the thickness becomes 2.8 μm.

Reference Example 1-2-5

In reference example 1-2-5, an alloy of Sn:Pb=63:37 (wt %) is used as a solder consisting of the solder bump. Ni layer is formed as thickness 0.03 μm, P content 0.4 wt %. On the other hand, Pd layer is formed as thickness 0.5 μm, P content 0 wt %. Therefore, the composition of the Ni—Sn alloy layer becomes Sn:Ni=67:33, the thickness becomes 0.8 μm.

Reference Example 1-2-6

In reference example 1-2-6, an alloy of Sn:Pb=63:37 (wt %) is used as a solder consisting of the solder bump. Ni layer is formed as thickness 0.03 μm, P content 0.4 wt %. On the other hand, Pd layer is formed as thickness 1 μm, P content 2 wt %. Therefore, the composition of the Ni—Sn alloy layer becomes Sn:Ni=67:33, the thickness becomes 0.9 μm.

Reference Example 1-2-7

In reference example 1-2-7, an alloy of Sn:Pb=63:37 (wt %) is used as a solder consisting of the solder bump. Ni layer is formed as thickness 0.03 μm, P content 17 wt %. On the other hand, Pd layer is formed as thickness 1 μm, P content 9 wt %. Therefore, the composition of the Ni—Sn alloy layer becomes Sn:Ni=67:33, the thickness becomes 0.9 μm.

Reference Example 1-2-8

In reference example 1-2-8, an alloy of Sn:Pb=63:37 (wt %) is used as a solder consisting of the solder bump. Ni layer is formed as thickness 0.03 μm, P content 17 wt %. On the other hand, Pd layer is formed as thickness 1.5 μm, P content 9 wt %. Therefore, the composition of the Ni—Sn alloy layer becomes Sn:Ni=67:33, the thickness becomes 0.9 μm.

Reference Example 1-2-9

In reference example 1-2-9, an alloy of Sn:Pb=63:37 (wt %) is used as a solder consisting of the solder bump. Ni layer is formed as thickness 12 μm, P content 0.4 wt %. On the other hand, Pd layer is formed as thickness 0.5 μm, P content 0 wt %. Therefore, the composition of the Ni—Sn alloy layer becomes Sn:Ni=67:33, the thickness becomes 2.5 μm.

Reference Example 1-2-10

In reference example 1-2-10, an alloy of Sn:Pb=63:37 (wt %) is used as a solder consisting of the solder bump. Ni layer is formed as thickness 12 μm, P content 0.4 wt %. On the other hand, Pd layer is formed as thickness 1 μm, P content 2 wt %. Therefore, the composition of the Ni—Sn alloy layer becomes Sn:Ni=87:33, the thickness becomes 2.6 μm.

Reference Example 1-2-11

In reference example 1-2-11, an alloy of Sn:Pb=63:37 (wt %) is used as a solder consisting of the solder bump. Ni layer is formed as thickness 12 μm, P content 16 wt %. On the other hand, Pd layer is formed as thickness 1 μm, P content 9 wt %. Therefore, the composition of the Ni—Sn alloy layer becomes Sn:Ni=67:33, the thickness becomes 2.7 μm.

Reference Example 1-2-12

In reference example 1-2-12, an alloy of Sn:Pb=63:37 (wt %) is used as a solder consisting of the solder bump. Ni layer is formed as thickness 12 μm, P content 16 wt %. On the other hand, Pd layer is formed as thickness 1.5 μm, P content 9 wt %. Therefore, the composition of the Ni—Sn alloy layer becomes Sn:Ni=67:33, the thickness becomes 2.9 μm.

Embodiment 2

The above mentioned embodiment 1, with referring to FIGS. 1-7, concerns to the build-up multi printed board. Whereas, embodiment 2 concerns to a laminated multilayer printed board.

Figure 9:
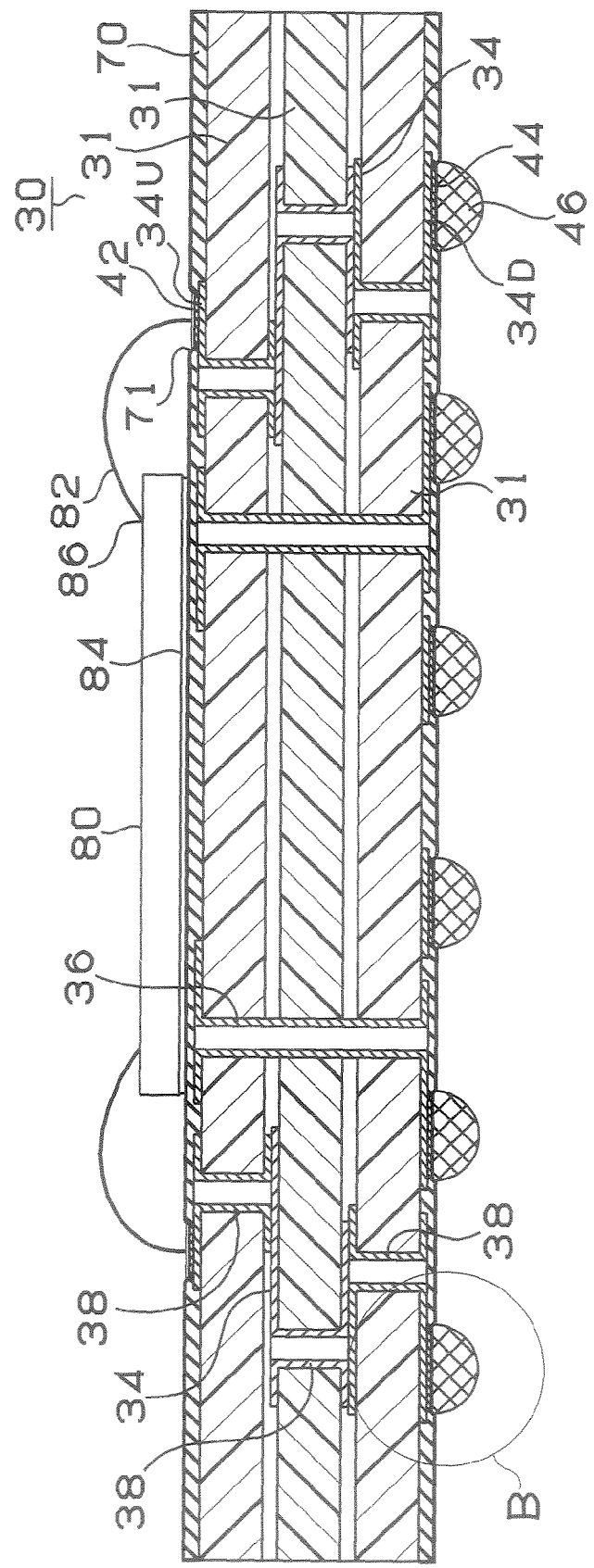
FIG. 9 is a sectional view of the multilayered printed wiring board according to a second embodiment of the present invention.

FIG. 9 shows the cross section of a printed circuit board 30 in embodiment 2. The multilayer printed circuit board 30 is a semiconductor mounting printed board which mounts a IC chip 80. The multilayer printed circuit board 30 consists of laminated plural, circuit boards 31, each board 31 has through holes 36, via holes 38 and conductor circuits 34. The conductor circuits 34U are formed on the upper surface of multilayer printed circuit board 30. The conductor circuits 34D are formed on the lower surface of multilayer printed, circuit board 30. Solder resist layer 70 is formed, on the surface side of the upper conductor circuits 34U. A part of conductor circuit 34U is exposed through opening portion 71 of solder resist layer 70, the exposed portion consists bonding pad 42. Also, solder resist layer 70 is formed on the surface side of the lower conductor circuits 34D. A part of conductor circuit 34D is exposed through opening portion 71 of solder resist layer 70, the exposed portion, consists bonding pad 44. solder layer 46 for connecting to outside circuit boards is formed on solder pad 44. IC chip 80 is mounted on the upper surface of multilayer printed circuit board 30 via adhesive 84. Terminals 86 of IC chip 80 and bonding pads 44 of the multilayer printed circuit board are bonding connected via wires 82.

Next, the solder pads will be explained with referring to FIG. 14. FIG. 14(B) enlarged shows circle B part of multilayer printed circuit board 30 in FIG. 9. Nickel plated layer 72 is formed on conductor circuit 34D. The conductor circuit 34D is connected to solder layer 46 via Ni—Sn alloy layer 75 on nickel plated layer 72. In embodiment 2, by controlling the average thickness of Cu—Ni—Sn alloy layer 75, the occurrence of the breakage in the interface between the nickel plated layers 72 and the solder layer 46 can be reduced. Thereby, the strength and adhesion of solder layer 46 can be improved.

Hereafter, a method for manufacturing the multilayer printed wiring board 30 described above will next be described with reference to FIGS. 10 to 13.

The printed circuit boards 31 having circuit patterns 34 and via holes 38 is prepared (FIG. 10(A)). The printed circuit boards 31 are bonded with adhesive 33 (FIG. 10(B)). The multilayer printed circuit boards consisting of the laminated printed circuit boards is drilled to form through holes 36 (FIG. 10(C)). Thereafter, the solder resist layer 70 having opening portions 71 is formed (FIG. 11(A)).

As shown in FIG. 11(A), conductor circuits 34U are formed on the upper side of the multilayer printed wiring board 30, a part of the conductor circuits 34U is exposed via the opening portions 71 of the solder resist layer 70. While, conductor circuits 34D are formed on the lower side of the multilayer board. A part of the conductor circuits 34D is exposed via the opening portions 71 of the solder resist layer 70. It is desirable to form the roughened surfaces on the conductor circuits 34U and the conductor circuits 34D so as to tightly bond with the solder resist layer 70.

(1) Next, nickel plated layers are formed on the solder pads of the substrate.

| [Nickel plating aqueous solution] | |
|---|---|
| nickel chloride | $2.3 \times 10^{-1}$ mol/l |
| sodium hypophosphite | 1.8 to $4.0 \times 10^{-1}$ mol/l |
| sodium citrate | $1.6 \times 10^{-1}$ mol/l |
| pH of 4.5 | |
| temperature of 40 to 60° C. | |

The substrate is immersed in the electroless nickel plating solution for 5 to 40 minutes, thereby forming nickel plated layers 72 in the opening portions 71 (FIG. 11(B)).

In Embodiment 2, nickel plated layers 72 are adjusted, so as to have a thickness of: 0.03 to 12 μm, to include 0.4 to 17 wt % of P. The thickness and the P content of the nickel plated layers are adjusted in considering the value of a plating tub and plating solution circulation. Thereby, in the case where the roughened surfaces have been formed on the conductor circuits 34U and the conductor circuits 34D, an uneven part of the roughened surfaces can be entirely covered, flattening the surface of the nickel plated layers 72.

(2) Thereafter, palladium layers are formed on the solder pads of the substrate on which the nickel plated layers have been formed.

| [Palladium plating aqueous solution] | |
|---|---|
| palladium chloride | $1.0 \times 10^{-2}$ mol/l |
| ethylenediamine | $8.0 \times 10^{-2}$ mol/l |
| sodium hypophosphite | 4.0 to $6.0 \times 10^{-2}$ mol/l |
| thiodiglycolic acid | 30 mg/l |
| pH of 8 | |
| temperature of 50 to 60° C. | |

The substrate is immersed in the electroless palladium plating solution for 3 to 10 minutes, thereby forming palladium plated layers 73 having a thickness of 0.08 μm the nickel plated layers 72 (FIG. 12(A)). In Embodiment 2, palladium plated layers 73 are adjusted so as to have a thickness of 0.008 to 2.0 μm, to include 1 to 8 wt % of P. The thickness and the P content of the palladium plated layers are adjusted in considering the value of a plating tub and plating solution circulation. Thereby, the bonding pads 42 are formed on the upper side conductor circuits 34U, and the solder pads 44 are formed on the lower side conductor circuits 34D. Here, gold layers can be formed on the palladium plated layers as oxidation resistance layers. In Embodiment 2, palladium plated layers 73 can be adjusted so as to have a thickness of 0.01 to 1.0 μm, to include 2 to 7 wt % of P.

(3) Solder paste 76α is printed on solder pads 44 in each opening 71 of the solder resist layer 70 (FIG. 12(B)). The solder pad 44 in FIG. 12(B) is enlarged shown in FIG. 14(A). The solder pad 44 consists of the multi-layers, that is, the two layers comprises nickel plated layers 72-palladium plated layers 73 which have been formed in turn on the conductor circuit 34D.

(4) Thereafter, solder layer 46 are formed by conducting reflow at 250° C. in nitrogenous atmosphere (FIG. 13(A)). During the reflow, palladium plated layers 73 and gold plated layers 64 almost diffuse into solder layer 46, Cu—Ni—Sn alloy layer 75, consisted of the nickel layers and composition metal of the solder, is formed in the interface between nickel plated layers 72 and solder layer 46 as shown in FIG. 9 and FIG. 14(B). Here, in Embodiment 2, the palladium plated layers 73 is adjusted, so as to have a thickness of 0.01 to 1.0 μm and the P content is adjusted to 2 to 7 wt %, thereby controlling the average thickness of Cu—Ni—Sn alloy layer 75. It reduces the occurrence of the breakage in the interface between the nickel plated layers 72 and the solder layer 46.

(5) IC chip 80 is mounted on the upper side of the finished multilayer printed wiring board 30 with adhesive 84 (FIG. 13(B)). Thereafter, bonding wires 82 are bonded between terminals 86 of IC chip 80 and bonding pads 42 of multilayer printed wiring board 30 (Refer to FIG. 9). While, outer connecting terminals (in this case, BGA:BALL GRID ARRAY) are placed on the solder layers. PGA (PIN GRID ARRAY)

can be placed as the outer connecting terminals. Also, capacitances or the like may be mounted on the solder layers.

Embodiment 2-1-1

In embodiment 2-1-2, an alloy of Cu: 0.5 wt %, Ag: 3.5 wt %, Sn: 95 wt % is used as a solder consisting of the solder layer. Ni layer is formed as thickness 5 μm, P content 1.2 wt %. On the other hand, Pd layer is formed as thickness 0.5 μm, P content 5 wt %. Therefore, the composition of the Ni—Sn alloy layer becomes Sn:Cu:Ni=42:37:21, the thickness becomes 1.5 μm. The Ni—Sn alloy layer is typically a board-shaped form. In embodiment 2-1-1, as shown in the electron microscope picture in the left side of FIG. 18, the Ni—Cu—Sn alloy layer is typically a board-shaped form, that is, formed in parallel with the Ni layer as same as above mentioned embodiment 1-1-1.

Embodiment 2-1-2

In embodiment 2-1-2, an alloy of Cu: 0.5 wt %, Ag: 3.5 wt %, Sn: 95 wt % is used as a solder consisting of the solder layer. Ni layer is formed as thickness 5 μm, P content 1.2 wt %. On the other hand, Pd layer is formed as thickness 0.01 μm, P content 2 wt %. Therefore, the composition of the Ni—Sn alloy layer becomes Sn:Cu:Ni=42:37:21, the thickness becomes 1.8 μm. The Ni—Sn alloy layer is typically a board-shaped form.

Embodiment 2-1-3

In embodiment 2-1-3, an alloy of Cu: 0.5 wt %, Ag: 3.5 wt %, Sn: 95 wt % is used as a solder consisting of the solder layer. Ni layer is formed as thickness 5 μm, P content 1.2 wt %. On the other hand, Pd layer is formed as thickness 0.01 μm, P content 7 wt %. Therefore, the composition of the Ni—Sn alloy layer becomes Sn:Cu:Ni=42:37:21, the thickness becomes 1.8 μm. The Ni—Sn alloy layer is typically a board-shaped form.

Embodiment 2-1-4

In embodiment 2-1-4, an alloy of Cu: 0.5 wt %, Ag: 3.5 wt %, Sn: 95 wt % is used as a solder consisting of the solder layer. Ni layer is formed as thickness 5 μm, P content 1.2 wt %. On the other hand, Pd layer is formed as thickness 1.0 μm, P content 2 wt %. Therefore, the composition of the Ni—Sn alloy layer becomes Sn:Cu:Ni=42:37:21, the thickness becomes 1.5 μm. The Ni—Sn alloy layer is typically a board-shaped form.

Embodiment 2-1-5

In embodiment 2-1-5, an alloy of Cu: 0.5 wt %, Ag: 3.5 wt %, Sn: 95 wt % is used as a solder consisting of the solder layer. Ni layer is formed as thickness 10 μm, P content 0.5 wt %. On the other hand, Pd layer is formed as thickness 1.0 μm, P content 7 wt %. Therefore, the composition of the Ni—Sn alloy layer becomes Sn:Cu:Ni=42:37:21, the thickness becomes 1.5 μm. The Ni—Sn alloy layer is typically a board-shaped form.

Embodiment 2-1-6

In embodiment 2-1-6, an alloy of Cu: 0.5 wt %, Ag: 3.5 wt %, Sn: 95 wt % is used as a solder consisting of the solder layer. Ni layer is formed as thickness 10 μm, P content 5 wt %. On the other hand, Pd layer is formed as thickness 0.01 μm, P content 7 wt %. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 2-1-7

In embodiment 2-1-7, an alloy of Cu: 0.5 wt %, Ag: 3.5 wt %, Sn: 95 wt % is used as a solder consisting of the solder layer. Ni layer is formed as thickness 0.05 μm, P content 0.5 wt %. On the other hand, Pd layer is formed as thickness 1 μm, P content 7 wt %. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 2-1-8

In embodiment 2-1-8, an alloy of Cu: 0.5 wt %, Ag: 3.5 wt %, Sn: 95 wt % is used as a solder consisting of the solder layer. Ni layer is formed as thickness 0.05 μm, P content 5 wt %. On the other hand, Pd layer is formed as thickness 0.01 μm, P content 3 wt %. Therefore, the composition of the Ni—Sn alloy layer becomes Sn:Cu:Ni=42:37:21, the thickness becomes 1.8 μm. The Ni—Sn alloy layer is typically a board-shaped form.

Embodiment 2-1-9

In embodiment 2-1-9, an alloy of Cu: 0.5 wt %, Ag: 3.5 wt %, Sn: 95 wt % is used as a solder consisting of the solder layer. Ni layer is formed as thickness 0.3 μm, P content 0.5 wt %. On the other hand, Pd layer is formed as thickness 0.01 μm, P content 2 wt %. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 2-1-10

In embodiment 2-1-10, an alloy of Cu: 0.5 wt %, Ag: 3.5 wt %, Sn: 95 wt % is used as a solder consisting of the solder layer. Ni layer is formed as thickness 0.3 μm, P content 0.5 wt %. On the other hand, Pd layer is formed as thickness 1 μm, P content 2 wt %. Therefore, the composition of the Ni—Sn alloy layer becomes Sn:Cu:Ni=42:37:21, the thickness becomes 1.6 μm. The Ni—Sn alloy layer is typically a board-shaped form.

Embodiment 2-1-11

In embodiment 2-1-11, an alloy of Cu: 0.5 wt %, Ag: 3.5 wt %, Sn: 95 wt % is used as a solder consisting of the solder layer. Ni layer is formed as thickness 0.3 μm, P content 5 wt %. On the other hand, Pd layer is formed as thickness 0.01 μm, P content 7 wt %. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 2-1-12

In embodiment 2-1-12, an alloy of Cu: 0.5 wt %, Ag: 3.5 wt %, Sn: 95 wt % is used as a solder consisting of the solder layer. Ni layer is formed, as thickness 0.3 μm, P content 5 wt %. On the other hand, Pd layer is formed as thickness 1 μm, P content 7 wt %. Therefore, the composition of the Ni—Sn alloy layer becomes Sn:Cu:Ni=42:37:21, the thickness becomes 1.6 μm. The Ni—Sn alloy layer is typically a board-shaped form.

Embodiment 2-1-13

In embodiment 2-1-13, an alloy of Cu: 0.5 wt %, Ag: 3.5 wt %, Sn: 95 wt % is used as a solder consisting of the solder layer. Ni layer is formed as thickness 1 μm, P content 0.5 wt %. On the other hand, Pd layer is formed as thickness 0.01 μm, P content 2 wt %. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 2-1-14

In embodiment 2-1-14, an alloy of Cu: 0.5 wt %, Ag: 3.5 wt %, Sn: 95 wt % is used as a solder consisting of the solder layer. Ni layer is formed as thickness 1 μm, P content 5 wt %. On the other hand, Pd layer is formed as thickness 1 μm, P content 7 wt %. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 2-1-15

In embodiment 2-1-15, an alloy of Cu: 0.5 wt %, Ag: 3.5 wt %, Sn: 95 wt % is used as a solder consisting of the solder layer. Ni layer is formed as thickness 0.3 μm, P content 8 wt %. On the other hand, Pd layer is formed as thickness 0.01 μm, P content 5 wt %. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 2-1-16

In embodiment 2-1-16, an alloy of Cu: 0.5 wt %, Ag: 3.5 wt %, Sn: 95 wt % is used as a solder consisting of the solder layer. Ni layer is formed as thickness 0.3 μm, P content 8 wt %. On the other hand, Pd layer is formed as thickness 1 μm, P content 7 wt %. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 2-1-17

In embodiment 2-1-17, an alloy of Cu: 0.5 wt %, Ag: 3.5 wt %, Sn: 95 wt % is used as a solder consisting of the solder layer. Ni layer is formed as thickness 0.05 μm, P content 10 wt %. On the other hand, Pd layer is formed as thickness 0.01 μm, P content 2 wt %. Therefore, the composition of the Ni—Sn alloy layer becomes Sn:Cu:Ni=42:37:21, the thickness becomes 1.8 μm. The Ni—Sn alloy layer is typically a board-shaped form.

Embodiment 2-1-18

In embodiment 2-1-18, an alloy of Cu: 0.5 wt %, Ag: 3.5 wt %, Sn: 95 wt % is used as a solder consisting of the solder layer. Ni layer is formed as thickness 1 μm, P content 10 wt %. On the other hand, Pd layer is formed as thickness 1 μm, P content 5 wt %. Therefore, the composition of the Ni—Sn alloy layer becomes Sn:Cu:Ni=42:37:21, the thickness becomes 1.8 μm. The Ni—Sn alloy layer is typically a board-shaped form.

Embodiment 2-1-19

In embodiment 2-1-19, an alloy of Cu: 0.5 wt %, Ag: 3.5 wt %, Sn: 95 wt % is used as a solder consisting of the solder layer. Ni layer is formed as thickness 0.05 μm, P content 15 wt %. On the other hand, Pd layer is formed as thickness 0.01 μm, P content 2 wt %. Therefore, the composition of the Ni—Sn alloy layer becomes Sn:Cu:Ni=42:37:21, the thickness becomes 2.0 μm. The Ni—Sn alloy layer is typically a board-shaped form.

Embodiment 2-1-20

In embodiment 2-1-20, an alloy of Cu: 0.5 wt %, Ag: 3.5 wt %, Sn: 95 wt % is used as a solder consisting of the solder layer. Ni layer is formed as thickness 1 μm, P content 15 wt %. On the other hand, Pd layer is formed as thickness 1 μm, P content 2 wt %. Therefore, the composition of the Ni—Sn alloy layer becomes Sn:Cu:Ni=42:37:21, the thickness becomes 1.9 μm. The Ni—Sn alloy layer is typically a board-shaped form.

Embodiment 2-1-21

In embodiment 2-1-21, an alloy of Cu: 0.5 wt %, Ag: 3.5 wt %, Sn: 95 wt % is used as a solder consisting of the solder layer. Ni layer is formed as thickness 8 μm, P content 15 wt %. On the other hand, Pd layer is formed as thickness 0.01 μm, P content 7 wt %. Therefore, the composition of the Ni—Sn alloy layer becomes Sn:Cu:Ni=42:37:21, the thickness becomes 2.0 μm. The Ni—Sn alloy layer is typically a board-shaped form.

Embodiment 2-1-22

In embodiment 2-1-22, an alloy of Cu: 0.5 wt %, Ag: 3.5 wt %, Sn: 95 wt % is used as a solder consisting of the solder layer. Ni layer is formed as thickness 10 μm, P content 15 wt %. On the other hand, Pd layer is formed as thickness 1 μm, P content 7 wt %. Therefore, the composition of the Ni—Sn alloy layer becomes Sn:Cu:Ni=42:37:21, the thickness becomes 2.1 μm. The Ni—Sn alloy layer is typically a board-shaped, form.

Embodiment 2-2-1

In embodiment 2-1-1, the Cu/Ag/Sn solder which does not include lead is used as the solder consisting of the solder layer. Whereas, in embodiment 2-2-1, an alloy of Sn:Pb=63:37 (wt %) is used as a solder consisting of the solder layer. Ni layer is formed as thickness 5 μm, P content 1.2 wt %. On the other hand, Pd layer is formed as thickness 0.5 μm, P content 5 wt %. Therefore, the composition of the Ni—Sn alloy layer becomes Sn:Ni=67:33, the thickness becomes 1.5 μm. The Ni—Sn alloy layer is typically a board-shaped form.

Embodiment 2-2-2

In embodiment 2-2-2, an alloy of Sn:Pb=63:37 (wt %) is used as a solder consisting of the solder layer. Ni layer is formed as thickness 5 μm, P content 1.2 wt %. On the other hand, Pd layer is formed as thickness 0.01 μm, P content 2 wt %. Therefore, the composition of the Ni—Sn alloy layer becomes Sn:Ni=67:33, the thickness becomes 1.8 μm. The Ni—Sn alloy layer is typically a board-shaped form.

Embodiment 2-2-3

In embodiment 2-2-3, an alloy of Sn:Pb=63:37 (wt %) is used as a solder consisting of the solder layer. Ni layer is formed as thickness 5 μm, P content 1.2 wt %. On the other hand, Pd layer is formed as thickness 0.01 μm, P content 7 wt %. Therefore, the composition of the Ni—Sn alloy layer becomes Sn:Ni=67:33, the thickness becomes 1.8 μm. The Ni—Sn alloy layer is typically a board-shaped form.

Embodiment 2-2-4

In embodiment 2-2-4, an alloy of Sn:Pb=63:37 (wt %) is used as a solder consisting of the solder layer. Ni layer is formed as thickness 5 μm, P content 1.2 wt %. On the other hand, Pd layer is formed as thickness 1.0 μm, P content 2 wt %. Therefore, the composition of the Ni—Sn alloy layer becomes Sn:Ni=67:33, the thickness becomes 1.5 μm. The Ni—Sn alloy layer is typically a board-shaped form.

Embodiment 2-2-5

In embodiment 2-2-5, an alloy of Sn:Pb=63:37 (wt %) is used as a solder consisting of the solder layer. Ni layer is formed as thickness 10 μm, P content 0.5 wt %. On the other hand, Pd layer is formed as thickness 1.0 μm, P content 7 wt %. Therefore, the composition of the Ni—Sn alloy layer becomes Sn:Ni=67:33, the thickness becomes 1.5 μm. The Ni—Sn alloy layer is typically a board-shaped form.

Embodiment 2-2-6

In embodiment 2-2-6, an alloy of Sn:Pb=63:37 (wt %) is used as a solder consisting of the solder layer. Ni layer is formed as thickness 10 μm, P content 5 wt %. On the other hand, Pd layer is formed as thickness 0.01 μm, P content 7 wt %. Therefore, the composition of the Ni—Sn alloy layer becomes Sn:Ni=67:33, the thickness becomes 1.7 μm. The Ni—Sn alloy layer is typically a board-shaped form.

Embodiment 2-2-7

In embodiment 2-2-7, an alloy of Sn:Pb=63:37 (wt %) is used as a solder consisting of the solder layer. Ni layer is formed as thickness 0.05 μm, P content 0.5 wt %. On the other hand, Pd layer is formed as thickness 1 μm, P content 7 wt %. Therefore, the composition of the Ni—Sn alloy layer becomes Sn:Ni=67:33, the thickness becomes 1.7 μm. The Ni—Sn alloy layer is typically a board-shaped form.

Embodiment 2-2-8

In embodiment 2-2-8, an alloy of Sn:Pb=63:37 (wt %) is used as a solder consisting of the solder layer. Ni layer is formed as thickness 0.05 μm, P content 5 wt %. On the other hand, Pd layer is formed as thickness 0.01 μm, P content 3 wt %. Therefore, the composition of the Ni—Sn alloy layer becomes Sn:Ni=67:33, the thickness becomes 1.8 μm. The Ni—Sn alloy layer is typically a board-shaped form.

Embodiment 2-2-9

In embodiment 2-2-9, an alloy of Sn:Pb=63:37 (wt %) is used as a solder consisting of the solder layer. Ni layer is formed as thickness 0.3 μm, P content 0.5 wt %. On the other hand, Pd layer is formed as thickness 0.01 μm, P content 2 wt %. Therefore, the composition of the Ni—Sn alloy layer becomes Sn:Ni=67:33, the thickness becomes 1.7 μm. The Ni—Sn alloy layer is typically a board-shaped form.

Embodiment 2-2-10

In embodiment 2-2-10, an alloy of Sn:Pb=63:37 (wt %) is used as a solder consisting of the solder layer. Ni layer is formed as thickness 0.3 μm, P content 0.5 wt %. On the other hand, Pd layer is formed as thickness 1 μm, P content 2 wt %. Therefore, the composition of the Ni—Sn alloy layer becomes Sn:Ni=67:33, the thickness becomes 1.6 μm, The Ni—Sn alloy layer is typically a board-shaped form.

Embodiment 2-2-11

In embodiment 2-2-11, an alloy of Sn:Pb=63:37 (wt %) is used as a solder consisting of the solder layer. Ni layer is formed as thickness 0.3 μm, P content 5 wt %. On the other hand, Pd layer is formed as thickness 0.01 μm, P content 7 wt %. Therefore, the composition of the Ni—Sn alloy layer becomes Sn:Ni=67:33, the thickness becomes 1.7 μm. The Ni—Sn alloy layer is typically a board-shaped form.

Embodiment 2-2-12

In embodiment 2-2-12, an alloy of Sn:Pb=63:37 (wt %) is used as a solder consisting of the solder layer. Ni layer is formed as thickness 0.3 μm, P content 5 wt %. On the other hand, Pd layer is formed as thickness 1 μm, P content 7 wt %. Therefore, the composition of the Ni—Sn alloy layer becomes Sn:Ni=67:33, the thickness becomes 1.6 μm. The Ni—Sn alloy layer is typically a board-shaped form.

Embodiment 2-2-13

In embodiment 2-2-13, an alloy of Sn:Pb=63:37 (wt %) is used as a solder consisting of the solder layer. Ni layer is formed as thickness 1 μm, P content 0.5 wt %. On the other hand, Pd layer is formed as thickness 0.01 μm, P content 2 wt %. Therefore, the composition of the Ni—Sn alloy layer becomes Sn:Ni=67:33, the thickness becomes 1.7 μm. The Ni—Sn alloy layer is typically a board-shaped form.

Embodiment 2-2-14

In embodiment 2-2-14, an alloy of Sn:Pb=63:37 (wt %) is used as a solder consisting of the solder layer. Ni layer is formed as thickness 1 μm, P content 5 wt %. On the other hand, Pd layer is formed as thickness 1 μm, P content 7 wt %. Therefore, the composition of the Ni—Sn alloy layer becomes Sn:Ni=67:33, the thickness becomes 1.7 μm. The Ni—Sn alloy layer is typically a board-shaped form.

Embodiment 2-2-15

In embodiment 2-2-15, an alloy of Sn:Pb=63:37 (wt %) is used as a solder consisting of the solder layer. Ni layer is formed as thickness 0.3 μm, P content 8 wt %. On the other hand, Pd layer is formed as thickness 0.01 μm, P content 5 wt %. Therefore, the composition of the Ni—Sn alloy layer becomes Sn:Ni=67:33, the thickness becomes 1.7 μm. The Ni—Sn alloy layer is typically a board-shaped form.

Embodiment 2-2-16

In embodiment 2-2-16, an alloy of Sn:Pb=63:37 (wt %) is used as a solder consisting of the solder layer. Ni layer is formed as thickness 0.3 μm, P content 8 wt %. On the other hand, Pd layer is formed as thickness 1 μm, P content 7 wt %. Therefore, the composition of the Ni—Sn alloy layer becomes Sn:Ni=67:33, the thickness becomes 1.7 μm. The Ni—Sn alloy layer is typically a board-shaped form.

Embodiment 2-2-17

In embodiment 2-2-17, an alloy of Sn:Pb=63:37 (wt %) is used as a solder consisting of the solder layer. Ni layer is formed as thickness 0.05 μm, P content 10 wt %. On the other hand, Pd layer is formed as thickness 0.01 μm, P content 2 wt %. Therefore, the composition of the Ni—Sn alloy layer becomes Sn:Ni=67:33, the thickness becomes 1.8 μm. The Ni—Sn alloy layer is typically a board-shaped form.

Embodiment 2-2-18

In embodiment 2-2-18, an alloy of Sn:Pb=63:37 (wt %) is used as a solder consisting of the solder layer. Ni layer is formed as thickness 1 μm, P content 10 wt %. On the other hand, Pd layer is formed as thickness 1 μm, P content 5 wt %. Therefore, the composition of the Ni—Sn alloy layer becomes Sn:Ni=67:33, the thickness becomes 1.7 μm. The Ni—Sn alloy layer is typically a board-shaped form.

Embodiment 2-2-19

In embodiment 2-2-19, an alloy of Sn:Pb=63:37 (wt %) is used as a solder consisting of the solder layer. Ni layer is formed as thickness 0.05 μm, P content 15 wt %. On the other hand, Pd layer is formed as thickness 0.01 μm, P content 2 wt %. Therefore, the composition of the Ni—Sn alloy layer becomes Sn:Ni=67:33, the thickness becomes 1.9 μm. The Ni—Sn alloy layer is typically a board-shaped form.

Embodiment 2-2-20

In embodiment 2-2-20, an alloy of Sn:Pb=63:37 (wt %) is used as a solder consisting of the solder layer. Ni layer is formed as thickness 1 μm, P content 15 wt %. On the other hand, Pd layer is formed as thickness 1 μm, P content 2 wt %. Therefore, the composition of the Ni—Sn alloy layer becomes Sn:Ni=67:33, the thickness becomes 1.8 μm. The Ni—Sn alloy layer is typically a board-shaped form.

Embodiment 2-2-21

In embodiment 2-2-21, an alloy of Sn:Pb=63:37 (wt %) is used as a solder consisting of the solder layer. Ni layer is formed as thickness 8 μm, P content 15 wt %. On the other hand, Pd layer is formed as thickness 0.01 μm, P content 7 wt %. Therefore, the composition of the Ni—Sn alloy layer becomes Sn:Ni=67:33, the thickness becomes 2.1 μm. The Ni—Sn alloy layer is typically a board-shaped form.

Embodiment 2-2-22

In embodiment 2-2-22, an alloy of Sn:Pb=63:37 (wt %) is used as a solder consisting of the solder layer. Ni layer is formed as thickness 10 μm, P content 15 wt %. On the other hand, Pd layer is formed as thickness 1 μm, P content 7 wt %. Therefore, the composition of the Ni—Sn alloy layer becomes Sn:Ni=67:33, the thickness becomes 2.2 μm. The Ni—Sn alloy layer is typically a board-shaped form.

Embodiment 2-3-1

In embodiments 2-3-1 to 2-3-14, the alloy of Cu: 0.5 wt %, Ag: 3.5 wt %, Sn: 95 wt % is used as a solder consisting of the solder layer as same as embodiments 2-1-1 to 2-1-14. Ni layer is formed as thickness 5 μm, P content 1.2 wt % as same as embodiment 2-1-1. On the other hand, Pd layer is formed as thickness 0.009 μm, P content 8 wt %. Therefore, the composition of the Ni—Sn alloy layer becomes Sn:Cu:Ni=42:45:13, the thickness becomes 2.5 μm. In embodiment 2-3-1, the Cu—Ni—Sn alloy layer is typically a pillar-shaped form, that is, pillar-shaped alloy crystal vertically formed along with the Ni layer as same as embodiment 1-3-1.

Embodiment 2-3-2

In embodiment 2-3-2, an alloy of Cu: 0.5 wt %, Ag: 3.5 wt %, Sn: 95 wt % is used as a solder consisting of the solder layer. Ni layer is formed as thickness 5 μm, P content 1.2 wt % as same as embodiment 2-3-1. On the other hand, Pd layer is formed as thickness 0.008 μm, P content 7 wt %. Therefore, the composition of the Ni—Sn alloy layer becomes Sn:Cu:Ni=42:45:13, the thickness becomes 2.5 μm. The Ni—Sn alloy layer is typically a pillar-shaped form.

Embodiment 2-3-3

In embodiment 2-3-3, an alloy of Cu: 0.5 wt %, Ag: 3.5 wt %, Sn: 95 wt % is used as a solder consisting of the solder layer. Ni layer is formed as thickness 5 μm, P content 1.2 wt % as same as embodiment 2-3-1. On the other hand, Pd layer is formed as thickness 0.009 μm, P content 1 wt %. Therefore, the composition of the Ni—Sn alloy layer becomes Sn:Cu:Ni=42:45:13, the thickness becomes 2.5 μm. The Ni—Sn alloy layer is typically a pillar-shaped form.

Embodiment 2-3-4

In embodiment 2-3-4, an alloy of Cu: 0.5 wt %, Ag: 3.5 wt %, Sn: 95 wt % is used as a solder consisting of the solder layer. Ni layer is formed as thickness 5 μm, P content 1.2 wt % as same as embodiment 2-3-1. On the other hand, Pd layer is formed as thickness 2.0 μm, P content 2 wt %. Therefore, the composition of the Ni—Sn alloy layer becomes Sn:Cu:Ni=66:29:5, the thickness becomes 1.3 μm. The Ni—Sn alloy layer is typically a grain-shaped and formed at an interface of the Ni layer.

Embodiment 2-3-5

In embodiment 2-3-5, an alloy of Cu: 0.5 wt %, Ag: 3.5 wt %, Sn: 95 wt % is used as a solder consisting of the solder layer. Ni layer is formed as thickness 10 μm, P content 0.5 wt %. On the other hand, Pd layer is formed as thickness 2.0 μm, P content 5 wt %. Therefore, the composition of the Ni—Sn alloy layer becomes Sn:Cu:Ni=66:29:5, the thickness becomes 1.3 μm. The Ni—Sn alloy layer is typically a grain-shaped and formed at an interface of the Ni layer.

Embodiment 2-3-6

In embodiment 2-3-6, an alloy of Cu: 0.5 wt %, Ag: 3.5 wt %, Sn: 95 wt % is used as a solder consisting of the solder layer, Ni layer is formed, as thickness 10 μm, P content 5 wt %. On the other hand, Pd layer is formed as thickness 2.0 μm, P content 9 wt %. Therefore, the composition of the Ni—Sn alloy layer becomes Sn:Cu:Ni=66:29:5, the thickness becomes 1.5 μm. The Ni—Sn alloy layer is typically a grain-shaped and formed at an interface of the Ni layer.

Embodiment 2-3-7

In embodiment 2-3-7, an alloy of Cu: 0.5 wt %, Ag: 3.5 wt %, Sn: 95 wt % is used as a solder consisting of the solder layer. Ni layer is formed as thickness 0.03 μm, P content 0.4 wt %. On the other hand, Pd layer is formed as thickness 0.03 μm, P content 3 wt %. Therefore, the composition of the Ni—Sn alloy layer becomes Sn:Cu:Ni=66:29:5, the thickness becomes 1.1 μm. The Ni—Sn alloy layer is typically a grain-shaped and formed at an interface of the Ni layer.

Embodiment 2-3-8

In embodiment 2-3-8, an alloy of Cu: 0.5 wt %, Ag: 3.5 wt %, Sn: 95 wt % is used as a solder consisting of the solder layer. Ni layer is formed as thickness 0.03 μm, P content 0.5 wt %. On the other hand, Pd layer is formed as thickness 0.2 μm, P content 7 wt %. Therefore, the composition of the Ni—Sn alloy layer becomes Sn:Cu:Ni=66:29:5, the thickness becomes 1.3 μm. The Ni—Sn alloy layer is typically a grain-shaped and formed at an interface of the Ni layer.

Embodiment 2-3-9

In embodiment 2-3-9, an alloy of Cu: 0.5 wt %, Ag: 3.5 wt %, Sn: 95 wt % is used as a solder consisting of the solder layer. Ni layer is formed as thickness 0.03 μm, P content 16 wt %. On the other hand, Pd layer is formed as thickness 0.2 μm, P content 7 wt %. Therefore, the composition of the Ni—Sn alloy layer becomes Sn:Cu:Ni=66:29:5, the thickness becomes 1.3 μm. The Ni—Sn alloy layer is typically a grain-shaped, and formed at an interface of the Ni layer.

Embodiment 2-3-10

In embodiment 2-3-10, an alloy of Cu: 0.5 wt %, Ag: 3.5 wt %, Sn: 95 wt % is used as a solder consisting of the solder layer. Ni layer is formed as thickness 10 μm, P content 0.4 wt %. On the other hand, Pd layer is formed as thickness 0.2 μm, P content 2 wt %. Therefore, the composition of the Ni—Sn alloy layer becomes Sn:Cu:Ni=66:29:5, the thickness becomes 1.4 μm. The Ni—Sn alloy layer is typically a grain-shaped and formed at an interface of the Ni layer.

Embodiment 2-3-11

In embodiment 2-3-11, an alloy of Cu: 0.5 wt %, Ag: 3.5 wt %, Sn: 95 wt % is used as a solder consisting of the solder layer. Ni layer is formed as thickness 10 μm, P content 16 wt %. On the other hand, Pd layer is formed as thickness 1 μm, P content 7 wt %. Therefore, the composition of the Ni—Sn alloy layer becomes Sn:Cu:Ni=66:29:5, the thickness becomes 1.5 μm. The Ni—Sn alloy layer is typically a grain-shaped and formed at an interface of the Ni layer.

Embodiment 2-3-12

In embodiment 2-3-12, an alloy of Cu: 0.5 wt %, Ag: 3.5 wt %, Sn: 95 wt % is used as a solder consisting of the solder layer. Ni layer is formed as thickness 12 μm, P content 0.4 wt %. On the other hand, Pd layer is formed as thickness 1 μm, P content 2 wt %. Therefore, the composition of the Ni—Sn alloy layer becomes Sn:Cu:Ni=66:29:5, the thickness becomes 2.4 μm. The Ni—Sn alloy layer is typically a grain-shaped and formed at an interface of the Ni layer.

Embodiment 2-3-13

In embodiment 2-3-13, an alloy of Cu: 0.5 wt %, Ag: 3.5 wt %, Sn: 95 wt % is used as a solder consisting of the solder layer. Ni layer is formed as thickness 12 μm, P content 5 wt %. On the other hand, Pd layer is formed as thickness 1 μm, P content 2 wt %. Therefore, the composition of the Ni—Sn alloy layer becomes Sn:Cu:Ni=66:29:5, the thickness becomes 2.5 μm. The Ni—Sn alloy layer is typically a grain-shaped and formed at an interface of the Ni layer.

Embodiment 2-3-14

In embodiment 2-3-14, an alloy of Cu: 0.5 wt %, Ag: 3.5 wt %, Sn: 95 wt % is used as a solder consisting of the solder layer. Ni layer is formed as thickness 12 μm, P content 17 wt %. On the other hand, Pd layer is formed as thickness 1 μm, P content 7 wt %. Therefore, the composition of the Ni—Sn alloy layer becomes Sn:Cu:Ni=66:29:5, the thickness becomes 2.4 μm. The Ni—Sn alloy layer is typically a grain-shaped and formed at an interface of the Ni layer.

Embodiment 2-4-1

In embodiments 2-4-1 to 2-4-14, an alloy of Sn:Pb=63:37 (wt %) is used as a solder consisting of the solder layer as same as embodiments 2-2-1 to 2-2-14. Ni layer is formed as thickness 5 μm, P content 1.2 wt % as same as embodiments 2-2-1. On the other hand, Pd layer is formed as thickness 0.009 μm, P content 8 wt %. Therefore, the composition of the Ni—Sn alloy layer becomes Sn:Ni=67:33, the thickness becomes 2.5 μm. The Ni—Sn alloy layer is typically a pillar-shaped form.

Embodiment 2-4-2

In embodiment 2-4-2, an alloy of Sn:Pb=63:37 (wt %) is used as a solder consisting of the solder layer. Ni layer is formed as thickness 5 μm, P content 1.2 wt % as same as embodiments 2-4-1. On the other hand, Pd layer is formed as thickness 0.008 μm, P content 7 wt %. Therefore, the composition of the Ni—Sn alloy layer becomes Sn:Ni=67:33, the thickness becomes 2.5 μm. The Ni—Sn alloy layer is typically a pillar-shaped form.

Embodiment 2-4-3

In embodiment 2-4-3, an alloy of Sn:Pb=63:37 (wt %) is used as a solder consisting of the solder layer. Ni layer is formed as thickness 5 μm, P content 1.2 wt % as same as embodiments 2-4-1. On the other hand, Pd layer is formed as thickness 0.009 μm, P content 1 wt %. Therefore, the composition of the Ni—Sn alloy layer becomes Sn:Ni=67:33, the thickness becomes 2.5 μm. The Ni—Sn alloy layer is typically a pillar-shaped form.

Embodiment 2-4-4

In embodiment 2-4-4, an alloy of Sn:Pb=63:37 (wt %) is used as a solder consisting of the solder layer. Ni layer is formed as thickness 5 μm, P content 1.2 wt % as same as embodiments 2-4-1. On the other hand, Pd layer is formed as thickness 2.0 μm, P content 2 wt %. Therefore, the composition of the Ni—Sn alloy layer becomes Sn:Ni=67:33, the thickness becomes 1.3 μm. The Ni—Sn alloy layer is typically a grain-shaped and formed at an interface of the Ni layer.

Embodiment 2-4-5

In embodiment 2-4-5, an alloy of Sn:Pb=63:37 (wt %) is used as a solder consisting of the solder layer. Ni layer is formed as thickness 10 μm, P content 0.5 wt %. On the other hand, Pd layer is formed as thickness 2.0 µm, P content 5 wt %. Therefore, the composition of the Ni—Sn alloy layer becomes Sn:Ni=67:33, the thickness becomes 1.3 µm. The Ni—Sn alloy layer is typically a grain-shaped and formed at an interface of the Ni layer.

Embodiment 2-4-6

In embodiment 2-4-6, an alloy of Sn:Pb=63:37 (wt %) is used as a solder consisting of the solder layer. Ni layer is formed as thickness 10 µm, P content 5 wt %. On the other hand, Pd layer is formed as thickness 2.0 µm, P content 9 wt %. Therefore, the composition of the Ni—Sn alloy layer becomes Sn:Ni=67:33, the thickness becomes 1.5 µm. The Ni—Sn alloy layer is typically a grain-shaped and formed at an interface of the Ni layer.

Embodiment 2-4-7

In embodiment 2-4-7, an alloy of Sn:Pb=63:37 (wt %) is used as a solder consisting of the solder layer. Ni layer is formed as thickness 0.03 µm, P content 0.4 wt %. On the other hand, Pd layer is formed as thickness 0.03 µm, P content 3 wt %. Therefore, the composition of the Ni—Sn alloy layer becomes Sn:Ni=67:33, the thickness becomes 1.1 µm. The Ni—Sn alloy layer is typically a grain-shaped and formed at an interface of the Ni layer.

Embodiment 2-4-8

In embodiment 2-4-8, an alloy of Sn:Pb=63:37 (wt %) is used as a solder consisting of the solder layer. Ni layer is formed as thickness 0.03 µm, P content 0.5 wt %. On the other hand, Pd layer is formed as thickness 0.2 µm, P content 7 wt %. Therefore, the composition of the Ni—Sn alloy layer becomes Sn:Ni=67:33, the thickness becomes 1.3 µm. The Ni—Sn alloy layer is typically a grain-shaped and formed at an interface of the Ni layer.

Embodiment 2-4-9

In embodiment 2-4-9, an alloy of Sn:Pb=63:37 (wt %) is used as a solder consisting of the solder layer. Ni layer is formed as thickness 0.03 µm, P content 16 wt %. On the other hand, Pd layer is formed as thickness 0.2 µm, P content 7 wt %. Therefore, the composition of the Ni—Sn alloy layer becomes Sn:Ni=67:33, the thickness becomes 1.3 µm. The Ni—Sn alloy layer is typically a grain-shaped and formed at an interface of the Ni layer.

Embodiment 2-4-10

In embodiment 2-4-10, an alloy of Sn:Pb=63:37 (wt %) is used as a solder consisting of the solder layer. Ni layer is formed, as thickness 10 µm, P content 0.4 wt %. On the other hand, Pd layer is formed as thickness 0.2 µm, P content 2 wt %. Therefore, the composition of the Ni—Sn alloy layer becomes Sn:Ni=67:33, the thickness becomes 1.4 µm. The Ni—Sn alloy layer is typically a grain-shaped and formed at an interface of the Ni layer.

Embodiment 2-4-11

In embodiment 2-4-11, an alloy of Sn:Pb=63:37 (wt %) is used as a solder consisting of the solder layer. Ni layer is formed as thickness 10 µm, P content 16 wt %. On the other hand, Pd layer is formed as thickness 1 µm, P content 7 wt %. Therefore, the composition of the Ni—Sn alloy layer becomes Sn:Ni=67:33, the thickness becomes 1.5 µm. The Ni—Sn alloy layer is typically a grain-shaped and formed at an interface of the Ni layer.

Embodiment 2-4-12

In embodiment 2-4-12, an alloy of Sn:Pb=63:37 (wt %) is used as a solder consisting of the solder layer. Ni layer is formed as thickness 12 µm, P content 0.4 wt %. On the other hand, Pd layer is formed as thickness 1 µm, P content 2 wt %. Therefore, the composition of the Ni—Sn alloy layer becomes Sn:Ni=67:33, the thickness becomes 2.4 µm. The Ni—Sn alloy layer is typically a grain-shaped and formed at an interface of the Ni layer.

Embodiment 2-4-13

In embodiment 2-4-13, an alloy of Sn:Pb=63:37 (wt %) is used as a solder consisting of the solder layer. Ni layer is formed as thickness 12 µm, P content 5 wt %. On the other hand, Pd layer is formed as thickness 1 µm, P content 2 wt %. Therefore, the composition of the Ni—Sn alloy layer becomes Sn:Ni=67:33, the thickness becomes 2.5 µm. The Ni—Sn alloy layer is typically a grain-shaped and formed at an interface of the Ni layer.

Embodiment 2-4-14

In embodiment 2-4-14, an alloy of Sn:Pb=63:37 (wt %) is used as a solder consisting of the solder layer. Ni layer is formed as thickness 12 µm, P content 17 wt %. On the other hand, Pd layer is formed as thickness 1 µm, P content 7 wt %. Therefore, the composition of the Ni—Sn alloy layer becomes Sn:Ni=67:33, the thickness becomes 2.4 µm. The Ni—Sn alloy layer is typically a grain-shaped and formed at an interface of the Ni layer.

Embodiment 2-5-1

In embodiment 2-5-1, an alloy of Sn:Pb=63:37 (wt %) is used as a solder consisting of the solder layer. Ni layer is formed as thickness 5 µm, P content 1.2 wt %. On the other hand, Pd layer is formed as thickness 0.03 µm, P content 0 wt %. When the solder is conducted reflow, flux containing copper is used. Therefore, the composition of the Ni—Sn alloy layer becomes Sn:Cu:Ni=42:37:21, the thickness becomes 1.5 µm. The Ni—Sn alloy layer is typically a grain-shaped form.

Embodiment 2-5-2

In embodiment 2-5-2, an alloy of Sn:Pb=63:37 (wt %) is used as a solder consisting of the solder layer. Ni layer is formed as thickness 5 µm, P content 1.2 wt %. On the other hand, Pd layer is formed as thickness 0.07 µm, P content 5 wt %. When the solder is conducted reflow, flux containing copper is used. Therefore, the composition of the Ni—Sn alloy layer becomes Sn:Cu:Ni=42:37:21, the thickness becomes 1.5 µm. The Ni—Sn alloy layer is typically a board-shaped form.

Reference Example 2-1-1

In reference examples 2-1-1 to 2-1-12 and reference examples 2-2-1 to 2-2-12, a buildup-multi-layer-circuitboard is formed and a solder layer is formed, as same as the above embodiment 2 explained with referring to FIGS. 9-14.

In reference example 2-1-1, an alloy of Cu: 0.2 wt %, Ag: 1 wt %, Sn: 97 wt % is used as a solder consisting of the solder layer. Ni layer is formed as thickness 5 μm, P content 1.2 wt %. On the other hand, Pd layer is formed as thickness 0.5 μm, P content 0 wt %. Therefore, the composition of the Ni—Sn alloy layer becomes Sn:Cu:Ni=38:20:42, the thickness becomes 0.8 μm. In reference example 2-1-1, as shown in the electron microscope picture in the right side of FIG. 18, the Ni—Cu—Sn alloy layer is typically a pillar-shaped form, that is, pillar-shaped alloy crystal vertically formed along with the Ni layer.

Reference Example 2-1-2

In reference example 2-1-2, an alloy of Cu: 0.2 wt %, Ag: 1 wt %, Sn: 97 wt % is used as a solder consisting of the solder layer. Ni layer is formed as thickness 5 μm, P content 4 wt %. On the other hand, Pd layer is formed as thickness 1.0 μm, P content 0.8 wt %. Therefore, the composition of the Ni—Sn alloy layer becomes Sn:Cu:Ni=40:25:35, the thickness becomes 0.9 μm.

Reference Example 2-1-3

In reference example 2-1-3, an alloy of Cu: 0.2 wt %, Ag: 1 wt %, Sn: 97 wt % is used as a solder consisting of the solder layer. Ni layer is formed as thickness 5 μm, P content 4 wt %. On the other hand, Pd layer is formed as thickness 1.0 μm, P content 9 wt %. Therefore, the composition of the Ni—Sn alloy layer becomes Sn:Cu:Ni=39:26:49, the thickness becomes 2.7 μm.

Reference Example 2-1-4

In reference example 2-1-4, an alloy of Cu: 0.2 wt %, Ag: 1 wt %, Sn: 97 wt % is used as a solder consisting of the solder layer. Ni layer is formed as thickness 5 μm, P content 4 wt %. On the other hand, Pd layer is formed as thickness 1.5 μm, P content 9 wt %. Therefore, the composition of the Ni—Sn alloy layer becomes Sn:Cu:Ni=39:26:49, the thickness becomes 2.9 μm.

Reference Example 2-1-5

In reference example 2-1-5, an alloy of Cu: 0.2 wt %, Ag: 1 wt %, Sn: 97 wt % is used as a solder consisting of the solder layer. Ni layer is formed as thickness 0.03 μm, P content 0.4 wt %. On the other hand, Pd layer is formed as thickness 0.5 μm, P content 0 wt %. Therefore, the composition of the Ni—Sn alloy layer becomes Sn:Cu:Ni=38:20:42, the thickness becomes 0.8 μm.

Reference Example 2-1-6

In reference example 2-1-6, an alloy of Cu: 0.2 wt %, Ag: 1 wt %, Sn: 97 wt % is used as a solder consisting of the solder layer. Ni layer is formed as thickness 0.03 μm, P content 0.4 wt %. On the other hand, Pd layer is formed as thickness 1.0 μm, P content 2 wt %. Therefore, the composition of the Ni—Sn alloy layer becomes Sn:Cu:Ni=40:25:35, the thickness becomes 0.9 μm.

Reference Example 2-1-7

In reference example 2-1-7, an alloy of Cu: 0.2 wt %, Ag: 1 wt %, Sn: 97 wt % is used as a solder consisting of the solder layer. Ni layer is formed as thickness 0.03 μm, P content 17 wt %. On the other hand, Pd layer is formed as thickness 1.0 μm, P content 9 wt %. Therefore, the composition of the Ni—Sn alloy layer becomes Sn:Cu:Ni=40:25:35, the thickness becomes 0.9 μm.

Reference Example 2-1-8

In reference example 2-1-8, an alloy of Cu: 0.2 wt %, Ag: 1 wt %, Sn: 97 wt % is used as a solder consisting of the solder layer, Ni layer is formed as thickness 0.03 μm, P content 17 wt %. On the other hand, Pd layer is formed as thickness 1.5 μm, P content 9 wt %. Therefore, the composition of the Ni—Sn alloy layer becomes Sn:Cu:Ni=40:25:35, the thickness becomes 0.9 μm.

Reference Example 2-1-9

In reference example 2-1-9, an alloy of Cu: 0.2 wt %, Ag: 1 wt %, Sn: 97 wt % is used as a solder consisting of the solder layer. Ni layer is formed as thickness 12 μm, P content 0.4 wt %. On the other hand, Pd layer is formed as thickness 0.5 μm, P content 0 wt %. Therefore, the composition of the Ni—Sn alloy layer becomes Sn:Cu:Ni=39:26:49, the thickness becomes 2.5 μm.

Reference Example 2-1-10

In reference example 2-1-10, an alloy of Cu: 0.2 wt %, Ag: 1 wt %, Sn: 97 wt % is used as a solder consisting of the solder layer. Ni layer is formed as thickness 12 μm, P content 0.4 wt %. On the other hand, Pd layer is formed as thickness 1 μm, P content 2 wt %. Therefore, the composition of the Ni—Sn alloy layer becomes Sn:Cu:Ni=39:26:49, the thickness becomes 2.6 μm.

Reference Example 2-1-11

In reference example 2-1-11, an alloy of Cu: 0.2 wt %, Ag: 1 wt %, Sn: 97 wt % is used as a solder consisting of the solder layer. Ni layer is formed as thickness 12 μm, P content 16 wt %. On the other hand, Pd layer is formed as thickness 1 μm, P content 9 wt %. Therefore, the composition of the Ni—Sn alloy layer becomes Sn:Cu:Ni=39:26:49, the thickness becomes 2.7 μm.

Reference Example 2-1-12

In reference example 2-1-12, an alloy of Cu: 0.2 wt %, Ag: 1 wt %, Sn: 97 wt % is used as a solder consisting of the solder layer. Ni layer is formed as thickness 12 μm, P content 16 wt %. On the other hand, Pd layer is formed as thickness 1.5 μm, P content 9 wt %. Therefore, the composition of the Ni—Sn alloy layer becomes Sn:Cu:Ni=39:26:49, the thickness becomes 2.9 μm.

Reference Example 2-2-1

In reference examples 2-1-1 to 2-1-12, the Cu/Ag/Sn solder which does not include lead is used as the solder consisting of the solder layer. Whereas, in reference examples 2-2-1 to 2-2-12, an alloy of Sn:Pb=63:37 (wt %) is used as a solder consisting of the solder layer. Ni layer is formed as thickness 5 μm, P content 1.2 wt %. On the other hand, Pd layer is farmed as thickness 0.5 μm, P content 0 wt %. Therefore, the composition of the Ni—Sn alloy layer becomes Sn:Ni=67:33, the thickness becomes 0.8 µm.

Reference Example 2-2-2

In reference example 2-2-2, an alloy of Sn:Pb=63:37 (wt %) is used as a solder consisting of the solder layer. Ni layer is formed as thickness 5 µm, P content 4 wt %. On the other hand, Pd layer is formed as thickness 1.0 µm, P content 0.8 wt %. Therefore, the composition of the Ni—Sn alloy layer becomes Sn:Ni=67:33, the thickness becomes 0.9 µm.

Reference Example 2-2-3

In reference example 2-2-3, an alloy of Sn:Pb=63:37 (wt %) is used as a solder consisting of the solder layer. Ni layer is formed as thickness 5 µm, P content 4 wt %. On the other hand, Pd layer is formed as thickness 1.0 µm, P content 9 wt %. Therefore, the composition of the Ni—Sn alloy layer becomes Sn:Ni=67:33, the thickness becomes 2.7 µm.

Reference Example 2-2-4

In reference example 2-2-4, an alloy of Sn:Pb=63:37 (wt %) is used as a solder consisting of the solder layer. Ni layer is formed as thickness 5 µm, P content 4 wt %. On the other hand, Pd layer is formed as thickness 1.5 µm, P content 9 wt %. Therefore, the composition of the Ni—Sn alloy layer becomes Sn:Ni=67:33, the thickness becomes 2.9 µm.

Reference Example 2-2-5

In reference example 2-2-5, an alloy of Sn:Pb=63:37 (wt %) is used as a solder consisting of the solder layer. Ni layer is formed as thickness 0.03 µm, P content 0.4 wt %. On the other hand, Pd layer is formed as thickness 0.5 µm, P content 0 wt %. Therefore, the composition of the Ni—Sn alloy layer becomes Sn:Ni=67:33, the thickness becomes 0.8 µm.

Reference Example 2-2-6

In reference example 2-2-6, an alloy of Sn:Pb=63:37 (wt %) is used as a solder consisting of the solder layer. Ni layer is formed as thickness 0.03 µm, P content 0.4 wt %. On the other hand, Pd layer is formed as thickness 1 µm, P content 2 wt %. Therefore, the composition of the Ni—Sn alloy layer becomes Sn:Ni=67:33, the thickness becomes 1.1 µm.

Reference Example 2-2-7

In reference example 2-2-7, an alloy of Sn:Pb=63:37 (wt %) is used as a solder consisting of the solder layer. Ni layer is formed as thickness 0.03 µm, P content 7 wt %. On the other hand, Pd layer is formed as thickness 1 µm, P content 9 wt %. Therefore, the composition of the Ni—Sn alloy layer becomes Sn:Ni=67:33, the thickness becomes 0.9 µm.

Reference Example 2-2-8

In reference example 2-2-8, an alloy of Sn:Pb=63:37 (wt %) is used as a solder consisting of the solder layer. Ni layer is formed as thickness 0.03 µm, P content 7 wt %. On the other hand, Pd layer is formed as thickness 1.5 µm, P content 9 wt %. Therefore, the composition of the Ni—Sn alloy layer becomes Sn:Ni=67:33, the thickness becomes 0.9 µm.

Reference Example 2-2-9

In reference example 2-2-9, an alloy of Sn:Pb=63:37 (wt %) is used as a solder consisting of the solder layer. Ni layer is formed as thickness 12 µm, P content 0.4 wt %. On the other hand, Pd layer is formed as thickness 0.5 µm, P content 0 wt %. Therefore, the composition of the Ni—Sn alloy layer becomes Sn:Ni=67:33, the thickness becomes 2.5 µm.

Reference Example 2-2-10

In reference example 2-2-10, an alloy of Sn:Pb=63:37 (wt %) is used as a solder consisting of the solder layer. Ni layer is formed as thickness 12 µm, P content 0.4 wt %. On the other hand, Pd layer is formed as thickness 1 µm, P content 2 wt %. Therefore, the composition of the Ni—Sn alloy layer becomes Sn:Ni=67:33, the thickness becomes 2.6 µm.

Reference Example 2-2-11

In reference example 2-2-11, an alloy of Sn:Pb=63:37 (wt %) is used as a solder consisting of the solder layer, Ni layer is formed as thickness 12 µm, P content 7 wt %. On the other hand, Pd layer is formed as thickness 1 µm, P content 9 wt %. Therefore, the composition of the Ni—Sn alloy layer becomes Sn:Ni=67:33, the thickness becomes 2.7 µm.

Reference Example 2-2-12

In reference example 2-2-12, an alloy of Sn:Pb=63:37 (wt %) is used as a solder consisting of the solder layer. Ni layer is formed as thickness 12 µm, P content 7 wt %. On the other hand, Pd layer is formed as thickness 1.5 µm, P content 9 wt %. Therefore, the composition of the Ni—Sn alloy layer becomes Sn:Ni=67:33, the thickness becomes 2.9 µm.

Embodiment 3

Figure 21:
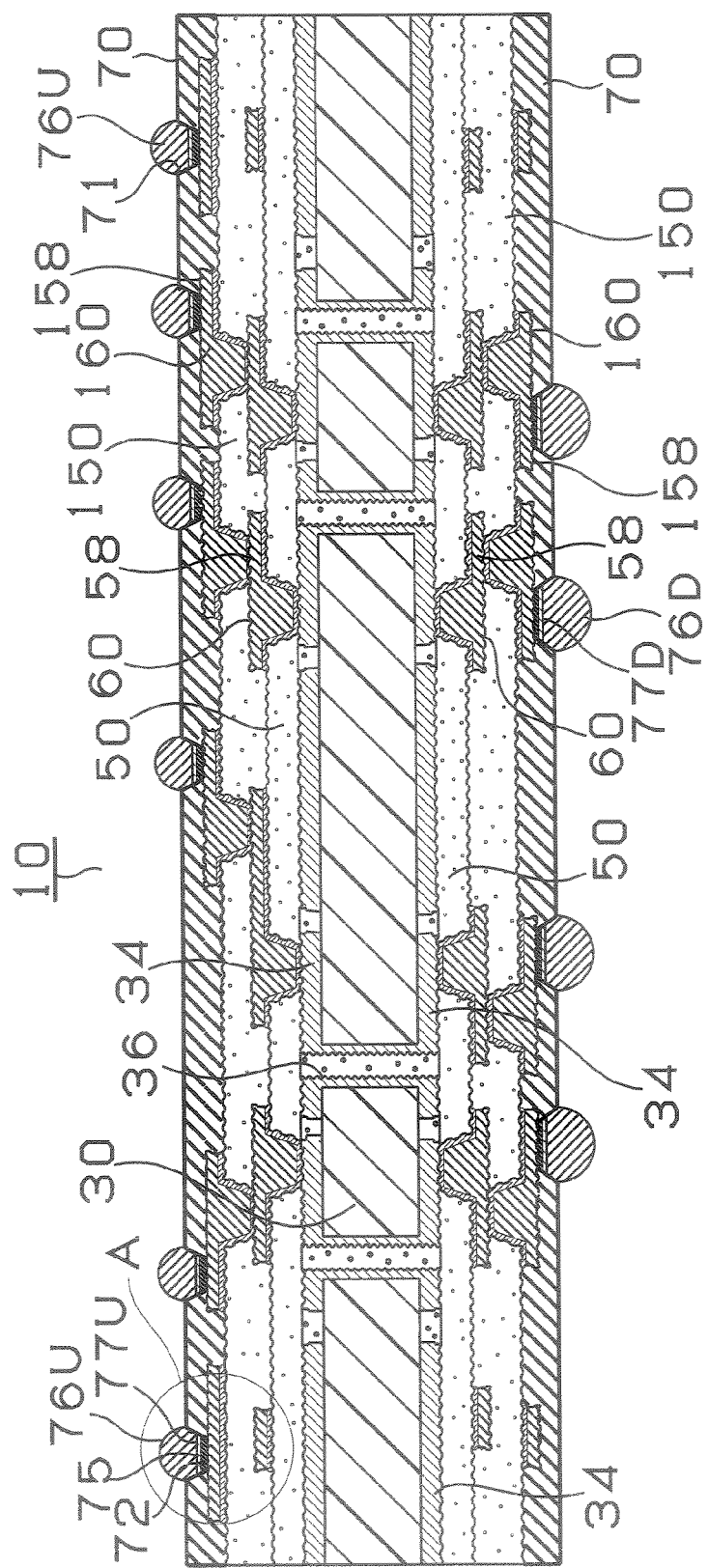
FIG. 21 is a sectional view of the multilayered printed wiring board according to a third embodiment of the present invention.

The configuration of a multilayer printed wiring board 10 according to Embodiment 3 of the present invention will first be described with reference to FIG. 21 showing the cross section thereof. The configuration of Embodiment 3 is as same as Embodiment 1. The multilayer printed wiring board 10 has a conductor circuit 34 formed on the front surface of a core substrate 30. The front and rear surfaces of the core substrate 30 are connected to each other via through holes 36. In addition, an interlayer resin insulating layer 50 on which via holes 60 and conductor circuits 58 are formed and an interlayer resin insulating layer 150 on which via holes 160 and conductor circuits 158 are formed are provided on the both surfaces of the core substrate 30. Solder resist layers 70 are formed on upper layers of the via holes 160 and the conductor circuits 158, and solder pads 77U and 77D are formed on the conductor circuits 158 through the opening portions 71 of the solder resist layers 70, respectively. Bumps 76U and 76D are formed on the solder pads 77U and 77D.

Next, the solder pads 76U will be described with referring to FIG. 24(B). FIG. 24(B) enlarged shows circle A part of multilayer printed circuit board 10 in FIG. 20. Nickel plated layer 72 is formed on conductor circuit 158. The conductor circuit 158 is connected to solder layer (bump) 46 via Ni—Sn alloy layer 75 on nickel plated layer 72. In embodiment 3, by controlling the average thickness of Ni—Sn alloy layer 75, the occurrence of the breakage in the interface between the nickel plated layers 72 and the solder layer 46 can be reduced. Thereby, the strength, and adhesion of solder layer 46 can be improved.

Hereafter, a method for manufacturing the multilayer printed wiring board 10 in Embodiment 3 will, next be described with reference to FIGS. 22 to 24.

Since the steps (1) to (17) in Embodiment 1 have been described with referring to FIGS. 2 to 5 are almost the same as the steps in Embodiment 3, the explanation will start from step (18) forming the nickel plated layers.

(18) Next, nickel plated layers are formed on the solder pads of the substrate having the solder resist layers 70 shown in FIG. 22(A).

| [Nickel plating aqueous solution] | |
|---|---|
| nickel chloride | $2.3 \times 10^{-1}$ mol/l |
| sodium hypophosphite | 1.8 to $4.0 \times 10^{-1}$ mol/l |
| sodium citrate | $1.6 \times 10^{-1}$ mol/l |
| pH of 4.5 | |
| temperature of 40 to 60° C. | |

The substrate is immersed in the electroless nickel plating solution for 5 to 40 minutes, thereby forming nickel plated layers 72 in the opening portions 71 (FIG. 22(B)). In the Embodiment 3, nickel plated layers 72 are adjusted so as to have a thickness of 0.03 to 10 μm, to include 0.4 to 17 wt % of P. The thickness and the P content of the nickel plated layers are adjusted in considering the value of a plating tub and plating solution circulation.

(19) Thereafter, palladium layers are formed on the solder pads on which the nickel plated layers have been formed in step (18) of the substrate.

| [Palladium plating aqueous solution] | |
|---|---|
| palladium chloride | $1.0 \times 10^{-2}$ mol/l |
| ethylenediamine | $8.0 \times 10^{-2}$ mol/l |
| sodium hypophosphite | 4.0 to $6.0 \times 10^{-2}$ mol/l |
| thiodiglycolic acid | 30 mg/l |
| pH of 8 | |
| temperature of 50 to 60° C. | |

The substrate is immersed in the electroless palladium plating solution for 3 to 10 minutes, thereby forming palladium plated layers 73 having a thickness of 0.08 μm on the nickel plated layers 72 (FIG. 22(C)). In the Embodiment 3, palladium plated layers 73 are adjusted so as to have a thickness of 0.008 to 2.0 μm, to include 1 to 8 wt % of P. The thickness and the P content of the palladium plated layers are adjusted in considering the value of a plating tub and plating solution circulation.

(20) Thereafter, gold layers are formed on the surface layer as oxidation resistance layers.

| [gold plating aqueous solution] | |
|---|---|
| potassium gold cyanide | $7.6 \times 10^{-3}$ mol/l |
| ammonium chloride | $1.9 \times 10^{-1}$ mol/l |
| sodium citrate | $1.2 \times 10^{-1}$ mol/l |
| sodium hypophosphite | $1.7 \times 10^{-1}$ mol/l |

The substrate is immersed in the electroless gold plating solution at 80° C. for 5 to 20 minutes, thereby forming gold plated layers 74 having a thickness of 0.01 to 2 μm on the palladium plated layers 73 (FIG. 23(A)). Thereby, bonding pads 42 are formed on the upper side of the conductor circuits 34U, and solder pads 44 are formed on the lower side of the conductor circuits 34D.

(21) Solder paste 76α is printed on solder pads 77U, 77D in each opening 71 of the solder resist layer 70 (FIG. 23(B)). The solder pad 77U in the circle A in FIG. 23(B) is enlarged shown in FIG. 24(A), The solder pad 77U consists of the multi-layers, that is, the three layers comprises nickel plated layers 72-palladium plated layers 73-gold plated layers 74 which have been formed in turn on the conductor circuit 158.

(22) Thereafter, solder bumps 76U, 76D are formed by conducting reflow at 250° C. in nitrogenous atmosphere (FIG. 20). The solder pad 77U in the circle A in FIG. 20 is enlarged shown in FIG. 24 (B). During the reflow, palladium plated layers 73 and gold plated layers 74 almost diffuse into solder bumps 76U, 76D, Cu—Ni—Sn alloy layer 75 or Ni layer alloy layer is formed in the interface between nickel plated layers 72 and solder bumps 76U, 76D as shown in FIG. 20 and FIG. 24(B).

Here, the nickel plated layers 72 is adjusted so as to have the thickness of 0.05 to 10 μm and the P content is adjusted to 0.4 to 17 wt % which is lower or higher than thereof the palladium layers. And the palladium plated layers 73 is adjusted so as to have thickness of 0.01 to 1.0 μm and the P content is adjusted to 2 to 7 wt %. Thereby, the average thickness of Cu—Ni—Sn alloy layer 75 is control led between 1.0 and 2.5 μm.

Embodiment 3-1-1

In embodiment 3-1-1, an alloy of Cu: 0.5 wt %, Ag: 3.5 wt %, Sn: 95 wt % is used as a solder consisting of the solder bump. Ni layer is formed as thickness 5 μm, P content 1.2 wt %. On the other hand, Pd layer is formed as thickness 0.5 μm, P content 5 wt %. Au layer is formed as thickness 0.03 μm. Therefore, the composition of the Ni—Sn alloy layer becomes Sn:Cu:Ni=42:37:21, the thickness becomes 1.5 μm. Electron microscope pictures of Ni layer, Cu—Ni—Sn alloy and solder in embodiment 3-1-1 are the same as embodiment 1-1-1 described with referring to FIGS. 15-18. The electron microscope picture (×20 k) in the left side of FIG. 15 corresponds to embodiment 3-1-1. The electron microscope pictures (×100 k) in the left sides of FIG. 16, 17 are a more enlarged scale. The right sides of electron microscope pictures in FIGS. 15, 16, 17 show Pd layers which do not contain P in reference example 3-1-1. The lower side is the Ni layer and the upper side is the solder and the interface between the Ni layer and the solder is the Cu—Ni—Sn alloy. As shown in the electron microscope picture in the left side of FIG. 15, in embodiment 3-1-1, the Cu—Ni—Sn alloy is consecutively formed on the surface of Ni layer, that is, is slightly Ups and downs. As shown in the electron microscope pictures in the left sides of FIG. 16, 17 using enlarged scale, Ag particles uniformly exist on the surface of the Cu—Ni—Sn alloy through skin layer of Sn. In embodiment 3-1-1, as shown in the permeation type electron microscope picture in the right side of FIG. 18, the Ni—Cu—Sn alloy layer is typically a board-shaped form, that is, formed in parallel with the Ni layer.

Embodiment 3-1-2

In embodiment 3-1-2, an alloy of Cu: 0.5 wt %, Ag: 3.5 wt %, Sn: 95 wt % is used as a solder consisting of the solder bump. Ni layer is formed as thickness 5 μm, P content 1.2 wt %. On the other hand, Pd layer is formed as thickness 0.01 μm, P content 2 wt %. Au layer is formed as thickness 0.05 μm. Therefore, the composition of the Ni—Sn alloy layer becomes Sn:Cu:Ni=42:37:21, the thickness becomes 1.8 μm. The Ni—Sn alloy layer is typically a board-shaped form.

Embodiment 3-1-3

In embodiment 3-1-3, an alloy of Cu: 0.5 wt %, Ag: 3.5 wt %, Sn: 95 wt % is used as a solder consisting of the solder bump. Ni layer is formed as thickness 5 μm, P content 1.2 wt %. On the other hand, Pd layer is formed as thickness 0.01 μm, P content 7 wt %. Au layer is formed as thickness 1.0 μm. Therefore, the composition of the Ni—Sn alloy layer becomes Sn:Cu:Ni=42:37:21, the thickness becomes 1.8 μm. The Ni—Sn alloy layer is typically a board-shaped form.

Embodiment 3-1-4

In embodiment 3-1-4, an alloy of Cu: 0.5 wt %, Ag: 3.5 wt %, Sn: 95 wt % is used as a solder consisting of the solder bump. Ni layer is formed as thickness 5 μm, P content 1.2 wt %. On the other hand, Pd layer is formed as thickness 1.0 μm, P content 2 wt %. Au layer is formed as thickness 0.03 μm. Therefore, the composition of the Ni—Sn alloy layer becomes Sn:Cu:Ni=42:37:21, the thickness becomes 1.5 μm. The Ni—Sn alloy layer is typically a board-shaped, form.

Embodiment 3-1-5

In embodiment 3-1-5, an alloy of Cu: 0.5 wt %, Ag: 3.5 wt %, Sn: 95 wt % is used as a solder consisting of the solder bump. Ni layer is formed as thickness 10 μm, P content 0.5 wt %. On the other hand, Pd layer is formed as thickness 1.0 μm, P content 7 wt %. Au layer is formed as thickness 0.03 μm. Therefore, the composition of the Ni—Sn alloy layer becomes Sn:Cu:Ni=42:37:21, the thickness becomes 1.5 μm. The Ni—Sn alloy layer is typically a board-shaped form.

Embodiment 3-1-6

In embodiment 3-1-6, an alloy of Cu: 0.5 wt %, Ag: 3.5 wt %, Sn: 95 wt % is used as a solder consisting of the solder bump. Ni layer is formed as thickness 10 μm, P content 5 wt %. On the other hand, Pd layer is formed as thickness 0.01 μm, P content 7 wt %. Au layer is formed as thickness 0.1 μm. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 3-1-7

In embodiment 3-1-7, an alloy of Cu: 0.5 wt %, Ag: 3.5 wt %, Sn: 95 wt % is used as a solder consisting of the solder bump. Ni layer is formed as thickness 0.05 μm, P content 0.5 wt %. On the other hand, Pd layer is formed as thickness 1 μm, P content 7 wt %. Au layer is formed as thickness 0.02 μm. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 3-1-8

In embodiment 3-1-8, an alloy of Cu: 0.5 wt %, Ag: 3.5 wt %, Sn: 95 wt % is used as a solder consisting of the solder bump. Ni layer is formed as thickness 0.05 μm, P content 5 wt %. On the other hand, Pd layer is formed as thickness 0.01 μm, P content 3 wt %. Au layer is formed as thickness 0.01 μm. Therefore, the composition of the Ni—Sn alloy layer becomes Sn:Cu:Ni=42:37:21, the thickness becomes 1.8 μm. The Ni—Sn alloy layer is typically a board-shaped form.

Embodiment 3-1-9

In embodiment 3-1-9, an alloy of Cu: 0.5 wt %, Ag: 3.5 wt %, Sn: 95 wt % is used as a solder consisting of the solder bump. Ni layer is formed as thickness 0.3 μm, P content 0.5 wt %. On the other hand, Pd layer is formed as thickness 0.01 μm, P content 2 wt %. Au layer is formed as thickness 0.2 μm. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 3-1-10

In embodiment 3-1-10, an alloy of Cu: 0.5 wt %, Ag: 3.5 wt %, Sn: 95 wt % is used as a solder consisting of the solder bump, Ni layer is formed as thickness 0.3 μm, P content 0.5 wt %. On the other hand, Pd layer is formed as thickness 1 μm, P content 2 wt %, Au layer is formed as thickness 0.4 μm. Therefore, the composition of the Ni—Sn alloy layer becomes Sn:Cu:Ni=42:37:21, the thickness becomes 1.6 μm. The Ni—Sn alloy layer is typically a board-shaped form.

Embodiment 3-1-11

In embodiment 3-1-11, an alloy of Cu: 0.5 wt %, Ag: 3.5 wt %, Sn: 95 wt % is used as a solder consisting of the solder bump. Ni layer is formed as thickness 0.3 μm, P content 5 wt %. On the other hand, Pd layer is formed as thickness 0.01 μm, P content 7 wt %. Au layer is formed as thickness 0.5 μm. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 3-1-12

In embodiment 3-1-12, an alloy of Cu: 0.5 wt %, Ag: 3.5 wt %, Sn: 95 wt % is used as a solder consisting of the solder bump. Ni layer is formed as thickness 0.3 μm, P content 5 wt %. On the other hand, Pd layer is formed as thickness 1 μm, P content 7 wt %. Au layer is formed as thickness 0.03 μm. Therefore, the composition of the Ni—Sn alloy layer becomes Sn:Cu:Ni=42:37:21, the thickness becomes 1.6 μm. The Ni—Sn alloy layer is typically a board-shaped form.

Embodiment 3-1-13

In embodiment 3-1-13, an alloy of Cu: 0.5 wt %, Ag: 3.5 wt %, Sn: 95 wt % is used as a solder consisting of the solder bump. Ni layer is formed as thickness 1 μm, P content 0.5 wt %. On the other hand, Pd layer is formed as thickness 0.01 μm, P content 2 wt %. Au layer is formed as thickness 0.5 μm. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 3-1-14

In embodiment 3-1-14, an alloy of Cu: 0.5 wt %, Ag: 3.5 wt %, Sn: 95 wt % is used as a solder consisting of the solder bump. Ni layer is formed as thickness 1 μm, P content 5 wt %. On the other hand, Pd layer is formed as thickness 1 μm, P content 7 wt %. Au layer is formed as thickness 0.5 μm. Therefore, the composition of the Ni—Sn alloy layer becomes Sn:Cu:Ni=42:37:21, the thickness becomes 1.7 µm. The Ni—Sn alloy layer is typically a board-shaped form.

Embodiment 3-1-15

In embodiment 3-1-15, an alloy of Cu: 0.5 wt %, Ag: 3.5 wt %, Sn: 95 wt % is used as a solder consisting of the solder bump. Ni layer is formed, as thickness 0.3 µm, P content 8 wt %. On the other hand, Pd layer is formed as thickness 0.01 µm, P content 5 wt %. Au layer is formed as thickness 0.03 µm. Therefore, the composition of the Ni—Sn alloy layer becomes Sn:Cu:Ni=42:37:21, the thickness becomes 1.7 µm. The Ni—Sn alloy layer is typically a board-shaped form.

Embodiment 3-1-16

In embodiment 3-1-16, an alloy of Cu: 0.5 wt %, Ag: 3.5 wt %, Sn: 95 wt % is used as a solder consisting of the solder bump. Ni layer is formed as thickness 0.3 µm, P content 8 wt %. On the other hand, Pd layer is formed as thickness 1 µm, P content 7 wt %. Au layer is formed as thickness 0.01 µm. Therefore, the composition of the Ni—Sn alloy layer becomes Sn:Cu:Ni=42:37:21, the thickness becomes 1.7 µm. The Ni—Sn alloy layer is typically a board-shaped form.

Embodiment 3-1-17

In embodiment 3-1-17, an alloy of Cu: 0.5 wt %, Ag: 3.5 wt %, Sn: 95 wt % is used as a solder consisting of the solder bump. Ni layer is formed as thickness 0.05 µm, P content 10 wt %. On the other hand, Pd layer is formed as thickness 0.01 µm, P content 2 wt %. Au layer is formed as thickness 0.05 µm. Therefore, the composition of the Ni—Sn alloy layer becomes Sn:Cu:Ni=42:37:21, the thickness becomes 1.8 µm. The Ni—Sn alloy layer is typically a board-shaped form.

Embodiment 3-1-18

In embodiment 3-1-18, an alloy of Cu: 0.5 wt %, Ag: 3.5 wt %, Sn: 95 wt % is used as a solder consisting of the solder bump. Ni layer is formed as thickness 1 µm, P content 10 wt %. On the other hand, Pd layer is formed as thickness 1 µm, P content 5 wt %. Au layer is formed as thickness 0.03 µm. Therefore, the composition of the Ni—Sn alloy layer becomes Sn:Cu:Ni=42:37:21, the thickness becomes 1.8 µm. The Ni—Sn alloy layer is typically a board-shaped form.

Embodiment 3-1-19

In embodiment 3-1-19, an alloy of Cu: 0.5 wt %, Ag: 3.5 wt %, Sn: 95 wt % is used as a solder consisting of the solder bump. Ni layer is formed as thickness 0.05 µm, P content 15 wt %. On the other hand, Pd layer is formed as thickness 0.01 µm, P content 2 wt %. Au layer is formed as thickness 0.5 µm. Therefore, the composition of the Ni—Sn alloy layer becomes Sn:Cu:Ni=42:37:21, the thickness becomes 2.0 µm. The Ni—Sn alloy layer is typically a board-shaped form.

Embodiment 3-1-20

In embodiment 3-1-20, an alloy of Cu: 0.5 wt %, Ag: 3.5 wt %, Sn: 95 wt % is used as a solder consisting of the solder bump. Ni layer is formed as thickness 1 µm, P content 15 wt %. On the other hand, Pd layer is formed as thickness 1 µm, P content 2 wt %. Au layer is formed as thickness 0.5 µm. Therefore, the composition of the Ni—Sn alloy layer becomes Sn:Cu:Ni=42:37:21, the thickness becomes 1.9 µm. The Ni—Sn alloy layer is typically a board-shaped form.

Embodiment 3-1-21

In embodiment 3-1-21, an alloy of Cu: 0.5 wt %, Ag: 3.5 wt %, Sn: 95 wt % is used as a solder consisting of the solder bump. Ni layer is formed as thickness 8 µm, P content 15 wt %. On the other hand, Pd layer is formed as thickness 0.01 µm, P content 7 wt %. Au layer is formed as thickness 1 µm. Therefore, the composition of the Ni—Sn alloy layer becomes Sn:Cu:Ni=42:37:21, the thickness becomes 2.0 µm. The Ni—Sn alloy layer is typically a board-shaped form.

Embodiment 3-1-22

In embodiment 3-1-22, an alloy of Cu: 0.5 wt %, Ag: 3.5 wt %, Sn: 95 wt % is used as a solder consisting of the solder bump. Ni layer is formed as thickness 10 µm, P content 15 wt %. On the other hand, Pd layer is formed as thickness 1 µm, P content 7 wt %. Au layer is formed as thickness 2 µm. Therefore, the composition of the Ni—Sn alloy layer becomes Sn:Cu:Ni=42:37:21, the thickness becomes 2.1 µm. The Ni—Sn alloy layer is typically a board-shaped form.

Embodiment 3-2-1

In embodiment 3-1-1, the Cu/Ag/Sn solder which does not include lead is used as the solder consisting of the solder bump. Whereas, in embodiment 3-2-1, an alloy of Sn:Pb=63:37 (wt %) is used as a solder consisting of the solder bump. Ni layer is formed as thickness 5 µm, P content 1.2 wt %. On the other hand, Pd layer is formed as thickness 0.5 µm, P content 5 wt %. Au layer is formed as thickness 0.03 µm. Therefore, the composition of the Ni—Sn alloy layer becomes Sn:Ni=67:33, the thickness becomes 1.5 µm. The Ni—Sn alloy layer is typically a board-shaped form.

Embodiment 3-2-2

In embodiment 3-2-2, an alloy of Sn:Pb=63:37 (wt %) is used as a solder consisting of the solder bump. Ni layer is formed as thickness 5 µm, P content 1.2 wt %. On the other hand, Pd layer is formed as thickness 0.5 µm, P content 2 wt %. Au layer is formed as thickness 0.05 µm. Therefore, the composition of the Ni—Sn alloy layer becomes Sn:Ni=67:33, the thickness becomes 1.8 µm. The Ni—Sn alloy layer is typically a board-shaped form.

Embodiment 3-2-3

In embodiment 3-2-3, an alloy of Sn:Pb=63:37 (wt %) is used as a solder consisting of the solder bump. Ni layer is formed as thickness 5 µm, P content 1.2 wt %. On the other hand, Pd layer is formed as thickness 0.01 µm, P content 7 wt %. Au layer is formed as thickness 1 µm. Therefore, the composition of the Ni—Sn alloy layer becomes Sn:Ni=67:33, the thickness becomes 1.8 µm. The Ni—Sn alloy layer is typically a board-shaped form.

Embodiment 3-2-4

In embodiment 3-2-4, an alloy of Sn:Pb=63:37 (wt %) is used as a solder consisting of the solder bump. Ni layer is formed as thickness 5 µm, P content 1.2 wt %. On the other hand, Pd layer is formed as thickness 1.0 µm, P content 2 wt %. Au layer is formed as thickness 0.03 µm. Therefore, the

Embodiment 3-2-5

In embodiment 3-2-5, an alloy of Sn:Pb=63:37 (wt %) is used as a solder consisting of the solder bump. Ni layer is formed as thickness 10 μm, P content 0.5 wt %. On the other hand, Pd layer is formed as thickness 1.0 μm, P content 7 wt %. Au layer is formed as thickness 0.03 μm. Therefore, the composition of the Ni—Sn alloy layer becomes Sn:Ni=67: 33, the thickness becomes 1.5 μm. The Ni—Sn alloy layer is typically a board-shaped form.

Embodiment 3-2-6

In embodiment 3-2-6, an alloy of Sn:Pb=63:37 (wt %) is used as a solder consisting of the solder bump. Ni layer is formed as thickness 10 μm, P content 5 wt %. On the other hand, Pd layer is formed as thickness 0.01 μm, P content 7 wt %. Au layer is formed as thickness 0.01 μm. Therefore, the composition of the Ni—Sn alloy layer becomes Sn:Ni=67: 33, the thickness becomes 1.7 μm. The Ni—Sn alloy layer is typically a board-shaped form.

Embodiment 3-2-7

In embodiment 3-2-7, an alloy of Sn:Pb=63:37 (wt %) is used as a solder consisting of the solder bump. Ni layer is formed as thickness 0.05 μm, P content 0.5 wt %. On the other hand, Pd layer is formed as thickness 1 μm, P content 7 wt %. Au layer is formed as thickness 0.02 μm. Therefore, the composition of the Ni—Sn alloy layer becomes Sn:Ni=67: 33, the thickness becomes 1.7 μm. The Ni—Sn alloy layer is typically a board-shaped form.

Embodiment 3-2-8

In embodiment 3-2-8, an alloy of Sn:Pb=63:37 (wt %) is used as a solder consisting of the solder bump. Ni layer is formed as thickness 0.05 μm, P content 5 wt %. On the other hand, Pd layer is formed as thickness 0.01 μm, P content 3 wt %. Au layer is formed as thickness 0.01 μm. Therefore, the composition of the Ni—Sn alloy layer becomes Sn:Ni=67: 33, the thickness becomes 1.8 μm. The Ni—Sn alloy layer is typically a board-shaped form.

Embodiment 3-2-9

In embodiment 3-2-9, an alloy of Sn:Pb=63:37 (wt %) is used as a solder consisting of the solder bump, Ni layer is formed as thickness 0.3 μm, P content 0.5 wt %. On the other hand, Pd layer is formed as thickness 0.01 μm, P content 2 wt %. Au layer is formed as thickness 0.2 μm. Therefore, the composition of the Ni—Sn alloy layer becomes Sn:Ni=67: 33, the thickness becomes 1.7 μm. The Ni—Sn alloy layer is typically a board-shaped form.

Embodiment 3-2-10

In embodiment 3-2-10, an alloy of Sn:Pb=63:37 (wt %) is used as a solder consisting of the solder bump. Ni layer is formed as thickness 0.3 μm, P content 0.5 wt %. On the other hand, Pd layer is formed as thickness 1 μm, P content 2 wt %. Au layer is formed as thickness 0.4 μm. Therefore, the composition of the Ni—Sn alloy layer becomes Sn:Ni=67:33, the thickness becomes 1.6 μm. The Ni—Sn alloy layer is typically a board-shaped form.

Embodiment 3-2-11

In embodiment 3-2-11, an alloy of Sn:Pb=63:37 (wt %) is used as a solder consisting of the solder bump. Ni layer is formed as thickness 0.3 μm, P content 5 wt %. On the other hand, Pd layer is formed as thickness 0.01 μm, P content 7 wt %. Au layer is formed as thickness 0.5 μm. Therefore, the composition of the Ni—Sn alloy layer becomes Sn:Ni=67: 33, the thickness becomes 1.7 μm. The Ni—Sn alloy layer is typically a board-shaped form.

Embodiment 3-2-12

In embodiment 3-2-12, an alloy of Sn:Pb=63:37 (wt %) is used as a solder consisting of the solder bump. Ni layer is formed as thickness 0.3 μm, P content 5 wt %. On the other hand, Pd layer is formed as thickness 1 μm, P content 7 wt %. Au layer is formed as thickness 0.03 μm. Therefore, the composition of the Ni—Sn alloy layer becomes Sn:Ni=67: 33, the thickness becomes 1.6 μm. The Ni—Sn alloy layer is typically a board-shaped form.

Embodiment 3-2-13

In embodiment 3-2-13, an alloy of Sn:Pb=63:37 (wt %) is used as a solder consisting of the solder bump. Ni layer is formed as thickness 1 μm, P content 0.5 wt %. On the other hand, Pd layer is formed as thickness 0.01 μm, P content 2 wt %. Au layer is formed as thickness 0.5 μm. Therefore, the composition of the Ni—Sn alloy layer becomes Sn:Ni=67: 33, the thickness becomes 1.7 μm. The Ni—Sn alloy layer is typically a board-shaped form.

Embodiment 3-2-14

In embodiment 3-2-14, an alloy of Sn:Pb=63:37 (wt %) is used as a solder consisting of the solder bump. Ni layer is formed as thickness 1 μm, P content 5 wt %. On the other hand. Pd layer is formed as thickness 1 μm, P content 7 wt %. Au layer is formed as thickness 0.5 μm. Therefore, the composition of the Ni—Sn alloy layer becomes Sn:Ni=67:33, the thickness becomes 1.7 μm. The Ni—Sn alloy layer is typically a board-shaped form.

Embodiment 3-2-15

In embodiment 3-2-15, an alloy of Sn:Pb=63:37 (wt %) is used as a solder consisting of the solder bump. Ni layer is formed as thickness 0.3 μm, P content 8 wt %. On the other hand, Pd layer is formed as thickness 0.01 μm, P content 5 wt %. Au layer is formed as thickness 0.03 μm. Therefore, the composition of the Ni—Sn alloy layer becomes Sn:Ni=67: 33, the thickness becomes 1.7 μm. The Ni—Sn alloy layer is typically a board-shaped form.

Embodiment 3-2-16

In embodiment 3-2-16, an alloy of Sn:Pb=63:37 (wt %) is used as a solder consisting of the solder bump, Ni layer is formed as thickness 0.3 μm, P content 8 wt %. On the other hand, Pd layer is formed as thickness 1 μm, P content 7 wt %. Au layer is formed as thickness 0.01 μm. Therefore, the composition of the Ni—Sn alloy layer becomes Sn:Ni=67:

33, the thickness becomes 1.7 µm. The Ni—Sn alloy layer is typically a board-shaped form.

Embodiment 3-2-17

In embodiment 3-2-17, an alloy of Sn:Pb=63:37 (wt %) is used as a solder consisting of the solder bump. Ni layer is formed as thickness 0.05 µm, P content 10 wt %. On the other hand, Pd layer is formed as thickness 0.01 µm, P content 2 wt %. Au layer is formed as thickness 0.05 µm. Therefore, the composition of the Ni—Sn alloy layer becomes Sn:Ni=67:33, the thickness becomes 1.8 µm. The Ni—Sn alloy layer is typically a board-shaped form.

Embodiment 3-2-18

In embodiment 3-2-18, an alloy of Sn:Pb=63:37 (wt %) is used as a solder consisting of the solder bump. Ni layer is formed as thickness 1 µm, P content 10 wt %. On the other hand, Pd layer is formed as thickness 1 µm, P content 5 wt %. Au layer is formed as thickness 0.03 µm. Therefore, the composition of the Ni—Sn alloy layer becomes Sn:Ni=67:33, the thickness becomes 1.8 µm. The Ni—Sn alloy layer is typically a board-shaped form.

Embodiment 3-2-19

In embodiment 3-2-19, an alloy of Sn:Pb=63:37 (wt %) is used as a solder consisting of the solder bump. Ni layer is formed as thickness 0.05 µm, P content 15 wt %. On the other hand, Pd layer is formed as thickness 0.01 µm, P content 2 wt %. Au layer is formed as thickness 0.5 µm. Therefore, the composition of the Ni—Sn alloy layer becomes Sn:Ni=67:33, the thickness becomes 2.0 µm. The Ni—Sn alloy layer is typically a board-shaped form.

Embodiment 3-2-20

In embodiment 3-2-20, an alloy of Sn:Pb=63:37 (wt %) is used as a solder consisting of the solder bump. Ni layer is formed as thickness 1 µm, P content 15 wt %. On the other hand, Pd layer is formed as thickness 1 µm, P content 2 wt %. Au layer is formed as thickness 0.5 µm. Therefore, the composition of the Ni—Sn alloy layer becomes Sn:Ni=67:33, the thickness becomes 1.9 µm. The Ni—Sn alloy layer is typically a board-shaped form.

Embodiment 3-2-21

In embodiment 3-2-21, an alloy of Sn:Pb=63:37 (wt %) is used as a solder consisting of the solder bump. Ni layer is formed as thickness 8 µm, P content 15 wt %. On the other hand, Pd layer is formed as thickness 0.01 µm, P content 7 wt %. Au layer is formed as thickness 1 µm. Therefore, the composition of the Ni—Sn alloy layer becomes Sn:Ni=67:33, the thickness becomes 2.0 µm. The Ni—Sn alloy layer is typically a board-shaped form.

Embodiment 3-2-22

In embodiment 3-2-22, an alloy of Sn:Pb=63:37 (wt %) is used as a solder consisting of the solder bump. Ni layer is formed as thickness 10 µm, P content 15 wt %. On the other hand, Pd layer is formed as thickness 1 µm, P content 7 wt %. Au layer is formed as thickness 2 µm. Therefore, the composition of the Ni—Sn alloy layer becomes Sn:Ni=67:33, the thickness becomes 2.1 µm. The Ni—Sn alloy layer is typically a board-shaped form.

Embodiment 3-3-1

In embodiment 3-3-1, an alloy of Cu: 0.5 wt %, Ag: 3.5 wt %, Sn: 95 wt % is used as a solder consisting of the solder bump as same as embodiment 3-1-1. Ni layer is formed as thickness 5 µm, P content 1.2 wt % as same as embodiment 3-1-1. On the other hand, Pd layer is formed as thickness 0.009 µm, P content 8 wt %. Au layer is formed as thickness 0.03 µm. Therefore, the composition of the Ni—Sn alloy layer becomes Sn:Cu:Ni=42:45:13, the thickness becomes 2.5 µm. In embodiment 3-3-1, as shown in the electron microscope picture in right side of FIG. 18, the Ni—Cu—Sn alloy layer is typically a pillar-shaped form, that is, pillar-shaped alloy crystal vertically formed along with the Ni layer as same as the above mentioned reference example 3-2-1.

Embodiment 3-3-2

In embodiment 3-3-2, an alloy of Cu: 0.5 wt %, Ag: 3.5 wt %, Sn: 95 wt % is used as a solder consisting of the solder bump. Ni layer is formed as thickness 5 µm, P content 1.2 wt %. On the other hand, Pd layer is formed as thickness 0.008 µm, P content 7 wt %. Au layer is formed as thickness 0.04 µm. Therefore, the composition of the Ni—Sn alloy layer becomes Sn:Cu:Ni=42:45:13, the thickness becomes 2.5 µm. The Ni—Sn alloy layer is typically a pillar-shaped form.

Embodiment 3-3-3

In embodiment 3-3-3, an alloy of Cu: 0.5 wt %, Ag: 3.5 wt %, Sn: 95 wt % is used as a solder consisting of the solder bump. Ni layer is formed as thickness 5 µm, P content 1.2 wt %. On the other hand, Pd layer is formed as thickness 0.009 µm, P content 1 wt %. Au layer is formed as thickness 0.03 µm. Therefore, the composition of the Ni—Sn alloy layer becomes Sn:Cu:Ni=42:45:13, the thickness becomes 2.5 µm. The Ni—Sn alloy layer is typically a pillar-shaped form.

Embodiment 3-3-4

In embodiment 3-3-4, an alloy of Cu: 0.5 wt %, Ag: 3.5 wt %, Sn: 95 wt % is used as a solder consisting of the solder bump. Ni layer is formed as thickness 5 µm. P content 1.2 wt %. On the other hand, Pd layer is formed as thickness 2.0 µm, P content 2 wt %. Au layer is formed as thickness 0.05 µm. Therefore, the composition of the Ni—Sn alloy layer becomes Sn:Cu:Ni=66:29:5, the thickness becomes 1.3 µm. The Ni—Sn alloy layer is typically a grain-shaped and formed at an interface of the Ni layer.

Embodiment 3-3-5

In embodiment 3-3-5, an alloy of Cu: 0.5 wt %, Ag: 3.5 wt %, Sn: 95 wt % 3 is used as a solder consisting of the solder bump. Ni layer is formed as thickness 10 µm, P content 0.5 wt %. On the other hand, Pd layer is formed as thickness 2.0 µm, P content 5 wt %. Au layer is formed as thickness 0.04 µm. Therefore, the composition of the Ni—Sn alloy layer becomes Sn:Cu:Ni=66:29:5, the thickness becomes 1.3 µm. The Ni—Sn alloy layer is typically a grain-shaped and formed at an interface of the Ni layer.

Embodiment 3-3-6

In embodiment 3-3-6, an alloy of Cu: 0.5 wt %, Ag: 3.5 wt %, Sn: 95 wt % is used as a solder consisting of the solder bump. Ni layer is formed as thickness 10 µm, P content 5 wt %. On the other hand, Pd layer is formed as thickness 2.0 µm, P content 9 wt %. Au layer is formed as thickness 0.06 µm. Therefore, the composition of the Ni—Sn alloy layer becomes Sn:Cu:Ni=66:29:5, the thickness becomes 1.5 µm. The Ni—Sn alloy layer is typically a grain-shaped and formed at an interface of the Ni layer.

Embodiment 3-3-7

In embodiment 3-3-7, an alloy of Cu: 0.5 wt %, Ag: 3.5 wt %, Sn: 95 wt % is used as a solder consisting of the solder bump. Ni layer is formed as thickness 0.03 µm, P content 0.4 wt %. On the other hand, Pd layer is formed as thickness 0.03 µm, P content 3 wt %. Au layer is formed as thickness 0.03 µm. Therefore, the composition of the Ni—Sn alloy layer becomes Sn:Cu:Ni=66:29:5, the thickness becomes 1.1 µm. The Ni—Sn alloy layer is typically a grain-shaped and formed, at an interface of the Ni layer.

Embodiment 3-3-8

In embodiment 3-3-8, an alloy of Cu: 0.5 wt %, Ag: 3.5 wt %, Sn: 95 wt % is used as a solder consisting of the solder bump. Ni layer is formed as thickness 0.03 µm, P content 0.5 wt %. On the other hand, Pd layer is formed as thickness 0.2 µm, P content 7 wt %. Au layer is formed, as thickness 0.04 µm. Therefore, the composition of the Ni—Sn alloy layer becomes Sn:Cu:Ni=66:29:5, the thickness becomes 1.3 µm. The Ni—Sn alloy layer is typically a grain-shaped and formed at an interface of the Ni layer.

Embodiment 3-3-9

In embodiment 3-3-9, an alloy of Cu: 0.5 wt %, Ag: 3.5 wt %, Sn: 95 wt % is used as a solder consisting of the solder bump. Ni layer is formed as thickness 0.03 µm, P content 16 wt %. On the other hand, Pd layer is formed, as thickness 0.2 µm, P content 7 wt %. Au layer is formed as thickness 0.05 µm. Therefore, the composition of the Ni—Sn alloy layer becomes Sn:Cu:Ni=66:29:5, the thickness becomes 1.3 µm. The Ni—Sn alloy layer is typically a grain-shaped and formed at an interface of the Ni layer.

Embodiment 3-3-10

In embodiment 3-3-10, an alloy of Cu: 0.5 wt %, Ag: 3.5 wt %, Sn: 95 wt % is used as a solder consisting of the solder bump. Ni layer is formed as thickness 10 µm, P content 0.4 wt %. On the other hand, Pd layer is formed as thickness 0.2 µm, P content 2 wt %. Au layer is formed as thickness 0.03 µm. Therefore, the composition of the Ni—Sn alloy layer becomes Sn:Cu:Ni=66:29:5, the thickness becomes 1.4 µm. The Ni—Sn alloy layer is typically a grain-shaped and formed at an interface of the Ni layer.

Embodiment 3-3-11

In embodiment 3-3-11, an alloy of Cu: 0.5 wt %, Ag: 3.5 wt %, Sn: 95 wt % is used as a solder consisting of the solder bump. Ni layer is formed as thickness 10 µm, P content 16 wt %. On the other hand, Pd layer is formed as thickness 1 µm, P content 7 wt %. Au layer is formed as thickness 0.01 µm. Therefore, the composition of the Ni—Sn alloy layer becomes Sn:Cu:Ni=66:29:5, the thickness becomes 1.5 µm. The Ni—Sn alloy layer is typically a grain-shaped and formed at an interface of the Ni layer.

Embodiment 3-3-12

In embodiment 3-3-12, an alloy of Cu: 0.5 wt %, Ag: 3.5 wt %, Sn: 95 wt % is used as a solder consisting of the solder bump. Ni layer is formed as thickness 12 µm, P content 0.4 wt %. On the other hand, Pd layer is formed as thickness 0.01 µm, P content 2 wt %. Au layer is formed as thickness 0.04 µm. Therefore, the composition of the Ni—Sn alloy layer becomes Sn:Cu:Ni=66:29:5, the thickness becomes 2.4 µm. The Ni—Sn alloy layer is typically a grain-shaped and formed, at an interface of the Ni layer.

Embodiment 3-3-13

In embodiment 3-3-13, an alloy of Cu: 0.5 wt %, Ag: 3.5 wt %, Sn: 95 wt % is used as a solder consisting of the solder bump. Ni layer is formed as thickness 12 µm, P content 5 wt %. On the other hand, Pd layer is formed as thickness 1 µm, P content 2 wt %. Au layer is formed as thickness 0.02 µm. Therefore, the composition of the Ni—Sn alloy layer becomes Sn:Cu:Ni=66:29:5, the thickness becomes 2.5 µm. The Ni—Sn alloy layer is typically a grain-shaped and formed at an interface of the Ni layer.

Embodiment 3-3-14

In embodiment 3-3-14, an alloy of Cu: 0.5 wt %, Ag: 3.5 wt %, Sn: 95 wt % is used, as a solder consisting of the solder bump. Ni layer is formed as thickness 12 µm, P content 17 wt %. On the other hand, Pd layer is formed as thickness 1 µm, P content 7 wt %. Au layer is formed as thickness 0.03 µm, Therefore, the composition of the Ni—Sn alloy layer becomes Sn:Cu:Ni=66:29:5, the thickness becomes 2.4 µm. The Ni—Sn alloy layer is typically a grain-shaped and formed at an interface of the Ni layer.

Embodiment 3-4-1

In embodiment 3-4-1, an alloy of Sn:Pb=63:37 (wt %) is used as a solder consisting of the solder bump. Ni layer is formed as thickness 5 µm, P content 1.2 wt %. On the other hand, Pd layer is formed as thickness 0.009 µm, P content 8 wt %. Au layer is formed as thickness 0.03 µm. Therefore, the composition of the Ni—Sn alloy layer becomes Sn:Ni=67:33, the thickness becomes 2.5 µm. The Ni—Sn alloy layer is typically a pillar-shaped form.

Embodiment 3-4-2

In embodiment 3-4-2, an alloy of Sn:Pb=63:37 (wt %) is used as a solder consisting of the solder bump. Ni layer is formed as thickness 5 µm, P content 1.2 wt %. On the other hand, Pd layer is formed as thickness 0.008 µm, P content 7 wt %. Au layer is formed as thickness 0.04 µm. Therefore, the composition of the Ni—Sn alloy layer becomes Sn:Ni=67:33, the thickness becomes 2.5 µm. The Ni—Sn alloy layer is typically a pillar-shaped form.

Embodiment 3-4-3

In embodiment 3-4-3, an alloy of Sn:Pb=63:37 (wt %) is used as a solder consisting of the solder bump. Ni layer is formed as thickness 5 µm, P content 1.2 wt %. On the other hand, Pd layer is formed as thickness 0.009 µm, P content 1 wt

Embodiment 3-4-4

In embodiment 3-4-4, an alloy of Sn:Pb=63:37 (wt %) is used as a solder consisting of the solder bump. Ni layer is formed as thickness 5 μm, P content 1.2 wt %. On the other hand, Pd layer is formed as thickness 2.0 μm, P content 2 wt %. Au layer is formed as thickness 0.05 μm. Therefore, the composition of the Ni—Sn alloy layer becomes Sn:Ni=67:33, the thickness becomes 1.3 μm. The Ni—Sn alloy layer is typically a grain-shaped and formed at an interface of the Ni layer.

Embodiment 3-4-5

In embodiment 3-4-5, an alloy of Sn:Pb=63:37 (wt %) is used as a solder consisting of the solder bump. Ni layer is formed as thickness 10 μm, P content 0.5 wt %. On the other hand, Pd layer is formed as thickness 2.0 μm, P content 5 wt %. Au layer is formed as thickness 0.04 μm. Therefore, the composition of the Ni—Sn alloy layer becomes Sn:Ni=67:33, the thickness becomes 1.3 μm. The Ni—Sn alloy layer is typically a grain-shaped and formed at an interface of the Ni layer.

Embodiment 3-4-6

In embodiment 3-4-6, an alloy of Sn:Pb=63:37 (wt %) is used as a solder consisting of the solder bump. Ni layer is formed as thickness 10 μm, P content 5 wt %. On the other hand, Pd layer is formed as thickness 2.0 μm, P content 9 wt %. Au layer is formed as thickness 0.06 μm. Therefore, the composition of the Ni—Sn alloy layer becomes Sn:Ni=67:33, the thickness becomes 1.5 μm. The Ni—Sn alloy layer is typically a grain-shaped and formed at an interface of the Ni layer.

Embodiment 3-4-7

In embodiment 3-4-7, an alloy of Sn:Pb=63:37 (wt %) is used as a solder consisting of the solder bump. Ni layer is formed as thickness 0.03 μm, P content 0.4 wt %. On the other hand, Pd layer is formed, as thickness 0.03 μm, P content 3 wt %. Au layer is formed as thickness 0.03 μm. Therefore, the composition of the Ni—Sn alloy layer becomes Sn:Ni=67:33, the thickness becomes 1.1 μm. The Ni—Sn alloy layer is typically a grain-shaped and formed at an interface of the Ni layer.

Embodiment 3-4-8

In embodiment 3-4-8, an alloy of Sn:Pb=63:37 (wt %) is used as a solder consisting of the solder bump. Ni layer is formed as thickness 0.03 μm, P content 0.5 wt %. On the other hand, Pd layer is formed as thickness 0.2 μm, P content 7 wt %. Au layer is formed as thickness 0.04 μm. Therefore, the composition of the Ni—Sn alloy layer becomes Sn:Ni=67:33, the thickness becomes 1.3 μm. The Ni—Sn alloy layer is typically a grain-shaped and formed at an interface of the Ni layer.

Embodiment 3-4-9

In embodiment 3-4-9, an alloy of Sn:Pb=63:37 (wt %) is used as a solder consisting of the solder bump. Ni layer is formed as thickness 0.03 μm, P content 16 wt %. On the other hand, Pd layer is formed as thickness 0.2 μm, P content 7 wt %. Au layer is formed as thickness 0.05 μm. Therefore, the composition of the Ni—Sn alloy layer becomes Sn:Ni=67:33, the thickness becomes 1.3 μm. The Ni—Sn alloy layer is typically a grain-shaped and formed at an interface of the Ni layer.

Embodiment 3-4-10

In embodiment 3-4-10, an alloy of Sn:Pb=63:37 (wt %) is used as a solder consisting of the solder bump. Ni layer is formed as thickness 10 μm, P content 0.4 wt %. On the other hand, Pd layer is formed as thickness 0.2 μm, P content 2 wt %. Au layer is formed, as thickness 0.03 μm. Therefore, the composition of the Ni—Sn alloy layer becomes Sn:Ni=67:33, the thickness becomes 1.4 μm. The Ni—Sn alloy layer is typically a grain-shaped and formed at an interface of the Ni layer.

Embodiment 3-4-11

In embodiment 3-4-11, an alloy of Sn:Pb=63:37 (wt %) is used as a solder consisting of the solder bump. Ni layer is formed as thickness 10 μm, P content 16 wt %. On the other hand, Pd layer is formed as thickness 1 μm, P content 7 wt %. Au layer is formed as thickness 0.01 μm. Therefore, the composition of the Ni—Sn alloy layer becomes Sn:Ni=67:33, the thickness becomes 1.5 μm. The Ni—Sn alloy layer is typically a grain-shaped and formed at an interface of the Ni layer.

Embodiment 3-4-12

In embodiment 3-4-12, an alloy of Sn:Pb=63:37 (wt %) is used as a solder consisting of the solder bump. Ni layer is formed as thickness 12 μm, P content 0.4 wt %. On the other hand, Pd layer is formed as thickness 0.01 μm, P content 2 wt %. Au layer is formed as thickness 0.04 μm, Therefore, the composition of the Ni—Sn alloy layer becomes Sn:Ni=67:33, the thickness becomes 2.4 μm. The Ni—Sn alloy layer is typically a grain-shaped and formed at an interface of the Ni layer.

Embodiment 3-4-13

In embodiment 3-4-13, an alloy of Sn:Pb=63:37 (wt %) is used as a solder consisting of the solder bump. Ni layer is formed as thickness 12 μm, P content 5 wt %. On the other hand, Pd layer is formed as thickness 1 μm, P content 2 wt %. Au layer is formed as thickness 0.02 μm. Therefore, the composition of the Ni—Sn alloy layer becomes Sn:Ni=67:33, the thickness becomes 2.5 μm. The Ni—Sn alloy layer is typically a grain-shaped and formed at an interface of the Ni layer.

Embodiment 3-4-14

In embodiment 3-4-14, an alloy of Sn:Pb=63:37 (wt %) is used as a solder consisting of the solder bump. Ni layer is formed as thickness 12 μm, P content 17 wt %. On the other hand, Pd layer is formed as thickness 1 μm, P content 7 wt %, Au layer is formed as thickness 0.03 μm. Therefore, the composition of the Ni—Sn alloy layer becomes Sn:Ni=67:33, the thickness becomes 2.4 μm. The Ni—Sn alloy layer is typically a grain-shaped and formed at an interface of the Ni layer.

Embodiment 3-5-1

In embodiment 3-5-1, an alloy of Sn:Pb=63:37 (wt %) is used as a solder consisting of the solder bump. Ni layer is formed as thickness 5 μm, P content 1.2 wt %. On the other hand, Pd layer is formed, as thickness 0.03 μm, P content 0 wt %. (As shown in the electron microscope picture in FIG. 19, Pd layer partly separates out, and under Ni layer can be seen via porous of the Pd layer as same as embodiment 1-5-1.) Au layer is formed as thickness 0.05 μm. When the solder is conducted reflow, flux containing copper is used. Therefore, the composition of the Ni—Sn alloy layer becomes Sn:Cu:Ni=42:37:21, the thickness becomes 1.5 μm. The Ni—Sn alloy layer is typically a grain-shaped form.

Embodiment 3-5-2

In embodiment 3-5-2, an alloy of Sn:Pb=63:37 (wt %) is used as a solder consisting of the solder bump. Ni layer is formed as thickness 5 μm, P content 1.2 wt %. On the other hand, Pd layer is formed as thickness 0.07 μm, P content 5 wt %. (As shown in the electron microscope picture in FIG. 20, Pd layer is uniformly formed as same as embodiment 1-5-2.) Au layer is formed as thickness 0.07 μm. When the solder is conducted reflow, flux containing copper is used. Therefore, the composition of the Ni—Sn alloy layer becomes Sn:Cu:Ni=42:37:21, the thickness becomes 1.5 μm. The Ni—Sn alloy layer is typically a board-shaped form shown in the electron microscope picture the left side in FIG. 18 as same as embodiment 1-1-1.

Reference Example 3-1-1

In reference examples 3-1-1 to 3-1-16 and reference examples 3-2-1 to 3-2-16, a buildup-multi-layer-circuit-board is formed and a solder bump is formed, as same as the above embodiment 3 explained with referring to FIGS. 1-8.

In reference example 3-1-1, an alloy of Cu: 0.2 wt %, Ag: 1 wt %, Sn: 97 wt % is used as a solder consisting of the solder bump. Ni layer is formed as thickness 5 μm, P content 1.2 wt %. On the other hand, Pd layer is formed as thickness 0.5 μm, P content 0 wt %. Au layer is formed as thickness 0.03 μm. Therefore, the composition of the Ni—Sn alloy layer becomes Sn:Cu:Ni=38:20:42, the thickness becomes 0.8 μm. The electron microscope pictures of Ni layer, Cu—Ni—Sn alloy and solder in reference example 3-1-1 are same as reference example 1-1-1 with referring to FIGS. 15-18. As shown in the electron microscope picture in the right side of FIG. 15, in reference example 3-1-1, the Cu—Ni—Sn alloy is un-consecutively formed on the surface of Ni layer, that is, is Ups and downs. As shown in the electron microscope pictures in the right side of FIGS. 16, 17 using enlarged scale, Ag particles un-uniformly dotted exist on the surface of the Cu—Ni—Sn alloy through skin layer of Sn. In reference example 3-1-1, as shown in the electron microscope picture in the right side of FIG. 18, the Ni—Cu—Sn alloy layer is typically a pillar-shaped form, that is, pillar-shaped alloy crystal vertically formed along with the Ni layer.

Reference Example 3-1-2

In reference example 3-1-2, an alloy of Cu: 0.2 wt %, Ag: 1 wt %, Sn: 97 wt % is used as a solder consisting of the solder bump as same as reference example 3-1-1. Ni layer is formed as thickness 5 μm, P content 4 wt %. On the other hand, Pd layer is formed, as thickness 1.0 μm, P content 0.8 wt %. Au layer is formed as thickness 0.03 μm. Therefore, the composition of the Ni—Sn alloy layer becomes Sn:Cu:Ni=40:25:35, the thickness becomes 0.9 μm.

Reference Example 3-1-3

In reference example 3-1-3, an alloy of Cu: 0.2 wt %, Ag: 1 wt %, Sn: 97 wt % is used as a solder consisting of the solder bump. Ni layer is formed as thickness 5 μm, P content 4 wt %. On the other hand, Pd layer is formed as thickness 1.0 μm, P content 9 wt %. Au layer is formed as thickness 0.04 μm. Therefore, the composition of the Ni—Sn alloy layer becomes Sn:Cu:Ni=39:26:49, the thickness becomes 2.7 μm.

Reference Example 3-1-4

In reference example 3-1-4, an alloy of Cu: 0.2 wt %, Ag: 1 wt %, Sn: 97 wt % is used as a solder consisting of the solder bump. Ni layer is formed as thickness 5 μm, P content 4 wt %. On the other hand, Pd layer is formed as thickness 1.5 μm, P content 9 wt %. Au layer is formed as thickness 0.02 μm. Therefore, the composition of the Ni—Sn alloy layer becomes Sn:Cu:Ni=39:26:49, the thickness becomes 2.9 μm.

Reference Example 3-1-5

In reference example 3-1-5, an alloy of Cu: 0.2 wt %, Ag: 1 wt %, Sn: 97 wt % is used as a solder consisting of the solder bump. Ni layer is formed as thickness 0.03 μm, P content 0.4 wt %. On the other hand, Pd layer is formed as thickness 0.5 μm, P content 0 wt %. Au layer is formed as thickness 0.03 μm. Therefore, the composition of the Ni—Sn alloy layer becomes Sn:Cu:Ni=38:20:42, the thickness becomes 0.8 μm.

Reference Example 3-1-6

In reference example 3-1-6, an alloy of Cu: 0.2 wt %, Ag: 1 wt %, Sn: 97 wt % is used as a solder consisting of the solder bump. Ni layer is formed as thickness 0.03 μm, P content 0.4 wt %. On the other hand, Pd layer is formed as thickness 1.0 μm, P content 2 wt %. Au layer is formed as thickness 0.05 μm. Therefore, the composition of the Ni—Sn alloy layer becomes Sn:Cu:Ni=40:25:35, the thickness becomes 0.9 μm.

Reference Example 3-1-7

In reference example 3-1-7, an alloy of Cu: 0.2 wt %, Ag: 1 wt %, Sn: 97 wt % is used as a solder consisting of the solder bump. Ni layer is formed as thickness 0.03 μm, P content 16 wt %. On the other hand, Pd layer is formed as thickness 1.0 μm, P content 9 wt %. Au layer is formed as thickness 0.02 μm. Therefore, the composition of the Ni—Sn alloy layer becomes Sn:Cu:Ni=40:25:35, the thickness becomes 0.9 μm.

Reference Example 3-1-8

In reference example 3-1-8, an alloy of Cu: 0.2 wt %, Ag: 1 wt %, Sn: 97 wt % is used as a solder consisting of the solder bump. Ni layer is formed as thickness 0.03 μm, P content 16 wt %. On the other hand, Pd layer is formed as thickness 1.5 μm, P content 9 wt %. Au layer is formed as thickness 0.05 μm. Therefore, the composition of the Ni—Sn alloy layer becomes Sn:Cu:Ni=40:25:35, the thickness becomes 0.9 μm.

Reference Example 3-1-9

In reference example 3-1-9, an alloy of Cu: 0.2 wt %, Ag: 1 wt %, Sn: 97 wt % is used as a solder consisting of the solder bump. Ni layer is formed as thickness 12 μm, P content 0.4 wt %. On the other hand, Pd layer is formed as thickness 0.5 μm, P content 0 wt %. Au layer is formed as thickness 0.03 μm. Therefore, the composition of the Ni—Sn alloy layer becomes Sn:Cu:Ni=39:26:49, the thickness becomes 2.5 μm.

Reference Example 3-1-10

In reference example 3-1-10, an alloy of Cu: 0.2 wt %, Ag: 1 wt %, Sn: 97 wt % is used as a solder consisting of the solder bump. Ni layer is formed as thickness 12 μm, P content 0.4 wt %. On the other hand, Pd layer is formed as thickness 1 μm, P content 2 wt %. Au layer is formed as thickness 0.02 μm. Therefore, the composition of the Ni—Sn alloy layer becomes Sn:Cu:Ni=39:26:49, the thickness becomes 2.6 μm.

Reference Example 3-1-11

In reference example 3-1-11, an alloy of Cu: 0.2 wt %, Ag: 1 wt %, Sn: 97 wt % is used as a solder consisting of the solder bump. Ni layer is formed as thickness 12 μm, P content 17 wt %. On the other hand, Pd layer is formed as thickness 1 μm, P content 9 wt %. Au layer is formed as thickness 0.03 μm. Therefore, the composition of the Ni—Sn alloy layer becomes Sn:Cu:Ni=39:26:49, the thickness becomes 2.7 μm.

Reference Example 3-1-12

In reference example 3-1-12, an alloy of Cu: 0.2 wt %, Ag: 1 wt %, Sn: 97 wt % is used as a solder consisting of the solder bump. Ni layer is formed as thickness 12 μm, P content 17 wt %. On the other hand, Pd layer is formed as thickness 1.5 μm, P content 9 wt %. Au layer is formed as thickness 0.05 μm. Therefore, the composition of the Ni—Sn alloy layer becomes Sn:Cu:Ni=39:26:49, the thickness becomes 2.9 μm.

Reference Example 3-1-13

In reference example 3-1-13, an alloy of Cu: 0.2 wt %, Ag: 1 wt %, Sn: 97 wt % is used as a solder consisting of the solder bump. Ni layer is formed as thickness 0.03 μm, P content 0.4 wt %. On the other hand, Pd layer is formed as thickness 1 μm, P content 2 wt %. Au layer is formed as thickness 0.008 μm. Therefore, the composition of the Ni—Sn alloy layer becomes Sn:Cu:Ni=39:26:49, the thickness becomes 0.9 μm.

Reference Example 3-1-14

In reference example 3-1-14, an alloy of Cu: 0.2 wt %, Ag: 1 wt %, Sn: 97 wt % is used as a solder consisting of the solder bump. Ni layer is formed as thickness 0.03 μm, P content 16 wt %. On the other hand, Pd layer is formed as thickness 1 μm, P content 9 wt %. Au layer is formed as thickness 0.008 μm. Therefore, the composition of the Ni—Sn alloy layer becomes Sn:Cu:Ni=39:26:49, the thickness becomes 0.9 μm.

Reference Example 3-1-15

In reference example 3-1-15, an alloy of Cu: 0.2 wt %, Ag: 1 wt %, Sn: 97 wt % is used as a solder consisting of the solder bump. Ni layer is formed as thickness 12 μm, P content 0.4 wt %. On the other hand, Pd layer is formed as thickness 1.5 μm, P content 2 wt %. Au layer is formed as thickness 2.1 μm. Therefore, the composition of the Ni—Sn alloy layer becomes Sn:Cu:Ni=39:26:49, the thickness becomes 2.6 μm.

Reference Example 3-1-16

In reference example 3-1-16, an alloy of Cu: 0.2 wt %, Ag: 1 wt %, Sn: 97 wt % is used as a solder consisting of the solder bump. NI layer is formed as thickness 12 μm, P content 17 wt %. On the other hand, Pd layer is formed as thickness 1.5 μm, P content 9 wt %. Au layer is formed as thickness 2.1 μm. Therefore, the composition of the Ni—Sn alloy layer becomes Sn:Cu:Ni=39:26:49, the thickness becomes 2.7 μm.

Reference Example 3-2-1

In reference examples 3-1-1 to 3-1-16, the Cu/Ag/Sn solder which does not include lead is used as the solder consisting of the solder bump. Whereas, in reference examples 3-2-1 to 3-2-16, an alloy of Sn:Pb=63:37 (wt %) is used as a solder consisting of the solder bump. Ni layer is formed as thickness 5 μm, P content 1.2 wt %. On the other hand, Pd layer is formed as thickness 0.5 μm, P content 0 wt %. Au layer is formed as thickness 0.03 μm. Therefore, the composition of the Ni—Sn alloy layer becomes Sn:Ni=67:33, the thickness becomes 0.8 μm.

Reference Example 3-2-2

In reference example 3-2-2, an alloy of Sn:Pb=63:37 (wt %) is used as a solder consisting of the solder bump. Ni layer is formed as thickness 5 μm, P content 4 wt %. On the other hand, Pd layer is formed as thickness 1.0 μm, P content 0.8 wt %. Au layer is formed as thickness 0.03 μm. Therefore, the composition of the Ni—Sn alloy layer becomes Sn:Ni=67:33, the thickness becomes 0.9 μm.

Reference Example 3-2-3

In reference example 3-2-3, an alloy of Sn:Pb=63:37 (wt %) is used as a solder consisting of the solder bump. Ni layer is formed as thickness 5 μm, P content 4 wt %. On the other hand, Pd layer is formed as thickness 1.0 μm, P content 9 wt %. Au layer is formed as thickness 0.04 μm. Therefore, the composition of the Ni—Sn alloy layer becomes Sn:Ni=67:33, the thickness becomes 2.7 μm.

Reference Example 3-2-4

In reference example 3-2-4, an alloy of Sn:Pb=63:37 (wt %) is used as a solder consisting of the solder bump, Ni layer is formed as thickness 5 μm, P content 4 wt %. On the other hand, Pd layer is formed as thickness 1.5 μm, P content 9 wt %. Au layer is formed as thickness 0.02 μm. Therefore, the composition of the Ni—Sn alloy layer becomes Sn:Ni=67:33, the thickness becomes 2.9 μm.

Reference Example 3-2-5

In reference example 3-2-5, an alloy of Sn:Pb=63:37 (wt %) is used as a solder consisting of the solder bump. Ni layer is formed as thickness 0.03 μm, P content 0.4 wt %. On the other hand, Pd layer is formed as thickness 0.5 μm, P content 0 wt %. Au layer is formed as thickness 0.03 μm. Therefore, the composition of the Ni—Sn alloy layer becomes Sn:Ni=67:33, the thickness becomes 0.8 μm.

Reference Example 3-2-6

In reference example 3-2-6, an alloy of Sn:Pb=63:37 (wt %) is used as a solder consisting of the solder bump. Ni layer is formed as thickness 0.03 μm, P content 0.4 wt %. On the other hand, Pd layer is formed as thickness 1 μm, P content 2 wt %. Au layer is formed as thickness 0.05 μm. Therefore, the composition of the Ni—Sn alloy layer becomes Sn:Ni=67:33, the thickness becomes 0.9 μm.

Reference Example 3-2-7

In reference example 3-2-7, an alloy of Sn:Pb=63:37 (wt %) is used as a solder consisting of the solder bump. Ni layer is formed as thickness 0.03 μm, P content 16 wt %. On the other hand, Pd layer is formed as thickness 1 μm, P content 9 wt %. Au layer is formed as thickness 0.02 μm. Therefore, the composition of the Ni—Sn alloy layer becomes Sn:Ni=67:33, the thickness becomes 0.9 μm.

Reference Example 3-2-8

In reference example 3-2-8, an alloy of Sn:Pb=63:37 (wt %) is used as a solder consisting of the solder bump. Ni layer is formed as thickness 0.03 μm, P content 16 wt %. On the other hand, Pd layer is formed as thickness 1.5 μm, P content 9 wt %. Au layer is formed as thickness 0.05 μm. Therefore, the composition of the Ni—Sn alloy layer becomes Sn:Ni=67:33, the thickness becomes 0.9 μm.

Reference Example 3-2-9

In reference example 3-2-9, an alloy of Sn:Pb=63:37 (wt %) is used as a solder consisting of the solder bump. Ni layer is formed as thickness 12 μm, P content 0.4 wt %. On the other hand, Pd layer is formed as thickness 0.5 μm, P content 0 wt %. Au layer is formed as thickness 0.03 μm. Therefore, the composition of the Ni—Sn alloy layer becomes Sn:Ni=67:33, the thickness becomes 2.5 μm.

Reference Example 3-2-10

In reference example 3-2-10, an alloy of Sn:Pb=63:37 (wt %) is used as a solder consisting of the solder bump. Ni layer is formed as thickness 12 μm, P content 0.4 wt %. On the other hand, Pd layer is formed as thickness 1 μm, P content 2 wt %. Au layer is formed as thickness 0.02 μm. Therefore, the composition of the Ni—Sn alloy layer becomes Sn:Ni=67:33, the thickness becomes 2.6 μm.

Reference Example 3-2-11

In reference example 3-2-11, an alloy of Sn:Pb=63:37 (wt %) is used as a solder consisting of the solder bump. Ni layer is formed as thickness 12 μm, P content 17 wt %. On the other hand, Pd layer is formed, as thickness 1 μm, P content 9 wt %. Au layer is formed as thickness 0.03 μm. Therefore, the composition of the Ni—Sn alloy layer becomes Sn:Ni=67:33, the thickness becomes 2.7 μm.

Reference Example 3-2-12

In reference example 3-2-12, an alloy of Sn:Pb=63:37 (wt %) is used as a solder consisting of the solder bump. Ni layer is formed as thickness 12 μm, P content 17 wt %. On the other hand, Pd layer is formed as thickness 1.5 μm, P content 9 wt %. Au layer is formed as thickness 0.05 μm. Therefore, the composition of the Ni—Sn alloy layer becomes Sn:Ni=67:33, the thickness becomes 2.9 μm.

Reference Example 3-2-13

In reference example 3-2-13, an alloy of Sn:Pb=63:37 (wt %) is used as a solder consisting of the solder bump. Ni layer is formed as thickness 0.03 μm, P content 0.4 wt %. On the other hand, Pd layer is formed as thickness 1 μm, P content 2 wt %. Au layer is formed as thickness 0.008 μm. Therefore, the composition of the Ni—Sn alloy layer becomes Sn:Ni=67:33, the thickness becomes 0.9 μm.

Reference Example 3-2-14

In reference example 3-2-14, an alloy of Sn:Pb=63:37 (wt %) is used as a solder consisting of the solder bump. Ni layer is formed as thickness 0.03 μm, P content 16 wt %. On the other hand, Pd layer is formed as thickness 1 μm, P content 9 wt %. Au layer is formed as thickness 0.008 μm. Therefore, the composition of the Ni—Sn alloy layer becomes Sn:Ni=67:33, the thickness becomes 0.9 μm.

Reference Example 3-2-15

In reference example 3-2-15, an alloy of Sn:Pb=63:37 (wt %) is used as a solder consisting of the solder bump. Ni layer is formed as thickness 12 μm, P content 0.4 wt %. On the other hand, Pd layer is formed as thickness 1.5 μm, P content 2 wt %. Au layer is formed as thickness 2.1 μm. Therefore, the composition of the Ni—Sn alloy layer becomes Sn:Ni=67:33, the thickness becomes 2.6 μm.

Reference Example 3-2-16

In reference example 3-2-16, an alloy of Sn:Pb=63:37 (wt %) is used as a solder consisting of the solder bump. Ni layer is formed as thickness 12 μm, P content 17 wt %. On the other hand, Pd layer is formed as thickness 1.5 μm, P content 9 wt %. Au layer is formed as thickness 2.1 μm. Therefore, the composition of the Ni—Sn alloy layer becomes Sn:Ni=67:33, the thickness becomes 2.7 μm.

Embodiment 4

The above mentioned embodiment 3 concerns to the build-up multi printed board. Whereas, embodiment 4 concerns to a laminated multilayer printed board as same as embodiment 2.

Figure 25:
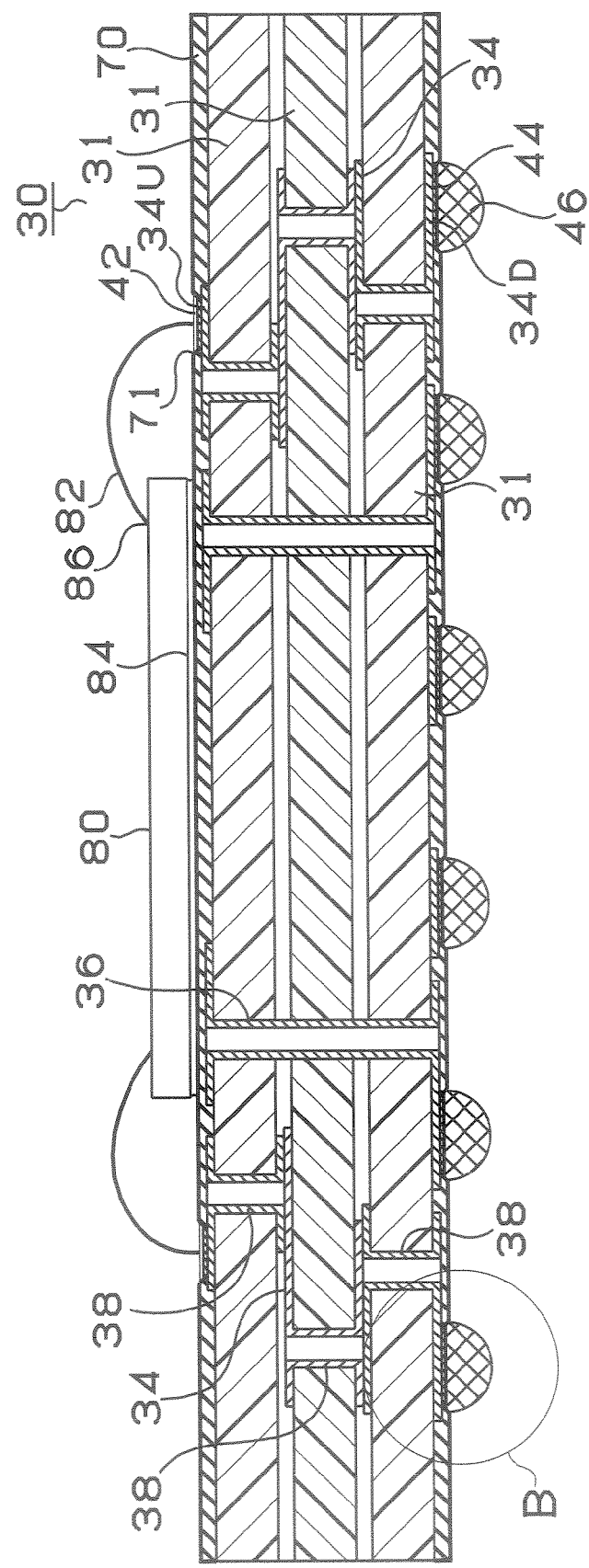
FIG. 25 is a sectional view of the multilayered printed wiring board according to a fourth embodiment of the present invention.
Figure 26:
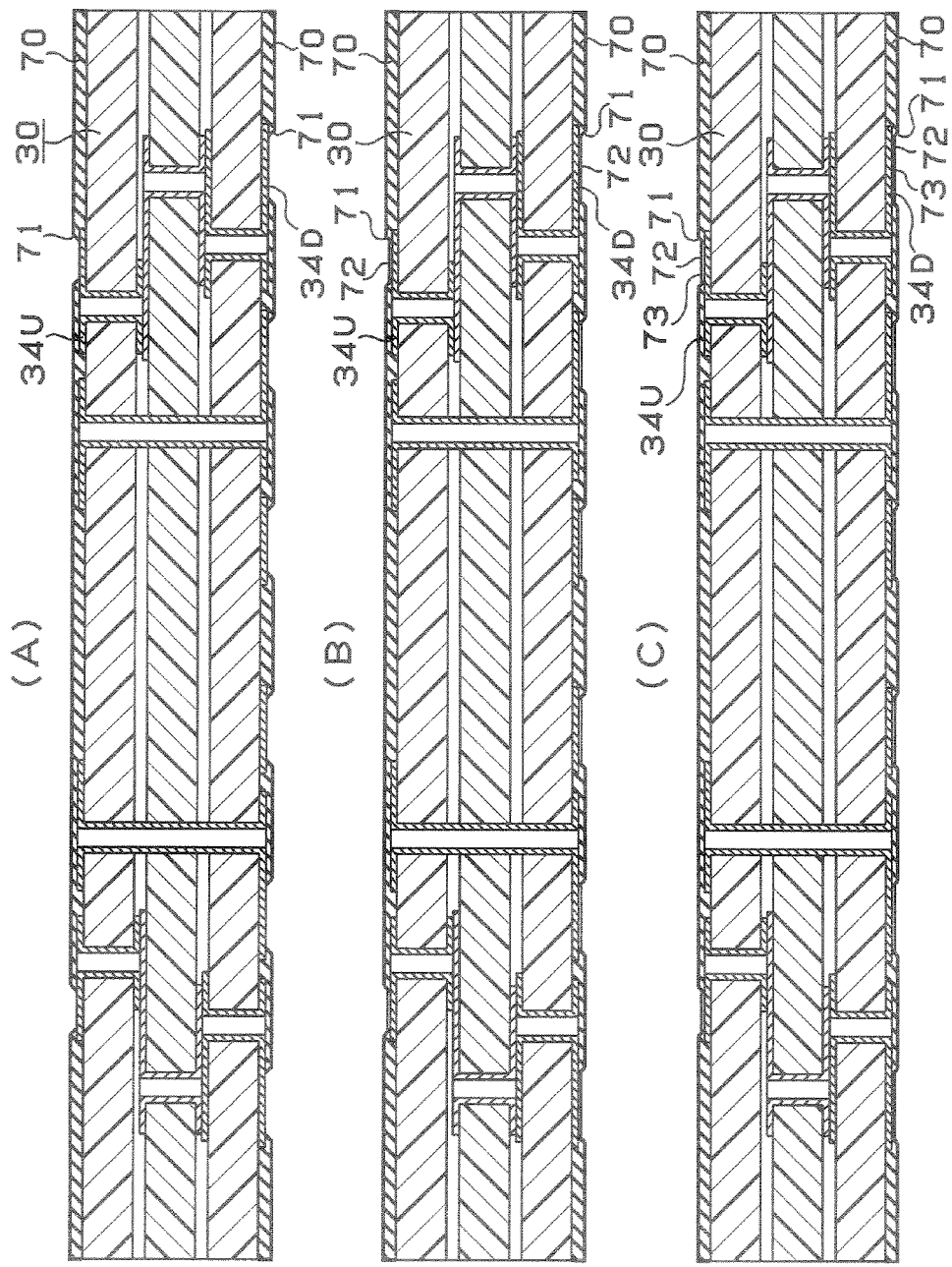
FIGS. 26 (A, B, C) are diagrams of a manufacturing process of the printed wiring board according to the fourth embodiment.
Figure 27:
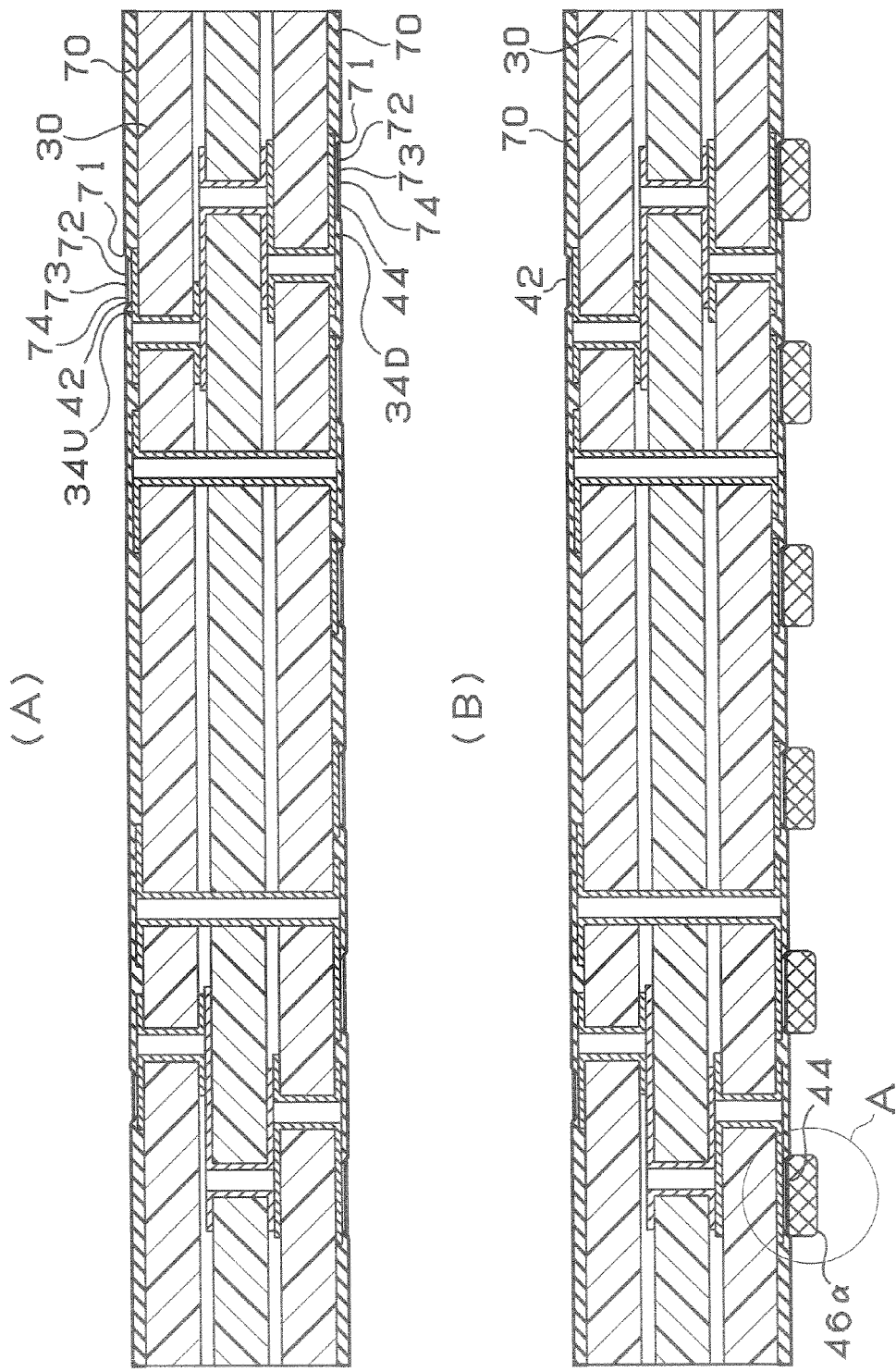
FIGS. 27 (A, B) are diagrams of a manufacturing process of the printed wiring board according to the fourth embodiment.
Figure 28:
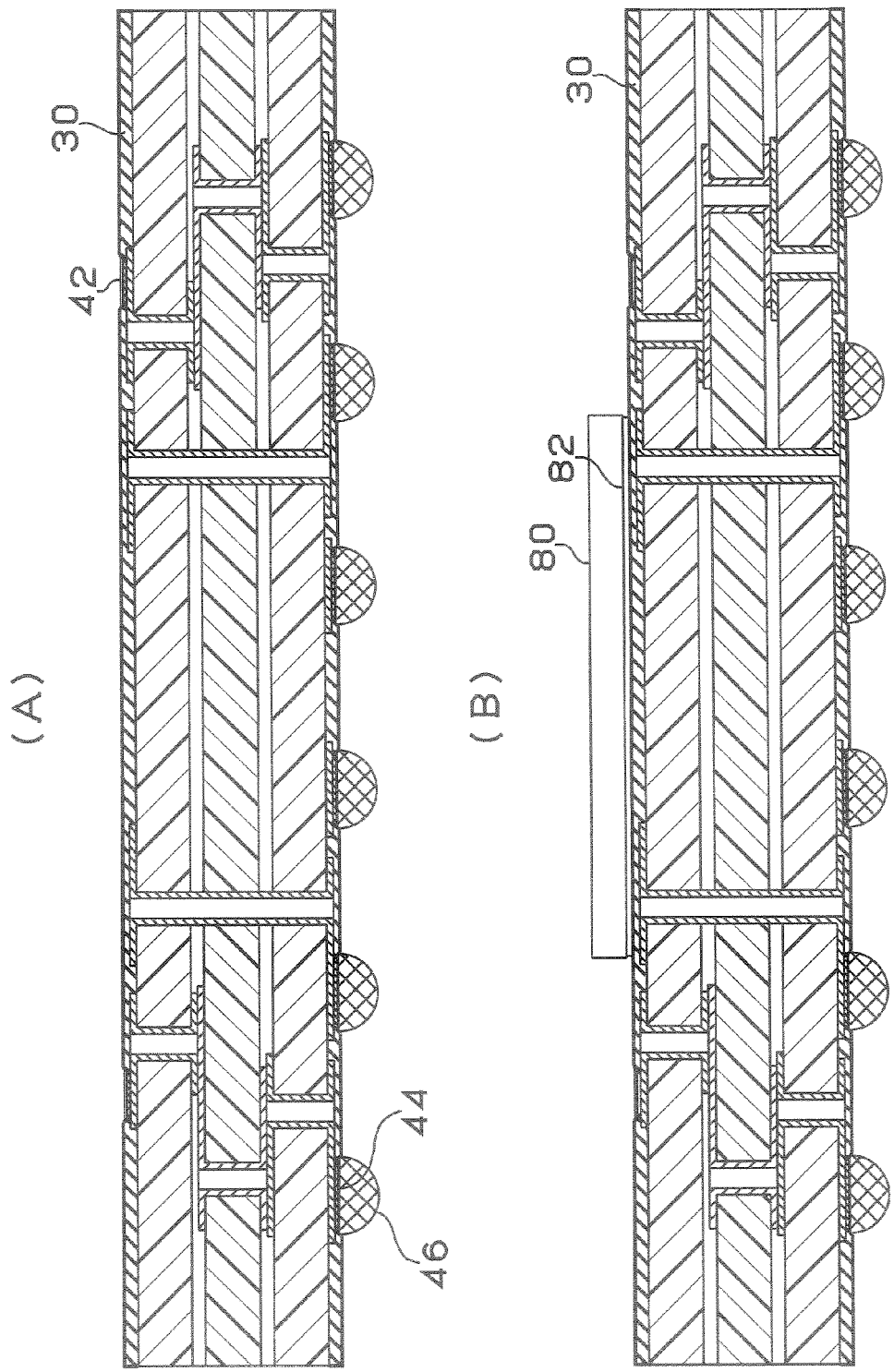
FIGS. 28 (A, B) are diagrams of a manufacturing process of the printed wiring board according to the fourth embodiment.
Figure 30:
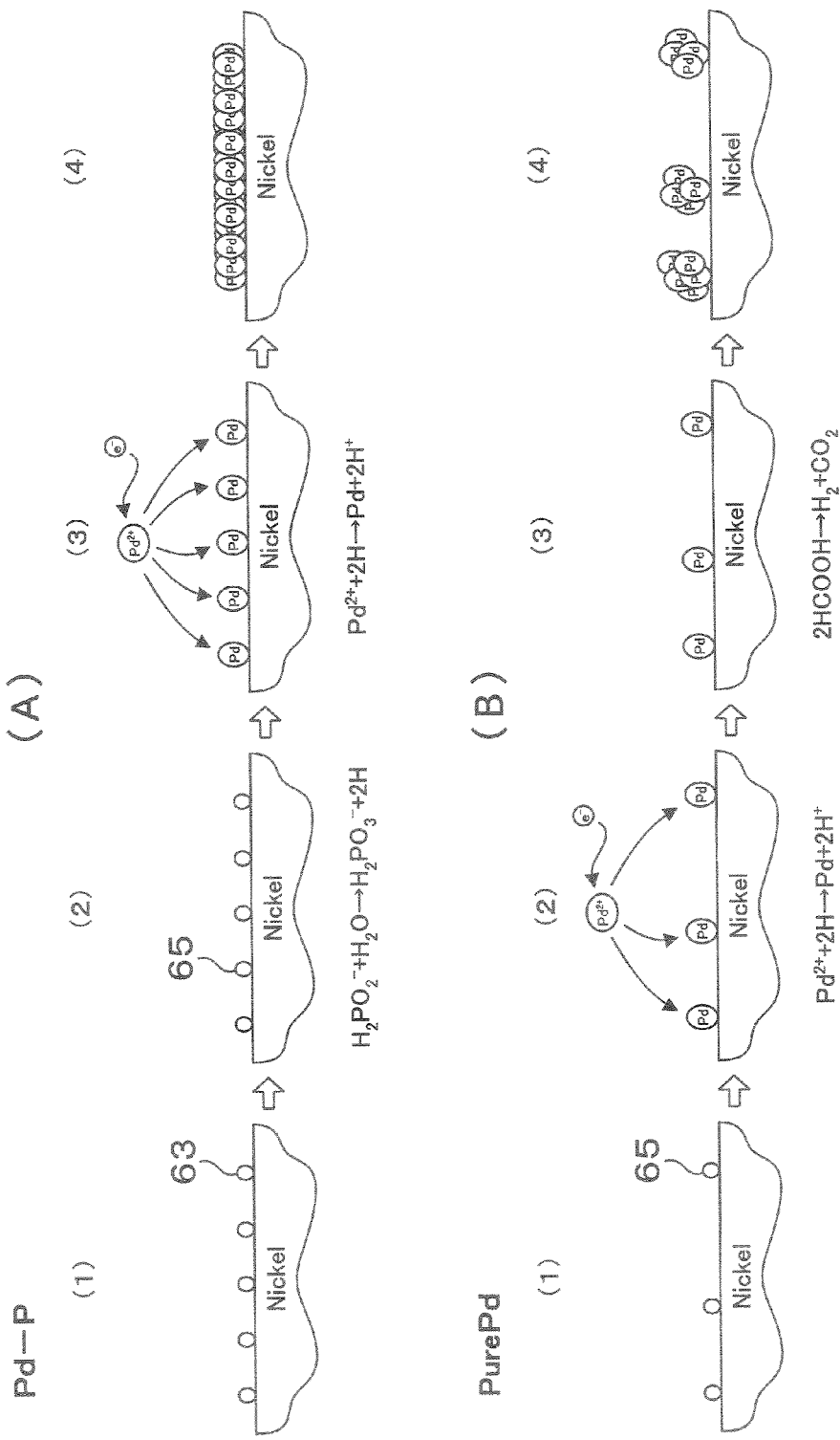
FIGS. 30(A), 30(B) are schematic diagrams illustrating the formation of a Pd film.

FIG. 25 shows the cross section of a printed circuit board 30 in embodiment 4. The multilayer printed circuit board 30 is a semiconductor mounting printed board which mounts a IC chip 80. The multilayer printed circuit board 30 consists of laminated plural circuit boards 31, each board 31 has through holes 36, via holes 38 and conductor circuits 34. The conductor circuits 34U are formed on the upper surface of multilayer printed circuit board 30. The conductor circuits 34D are formed on the lower surface of multilayer printed circuit board 30. Solder resist layer 70 is formed on the surface side of the upper conductor circuits 34U. A part of conductor circuit 34U is exposed through opening portion 71 of solder resist layer 70, the exposed portion consists bonding pad 42. Also, solder resist layer 70 is formed on the surface side of the lower conductor circuits 34D. A part of conductor circuit 34D is exposed through opening portion 71 of solder resist layer 70, the exposed portion consists bonding pad 44. Solder layer 46 for connecting to outside circuit boards is formed on solder pad 44. IC chip 80 is mounted on the upper surface of multilayer printed circuit board 30 via adhesive 84. Terminals 86 of IC chip 80 and bonding pads 44 of the multilayer printed circuit board are bonding connected via wires 82.

Next, the solder pads will be explained with referring to FIG. 29. FIG. 29(B) enlarged shows circle B part of multilayer printed circuit board 30 in FIG. 25. Nickel plated layer 72 is formed on conductor circuit 34D. The conductor circuit 34D is connected to solder layer 46 via Ni alloy layer 75 on nickel plated layer 72. In embodiment 4, by controlling the average thickness of Ni alloy layer 75, to reduce the occurrence of the breakage in the interface between the nickel plated layers 72 and the solder layer 46. Thereby, the strength and adhesion of solder layer 46 can be improved.

Hereafter, a method for manufacturing the multilayer printed wiring board 30 in Embodiment 4 will next be described, with reference to FIGS. 26 to 29.

Figure 10:
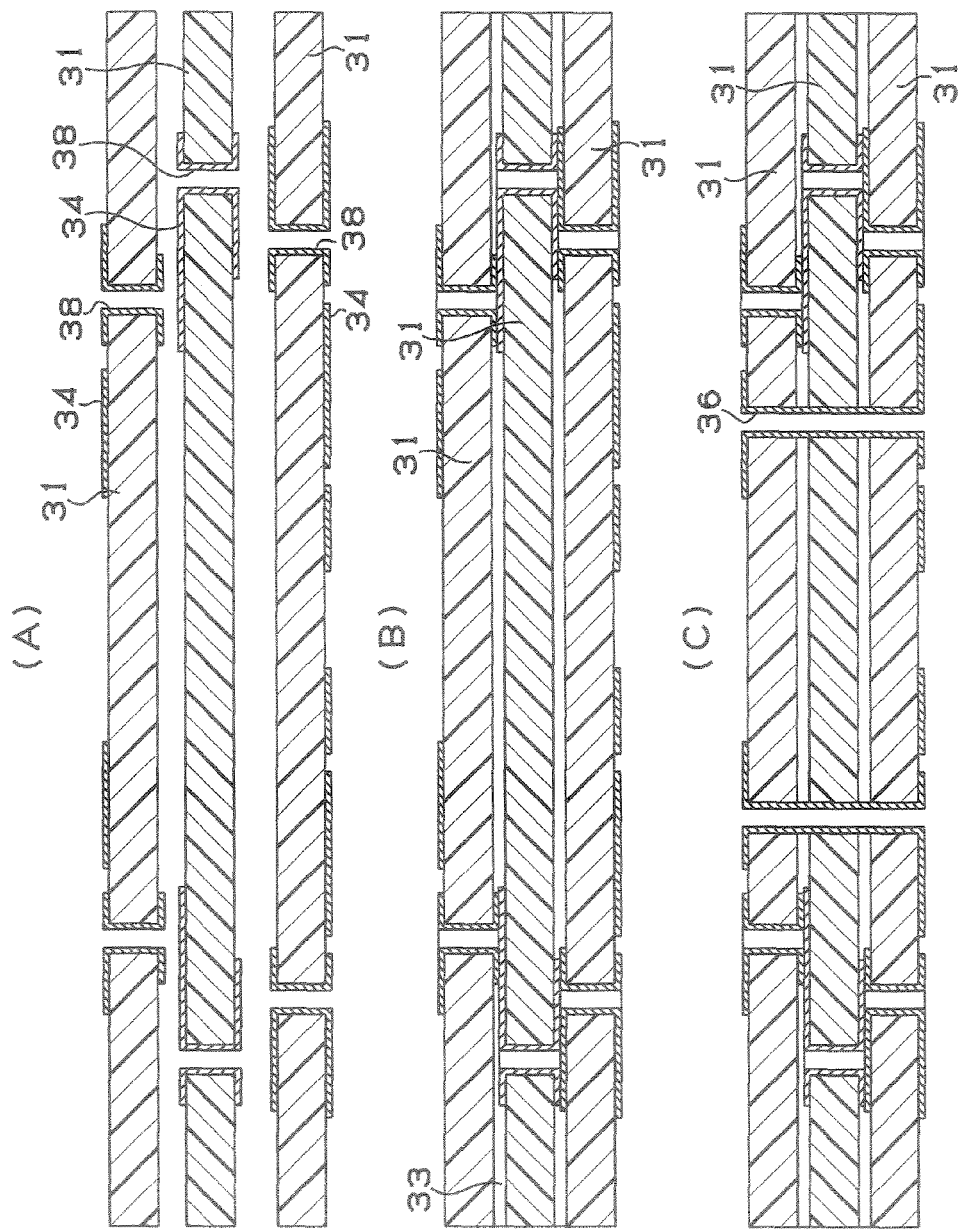
FIGS. 10 (A, B, C) are diagrams of a manufacturing process of the printed wiring board according to the second embodiment.
Figure 11:
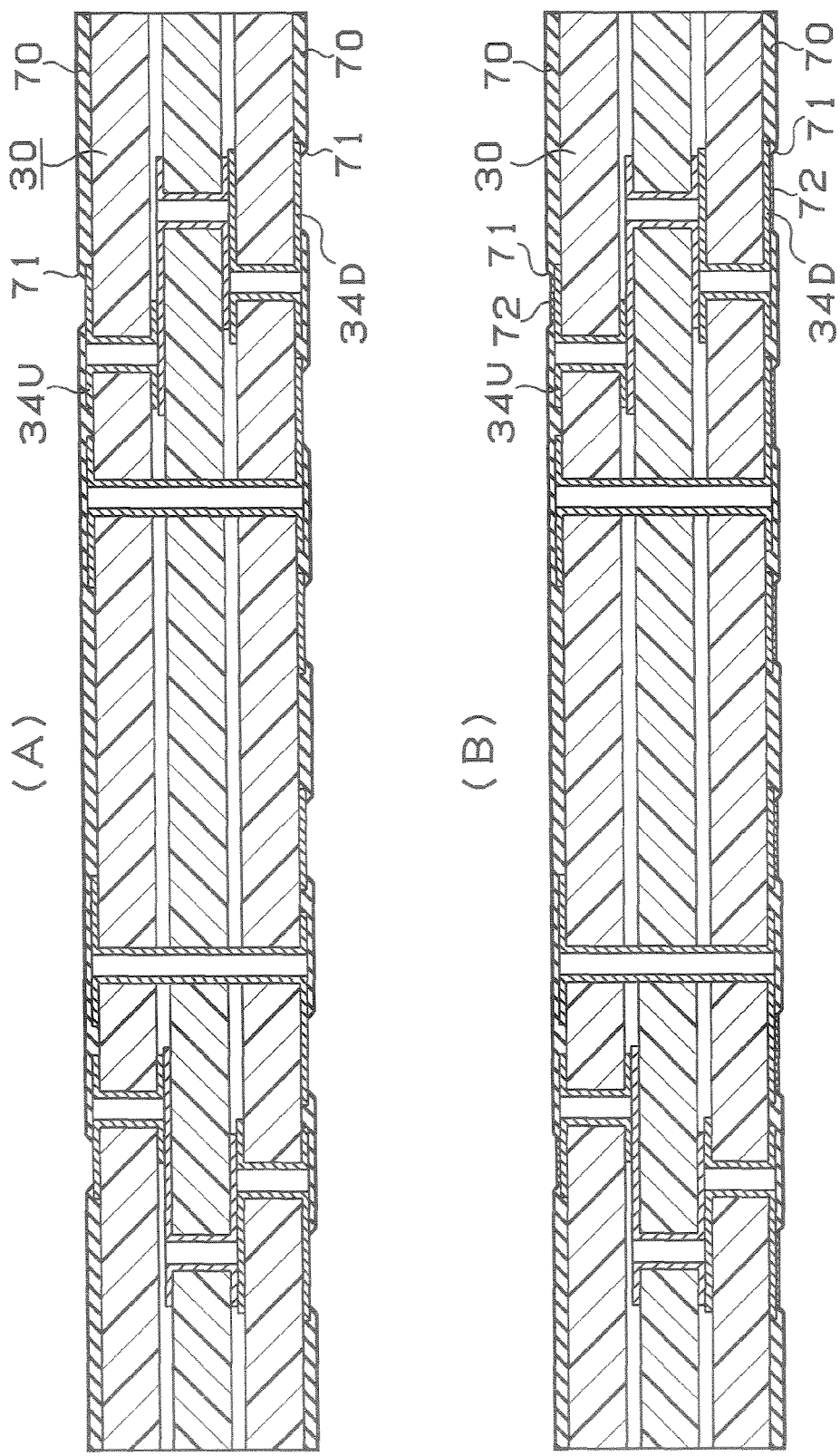
FIGS. 11 (A, B) are diagrams of a manufacturing process of the printed wiring board according to the second embodiment.
Figure 12:
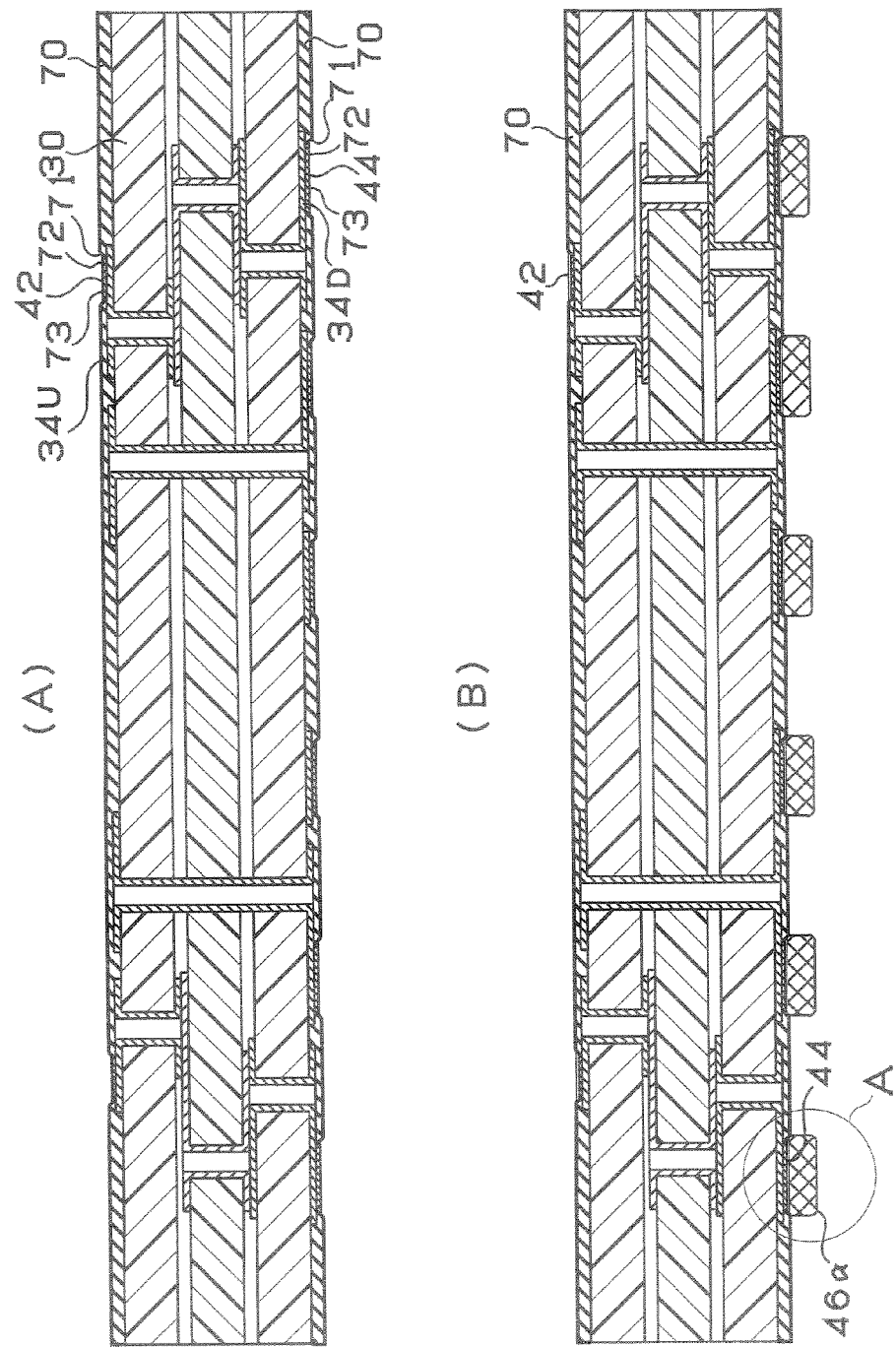
FIGS. 12 (A, B) are diagrams of a manufacturing process of the printed wiring board according to the second embodiment.
Figure 13:
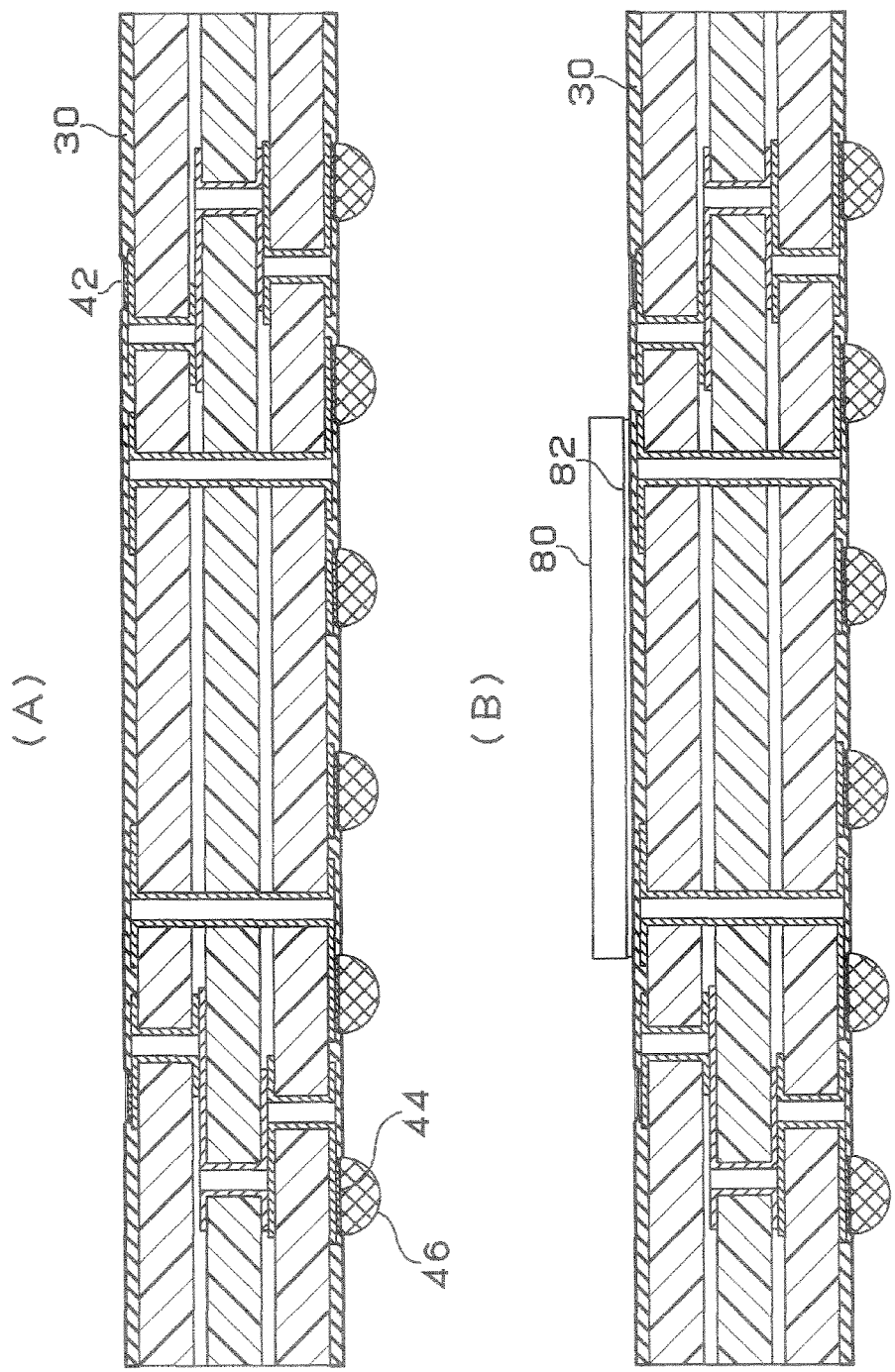
FIGS. 13 (A, B) are diagrams of a manufacturing process of the printed wiring board according to the second embodiment.

Since the treatment steps forming solder resist layer 70 having opening portions 71 in Embodiment 4 have been described with referring to FIGS. 10 to 11(A) are almost the same as the steps in Embodiment 4, the explanation thereof will be omitted.

(1) Next, nickel plated layers are formed on the solder pads 34U, 34D in opening portion 71 of solder resist layer 70 shown in FIG. 26(A).

| [Nickel plating aqueous solution] | |
| --- | --- |
| nickel chloride | $2.3 \times 10^{-1}$ mol/l |
| sodium hypophosphite | 1.8 to $4.0 \times 10^{-1}$ mol/l |
| sodium citrate | $1.6 \times 10^{-1}$ mol/l |
| pH of 4.5 | |
| temperature of 40 to 60° C. | |

The substrate is immersed in the electroless nickel, plating solution for 5 to 40 minutes, thereby forming nickel plated layers 72 in the opening portions 71 (FIG. 26(B)).

In Embodiment 4, nickel plated layers 72 are adjusted so as to have a thickness of 0.03 to 10 μm, to include 0.4 to 17 wt % of P. The thickness and the P content of the nickel plated layers are adjusted in considering the value of a plating tub and plating solution circulation. Thereby, in the case where the roughened surfaces have been formed on the conductor circuits 34U and the conductor circuits 34D, an uneven part of the roughened surfaces can be entirely covered, flattening the surface of the nickel plated layers 72.

(2) Thereafter, palladium layers are formed on the solder pads of the substrate on which the nickel plated layers have been formed.

| [Palladium plating aqueous solution] | |
| --- | --- |
| palladium chloride | $1.0 \times 10^{-2}$ mol/l |
| ethylenediamine | $8.0 \times 10^{-2}$ mol/l |
| sodium hypophosphite | 4.0 to $6.0 \times 10^{-2}$ mol/l |
| thiodiglycolic acid | 30 mg/l |
| pH of 8 | |
| temperature of 50 to 60° C. | |

The substrate is immersed in the electroless palladium plating solution for 3 to 10 minutes, thereby forming palladium plated layers 73 having a thickness of 0.08 μm on the nickel plated layers 72 (FIG. 26(C)). In Embodiment 4, palladium plated layers 73 are adjusted so as to have a thickness of 0.008 to 2.0 μm, to include 1 to 8 wt % of P. The thickness and the P content of the palladium plated layers are adjusted in considering the value of a plating tub and plating solution circulation. Thereby, the bonding pads 42 are formed on the upper side conductor circuits 34U, and the solder pads 44 are formed on the lower side conductor circuits 34D. In Embodiment 4, palladium plated layers 73 can be adjusted so as to have a thickness of 0.01 to 1.0 μm, to include 2 to 7 wt % of P.

(3) Thereafter, gold layers are formed on the surface layer as oxidation resistance layers.

| [gold plating aqueous solution] | |
| --- | --- |
| potassium gold cyanide | $7.6 \times 10^{-3}$ mol/l |
| ammonium chloride | $1.9 \times 10^{-1}$ mol/l |
| sodium citrate | $1.2 \times 10^{-1}$ mol/l |
| sodium hypophosphite | $1.7 \times 10^{-1}$ mol/l |

The substrate is immersed in the electroless gold plating solution at 80° C. for 5 to 20 minutes, thereby forming gold plated layers 74 having a thickness of 0.01 to 2 μm on the palladium plated layers 73 (FIG. 27(A)). Thereby, bonding pads 42 are formed on the upper side of the conductor circuits 34U, and solder pads 44 are formed on the lower side of the conductor circuits 34D.

(4) Solder paste 76α is printed on solder pads 44 in each opening 71 of the solder resist layer 70 (FIG. 27(B)). The solder pad 44 in FIG. 27(B) is enlarged shown in FIG. 29(A). The solder pad 44 consists of the multi-layers, that is, the three layers comprises nickel plated layers 72-palladium plated layers 73-gold, plated layers 74 which have been formed in turn on the conductor circuit 34D.

(5) Thereafter, solder layer 46 are formed by conducting reflow at 250° C. in nitrogenous atmosphere (FIG. 28(A)). During the reflow, palladium plated, layers 73 and gold plated layers 64 almost diffuse into solder layer 46, Cu—Ni—Sn alloy layer 75, consisted of the nickel layers and composition metal of the solder, is formed the interface between nickel plated layers 72 and solder layer 46 as shown in FIG. 25 and FIG. 29(B). Here, in Embodiment 4, the palladium plated layers 73 is adjusted so as to have a thickness of 0.01 to 1.0 μm and the P content is adjusted to 2 to 7 wt %, thereby controlling the average thickness of Cu—Ni—Sn alloy layer 75. It reduces the occurrence the breakage in the interface between the nickel plated layers 72 and the solder layer 46.

(6) IC chip 80 is mounted on the upper side of the finished multilayer printed wiring board 30 with adhesive 84 (FIG. 28(B)). Thereafter, bonding wires 82 are bonded between terminals 86 of IC chip 80 and bonding pads 42 of multilayer printed wiring board 30 (Refer to FIG. 25). While, outer connecting terminals (in this case, BGA) are placed on the solder layers. PGA can be placed as the outer connecting terminals. Also, capacitances or the like may be mounted on the solder layers.

Embodiment 4-1-1

In embodiment 4-1-1, an alloy of Cu: 0.5 wt %, Ag: 3.5 wt %, Sn: 95 wt % is used as a solder consisting of the solder layer. Ni layer is formed as thickness 5 μm, P content 1.2 wt %. On the other hand, Pd layer is formed as thickness 0.5 μm, P content 5 wt %. Au layer is formed as thickness 0.03 μm. Therefore, the composition of the Ni—Sn alloy layer becomes Sn:Cu:Ni=42:37:21, the thickness becomes 1.5 μm. In embodiment 4-1-1, as shown in the electron microscope picture in the left side of FIG. 18, the Ni—Cu—Sn alloy layer is typically a board-shaped form, that is, formed in parallel with the Ni layer as same as above mentioned embodiment 1-1-1.

Embodiment 4-1-2

In embodiment 4-1-2, an alloy of Cu: 0.5 wt %, Ag: 3.5 wt %, Sn: 95 wt % is used as a solder consisting of the solder layer. Ni layer is formed as thickness 5 μm, P content 1.2 wt %. On the other hand, Pd layer is formed as thickness 0.01 μm, P content 2 wt %. Au layer is formed as thickness 0.05 μm. Therefore, the composition of the Ni—Sn alloy layer becomes Sn:Cu:Ni=42:37:21, the thickness becomes 1.8 μm. The Ni—Sn alloy layer is typically a board-shaped form.

Embodiment 4-1-3

In embodiment 4-1-3, an alloy of Cu: 0.5 wt %, Ag: 3.5 wt %, Sn: 95 wt % is used as a solder consisting of the solder layer. Ni layer is formed as thickness 5 μm, P content 1.2 wt %. On the other hand, Pd layer is formed as thickness 0.01 μm, P content 7 wt %. Au layer is formed as thickness 1.0 μm. Therefore, the composition of the Ni—Sn alloy layer becomes Sn:Cu:Ni=42:37:21, the thickness becomes 1.8 μm. The Ni—Sn alloy layer is typically a board-shaped form.

Embodiment 4-1-4

In embodiment 4-1-4, an alloy of Cu: 0.5 wt %, Ag: 3.5 wt %, Sn: 95 wt % is used as a solder consisting of the solder layer. Ni layer is formed as thickness 5 μm, P content 1.2 wt %. On the other hand, Pd layer is formed as thickness 1.0 μm, P content 2 wt %. Au layer is formed as thickness 0.03 μm. Therefore, the composition of the Ni—Sn alloy layer becomes Sn:Cu:Ni=42:37:21, the thickness becomes 1.5 μm. The Ni—Sn alloy layer is typically a board-shaped form.

Embodiment 4-1-5

In embodiment 4-1-5, an alloy of Cu: 0.5 wt %, Ag: 3.5 wt %, Sn: 95 wt % is used as a solder consisting of the solder layer. NI layer is formed as thickness 10 μm, P content 0.5 wt %. On the other hand, Pd layer is formed as thickness 1.0 μm, P content 7 wt %. Au layer is formed as thickness 0.03 μm. Therefore, the composition of the Ni—Sn alloy layer becomes Sn:Cu:Ni=42:37:21, the thickness becomes 1.5 μm. The Ni—Sn alloy layer is typically a board-shaped form.

Embodiment 4-1-6

In embodiment 4-1-6, an alloy of Cu: 0.5 wt %, Ag: 3.5 wt %, Sn: 95 wt % is used, as a solder consisting of the solder layer. Ni layer is formed as thickness 10 μm, P content 5 wt %. On the other hand, Pd layer is formed as thickness 0.01 μm, P content 7 wt %. Au layer is formed as thickness 0.01 μm. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 4-1-7

In embodiment 4-1-7, an alloy of Cu: 0.5 wt %, Ag: 3.5 wt %, Sn: 95 wt % is used as a solder consisting of the solder layer. Ni layer is formed as thickness 0.05 μm, P content 0.5 wt %. On the other hand, Pd layer is formed, as thickness 1 μm, P content 7 wt %. Au layer is formed as thickness 0.02 μm. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 4-1-8

In embodiment 4-1-8, an alloy of Cu: 0.5 wt %, Ag: 3.5 wt %, Sn: 95 wt % is used as a solder consisting of the solder layer. Ni layer is formed as thickness 0.05 μm, P content 5 wt %. On the other hand, Pd layer is formed as thickness 0.01 μm, P content 3 wt %. Au layer is formed as thickness 0.01 μm. Therefore, the composition of the Ni—Sn alloy layer becomes Sn:Cu:Ni=42:37:21, the thickness becomes 1.8 μm. The Ni—Sn alloy layer is typically a board-shaped form.

Embodiment 4-1-9

In embodiment 4-1-9, an alloy of Cu: 0.5 wt %, Ag: 3.5 wt %, Sn: 95 wt % is used as a solder consisting of the solder layer. Ni layer is formed as thickness 0.3 μm, P content 0.5 wt %. On the other hand, Pd layer is formed as thickness 0.01 μm, P content 2 wt %. Au layer is formed as thickness 0.2 μm. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 4-1-10

In embodiment 4-1-10, an alloy of Cu: 0.5 wt %, Ag: 3.5 wt %, Sn: 95 wt % is used as a solder consisting of the solder layer. Ni layer is formed as thickness 0.3 μm, P content 0.5 wt %. On the other hand, Pd layer is formed as thickness 1 μm, P content 2 wt %. Au layer is formed as thickness 0.4 μm. Therefore, the composition of the Ni—Sn alloy layer becomes Sn:Cu:Ni=42:37:21, the thickness becomes 1.6 μm. The Ni—Sn alloy layer is typically a board-shaped form.

Embodiment 4-1-11

In embodiment 4-1-11, an alloy of Cu: 0.5 wt %, Ag: 3.5 wt %, Sn: 95 wt % is used as a solder consisting of the solder layer. Ni layer is formed as thickness 0.3 μm, P content 5 wt %. On the other hand, Pd layer is formed as thickness 0.01 μm, P content 7 wt %. Au layer is formed as thickness 0.5 μm. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 4-1-12

In embodiment 4-1-12, an alloy of Cu: 0.5 wt %, Ag: 3.5 wt %. Sn: 95 wt % is used as a solder consisting of the solder layer. Ni layer is formed as thickness 0.3 μm, P content 5 wt %. On the other hand, Pd layer is formed as thickness 1 μm, P content 7 wt %. Au layer is formed as thickness 0.03 μm. Therefore, the composition of the Ni—Sn alloy layer becomes Sn:Cu:Ni=42:37:21, the thickness becomes 1.6 μm. The Ni—Sn alloy layer is typically a board-shaped form.

Embodiment 4-1-13

In embodiment 4-1-13, an alloy of Cu: 0.5 wt %, Ag: 3.5 wt %, Sn: 95 wt % is used as a solder consisting of the solder layer. Ni layer is formed as thickness 1 μm, P content 0.5 wt %. On the other hand, Pd layer is formed as thickness 0.01 μm, P content 2 wt %. Au layer is formed as thickness 0.5 μm. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 4-1-14

In embodiment 4-1-14, an alloy of Cu: 0.5 wt %, Ag: 3.5 wt %, Sn: 95 wt % is used as a solder consisting of the solder layer. Ni layer is formed as thickness 1μm, P content 5 wt %. On the other hand, Pd layer is formed as thickness 1 μm, P content 7 wt %. Au layer is formed as thickness 0.5 μm. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 4-1-15

In embodiment 4-1-15, an alloy of Cu: 0.5 wt %, Ag: 3.5 wt %, Sn: 95 wt % is used as a solder consisting of the solder layer. Ni layer is formed as thickness 0.3 μm, P content 8 wt %. On the other hand, Pd layer is formed as thickness 0.01 μm, P content 5 wt %. Au layer is formed as thickness 0.03 μm. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 4-1-16

In embodiment 4-1-16, an alloy of Cu: 0.5 wt %, Ag: 3.5 wt %, Sn: 95 wt % is used as a solder consisting of the solder layer. Ni layer is formed as thickness 0.3 μm, P content 8 wt %. On the other hand, Pd layer is formed as thickness 1 μm, P content 7 wt %. Au layer is formed as thickness 0.01 μm. Therefore, the composition of the Ni—Sn alloy layer becomes Sn:Cu:Ni=42:37:21, the thickness becomes 1.7 μm. The Ni—Sn alloy layer is typically a board-shaped form.

Embodiment 4-1-17

In embodiment 4-1-17, an alloy of Cu: 0.5 wt %, Ag: 3.5 wt %, Sn: 95 wt % is used as a solder consisting of the solder layer. Ni layer is formed as thickness 0.05 μm, P content 10 wt %. On the other hand, Pd layer is formed as thickness 0.01 μm, P content 2 wt %. Au layer is formed as thickness 0.05 μm. Therefore, the composition of the Ni—Sn alloy layer becomes Sn:Cu:Ni=42:37:21, the thickness becomes 1.8 μm. The Ni—Sn alloy layer is typically a board-shaped form.

Embodiment 4-1-18

In embodiment 4-1-18, an alloy of Cu: 0.5 wt %, Ag: 3.5 wt %, Sn: 95 wt % is used as a solder consisting of the solder layer. Ni layer is formed as thickness 1 μm, P content 10 wt %. On the other hand, Pd layer is formed as thickness 1 μm, P content 5 wt %. Au layer is formed as thickness 0.03 μm. Therefore, the composition of the Ni—Sn alloy layer becomes Sn:Cu:Ni=42:37:21, the thickness becomes 1.8 μm. The Ni—Sn alloy layer is typically a board-shaped form.

Embodiment 4-1-19

In embodiment 4-1-19, an alloy of Cu: 0.5 wt %, Ag: 3.5 wt %, Sn: 95 wt % is used as a solder consisting of the solder layer. Ni layer is formed as thickness 0.05 μm, P content 15 wt %. On the other hand, Pd layer is formed as thickness 0.01 μm, P content 2 wt %. Au layer is formed as thickness 0.5 μm. Therefore, the composition of the Ni—Sn alloy layer becomes Sn:Cu:Ni=42:37:21, the thickness becomes 2.0 μm. The Ni—Sn alloy layer is typically a board-shaped form.

Embodiment 4-1-20

In embodiment 4-1-20, an alloy of Cu: 0.5 wt %, Ag: 3.5 wt %, Sn: 95 wt % is used as a solder consisting of the solder layer. Ni layer is formed as thickness 1 μm, P content 15 wt %. On the other hand, Pd layer is formed as thickness 1 μm, P content 2 wt %. Au layer is formed as thickness 0.5 μm. Therefore, the composition of the Ni—Sn alloy layer becomes Sn:Cu:Ni=42:37:21, the thickness becomes 1.9 μm. The Ni—Sn alloy layer is typically a board shaped form.

Embodiment 4-1-21

In embodiment 4-1-21, an alloy of Cu: 0.5 wt %, Ag: 3.5 wt %, Sn: 95 wt % is used as a solder consisting of the solder layer. Ni layer is formed as thickness 8 μm, P content: 15 wt %. On the other hand, Pd layer is formed as thickness 0.01 μm, P content 7 wt %. Au layer is formed as thickness 1 μm. Therefore, the composition of the Ni—Sn alloy layer becomes Sn:Cu:Ni=42:37:21, the thickness becomes 2.0 μm. The Ni—Sn alloy layer is typically a board-shaped form.

Embodiment 4-1-22

In embodiment 4-1-22, an alloy of Cu: 0.5 wt %, Ag: 3.5 wt %, Sn: 95 wt % is used as a solder consisting of the solder layer. Ni layer is formed as thickness 10 μm, P content 15 wt %. On the other hand, Pd layer is formed as thickness 1 μm, P content 7 wt %. Au layer is formed as thickness 2 μm. Therefore, the composition of the Ni—Sn alloy layer becomes Sn:Cu:Ni=42:37:21, the thickness becomes 2.1 μm. The Ni—Sn alloy layer is typically a board-shaped form.

Embodiment 4-2-1

In embodiment 4-1-1, the Cu/Ag/Sn solder which does not include lead is used as the solder consisting of the solder layer. Whereas, in embodiment 4-2-1, an alloy of Sn:Pb=63:37 (wt %) is used as a solder consisting of the solder layer. Ni layer is formed as thickness 5 μm, P content 1.2 wt %. On the other hand, Pd layer is formed as thickness 0.5 μm, P content 5 wt %. Au layer is formed as thickness 0.03 μm. Therefore, the composition of the Ni—Sn alloy layer becomes Sn:Ni=67:33, the thickness becomes 1.5 μm. The Ni—Sn alloy layer is typically a board-shaped form.

Embodiment 4-2-2

In embodiment 4-2-2, an alloy of Sn:Pb=63:37 (wt %) is used as a solder consisting of the solder layer. Ni layer is formed as thickness 5 μm, P content 1.2 wt %. On the other hand, Pd layer is formed as thickness 0.01 μm, P content 2 wt %. Au layer is formed as thickness 0.05 μm. Therefore, the composition of the Ni—Sn alloy layer becomes Sn:Ni=67:33, the thickness becomes 1.8 μm. The Ni—Sn alloy layer is typically a board-shaped form.

Embodiment 4-2-3

In embodiment 4-2-3, an alloy of Sn:Pb=63:37 (wt %) is used as a solder consisting of the solder layer. Ni layer is formed as thickness 5 μm, P content 1.2 wt %. On the other hand, Pd layer is formed as thickness 0.01 μm, P content 7 wt %. Au layer is formed as thickness 1 μm. Therefore, the composition of the Ni—Sn alloy layer becomes Sn:Ni=67:33, the thickness becomes 1.8 μm. The Ni—Sn alloy layer is typically a board-shaped form.

Embodiment 4-2-4

In embodiment 4-2-4, an alloy of Sn:Pb=63:37 (wt %) is used as a solder consisting of the solder layer. Ni layer is formed as thickness 5 μm, P content 1.2 wt %. On the other hand, Pd layer is formed as thickness 1.0 μm, P content 2 wt %. Au layer is formed as thickness 0.03 µm. Therefore, the composition of the Ni—Sn alloy layer becomes Sn:Ni=67: 33, the thickness becomes 1.5 µm. The Ni—Sn alloy layer is typically a board-shaped form.

Embodiment 4-2-5

In embodiment 4-2-5, an alloy of Sn:Pb=63:37 (wt %) is used as a solder consisting of the solder layer. Ni layer is formed as thickness 10 µm, P content 0.5 wt %. On the other hand, Pd layer is formed as thickness 1.0 µm, P content 7 wt %. Au layer is formed as thickness 0.03 µm. Therefore, the composition of the Ni—Sn alloy layer becomes Sn:Ni=67: 33, the thickness becomes 1.5 µm. The Ni—Sn alloy layer is typically a board-shaped form.

Embodiment 4-2-6

In embodiment 4-2-6, an alloy of Sn:Pb=63:37 (wt %) is used as a solder consisting of the solder layer. Ni layer is formed as thickness 10 µm, P content 5 wt %. On the other hand, Pd layer is formed as thickness 0.01 µm, P content 7 wt %. Au layer is formed as thickness 0.01 µm. Therefore, the composition of the Ni—Sn alloy layer becomes Sn:Ni=67: 33, the thickness becomes 1.7 µm. The Ni—Sn alloy layer is typically a board-shaped form.

Embodiment 4-2-7

In embodiment 4-2-7, an alloy of Sn:Pb=63:37 (wt %) is used as a solder consisting of the solder layer. Ni layer is formed as thickness 0.05 µm, P content 0.5 wt %. On the other hand, Pd layer is formed as thickness 1 µm, P content 7 wt %. Au layer is formed as thickness 0.02 µm. Therefore, the composition of the Ni—Sn alloy layer becomes Sn:Ni=67: 33, the thickness becomes 1.7 µm, The Ni—Sn alloy layer is typically a board-shaped form.

Embodiment 4-2-8

In embodiment 4-2-8, an alloy of Sn:Pb=63:37 (wt %) is used as a solder consisting of the solder layer. Ni layer is formed as thickness 0.05 µm, P content 5 wt %. On the other hand, Pd layer is formed as thickness 0.01 µm, P content 3 wt %. Au layer is formed as thickness 0.01 µm. Therefore, the composition of the Ni—Sn alloy layer becomes Sn:Ni=67: 33, the thickness becomes 1.8 µm. The Ni—Sn alloy layer is typically a board-shaped form.

Embodiment 4-2-9

In embodiment 4-2-9, an alloy of Sn:Pb=63:37 (wt %) is used as a solder consisting of the solder layer. Ni layer is formed as thickness 0.3 µm, P content 0.5 wt %. On the other hand, Pd layer is formed as thickness 0.01 µm, P content 2 wt %. Au layer is formed as thickness 0.2 µm. Therefore, the composition of the Ni—Sn alloy layer becomes Sn:Ni=67: 33, the thickness becomes 1.7 µm. The Ni—Sn alloy layer is typically a board-shaped form.

Embodiment 4-2-10

In embodiment 4-2-10, an alloy of Sn:Pb=63:37 (wt %) is used as a solder consisting of the solder layer. Ni layer is formed as thickness 0.3 µm, P content 0.5 wt %. On the other hand, Pd layer is formed as thickness 1 µm, P content 2 wt %. Au layer is formed as thickness 0.4 µm. Therefore, the composition of the Ni—Sn alloy layer becomes Sn:Ni=67:33, the thickness becomes 1.6 µm. The Ni—Sn alloy layer is typically a board-shaped form.

Embodiment 4-2-11

In embodiment 4-2-11, an alloy of Sn:Pb=63:37 (wt %) is used as a solder consisting of the solder layer. Ni layer is formed as thickness 0.3 µm, P content 5 wt %. On the other hand, Pd layer is formed as thickness 0.01 µm, P content 7 wt %. Au layer is formed as thickness 0.5 µm. Therefore, the composition of the Ni—Sn alloy layer becomes Sn:Ni=67: 33, the thickness becomes 1.7 µm. The Ni—Sn alloy layer is typically a board-shaped form.

Embodiment 4-2-12

In embodiment 4-2-12, an alloy of Sn:Pb=63:37 (wt %) is used as a solder consisting of the solder layer. Ni layer is formed as thickness 0.3 µm, P content 5 wt %. On the other hand, Pd layer is formed as thickness 1 µm, P content 7 wt %. Au layer is formed as thickness 0.03 µm. Therefore, the composition of the Ni—Sn alloy layer becomes Sn:Ni=67: 33, the thickness becomes 1.6 µm. The Ni—Sn alloy layer is typically a board-shaped form.

Embodiment 4-2-13

In embodiment 4-2-13, an alloy of Sn:Pb=63:37 (wt %) is used as a solder consisting of the solder layer, Ni layer is formed as thickness 1 µm, P content 0.5 wt %. On the other hand, Pd layer is formed as thickness 0.01 µm, P content 2 wt %. Au layer is formed as thickness 0.5 µm. Therefore, the composition of the Ni—Sn alloy layer becomes Sn:Ni=67: 33, the thickness becomes 1.7 µm. The Ni—Sn alloy layer is typically a board-shaped form.

Embodiment 4-2-14

In embodiment 4-2-14, an alloy of Sn:Pb=63:37 (wt %) is used as a solder consisting of the solder layer. Ni layer is formed as thickness 1 µm, P content 5 wt %. On the other hand, Pd layer is formed as thickness 1 µm, P content 7 wt %. Au layer is formed as thickness 0.5 µm. Therefore, the composition of the Ni—Sn alloy layer becomes Sn:Ni=67:33, the thickness becomes 1.7 µm. The Ni—Sn alloy layer is typically a board-shaped form.

Embodiment 4-2-15

In embodiment 4-2-15, an alloy of Sn:Pb=63:37 (wt %) is used as a solder consisting of the solder layer. Ni layer is formed as thickness 0.3 µm, P content 8 wt %. On the other hand, Pd layer is formed as thickness 0.01 µm, P content 5 wt %. Au layer is formed as thickness 0.03 µm. Therefore, the composition of the Ni—Sn alloy layer becomes Sn:Ni=67: 33, the thickness becomes 1.7 µm. The Ni—Sn alloy layer is typically a board-shaped form.

Embodiment 4-2-16

In embodiment 4-2-16, an alloy of Sn:Pb=63:37 (wt %) is used as a solder consisting of the solder layer. Ni layer is formed as thickness 0.3 µm, P content 8 wt %. On the other hand, Pd layer is formed as thickness 1 µm, P content 7 wt %. Au layer is formed as thickness 0.01 µm. Therefore, the composition of the Ni—Sn alloy layer becomes Sn:Ni=67:

33, the thickness becomes 1.7 µm. The Ni—Sn alloy layer is typically a board-shaped form.

Embodiment 4-2-17

In embodiment 4-2-17, an alloy of Sn:Pb=63:37 (wt %) is used as a solder consisting of the solder layer. Ni layer is formed as thickness 0.05 µm, P content 10 wt %. On the other hand, Pd layer is formed as thickness 0.01 µm, P content 2 wt %. Au layer is formed as thickness 0.05 µm. Therefore, the composition of the Ni—Sn alloy layer becomes Sn:Ni=67:33, the thickness becomes 1.8 µm. The Ni—Sn alloy layer is typically a board-shaped form.

Embodiment 4-2-18

In embodiment 4-2-18, an alloy of Sn:Pb=63:37 (wt %) is used as a solder consisting of the solder layer. Ni layer is formed as thickness 1 µm, P content 10 wt %. On the other hand, Pd layer is formed as thickness 1 µm, P content 5 wt %. Au layer is formed as thickness 0.03 µm. Therefore, the composition of the Ni—Sn alloy layer becomes Sn:Ni=67:33, the thickness becomes 1.8 µm. The Ni—Sn alloy layer is typically a board-shaped form.

Embodiment 4-2-19

In embodiment 4-2-19, an alloy of Sn:Pb=63:37 (wt %) is used as a solder consisting of the solder layer. Ni layer is formed as thickness 0.05 µm, P content 15 wt %. On the other hand, Pd layer is formed as thickness 0.01 µm, P content 2 wt %. Au layer is formed as thickness 0.5 µm. Therefore, the composition of the Ni—Sn alloy layer becomes Sn:Ni=67:33, the thickness becomes 2.0 µm. The Ni—Sn alloy layer is typically a board-shaped form.

Embodiment 4-2-20

In embodiment 4-2-20, an alloy of Sn:Pb=63:37 (wt %) is used as a solder consisting of the solder layer. Ni layer is formed as thickness 1 µm, P content 15 wt %. On the other hand, Pd layer is formed as thickness 1 µm, P content 2 wt %. Au layer is formed as thickness 0.5 µm. Therefore, the composition of the Ni—Sn alloy layer becomes Sn:Ni=67:33, the thickness becomes 1.9 µm, The Ni—Sn alloy layer is typically a board-shaped form.

Embodiment 4-2-21

In embodiment 4-2-21, an alloy of Sn:Pb=63:37 (wt %) is used as a solder consisting of the solder layer. Ni layer is formed as thickness 8 µm, P content 15 wt %. On the other hand, Pd layer is formed as thickness 0.01 µm, P content 7 wt %. Au layer is formed as thickness 1 µm. Therefore, the composition of the Ni—Sn alloy layer becomes Sn:Ni=67:33, the thickness becomes 2.0 µm. The Ni—Sn alloy layer is typically a board-shaped form.

Embodiment 4-2-22

In embodiment 4-2-22, an alloy of Sn:Pb=63:37 (wt %) is used as a solder consisting of the solder layer. Ni layer is formed as thickness 10 µm, P content 15 wt %. On the other hand, Pd layer is formed as thickness 1 µm, P content 7 wt %. Au layer is formed as thickness 2 µm. Therefore, the composition of the Ni—Sn alloy layer becomes Sn:Ni=67:33, the thickness becomes 2.1 µm. The Ni—Sn alloy layer is typically a board-shaped form.

Embodiment 4-3-1

In embodiments 4-3-1 to 4-3-14, an alloy of Cu: 0.5 wt %, Ag: 3.5 wt %, Sn: 95 wt % is used as a solder consisting of the solder layer as same as embodiments 4-1-1 to 4-1-14. Ni layer is formed as thickness 5 µm, P content 1.2 wt %. On the other hand, Pd layer is formed as thickness 0.009 µm, P content 8 wt %. Au layer is formed as thickness 0.03 µm. Therefore, the composition of the Ni—Sn alloy layer becomes Sn:Cu:Ni=42:45:13, the thickness becomes 2.5 µm. The Cu—Ni—Sn alloy layer is typically a pillar-shaped form, that is, pillar-shaped alloy crystal vertically formed along with the Ni layer.

Embodiment 4-3-2

In embodiment 4-3-2, an alloy of Cu: 0.5 wt %, Ag: 3.5 wt %, Sn: 95 wt % is used as a solder consisting of the solder layer. Ni layer is formed, as thickness 5 µm, P content 1.2 wt %. On the other hand, Pd layer is formed as thickness 0.008 µm, P content 7 wt %. Au layer is formed as thickness 0.04 µm. Therefore, the composition of the Ni—Sn alloy layer becomes Sn:Cu:Ni=42:45:13, the thickness becomes 2.5 µm. The Ni—Sn alloy layer is typically a pillar-shaped form.

Embodiment 4-3-3

In embodiment 4-3-3, an alloy of Cu: 0.5 wt %, Ag: 3.5 wt %, Sn: 95 wt % is used as a solder consisting of the solder layer. Ni layer is formed as thickness 5 µm, P content 1.2 wt %. On the other hand, Pd layer is formed as thickness 0.009 µm, P content 1 wt %. Au layer is formed as thickness 0.03 µm. Therefore, the composition of the Ni—Sn alloy layer becomes Sn:Cu:Ni=42:45:13, the thickness becomes 2.5 µm. The Ni—Sn alloy layer is typically a pillar-shaped form.

Embodiment 4-3-4

In embodiment 4-3-4, an alloy of Cu: 0.5 wt %, Ag: 3.5 wt %, Sn: 95 wt % is used as a solder consisting of the solder layer. Ni layer is formed as thickness 5 µm, P content 1.2 wt %. On the other hand, Pd layer is formed as thickness 2.0 µm, P content 2 wt %. Au layer is formed as thickness 0.05 µm. Therefore, the composition of the Ni—Sn alloy layer becomes Sn:Cu:Ni=66:29:5, the thickness becomes 1.3 µm. The Ni—Sn alloy layer is typically a grain-shaped and formed at an interface of the Ni layer.

Embodiment 4-3-5

In embodiment 4-3-5, an alloy of Cu: 0.5 wt %, Ag: 3.5 wt %, Sn: 95 wt % is used as a solder consisting of the solder layer. Ni layer is formed as thickness 10 µm, P content 0.5 wt %. On the other hand, Pd layer is formed as thickness 2.0 µm, P content 5 wt %. Au layer is formed as thickness 0.04 µm. Therefore, the composition of the Ni—Sn alloy layer becomes Sn:Cu:Ni=66:29:5, the thickness becomes 1.3 µm. The Ni—Sn alloy layer is typically a grain-shaped and formed at an interface of the Ni layer.

Embodiment 4-3-6

In embodiment 4-3-6, an alloy of Cu: 0.5 wt %, Ag: 3.5 wt %, Sn: 95 wt % is used as a solder consisting of the solder layer. Ni layer is formed as thickness 10 µm, P content 5 wt %. On the other hand, Pd layer is formed as thickness 2.0 µm, P content 9 wt %. Au layer is formed as thickness 0.06 µm, Therefore, the composition of the Ni—Sn alloy layer becomes Sn:Cu:Ni=66:29:5, the thickness becomes 1.5 µm. The Ni—Sn alloy layer is typically a grain-shaped and formed at an interface of the Ni layer.

Embodiment 4-3-7

In embodiment 4-3-7, an alloy of Cu: 0.5 wt %, Ag: 3.5 wt %, Sn: 95 wt % is used as a solder consisting of the solder layer. Ni layer is formed as thickness 0.03 µm, P content 0.4 wt %. On the other hand, Pd layer is formed as thickness 0.03 µm, P content 3 wt %. Au layer is formed as thickness 0.03 µm. Therefore, the composition of the Ni—Sn alloy layer becomes Sn:Cu:Ni=66:29:5, the thickness becomes 1.1 µm. The Ni—Sn alloy layer is typically a grain-shaped and formed at an interface of the Ni layer.

Embodiment 4-3-8

In embodiment 4-3-8, an alloy of Cu: 0.5 wt %, Ag: 3.5 wt %, Sn: 95 wt % is used as a solder consisting of the solder layer. Ni layer is formed as thickness 0.03 µm, P content 0.5 wt %. On the other hand, Pd layer is formed as thickness 0.2 µm, P content 7 wt %. Au layer is formed as thickness 0.04 µm. Therefore, the composition of the Ni—Sn alloy layer becomes Sn:Cu:Ni=66:29:5, the thickness becomes 1.3 µm. The Ni—Sn alloy layer is typically a grain-shaped and formed at an interface of the Ni layer.

Embodiment 4-3-9

In embodiment 4-3-9, an alloy of Cu: 0.5 wt %, Ag: 3.5 wt %, Sn: 95 wt % is used as a solder consisting of the solder layer. Ni layer is formed as thickness 0.03 µm, P content 16 wt %. On the other hand, Pd layer is formed as thickness 0.2 µm, P content 7 wt %. Au layer is formed as thickness 0.05 µm. Therefore, the composition of the Ni—Sn alloy layer becomes Sn:Cu:Ni=66:29:5, the thickness becomes 1.3 µm. The Ni—Sn alloy layer is typically a grain-shaped and formed at an interface of the Ni layer.

Embodiment 4-3-10

In embodiment 4-3-10, an alloy of Cu: 0.5 wt %, Ag: 3.5 wt %, Sn: 95 wt % is used as a solder consisting of the solder layer. Ni layer is formed as thickness 10 µm, P content 0.4 wt %. On the other hand, Pd layer is formed as thickness 0.2 µm, P content 2 wt %. Au layer is formed as thickness 0.03 µm. Therefore, the composition of the Ni—Sn alloy layer becomes Sn:Cu:Ni=66:29:5, the thickness becomes 1.4 µm. The Ni—Sn alloy layer is typically a grain-shaped and formed at an interface of the Ni layer.

Embodiment 4-3-11

In embodiment 4-3-11, an alloy of Cu: 0.5 wt %, Ag: 3.5 wt %, Sn: 95 wt % is used as a solder consisting of the solder layer. Ni layer is formed as thickness 10 µm, P content 16 wt %. On the other hand, Pd layer is formed as thickness 1 µm, P content 7 wt %. Au layer is formed as thickness 0.01 µm. Therefore, the composition of the Ni—Sn alloy layer becomes Sn:Cu:Ni=66:29:5, the thickness becomes 1.5 µm. The Ni—Sn alloy layer is typically a grain-shaped and formed at an interface of the Ni layer.

Embodiment 4-3-12

In embodiment 4-3-12, an alloy of Cu: 0.5 wt %, Ag: 3.5 wt %, Sn: 95 wt % is used as a solder consisting of the solder layer. NI layer is formed as thickness 12 µm, P content 0.4 wt %. On the other hand, Pd layer is formed as thickness 1 µm, P content 2 wt %. Au layer is formed as thickness 0.04 µm. Therefore, the composition of the Ni—Sn alloy layer becomes Sn:Cu:Ni=66:29:5, the thickness becomes 2.4 µm. The Ni—Sn alloy layer is typically a grain-shaped and formed at an interface of the Ni layer.

Embodiment 4-3-13

In embodiment 4-3-13, an alloy of Cu: 0.5 wt %, Ag: 3.5 wt %, Sn: 95 wt % is used as a solder consisting of the solder layer. Ni layer is formed as thickness 12 µm, P content 5 wt %. On the other hand, Pd layer is formed as thickness 1 µm, P content 2 wt %. Au layer is formed as thickness 0.02 µm. Therefore, the composition of the Ni—Sn alloy layer becomes Sn:Cu:Ni=66:29:5, the thickness becomes 2.5 µm. The Ni—Sn alloy layer is typically a grain-shaped and formed at an interface of the Ni layer.

Embodiment 4-3-14

In embodiment 4-3-14, an alloy of Cu: 0.5 wt %, Ag: 3.5 wt %, Sn: 95 wt % is used as a solder consisting of the solder layer. Ni layer is formed as thickness 12 µm, P content 17 wt %. On the other hand, Pd layer is formed as thickness 1 µm, P content 7 wt %. Au layer is formed as thickness 0.03 µm. Therefore, the composition of the Ni—Sn alloy layer becomes Sn:Cu:Ni=66:23:5, the thickness becomes 2.4 µm. The Ni—Sn alloy layer is typically a grain-shaped and formed at an interface of the Ni layer.

Embodiment 4-4-1

In embodiments 4-4-1 to 4-4-14, an alloy of Sn:Pb=63:37 (wt %) is used as a solder consisting of the solder layer as same as embodiments 4-2-1 to 4-2-14, Ni layer is formed as thickness 5 µm, P content 1.2 wt %. On the other hand, Pd layer is formed as thickness 0.009 µm, P content 8 wt %. Au layer is formed as thickness 0.03 µm. Therefore, the composition of the Ni—Sn alloy layer becomes Sn:Ni=67:33, the thickness becomes 2.5 µm. The Ni—Sn alloy layer is typically a pillar-shaped form.

Embodiment 4-4-2

In embodiment 4-4-2, an alloy of Sn:Pb=63:37 (wt %) is used as a solder consisting of the solder layer. Ni layer is formed as thickness 5 µm, P content 1.2 wt %. On the other hand, Pd layer is formed as thickness 0.008 µm, P content 7 wt %. Au layer is formed as thickness 0.04 µm. Therefore, the composition of the Ni—Sn alloy layer becomes Sn:Ni=67:33, the thickness becomes 2.5 µm. The Ni—Sn alloy layer is typically a pillar-shaped form.

Embodiment 4-4-3

In embodiment 4-4-3, an alloy of Sn:Pb=63:37 (wt %) is used as a solder consisting of the solder layer. Ni layer is formed as thickness 5 µm, P content 1.2 wt %. On the other hand, Pd layer is formed as thickness 0.009 μm, P content 1 wt %. Au layer is formed as thickness 0.03 μm. Therefore, the composition of the Ni—Sn alloy layer becomes Sn:Ni=67:33, the thickness becomes 2.5 μm. The Ni—Sn alloy layer is typically a pillar-shaped form.

Embodiment 4-4-4

In embodiment 4-4-4, an alloy of Sn:Pb=63:37 (wt %) is used as a solder consisting of the solder layer. Ni layer is formed as thickness 5 μm, P content 1.2 wt %. On the other hand, Pd layer is formed as thickness 2.0 μm, P content 2 wt %. Au layer is formed as thickness 0.05 μm. Therefore, the composition of the Ni—Sn alloy layer becomes Sn:Ni=67:33, the thickness becomes 1.3 μm. The Ni—Sn alloy layer is typically a grain-shaped and formed at an interface of the Ni layer.

Embodiment 4-4-5

In embodiment 4-4-5, an alloy of Sn:Pb=63:37 (wt %) is used as a solder consisting of the solder layer. Ni layer is formed as thickness 10 μm, P content 0.5 wt %. On the other hand, Pd layer is formed as thickness 2.0 μm, P content 5 wt %. Au layer is formed as thickness 0.04 μm. Therefore, the composition of the Ni—Sn alloy layer becomes Sn:Ni=67:33, the thickness becomes 1.3 μm. The Ni—Sn alloy layer is typically a grain-shaped and formed at an interface of the Ni layer.

Embodiment 4-4-6

In embodiment 4-4-6, an alloy of Sn:Pb=63:37 (wt %) is used as a solder consisting of the solder layer. Ni layer is formed as thickness 10 μm, P content 5 wt %. On the other hand, Pd layer is formed as thickness 2.0 μm, P content 9 wt %. Au layer is formed as thickness 0.06 μm. Therefore, the composition of the Ni—Sn alloy layer becomes Sn:Ni=67:33, the thickness becomes 1.5 μm. The Ni—Sn alloy layer is typically a grain-shaped and formed at an interface of the Ni layer.

Embodiment 4-4-7

In embodiment 4-4-7, an alloy of Sn:Pb=63:37 (wt %) is used as a solder consisting of the solder layer. Ni layer is formed as thickness 0.03 μm, P content 0.4 wt %. On the other hand, Pd layer is formed as thickness 0.03 μm, P content 3 wt %. Au layer is formed as thickness 0.03 μm. Therefore, the composition of the Ni—Sn alloy layer becomes Sn:Ni=67:33, the thickness becomes 1.1 μm. The Ni—Sn alloy layer is typically a grain-shaped and formed at an interface of the Ni layer.

Embodiment 4-4-8

In embodiment 4-4-8, an alloy of Sn:Pb=63:37 (wt %) is used as a solder consisting of the solder layer. Ni layer is formed as thickness 0.03 μm, P content 0.5 wt %. On the other hand, Pd layer is formed as thickness 0.2 μm, P content 7 wt %. Au layer is formed as thickness 0.04 μm. Therefore, the composition of the Ni—Sn alloy layer becomes Sn:Ni=67:33, the thickness becomes 1.3 μm. The Ni—Sn alloy layer is typically a grain-shaped and formed at an interface of the Ni layer.

Embodiment 4-4-9

In embodiment 4-4-9, an alloy of Sn:Pb=63:37 (wt %) is used as a solder consisting of the solder layer. Ni layer is formed as thickness 0.03 μm, P content 16 wt %. On the other hand, Pd layer is formed as thickness 0.2 μm, P content 7 wt %. Au layer is formed as thickness 0.05 μm. Therefore, the composition of the Ni—Sn alloy layer becomes Sn:Ni=67:33, the thickness becomes 1.3 μm. The Ni—Sn alloy layer is typically a grain-shaped and formed at an interface of the Ni layer.

Embodiment 4-4-10

In embodiment 4-4-10, an alloy of Sn:Pb=63:37 (wt %) is used as a solder consisting of the solder layer. Ni layer is formed as thickness 10 μm, P content 0.4 wt %. On the other hand, Pd layer is formed as thickness 0.2 μm, P content 2 wt %. Au layer is formed as thickness 0.03 μm. Therefore, the composition of the Ni—Sn alloy layer becomes Sn:Ni=67:33, the thickness becomes 1.4 μm. The Ni—Sn alloy layer is typically a grain-shaped and formed at an interface of the Ni layer.

Embodiment 4-4-11

In embodiment 4-4-11, an alloy of Sn:Pb=63:37 (wt %) is used as a solder consisting of the solder layer. Ni layer is formed as thickness 10 μm, P content 16 wt %. On the other hand, Pd layer is formed as thickness 1 μm, P content 7 wt %. Au layer is formed as thickness 0.01 μm. Therefore, the composition of the Ni—Sn alloy layer becomes Sn:Ni=67:33, the thickness becomes 1.5 μm. The Ni—Sn alloy layer is typically a grain-shaped and formed at an interface of the Ni layer.

Embodiment 4-4-12

In embodiment 4-4-12, an alloy of Sn:Pb=63:37 (wt %) is used as a solder consisting of the solder layer. Ni layer is formed as thickness 12 μm, P content 0.4 wt %. On the other hand, Pd layer is formed as thickness 1 μm, P content 2 wt %, Au layer is formed as thickness 0.04 μm. Therefore, the composition of the Ni—Sn alloy layer becomes Sn:Ni=67:33, the thickness becomes 2.4 μm. The Ni—Sn alloy layer is typically a grain-shaped and formed at an interface of the Ni layer.

Embodiment 4-4-13

In embodiment 4-4-13, an alloy of Sn:Pb=63:37 (wt %) is used as a solder consisting of the solder layer. Ni layer is formed as thickness 12 μm, P content: 5 wt %. On the other hand, Pd layer is formed as thickness 1 μm, P content 2 wt %. Au layer is formed as thickness 0.02 μm. Therefore, the composition of the Ni—Sn alloy layer becomes Sn:Ni=67:33, the thickness becomes 2.5 μm. The Ni—Sn alloy layer is typically a grain-shaped and formed at an interface of the Ni layer.

Embodiment 4-4-14

In embodiment 4-4-14, an alloy of Sn:Pb=63:37 (wt %) is used as a solder consisting of the solder layer. Ni layer is formed as thickness 12 μm, P content 17 wt %. On the other hand, Pd layer is formed as thickness 1 μm, P content 7 wt %. Au layer is formed as thickness 0.03 μm. Therefore, the composition of the Ni—Sn alloy layer becomes Sn:Ni=67:33, the thickness becomes 2.4 μm. The Ni—Sn alloy layer is typically a grain-shaped and formed at an interface of the Ni layer.

Embodiment 4-5-1

In embodiment 4-5-1, an alloy of Sn:Pb=63:37 (wt %) is used as a solder consisting of the solder layer. Ni layer is formed as thickness 5 μm, P content 1.2 wt %. On the other hand, Pd layer is formed as thickness 0.03 μm, P content 0 wt %. Au layer is formed as thickness 0.05 μm. When the solder is conducted reflow, flux containing copper is used. Therefore, the composition of the Ni—Sn alloy layer becomes Sn:Cu:Ni=42:37:21, the thickness becomes 1.5 μm. The Ni—Sn alloy layer is typically a grain-shaped form.

Embodiment 4-5-2

In embodiment 4-5-2, an alloy of Sn:Pb=63:37 (wt %) is used as a solder consisting of the solder layer. Ni layer is formed as thickness 5 μm, P content 1.2 wt %. On the other hand, Pd layer is formed as thickness 0.07 μm, P content 5 wt %. Au layer is formed as thickness 0.07 μm. When the solder is conducted reflow, flux containing copper is used. Therefore, the composition of the Ni—Sn alloy layer becomes Sn:Cu:Ni=42:37:21, the thickness becomes 1.5 μm. The Ni—Sn alloy layer is typically a board-shaped form.

Reference Example 4-1-1

In reference examples 4-1-1 to 4-1-16 and reference examples 4-2-1 to 4-2-16, a buildup-multi-layer-circuit-board is formed and a solder layer is formed, as same as the above embodiment 4 explained with referring to FIGS. 25-29.

In reference example 4-1-1, an alloy of Cu: 0.5 wt %, Ag: 3.5 wt %, Sn: 95 wt % is used as a solder consisting of the solder layer. Ni layer is formed as thickness 5 μm, P content 1.2 wt %. On the other hand, Pd layer is formed as thickness 0.5 μm, P content 0 wt %. Au layer is formed as thickness 0.03 μm. Therefore, the composition of the Ni—Sn alloy layer becomes Sn:Cu:Ni=42:37:21, the thickness becomes 0.8 μm. In reference example 4-1-1, as shown in the electron microscope picture in the right side of FIG. 18, the Ni—Cu—Sn alloy layer is typically a pillar-shaped form, that is, pillar-shaped alloy crystal vertically formed along with the Ni layer.

Reference Example 4-1-2

In reference example 4-1-2, an alloy of Cu: 0.5 wt %, Ag: 3.5 wt %, Sn: 95 wt % is used as a solder consisting of the solder layer. Ni layer is formed as thickness 5 μm, P content 4 wt %. On the other hand, Pd layer is formed as thickness 1.0 μm, P content 0.8 wt %. Au layer is formed as thickness 0.03 μm. Therefore, the composition of the Ni—Sn alloy layer becomes Sn:Cu:Ni=42:37:21, the thickness becomes 0.9 μm.

Reference Example 4-1-3

In reference example 4-1-3, an alloy of Cu: 0.5 wt %, Ag: 3.5 wt %, Sn: 95 wt % is used as a solder consisting of the solder layer. Ni layer is formed as thickness 5 μm, P content 4 wt %. On the other hand, Pd layer is formed as thickness 1.0 μm, P content 9 wt %, Au layer is formed as thickness 0.04 μm. Therefore, the composition of the Ni—Sn alloy layer becomes Sn:Cu:Ni=42:37:21, the thickness becomes 2.7 μm.

Reference Example 4-1-4

In reference example 4-1-4, an alloy of Cu: 0.5 wt %, Ag: 3.5 wt %, Sn: 95 wt % is used as a solder consisting of the solder layer. Ni layer is formed as thickness 5 μm, P content 4 wt %. On the other hand, Pd layer is formed as thickness 1.5 μm, P content 9 wt %. Au layer is formed as thickness 0.02 μm. Therefore, the composition of the Ni—Sn alloy layer becomes Sn:Cu:Ni=42:37:21, the thickness becomes 2.9 μm.

Reference Example 4-1-5

In reference example 4-1-5, an alloy of Cu: 0.2 wt %, Ag: 1 wt %, Sn: 97 wt % is used as a solder consisting of the solder layer. Ni layer is formed as thickness 0.03 μm, P content 0.4 wt %. On the other hand, Pd layer is formed as thickness 0.5 μm, P content 0 wt %. Au layer is formed as thickness 0.03 μm. Therefore, the composition of the Ni—Sn alloy layer becomes Sn:Cu:Ni=38:20:42, the thickness becomes 0.8 μm.

Reference Example 4-1-6

In reference example 4-1-6, an alloy of Cu: 0.2 wt %, Ag: 1 wt %, Sn: 97 wt % is used as a solder consisting of the solder layer. Ni layer is formed as thickness 0.03 μm, P content 0.4 wt %. On the other hand, Pd layer is formed as thickness 1.0 μm, P content 2 wt %. Au layer is formed as thickness 0.05 μm. Therefore, the composition of the Ni—Sn alloy layer becomes Sn:Cu:Ni=40:25:35, the thickness becomes 0.9 μm.

Reference Example 4-1-7

In reference example 4-1-7, an alloy of Cu: 0.2 wt %, Ag: 1 wt %, Sn: 97 wt % is used as a solder consisting of the solder layer. Ni layer is formed as thickness 0.03 μm, P content 16 wt %. On the other hand, Pd layer is formed as thickness 1.0 μm, P content 9 wt %. Au layer is formed as thickness 0.02 μm. Therefore, the composition of the Ni—Sn alloy layer becomes Sn:Cu:Ni=40:25:35, the thickness becomes 0.9 μm.

Reference Example 4-1-8

In reference example 4-1-8, an alloy of Cu: 0.2 wt %, Ag: 1 wt %, Sn: 97 wt % is used as a solder consisting of the solder layer. Ni layer is formed as thickness 0.03 μm, P content 16 wt %. On the other hand, Pd layer is formed as thickness 1.5 μm, P content 9 wt %. Au layer is formed as thickness 0.05 μm, Therefore, the composition of the Ni—Sn alloy layer becomes Sn:Cu:Ni=40:25:35, the thickness becomes 0.9 μm.

Reference Example 4-1-9

In reference example 4-1-9, an alloy of Cu: 0.2 wt %, Ag: 1 wt %, Sn: 97 wt % is used as a solder consisting of the solder layer. Ni layer is formed as thickness 12 μm, P content 0.4 wt %. On the other hand, Pd layer is formed as thickness 0.5 μm, P content 0 wt %. Au layer is formed as thickness 0.03 μm. Therefore, the composition of the Ni—Sn alloy layer becomes Sn:Cu:Ni=39:26:49, the thickness becomes 2.5 μm.

Reference Example 4-1-10

In reference example 4-1-10, an alloy of Cu: 0.2 wt %, Ag: 1 wt %, Sn: 97 wt % is used as a solder consisting of the solder layer. Ni layer is formed as thickness 12 μm, P content 0.4 wt %. On the other hand, Pd layer is formed as thickness 1 μm, P content 2 wt %. Au layer is formed as thickness 0.02 μm. Therefore, the composition of the Ni—Sn alloy layer becomes Sn:Cu:Ni=39:26:49, the thickness becomes 2.6 μm.

Reference Example 4-1-11

In reference example 4-1-11, an alloy of Cu: 0.2 wt %, Ag: 1 wt %, Sn: 97 wt % is used as a solder consisting of the solder layer. Ni layer is formed as thickness 12 μm, P content 17 wt %. On the other hand, Pd layer is formed as thickness 1 μm, P content 9 wt %. Au layer is formed as thickness 0.03 μm. Therefore, the composition of the Ni—Sn alloy layer becomes Sn:Cu:Ni=39:26:49, the thickness becomes 2.7 μm.

Reference Example 4-1-12

In reference example 4-1-12, an alloy of Cu: 0.2 wt %, Ag: 1 wt %, Sn: 97 wt % is used as a solder consisting of the solder layer. Ni layer is formed as thickness 12 μm, P content 17 wt %. On the other hand, Pd layer is formed as thickness 1.5 μm, P content 9 wt %. Au layer is formed as thickness 0.05 μm. Therefore, the composition of the Ni—Sn alloy layer becomes Sn:Cu:Ni=39:26:49, the thickness becomes 2.9 μm.

Reference Example 4-1-13

In reference example 4-1-13, an alloy of Cu: 0.2 wt %, Ag: 1 wt %, Sn: 97 wt % is used as a solder consisting of the solder layer. Ni layer is formed as thickness 0.03 μm, P content 0.4 wt %. On the other hand, Pd layer is formed as thickness 1 μm, P content 2 wt %. Au layer is formed as thickness 0.008 μm. Therefore, the composition of the Ni—Sn alloy layer becomes Sn:Cu:Ni=39:26:49, the thickness becomes 0.9 μm.

Reference Example 4-1-14

In reference example 4-1-14, an alloy of Cu: 0.2 wt %, Ag: 1 wt %, Sn: 97 wt % is used as a solder consisting of the solder layer. Ni layer is formed as thickness 0.03 μm, P content 16 wt %. On the other hand, Pd layer is formed as thickness 1 μm, P content 9 wt %. Au layer is formed as thickness 0.008 μm. Therefore, the composition of the Ni—Sn alloy layer becomes Sn:Cu:Ni=39:26:49, the thickness becomes 0.9 μm.

Reference Example 4-1-15

In reference example 4-1-15, an alloy of Cu: 0.2 wt %, Ag: 1 wt %, Sn: 97 wt % is used as a solder consisting of the solder layer. Ni layer is formed as thickness 12 μm, P content 0.4 wt %. On the other hand, Pd layer is formed as thickness 1.5 μm, P content 2 wt %. Au layer is formed as thickness 2.1 μm. Therefore, the composition of the Ni—Sn alloy layer becomes Sn:Cu:Ni=39:26:49, the thickness becomes 2.6 μm.

Reference Example 4-1-16

In reference example 4-1-16, an alloy of Cu: 0.2 wt %, Ag: 1 wt %, Sn: 97 wt % is used as a solder consisting of the solder layer. Ni layer is formed as thickness 12 μm, P content 17 wt %. On the other hand, Pd layer is formed as thickness 1.5 μm, P content 9 wt %. Au layer is formed as thickness 2.1 μm. Therefore, the composition of the Ni—Sn alloy layer becomes Sn:Cu:Ni=39:26:49, the thickness becomes 2.7 μm.

Reference Example 4-2-1

In reference examples 4-1-1 to 4-1-16, the Cu/Ag/Sn solder which does not include lead is used as the solder consisting of the solder layer. Whereas, in reference examples 4-2-1 to 4-2-16, an alloy of Sn:Pb=63:37 (wt %) is used as a solder consisting of the solder layer. Ni layer is formed as thickness 5 μm, P content 1.2 wt %. On the other hand, Pd layer is formed as thickness 0.5 μm, P content 0 wt %. Au layer is formed as thickness 0.03 μm. Therefore, the composition of the Ni—Sn alloy layer becomes Sn:Ni=67:33, the thickness becomes 0.8 μm.

Reference Example 4-2-2

In reference example 4-2-2, an alloy of Sn:Pb=63:37 (wt %) is used as a solder consisting of the solder layer. Ni layer is formed as thickness 5 μm, P content 4 wt %. On the other hand, Pd layer is formed as thickness 1.0 μm, P content 0.8 wt %. Au layer is formed as thickness 0.03 μm. Therefore, the composition of the Ni—Sn alloy layer becomes Sn:Ni=67:33, the thickness becomes 0.9 μm.

Reference Example 4-2-3

In reference example 4-2-3, an alloy of Sn:Pb=63:37 (wt %) is used as a solder consisting of the solder layer. Ni layer is formed as thickness 5 μm, P content 4 wt %. On the other hand, Pd layer is formed as thickness 1.0 μm, P content 9 wt %. Au layer is formed as thickness 0.04 μm. Therefore, the composition of the Ni—Sn alloy layer becomes Sn:Ni=67:33, the thickness becomes 2.7 μm.

Reference Example 4-2-4

In reference example 4-2-4, an alloy of Sn:Pb=63:37 (wt %) is used as a solder consisting of the solder layer. Ni layer is formed as thickness 5 μm, P content 4 wt %. On the other hand, Pd layer is formed as thickness 1.5 μm, P content 9 wt %. Au layer is formed as thickness 0.02 μm. Therefore, the composition of the Ni—Sn alloy layer becomes Sn:Ni=67:33, the thickness becomes 2.9 μm.

Reference Example 4-2-5

In reference example 4-2-5, an alloy of Sn:Pb=63:37 (wt %) is used as a solder consisting of the solder layer. Ni layer is formed as thickness 0.03 μm, P content 0.4 wt %. On the other hand, Pd layer is formed as thickness 0.5 μm, P content 0 wt %. Au layer is formed, as thickness 0.03 μm. Therefore, the composition of the Ni—Sn alloy layer becomes Sn:Ni=67:33, the thickness becomes 0.8 μm.

Reference Example 4-2-6

In reference example 4-2-6, an alloy of Sn:Pb=63:37 (wt %) is used as a solder consisting of the solder layer. Ni layer is formed as thickness 0.03 μm, P content 0.4 wt %. On the other hand, Pd layer is formed as thickness 1 μm, P content 2 wt %. Au layer is formed as thickness 0.05 μm. Therefore, the composition of the Ni—Sn alloy layer becomes Sn:Ni=67:33, the thickness becomes 0.9 μm.

Reference Example 4-2-7

In reference example 4-2-7, an alloy of Sn:Pb=63:37 (wt %) is used as a solder consisting of the solder layer. Ni layer is formed as thickness 0.03 μm, P content 16 wt %. On the other hand, Pd layer is formed as thickness 1 μm, P content 9 wt %. Au layer is formed as thickness 0.02 μm. Therefore, the composition of the Ni—Sn alloy layer becomes Sn:Ni=67:33, the thickness becomes 0.9 μm.

Reference Example 4-2-8

In reference example 4-2-8, an alloy of Sn:Pb=63:37 (wt %) is used as a solder consisting of the solder layer. Ni layer is formed as thickness 0.03 µm, P content 16 wt %. On the other hand, Pd layer is formed as thickness 1.5 µm, P content 9 wt %. Au layer is formed as thickness 0.05 µm. Therefore, the composition of the Ni—Sn alloy layer becomes Sn:Ni=67:33, the thickness becomes 0.9 µm.

Reference Example 4-2-9

In reference example 4-2-9, an alloy of Sn:Pb=63:37 (wt %) is used as a solder consisting of the solder layer. Ni layer is formed as thickness 12 µm, P content 0.4 wt %. On the other hand, Pd layer is formed as thickness 0.5 µm, P content 0 wt %. Au layer is formed as thickness 0.03 µm. Therefore, the composition of the Ni—Sn alloy layer becomes Sn:Ni=67:33, the thickness becomes 2.5 µm.

Reference Example 4-2-10

In reference example 4-2-10, an alloy of Sn:Pb=63:37 (wt %) is used as a solder consisting of the solder layer. Ni layer is formed as thickness 12 µm, P content 0.4 wt %. On the other hand, Pd layer is formed as thickness 1 µm, P content 2 wt %. Au layer is formed as thickness 0.02 µm. Therefore, the composition of the Ni—Sn alloy layer becomes Sn:Ni=67:33, the thickness becomes 2.6 µm.

Reference Example 4-2-11

In reference example 4-2-11, an alloy of Sn:Pb=63:37 (wt %) is used as a solder consisting of the solder layer. Ni layer is formed as thickness 12 µm, P content 17 wt %. On the other hand, Pd layer is formed as thickness 1 µm, P content 9 wt %. Au layer is formed as thickness 0.03 µm. Therefore, the composition of the Ni—Sn alloy layer becomes Sn:Ni=67:33, the thickness becomes 2.7 µm.

Reference Example 4-2-12

In reference example 4-2-12, an alloy of Sn:Pb=63:37 (wt %) is used as a solder consisting of the solder layer. Ni layer is formed as thickness 12 µm, P content 17 wt %. On the other hand, Pd layer is formed as thickness 1.5 µm, P content 9 wt %. Au layer is formed as thickness 0.05 µm. Therefore, the composition of the Ni—Sn alloy layer becomes Sn:Ni=67:33, the thickness becomes 2.9 µm.

Reference Example 4-2-13

In reference example 4-2-13, an alloy of Sn:Pb=63:37 (wt %) is used as a solder consisting of the solder layer. Ni layer is formed as thickness 0.03 µm, P content 0.4 wt %. On the other hand, Pd layer is formed as thickness 1 µm, P content 2 wt %. Au layer is formed as thickness 0.008 µm. Therefore, the composition of the Ni—Sn alloy layer becomes Sn:Ni=67:33, the thickness becomes 0.9 µm.

Reference Example 4-2-14

In reference example 4-2-14, an alloy of Sn:Pb=63:37 (wt %) is used as a solder consisting of the solder layer. Ni layer is formed as thickness 0.03 µm, P content 16 wt %. On the other hand, Pd layer is formed as thickness 1 µm, P content 9 wt %. Au layer is formed as thickness 0.008 µm. Therefore, the composition of the Ni—Sn alloy layer becomes Sn:Ni=67:33, the thickness becomes 0.9 µm.

Reference Example 4-2-15

In reference example 4-2-15, an alloy of Sn:Pb=63:37 (wt %) is used as a solder consisting of the solder layer. Ni layer is formed as thickness 12 µm, P content 0.4 wt %. On the other hand, Pd layer is formed as thickness 1.5 µm, P content 2 wt %. Au layer is formed as thickness 2.1 µm. Therefore, the composition of the Ni—Sn alloy layer becomes Sn:Ni=67:33, the thickness becomes 2.6 µm.

Reference Example 4-2-16

In reference example 4-2-16, an alloy of Sn:Pb=63:37 (wt %) is used as a solder consisting of the solder layer. Ni layer is formed as thickness 12 µm, P content 17 wt %. On the other hand, Pd layer is formed as thickness 1.5 µm, P content 9 wt %. Au layer is formed as thickness 2.1 µm. Therefore, the composition of the Ni—Sn alloy layer becomes Sn:Ni=67:33, the thickness becomes 2.7 µm.

Comparative Example

In comparative examples, as the conductive layer of the solder pad part, conventional nickel (Ni layer)-gold (Au layer) are formed.

Comparative Example 1-1-1

In Comparative example 1-1-1, an alloy of Cu: 0.2 wt %, Ag: 1 wt %, Sn: 97 wt % is used as a solder consisting of the solder bump Ni layer is formed as thickness 5 µm, P content 1.2 wt %. On the other hand, Au layer is formed as thickness 0.03 µm on the Ni layer, Instead of Pd layer. Therefore, the Ni—Sn alloy layer is not formed after the reflow.

Comparative Example 1-2-1

In comparative example 1-2-1, an alloy of Sn:Pb=63:37 (wt %) is used as a solder consisting of the solder bump. Ni layer is formed as thickness 5 µm, P content 1.2 wt %. On the other hand, Au layer is formed as thickness 0.03 µm on the Ni layer, instead of Pd layer. Therefore, the Ni—Sn alloy layer is not formed after the reflow.

Comparative Example 2-1-1

In Comparative example 2-1-1, an alloy of Cu: 0.2 wt %, Ag: 1 wt %, Sn: 97 wt % is used as a solder consisting of the solder layer Ni layer is formed as thickness 5 µm, P content 1.2 wt %. On the other hand, Au layer is formed, as thickness 0.03 µm on the Ni layer, instead of Pd layer. Therefore, the Ni—Sn alloy layer is not formed after the reflow.

Comparative Example 2-2-1

In comparative example 2-2-1, an alloy of Sn:Pb=63:37 (wt %) is used as a solder consisting of the solder layer. Ni layer is formed as thickness 5 µm, P content 1.2 wt %. On the other hand, Au layer is formed as thickness 0.03 µm on the Ni layer, instead of Pd layer. Therefore, the Ni—Sn alloy layer is not formed after the reflow.

(Evaluation Items)

For evaluation of this board, 10 specimens, each processed individually, were used. Parameters of the first to fourth embodiments, reference examples 1-4 and comparative examples are shown in FIGS. 31-47, and the evaluation results are shown in FIGS. 48-64.

1. Solder Peeling Test

After solder paste was applied, a solder paste peeling test was carried out. Instances where a value in tensile strength of over 4.0 Kg/pin (solder bump or solder layer) was obtained are annotated with a ⊚, instances where a value in tensile strength of 2.0-4.0 Kg/pin was obtained, with a ○, instances where a value of 1.0-2.0 Kg/pin was obtained, with a Δ, and instances where a value of less than 1.0 Kg/pin was obtained, with an X.

2. Reliability Test

First embodiment, third embodiment, first reference example, third reference example group: measurement of resistance after IC chip has been mounted.

Second embodiment, second embodiment, fourth reference example, fourth reference example group: measurement of resistance after installation on a mother board Under heat cycle conditions (135° C./3 minutes--55° C./3 minutes as a cycle), a reliability test was carried out every 500 cycles from 2500 cycles to 50,000 cycles.

At this time, after being taken out of a reliability test machine and left for two hours, a determination was made as to whether or not conductivity was found and resistance value were measured. Instances were conductivity was found, and a change of resistance was less than 2%, are annotated with a ⊚, instances where conductivity was found, and a change of resistance was over 2% and less than 5%, are annotated with a ○, instances where a change of resistance was over 5% are annotated with a Δ and instances where conductivity was lost are annotated with an X.

3. Peeling Test of a Chip/Mother Board after a Reliability Test

Pulling resistance was measured on a board, the installation of which had been completed and on which a reliability test had been completed over 5000 cycles under heat cycle conditions (135° C.--55° C. as a cycle). Instances where a value in tensile strength of 1.0-2.0 Kg/pin (solder bump or solder layer) was obtained are annotated with a ○ and instances where a value of less than 1.0 Kg/pin was obtained are annotated with an X. This evaluation was carried out in three locations and results were evaluated in terms of their minimum values.

<Confirmation of Factors Test for the Palladium Film of the First and Second Embodiments>

Next the results will be described of a confirmation of factors test on the palladium film.

A board of the first embodiment was manufactured under conditions A and B under the following conditions:
Condition A-1 (Δ) nickel thickness 0.05 μm, amount of the content of P in the nickel 0.5 wt %
Condition A-2 (○) nickel thickness 0.05 μm, amount of content of P in the nickel 6.0 wt %
Condition A-3 (X) nickel thickness 0.05 μm, amount of the content of P in the nickel 15.0 wt %
Condition B-1 (Δ) nickel thickness 10.0 μm, amount of the content of P in the nickel 0.5 wt %
Condition B-2 (○) nickel thickness 10.0 μm, amount of the content of P in the nickel 6.0 wt %
Condition B-3 (X) nickel thickness 10.0 μm, amount of the content of P in the nickel 15.0 wt %
(Correlation with Thickness of Palladium)

After the thickness of the palladium was set to 0.008 μm, 0.01 μm, 0.03 μm, 0.1 μm, 1.0 μm and 1.2 μm with the amount of the content of phosphor in the palladium film set to 5 wt %, a solder having Cu: 0.5 wt %, Ag: 3.5 wt % and Sn: 96 wt % was loaded, and a dummy semiconductor was mounted.

Thereafter, a PCT (pressure cooker test) was carried out (under conditions of 2 atm at 130° C.) for a period of 100 hours so as to execute a pulling test in three locations, and an average value was calculated. The results in each case are shown in the graph in FIG. 65.

(Correlation with the Amount of the Content of Phosphor in the Palladium)

After the amount of the content of phosphor; in the palladium was set to 0 wt %, 1 wt %, 2 wt %, 4 wt %, 6 wt %, 7 wt %, 8 wt % and 9 wt % with the thickness of the palladium set to 0.1 μm, a solder having Cu: 0.5 wt %, Ag: 3.5 wt %, Sn: 96 wt % was loaded, and a dummy semiconductor was mounted.

Thereafter, a PCT (pressure cooker test) was carried out (under condition of 2 atm at 130° C.) for a period of 100 hours so as to execute a pulling test in three locations, and an average value was calculated. The results in each case are shown in the graph in FIG. 66.

<Confirmation of Factors Test for the Nickel Film of the First and Second Embodiments>

Next, the results of the confirmation of factors test, of the nickel film will be described.

Boards of the first embodiment were manufactured under conditions C and D as follows.
Condition C-1 thickness of palladium 0.01 μm, amount of the content of P (phosphor) in the palladium 2 wt %
Condition C-2 thickness of palladium 0.01 μm, amount of the content of P (phosphor) in the palladium 5 wt %
Condition C-3 thickness of palladium 0.01 μm, amount of the content of P (phosphor) in the palladium 7 wt %
Condition D-1 thickness of palladium 1.0 μm, amount of content of phosphor in the palladium 2 wt %
Condition D-2 thickness of palladium 1.0 μm, amount of content of phosphor in the palladium 5 wt %
Condition D-3 thickness of palladium 1.0 μm, amount of content of phosphor in the palladium 7 wt %
(Correlation with the Thickness of the Nickel)

After the thickness of the nickel was set at 0.03 μm, 0.05 μm, 0.1 μm, 0.3 μm, 1.0 μm, 2.0 μm, 5 μm, 10 μm and 12 μm with the amount of phosphor in the nickel film set to 6.0 wt %, a palladium film was formed under the following condition.

(Correlation with the Amount of the Content of Phosphor in the Nickel)

With the thickness of nickel set to 0.1 μm, the amount of content of phosphor in the nickel was set at 0 wt %, 0.5 wt %, 1 wt %, 3 wt %, 5 wt %, 8 wt %, 10 wt %, 15 wt %, and 17 wt %.

Then, a solder having Cu: 0.2 wt %, Ag: 1 wt %, Sn: 97 wt % was loaded and a dummy semiconductor was mounted. Thereafter, a PCT (pressure cooker test) was carried out (under condition of 2 atm at 130° C.) for a period of 100 hours so as to execute a pulling test in three locations and an average value was calculated. As for the results in each case, the correlation between the thickness and the strength of the nickel is shown in the graph in FIG. 67, and the correlation between the nickel and the phosphor in the amount of the content is shown in the graph of FIG. 68.

Figure 69:
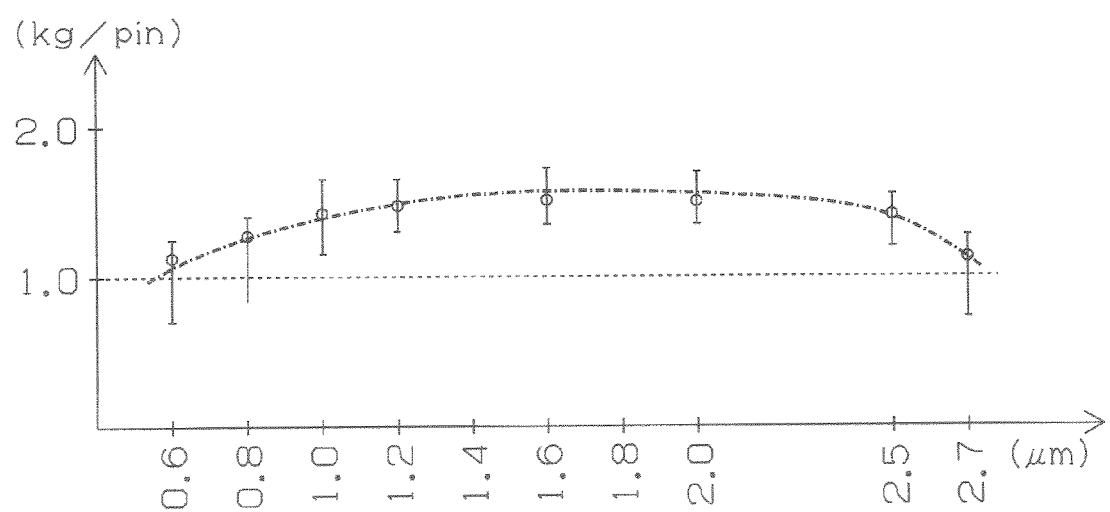
FIG. 69 is a graph showing results of simulation of pulling resistance for thicknesses of a Ni—Sn alloy layer.

When, on the basis of the results of the experiments, simulation of resistance to pulling was performed for thicknesses of the Ni—Sn alloy layer (in this case, Ni—Sn—Cu was used for evaluation), the relationship shown in the graph of FIG. 69 was discovered.

Confirmation of Factors Test of Palladium Film in the Third and Fourth Embodiments>

Next, the results of the confirmation of factors test of the palladium film in the third and fourth embodiments will be described. Boards of the third embodiment were manufactured under the conditions A and B that have already been described above.

(Correlation with the Thickness of the Palladium)

With the amount of the content of phosphor in the palladium film set to 5 wt %, the thickness of palladium was set at 0.008 μm, 0.01 μm, 0.03 μm, 0.1 μm, 1.0 μm and 1.2 μm. Thereafter, a solder having Cu: 0.5 wt %, Ag: 3.5 wt % and Sn: 96 wt % was loaded, and a dummy semiconductor was mounted.

As can be evidenced from the graph of FIG. 65, the results of the PCT (pressure cooker test) were substantially the same as in the first embodiment.

(Correlation with the Amount of the Content, of Phosphor in the Palladium)

With the thickness of palladium set to 0.1 μm, the amount of the content of phosphor in palladium was set at 0 wt %, 1 wt %, 2 wt %, 4 wt %, 6 wt %, 7 wt %, 8 wt % and 9 wt %. Thereafter, a solder having Cu: 0.5 wt %, Ag: 3.5 wt %, Sn: 96 wt % was loaded and a dummy semiconductor was mounted.

As is apparent from FIG. 66, the results of the PCT (pressure cooker test) were substantially the same as in the first embodiment.

<Confirmation of Factors Test of the Nickel Film According to the Third and Fourth Embodiments>

The results of the confirmation of factors test of the nickel film in the third and fourth embodiments of the present invention will now be described. Boards of the third embodiment were manufactured under conditions C and D that have already been described above.

(Correlation with the Thickness of the Nickel)

With the amount of the content of phosphor in the nickel film set to 6.0 wt %, the thickness of the nickel was set at 0.03 μm, 0.05 μm, 0.1 μm, 0.3 μm, 1.0 μm, 2.0 μm, 5 μm, 10 μm and 12 μm. Thereafter, the palladium film was formed under the following condition.

(Correlation with the Content of Phosphor in the Nickel)

With the thickness of the nickel set to 0.1 μm, the amount of the content of phosphor in the nickel was set at 0.5 wt %, 1 wt %, 3 wt %, 5 wt %, 8 wt %, 10 wt %, 15 wt % and 17 wt %.

Then, a solder having Cu: 0.2 wt %, Ag: 1 wt %, Sn: 97 wt % was loaded, and a dummy semiconductor was mounted. As is apparent from FIGS. 67 and 68, the results of the PCT (pressure cooker test) were substantially the same as in the first embodiment that has already been described.

When, on the basis of the results of these experiments, simulation of resistance to pulling was performed for thicknesses of the Ni—Sn alloy layer (in this case, evaluation was carried out with Ni—Sn—Cu), the same relationship was discovered as in the first embodiment already described, as is apparent from FIG. 69.

Trends apparent from the <confirmation of factors test of the palladium film in the first-fourth embodiments> and the <confirmation of factors test of the nickel film in the first-fourth embodiments> have been confirmed as identical to the case in where the external terminal was disposed as the solder layer. Further, substantial variations in the trend were not apparent from the various types of solder tested (solder composition).

<Confirmation of Factors Test of the Corrosion Resistant Film of the Third and Fourth Embodiments>

Next, the results of the confirmation of factor test of the corrosion resistant film will be described. Boards of the third embodiment were manufactured under the following conditions.

(Correlation with the Thickness of Gold)

Thickness of nickel: 0.3 μm, amount of the content of phosphor in the nickel: 5 wt %

Thickness of palladium: 0.5 μm, amount of the content of phosphor in the palladium: 5 wt %

Thereafter, the thickness of the gold was set at 0.01 μm, 0.03 μm, 0.05 μm, 0.05 μm, 0.1 μm, 0.5 μm, 1.0 μm, 2.0 μm, and 2.5 μm.

(Correlation with Other Corrosion Resistant Layers)

Corrosion resistant layers were formed with silver, platinum and tin instead of gold set at 0.03 μm.

After the corrosion resistant layers were formed, a solder having Cu: 2 wt %, Ag: 1 wt % and Sn: 97 wt % was loaded, and a dummy semiconductor was mounted.

Figure 70:
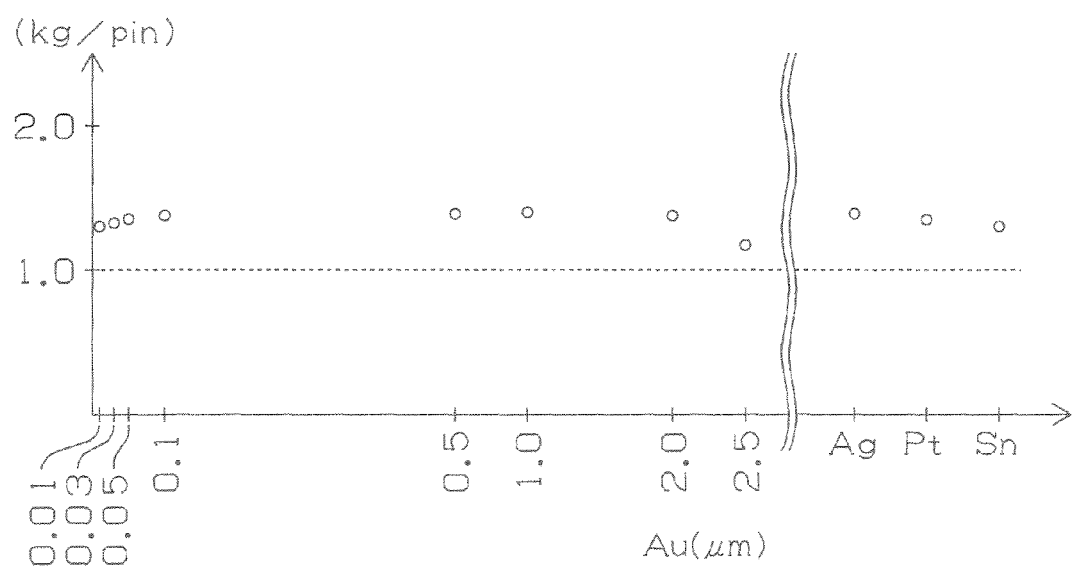
FIG. 70 is a graph showing a correlation between thickness of a corrosion resistant layer and strength.

Thereafter, a PCT (pressure cooker test) was carried out (under conditions of 2 atm at 130° C.) for a period of 100 hours so as to execute a pulling test, at three locations, and the results of a calculation of an average value at this time are shown in the graph of FIG. 70.

What is claimed is:

1. A printed wiring board comprising:
   a solder pad;
   a solder resist layer having an opening portion exposing the solder pad; and
   a structure for forming a composite layer on the solder pad and configured to receive a solder material,
   wherein the structure has a first layer comprising Ni and a second layer comprising Pd, the first layer is positioned on the solder pad, the second layer is positioned on the first layer, at least one of the first layer and the second layer has a degree of a thickness and contains an amount of P such that the composite layer which has Ni reaching to an interface between the composite layer and a solder structure is formed as a result of solder reflow of the solder material, a thickness of the second layer is 0.01-1.0 μm, and the second layer contains P of 2-7 wt %.

2. The printed wiring board according to claim 1 wherein the first layer contains P of 0.5-15 wt %.

3. The printed wiring board according to claim 1 wherein both the first layer and the second layer contain P.

4. The printed wiring board according to claim 3 wherein the first layer contains P in a smaller amount of content than a content of P in the second layer.

5. The printed wiring board according to claim 3 wherein the first layer contains P in a larger amount of content than a content of P in the second layer.

6. A printed wiring board comprising:
   a solder pad;
   a solder resist layer having an opening portion exposing the solder pad;
   a composite layer on the solder pad and comprising Ni; and
   a solder structure on the composite layer and configured to be connected to an exterior component,
   wherein the composite layer is formed by forming a first layer comprising Ni on the solder pad, forming a second layer comprising Pd on the first layer, providing a solder material on the second layer and subjecting the solder material to solder reflow such that the composite layer which has Ni reaching to an interface between the composite layer and the solder structure is formed, a thickness of the second layer is 0.01-1.0 μm, and the second layer contains P of 2-7 wt %.

7. The printed wiring board according to claim 6 wherein the solder structure comprises a solder material which is selected from the group consisting of an Sn—Ag base solder, an Sn—Sb base solder, an Sn—Cu base solder and an Sn—Ag—Cu base solder.

8. A printed wiring board comprising:
   a solder pad;
   a solder resist layer having an opening portion exposing the solder pad;
   a composite layer on the solder pad and comprising Ni; and
   a solder structure on the composite layer and configured to be connected to an exterior component,
   wherein the composite layer has a first layer comprising Ni and a second layer comprising a Ni alloy, the first layer is formed on the solder pad, the second layer is formed on the first layer, the composite layer is formed by forming a Ni layer comprising Ni on the solder pad, forming a Pd layer comprising Pd on the Ni layer, providing a solder material on the Pd layer and subjecting the solder material to solder reflow such that the composite layer which has Ni reaching to an interface between the composite layer and the solder structure is formed, the second layer is 1.0-2.5 μm in thickness, and the second layer contains sheet-like bodies.

9. The printed wiring board according to claim 8 wherein the solder structure is a solder layer for connecting to a semiconductor device.

10. The printed wiring board according to claim 8 wherein the solder structure comprises the solder material which contains Sn and the second layer contains Ni—Sn.

11. The printed wiring board according to claim 8 wherein the solder structure comprises the solder material comprising Cu—Sn—Ag and the second layer comprises Cu—Ni—Sn.

12. The printed wiring board according to claim 8 wherein the solder structure is a solder layer which contains Cu.

13. The printed wiring board according to claim 8 wherein the solder structure is subjected to heat treatment.

14. A printed wiring board comprising:
a solder pad;
a solder resist layer having an opening portion exposing the solder pad;
a composite layer on the solder pad and comprising Ni and Sn; and
a solder structure on the composite layer and configured to be connected to an exterior component,
wherein the composite layer has a first layer comprising Ni and a second layer comprising a Ni—Sn alloy, the first layer is provided on the solder pad, the second layer is provided on the first layer, the composite layer is formed by forming a Ni layer comprising Ni on the solder pad, forming a Pd layer comprising Pd on the Ni layer, providing a solder material on the Pd layer and subjecting the solder material to solder reflow such that the composite layer which has Ni reaching to an interface between the composite layer and the solder structure is formed, the second layer is 1.0-2.5 μm in thickness, and the second layer contains sheet-like bodies.

15. The printed wiring board according to claim 14 wherein the second layer has three components made up of Ni, Sn, and Cu.

16. A printed wiring board comprising:
a solder pad;
a solder resist layer having an opening portion exposing the solder pad; and
a structure for forming a composite layer on the solder pad and configured to receive a solder material,
wherein the structure has a first layer comprising Ni on the solder pad, a second layer comprising Pd on the first layer, a corrosion resistant layer on the second layer, the first layer has a thickness which is between 3 μm and 10 μm, and at least one of the first layer and the second layer contains an amount of P such that the composite layer which has Ni reaching to an interface between the composite layer and a solder structure is formed as a result of solder reflow of the solder material.

17. The printed wiring board according to claim 16 wherein the first layer contains P of 0.5-15 wt %.

18. The printed wiring board according to claim 16 wherein the corrosion resistant layer contains at least one selected from the group consisting of Au, Ag, Pt and Sn.

19. The printed wiring board according to claim 16 wherein both the first layer and the second layer contain P.

20. The printed wiring board according to claim 19 wherein the first layer contains P in a smaller amount of content than a content of P in the second layer.

21. The printed wiring board according to claim 19 wherein the first layer contains P in a larger amount of content than an amount of P in the second layer.

\* \* \* \* \*